(12) United States Patent
Lee et al.

(10) Patent No.: US 6,992,349 B2
(45) Date of Patent: Jan. 31, 2006

(54) RAIL STACK ARRAY OF CHARGE STORAGE DEVICES AND METHOD OF MAKING SAME

(75) Inventors: Thomas H. Lee, Burlingame, CA (US); Andrew J. Walker, Mountain View, CA (US); Christopher J. Petti, Mountain View, CA (US); Igor G. Kouznetzov, Santa Clara, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/849,000

(22) Filed: May 20, 2004

(65) Prior Publication Data

US 2004/0214379 A1    Oct. 28, 2004

Related U.S. Application Data

(63) Continuation of application No. 09/927,648, filed on Aug. 13, 2001, now Pat. No. 6,881,994, and a continuation-in-part of application No. 09/801,233, filed on Mar. 6, 2001, now abandoned, which is a continuation-in-part of application No. 09/745,125, filed on Dec. 21, 2000, now abandoned, application No. 10/849,000, which is a continuation-in-part of application No. 09/639,749, filed on Aug. 17, 2000, now abandoned, and a continuation-in-part of application No. 09/639,702, filed on Aug. 14, 2000, now abandoned, and a continuation-in-part of application No. 09/639,579, filed on Aug. 14, 2000, now abandoned.

(60) Provisional application No. 60/279,855, filed on Mar. 28, 2001.

(51) Int. Cl.
  *H01L 29/792*    (2006.01)
  *H01L 21/336*    (2006.01)

(52) U.S. Cl. .................................. 257/324; 438/261
(58) Field of Classification Search ................ 257/324; 438/261
    See application file for complete search history.

(56) References Cited

U.S. PATENT DOCUMENTS

| | | |
|---|---|---|
| 3,414,892 A | 12/1968 | McCormack et al. |
| 3,432,827 A | 3/1969 | Sarno |
| 3,571,809 A | 3/1971 | Nelson |
| 3,573,757 A | 4/1971 | Adams |
| 3,576,549 A | 4/1971 | Hess |
| 3,582,908 A | 6/1971 | Koo |
| 3,629,863 A | 12/1971 | Neale |
| 3,634,929 A | 1/1972 | Yoshida et al. |
| 3,671,948 A | 6/1972 | Cassen et al. |
| 3,699,543 A | 10/1972 | Neale |
| 3,717,852 A | 2/1973 | Abbas et al. |
| 3,728,695 A | 4/1973 | Frohman-Bentchowsky |
| 3,787,822 A | 1/1974 | Rioult |

(Continued)

FOREIGN PATENT DOCUMENTS

EP    0 073 486 A2    8/1982

(Continued)

OTHER PUBLICATIONS

Copending U.S. Appl. No. 10/842,008, Lee at al., May. 10, 2004.

(Continued)

*Primary Examiner*—Howard Weiss

(74) *Attorney, Agent, or Firm*—Foley & Lardner LLP

(57) ABSTRACT

There is provided a monolithic three dimensional array of charge storage devices which includes a plurality of device levels, wherein at least one surface between two successive device levels is planarized by chemical mechanical polishing.

59 Claims, 85 Drawing Sheets

U.S. PATENT DOCUMENTS

| | | |
|---|---|---|
| 3,846,767 A | 11/1974 | Cohen |
| 3,863,231 A | 1/1975 | Taylor |
| 3,877,049 A | 4/1975 | Buckley |
| 3,886,577 A | 5/1975 | Buckley |
| 3,922,648 A | 11/1975 | Buckley |
| 3,980,505 A | 9/1976 | Buckley |
| 3,990,098 A | 11/1976 | Mastrangelo |
| 4,146,902 A | 3/1979 | Tanimoto et al. |
| 4,177,475 A | 12/1979 | Holmberg |
| 4,203,123 A | 5/1980 | Shanks |
| 4,203,158 A | 5/1980 | Frohman-Bentchkowsky et al. |
| 4,272,880 A | 6/1981 | Pashley |
| 4,281,397 A | 7/1981 | Neal et al. |
| 4,419,741 A | 12/1983 | Stewart et al. |
| 4,420,766 A | 12/1983 | Kasten |
| 4,442,507 A | 4/1984 | Roesner |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,500,905 A | 2/1985 | Shibata |
| 4,507,757 A | 3/1985 | McElroy |
| 4,535,424 A | 8/1985 | Reid |
| 4,543,594 A | 9/1985 | Mohsen et al. |
| 4,569,121 A | 2/1986 | Lim et al. |
| 4,630,096 A | 12/1986 | Drye |
| 4,646,266 A | 2/1987 | Ovshinsky et al. |
| 4,672,577 A | 6/1987 | Hirose |
| 4,677,742 A | 7/1987 | Johnson |
| 4,686,758 A | 8/1987 | Liu et al. |
| 4,692,994 A | 9/1987 | Moniwa et al. |
| 4,710,798 A | 12/1987 | Marcantonio |
| 4,728,626 A | 3/1988 | Tu |
| 4,729,005 A | 3/1988 | Wei et al. |
| 4,811,082 A | 3/1989 | Jacobs |
| 4,811,114 A | 3/1989 | Yamamoto et al. |
| 4,820,657 A | 4/1989 | Hughes et al. |
| 4,823,181 A | 4/1989 | Mohsen et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 5,001,539 A | 3/1991 | Inoue et al. |
| 5,070,383 A | 12/1991 | Sinar et al. |
| 5,070,384 A | 12/1991 | McCollum et al. |
| 5,089,862 A | 2/1992 | Warner, Jr. et al. |
| 5,091,762 A | 2/1992 | Watanabe |
| 5,160,987 A | 11/1992 | Pricer et al. |
| 5,191,405 A | 3/1993 | Tomita et al. |
| 5,191,551 A | 3/1993 | Inoue |
| 5,202,754 A | 4/1993 | Bertin et al. |
| 5,266,912 A | 11/1993 | Kledzik |
| 5,283,458 A | 2/1994 | Stokes et al. |
| 5,283,468 A | 2/1994 | Kondo et al. |
| 5,306,935 A | 4/1994 | Esquivel et al. |
| 5,311,039 A | 5/1994 | Kimura et al. |
| 5,321,286 A | 6/1994 | Koyama et al. |
| 5,334,880 A | 8/1994 | Abadeer et al. |
| 5,379,255 A | 1/1995 | Shah |
| 5,391,518 A | 2/1995 | Bhushan |
| 5,391,907 A | 2/1995 | Jang |
| 5,398,200 A | 3/1995 | Mazure et al. |
| 5,422,435 A | 6/1995 | Takiar et al. |
| 5,426,566 A | 6/1995 | Beilstein, Jr. |
| 5,427,979 A | 6/1995 | Chang |
| 5,434,745 A | 7/1995 | Shokrgozar et al. |
| 5,441,907 A | 8/1995 | Sung et al. |
| 5,453,952 A | 9/1995 | Okudaira |
| 5,455,445 A | 10/1995 | Kurtz et al. |
| 5,463,244 A | 10/1995 | De Araujo et al. |
| 5,468,663 A | 11/1995 | Bertin et al. |
| 5,468,997 A | 11/1995 | Imai et al. |
| 5,471,090 A | 11/1995 | Deutsch |
| 5,481,133 A | 1/1996 | Hsu |
| 5,495,398 A | 2/1996 | Takiar et al. |
| 5,502,289 A | 3/1996 | Takiar et al. |
| 5,517,044 A | 5/1996 | Koyama |
| 5,523,622 A | 6/1996 | Harada et al. |
| 5,523,628 A | 6/1996 | Williams et al. |
| 5,535,156 A | 7/1996 | Levy et al. |
| 5,536,968 A | 7/1996 | Crafts et al. |
| 5,552,963 A | 9/1996 | Burns |
| 5,561,622 A | 10/1996 | Bertin et al. |
| 5,581,498 A | 12/1996 | Ludwig et al. |
| 5,585,675 A | 12/1996 | Knopf |
| 5,612,570 A | 3/1997 | Eide et al. |
| 5,654,220 A | 8/1997 | Leedy |
| 5,675,547 A | 10/1997 | Koga |
| 5,693,552 A | 12/1997 | Hsu |
| 5,696,031 A | 12/1997 | Wark |
| 5,703,747 A | 12/1997 | Voldman et al. |
| 5,737,259 A | 4/1998 | Chang |
| 5,745,407 A | 4/1998 | Levy et al. |
| 5,751,012 A | 5/1998 | Wolstenholme et al. |
| 5,768,192 A | 6/1998 | Eitan |
| 5,776,810 A | 7/1998 | Guterman et al. |
| 5,780,925 A | 7/1998 | Cipolla et al. |
| 5,781,031 A | 7/1998 | Bertin et al. |
| 5,801,437 A | 9/1998 | Burns |
| 5,825,046 A | 10/1998 | Czubatyj et al. |
| 5,835,396 A | 11/1998 | Zhang |
| 5,840,589 A | 11/1998 | Warner et al. |
| 5,883,409 A | 3/1999 | Guterman et al. |
| 5,889,302 A | 3/1999 | Liu |
| 5,915,167 A | 6/1999 | Leedy |
| 5,930,608 A | 7/1999 | Yamazaki et al. |
| 5,936,280 A | 8/1999 | Liu |
| 5,966,603 A | 10/1999 | Eitan |
| 5,969,380 A | 10/1999 | Syyedy |
| 5,973,356 A | 10/1999 | Noble et al. |
| 5,976,953 A | 11/1999 | Zavracky et al. |
| 5,978,258 A | 11/1999 | Manning |
| 5,981,974 A | 11/1999 | Makita |
| 5,985,693 A | 11/1999 | Leedy |
| 5,998,808 A | 12/1999 | Matsushita |
| 6,005,270 A | 12/1999 | Noguchi |
| 6,028,326 A | 2/2000 | Uochi et al. |
| 6,034,882 A | 3/2000 | Johnson et al. |
| 6,057,598 A | 5/2000 | Payne et al. |
| 6,066,547 A | 5/2000 | Maekawa |
| 6,072,193 A | 6/2000 | Ohnuma et al. |
| 6,072,234 A | 6/2000 | Camien et al. |
| 6,075,719 A | 6/2000 | Lowrey et al. |
| 6,087,674 A | 7/2000 | Ovshinsky et al. |
| 6,087,722 A | 7/2000 | Lee et al. |
| 6,107,666 A | 8/2000 | Chang |
| 6,110,278 A | 8/2000 | Saxena |
| 6,114,767 A | 9/2000 | Nagai et al. |
| 6,133,640 A | 10/2000 | Leedy |
| 6,137,718 A | 10/2000 | Reisinger |
| 6,141,241 A | 10/2000 | Ovshinsky et al. |
| 6,153,495 A | 11/2000 | Kub et al. |
| 6,185,122 B1 | 2/2001 | Johnson et al. |
| 6,197,641 B1 | 3/2001 | Hergenrother et al. |
| 6,208,545 B1 | 3/2001 | Leedy |
| RE37,259 E | 7/2001 | Ovshinsky |
| 6,255,705 B1 | 7/2001 | Zhang et al. |
| 6,281,042 B1 | 8/2001 | Ahn et al. |
| 6,291,858 B1 | 9/2001 | Ma et al. |
| 6,307,257 B1 | 10/2001 | Huang et al. |
| 6,314,013 B1 | 11/2001 | Ahn et al. |

| | | | |
|---|---|---|---|
| 6,322,903 B1 | 11/2001 | Siniaguine et al. | |
| 6,323,515 B1 | 11/2001 | Yamazaki et al. | |
| 6,337,521 B1 | 1/2002 | Masuda | |
| 6,351,028 B1 | 2/2002 | Akram | |
| 6,353,265 B1 | 3/2002 | Michii | |
| 6,355,501 B1 | 3/2002 | Fung et al. | |
| 6,472,684 B1 | 10/2002 | Yamazaki et al. | |
| 6,498,369 B1 | 12/2002 | Yamazaki et al. | |
| 6,509,602 B2 | 1/2003 | Yamazaki et al. | |
| 6,577,531 B2 | 6/2003 | Kato | |
| 6,627,518 B1 | 9/2003 | Inoue et al. | |
| 6,653,733 B1 | 11/2003 | Gonzalez et al. | |
| 6,713,810 B1 | 3/2004 | Bhattacharyya | |
| 6,888,750 B2 * | 5/2005 | Walker et al. | 365/185.05 |
| 2001/0033030 A1 | 10/2001 | Leedy | |
| 2001/0054759 A1 | 12/2001 | Nishiura | |
| 2001/0055838 A1 | 12/2001 | Walker et al. | |
| 2002/0024146 A1 | 2/2002 | Furusawa | |
| 2002/0027275 A1 | 3/2002 | Fujimoto et al. | |
| 2002/0030262 A1 | 3/2002 | Akram | |
| 2002/0030263 A1 | 3/2002 | Akram | |
| 2002/0142546 A1 | 10/2002 | Kouznetsov et al. | |
| 2003/0030074 A1 | 2/2003 | Walker et al. | |
| 2003/0057435 A1 | 3/2003 | Walker | |
| 2003/0173643 A1 | 9/2003 | Herner | |
| 2004/0000679 A1 | 1/2004 | Patel et al. | |

FOREIGN PATENT DOCUMENTS

| | | |
|---|---|---|
| EP | 0 387 834 A2 | 9/1990 |
| EP | 0387834 | 9/1990 |
| EP | 0 395 886 A2 | 11/1990 |
| EP | 0 516 866 A1 | 12/1992 |
| EP | 0 606 653 A1 | 7/1994 |
| EP | 0 644 548 A2 | 9/1994 |
| EP | 0 800 137 A1 | 3/1997 |
| EP | 1017 100 A1 | 7/2000 |
| JP | 61-222216 | 10/1986 |
| JP | 5-082787 | 4/1993 |
| JP | 6-22352 | 1/1994 |
| JP | 6-338602 | 12/1994 |
| JP | 63-52463 | 3/1998 |
| WO | WO 94/26083 | 11/1994 |

OTHER PUBLICATIONS

John H. Douglas: "The Route to 3-D Chips," High Technology, Sep. 1983, pp. 55-59, vol. 3, No. 9, High Technology Publishing Corporation, Boston, MA.

M. Arienzo et al.: "Diffusion of Arsenic in Bilayer Polycrystalline Silicon Films," J. Appl. Phys., Jan. 1984, pp. 365-369, vol. 55, No. 2, American Institute of Physics.

O. Bellezza et al.: "A New Self-Aligned Field Oxide Cell for Multimegabit Eproms," IEDM. pp. 579-582, IEEE.

S.D. Brotherton et al.: "Excimer-Laser-Annealed Poly-Si Thin-Film Transistors," IEEE Transactions on Electron Devices, Feb. 1993, pp. 407-413, vol. 40, No. 2, IEEE.

P. Candelier et al.: "Simplified 0.35$\mu$m Flash EEPROM Process Using High-Temperature Oxide (HTO) Deposited by LPCVD as Interpoly Dielectrics and Peripheral Transistors Gate Oxide," IEEE Electron Device Letters, Jul. 1997, pp. 306-308, vol. 18, No. 7, IEEE.

Min Cao et al.: "A High-Performance Polysilicon Thin-Film Transistor Using XeCl Excimer Laser Crystallization of Pre-Patterned Amorphous Si Films," IEEE Transactions on Electron Devices, Apr. 1996, pp. 561-567, vol. 43, No. 4, IEEE.

Mino Cao et al.: "A Simple EEPROM Cell Using Twin Polysilicon Thin Film Transistors," IEEE Electron Device Letters, Aug. 1994, pp. 304-306, vol. 15, No. 8, IEEE.

Bomy Chen et al.: "Yield Improvement for a 3.5-ns BICOMS Technology in a 200-mm Manufacturing Line," IBM Technology Products, 1993, pp. 301-305, VLSITSA.

Victor W.C. Chan et al.: "Three Dimensional CMOS Integrated Circuits on Large Grain Polysilicon Films," IEDM, 2000, IEEE.

Boaz Eitan et al.: "Alternate Metal Virtual Ground (AMG)-A New Scaling Concept for Very High-Density EPROM's," IEEE Electron Device Letters, pp. 450-452, vol. 12, No. 8, Aug. 1991, IEEE.

Boaz Eitan et al.: "Multilevel Flash cells and their Tradeoffs," IEEE Electron Device Letters , pp. 169-172, 1996, IEEE.

Dr. Heinrich Endert: "Excimer Lasers as Tools for Material Processing in Manufacturing," Technical Digest: International Electron Devices Meeting, 1985, pp. 28-29, Washington, DC, Dec. 1-4, 1985, Göttingen, Germany.

Dov Frohman-Bentchkowsky: "A Fully Decoded 2048-Bit Electrically Programmable FAMOS Read-Only Memory," IEEE Journal of Solid-State Circuits, pp. 301-306, vol. sc-6, No. 5, Oct. 1971.

G.K. Giust et al., "Laser-Processed Thin-Film Transistors Fabricated from Sputtered Amorphous-Silicon Films," IEEE Transactions on Electron Devices, pp. 207-213, vol. 47, No. 1, Jan. 2000, IEEE.

G.K. Giust et al.: "High-Performance Thin-Film Transistors Fabricated Using Excimer Laser Processing and Grain Engineering," IEEE Transactions on Electron Devices, pp. 925-932, vol. 45, No. 4, Apr. 1998, IEEE.

G.K. Giust et al.: "High-Performance Laser-Processed Polysilicon Thin-Film Transistors," IEE Electron Device Letters, pp. 77-79, vol. 20, No. 2, Feb. 1999, IEEE.

Fumihiko Hayashi et al.: "A Self-Aligned Split-Gate Flash EEPROM Cell with 3-D Pillar Structure," 1999 Symposium on VLSI Technology Digest of Technical Papers, pp. 87-88, Stanford University, Stanford, CA 94305, USA.

Stephen C.H. Ho et al.: "Thermal Stability of Nickel Silicides in Different Silicon Substrates," Department of Electrical and Electronic Engineering, pp. 105-108, 1998, IEEE.

J. Esquivel et al. "High Density Contactless, Self Aligned EPROM Cell Array Technology, " Texas Instruments (Dallas), IEDM 86, pp. 592-595, 1986, IEEE.

R. Kazerounian et al.: Alternate Metal Virtual Ground EPROM Array Implemented in a 0.8$\mu$m Process for Very High Density Applications, IEDM 91, pp. 311-314, 1991, IEEE.

Chang-Dong Kim et al.: "Short-Channel Amorphous-Silicon Thin-Film Transistors," IEEE Transactions on Electron Devices, pp. 2172-2176, vol. 43, No. 12, December 1996, IEEE.

Johan H. Klootwijk et al.: "Deposited Inter-Polysilicon Dielectrics for Nonvolatie Memories," IEEE Transactions on Electron Devices, pp. 1435-1445, vol. 46, No. 7, Jul. 1999, IEEE.

Webpage—Ja-Hum Ku et al.: "High Performance pMOSFETs With Ni(Si/sub x/Ge/sub 1−x Si/Sub 0.8/Ge/sub 0.2/ gate, IEEE Xplore Citation," VLSI Technology, 200. Digest of Technical Paper Symposium on pages(s): 114-115 Jun. 13-15, 2000.

Nae-In Lee et al.: "High-Performance EEPROM's Using N- and P-Channel Polysilicon Thin-Film Transistors with Electron Cyclotron Resonance N20-Plasma Oxide," pp.15-17, IEEE Electron Device Letters, vol. 20, No. 1, Jan. 1999, IEEE.

Jin-Woo Lee et al.: "Improved Stability of Polysilicon Thin-Film Transistors under Self-Heating and High Endurance EEPROM Cells for Systems-On-Panel," IEEE Electron Device Letters, 1998, pp. 265-268, IEEE.

Seok-Woon Lee et al.: "Pd induced lateral crystallization of Amorphous Si Thin Films," Appl. Phys. Lett. 66(13), pp. 1671-1673, Mar. 27, 1995, American Institute of Physics.

K. Miyashita etal.: "Optimized Halo Structure for 80 nm Physical Gate CMOS Technology with indium and Antimony Highly Angled Ion Implantation," IEDM 99-645, pp. 27.2.1-27.2.4, 1999, IEEE.

N.D. Young et al.: "The Fabrication and Characterization of EEPROM Arrays on Glass Using a Low-Temperature Poly-Si TFT Process," IEEE Transactions on Electron Devices, pp. 1930-1936, vol. 43, No. 11, Nov. 1996, IEEE.

Jung-Hoon Oh et al.: "A High-Endurance Low-Temperature Polysilicon Thin-Film Transistor EEPROM Cell," pp. 304-306, IEEE Electron Device Letters, vol. 21, No. 6, Jun. 2000, IEEE.

Webpage—M.C. Poon. et al.: "Thermal Stability of Cobalt and Nickel Silicides in Amorpho Crystalline Silicon," p. 1, IEEE Xplore, Electron Devices Meeting, 1997, Proceedings, 19 Hong Kong, 2000, IEEE.

Noriaki Sato et al.: "A New Programmable Cell Utilizing Insulator Breakdown," IEDM 85, pp. 639-642, 1985, IEEE.

Takeo Shiba et al.: "In Situ Phosphorus-Doped Polysilicon Emitter Technology for Very High-Speed, Small Emitter Bipolar Transistors," IEEE Transactions on Electron Devices, pp. 889-897, vol. 43, No. 6, Jun. 1996, IEEE.

Seungheon Song et al.: "High Performance Transistors with State-of-the-Art CMOS Technologies," IEDM 99, pp. 427-430, 1999, IEEE.

Yoshihiro Takao et al. "Low-Power and High-Stability SRAM Technology Using a Laser-Recrystallized p-Channel SOI MOSFET," IEEE Transactions on Electron Devices, pp. 2147-2152, vol. 39, No. 9, Sep. 1992, IEEE.

Kenji Taniguchi et al.: "Process Modeling and Simulation: Boundary Conditions for Point Defect-Based Impurity Diffusion Model," IEEE Transactions on Computer-Aided Design , pp. 1177-1183, vol. 9, No. 11, Nov. 1990, IEEE.

Hongmei Wang et al.: "Submicron Super TFTs for 3-D VLSI Applications," IEEE Electron Device Letters, pp. 391-393, vol. 21, No. 9, Sep. 2000, IEEE.

Hongmei Wang et al.: "Submicron Super TFTs for 3-D VLSI Applications," IEEE Electron Device Letters, vol. 21, No. 9, pp. 439-441, Sep. 2000, IEEE.

Hongmei Wang et al.: "Super Thin-Film Transistor with SOI CMOS Performance Formed by a Novel Grain Enhancement Method," IEEE Transactions on Electron Devices, pp. 1580-1586, vol. 47, No. 8, Aug. 2000, IEEE.

Marvin H. White et al. "On the Go With Sonos," Circuit & Devices, pp. 22-31, Jul. 2000, IEEE.

B.J. Woo et al.: "A Novel Memory Cell Using Flash Array Contactless Eprom (Face) Technology," IEDM, pp. 90-93, 1990, IEEE.

Qi Xiang et al.: "Deep sub-100 nm CMOS with Ultra Low Gate Sheet Resista NiSi," VLSI Technology, 2000. Digest of Technical Paper Symposium on . . . pp. 76-77, IEEE Xplore, Jun. 13-15, 2000.

Qi Xiang et al.: "Deep sub-100nm CMOS with Ultra Low Gate Sheet Resistance by NiSi," IEEE, pp. 76-77, 2000, Symposium on VLSI Technology Digest of Technical Papers.

Qiuxia Xu et al.: "New Ti-SALICIDE Process Using Sb and Ge Preamorphization for Sub-0.2 µm CMOS Technology," IEEE Transactions on Electron Devices, pp. 2002-2009, vol. 45, No. 9, Sep. 1998, IEEE.

Kuniyoshi Yoshikawa et al.: "An Asymmetrical Lightly Doped Source Cell for Virtual Ground High-Density EPROM's," IEEE Transactions on Electron Devices, pp. 1046-1051, vol. 37, No. 4, Apr. 1990, IEEE.

John R. Lindsey et al.: "Polysilicon Thin Film Transistor and EEPROM Characteristics for Three Dimensional Memory," 198th Meeting of The Electrochemical Society, Meeting Abstracts, vol. 2000-2, Phoenix, Oct. 22-27, 2000.

Vivek Subramanian: "Control of Nucleation and Grain Growth in Solid-Phrase Crystallized Silicon for High-Performance Thin Film Transistors," A Dissertation submitted to the Department of Electrical Engineering and the Committee of Graduate Studies of Stanford University, 1998.

Brian Dipert: "Exotic Memories, Diverse Approaches," EDN Asia, Sep. 2000.

Dietmar Gogl et al.: "A 1-Kbit EEPROM in SIMOX Technology for High-Temperature Applications up to 250° C," IEEE Journal of Solid-State Circuits, Oct. 2000, vol. 35, No. 10, IEEE.

3D-ROM-A First Practical Step Towards 3D-IC by G. Zhang, Semiconductor International, Jul. 2000.

Chan et al. "Three Dimensional CMOS integrated Circuits on Large Grain Polysilicon Films" EEE, *Hong Kong University of Science and Technology* 2000 IEEE.

Abstract "Looking Diverse Storage", Electronic Engineering Times, Oct. 31, 1994, p. 44.

Abstract "Special Report: Memory Market Startups Cubic Memory: 3D Space Savers", Semiconductor Industry & Business Survey, vol. 16, No. 13, Sep. 12, 1994.

Abstract "Technique Boosts 3D Memory Density", Electronic Engineering Times, Aug. 29, 1994, p. 16.

Abstract "Memory Packs Poised 3D Use", Electronic Engineering Times, Dec. 7, 1992, p. 82.

Abstract "MCMs Hit the Road", Electronic Engineering Times, Jun. 15, 1992, p. 45.

Abstract "IEDM Ponders the 'Gigachip' Era", Electronic Engineering Times, Jan. 20, 1992, p. 33.

Abstract "Tech Watch: 1-Gbit DRAM in Sight", Electronic World News, Dec. 16, 1991, p. 20.

Abstract "MCMs Meld into Systems", Electronic Engineering Times, Jul. 22, 1991, p. 35.

Abstract "Systems EEs See Future In 3D", Electronic Engineering Times, Sep. 24, 1990, p. 37.

Makiniak David: "Vertical integration of Silicon Allows Packaging of Extremely Dense System Memory In Tiny Volumes: Memory-chip Stacks Send Density Skyward", Electronic Design, No. 17, Aug. 22, 1994, pp. 69-75, Cleveland Ohio.

Yamazaki K.: "Fabrication Technologies for Dual 4-KBIT Stacked SRAM", IEDM 16.8., 1986, pp. 435-438.

Pein Howard: "Performance of the 3-D PENCIL Flash EPROM Cell an Memory Array", IEEE Transactions on Electron Devices, vol. 42, No. 11, Nov. 1995, pp. 1982-1991.

Abstract Lomatch S.: "Multilayered Josephson Junction Logic and Memory Devices", Proceedings of the SPIE-The International Society for Optical Engineering vol. 2157, pp. 332-343.

Abstract LU N.C.C.: "Advanced Cell Structures for Dynamic RAMs", IEEE Circuits and Devices Magazine, vol. 5, No. 1, Jan. 1989, pp. 27-36.

Abstract Sakamato K.: "Architecture of Three Dimensional Devices", Journal: Bulletin of the Electrotechnical Laboratory, vol. 51, No. 1, 1987, pp. 16-29.
Abstract "Wide Application of Low-Cost Associative Processing Associative Processing Seen", Electronic Engineering Times, Aug. 26, 1996, p. 43.
Abstract "Interconnects & Packaging", Electronic Engineering Times, Nov. 27, 1995, p. 43.
Abstract "Closing in on Gigabit DRAMs", Electronic Engineering Times, Nov. 27, 1995, p. 35.
Abstract "Module Pact Pairs Cubic Memory with VisionTek", Semiconductor Industry & Business Survey, vol. 17, No. 15, Oct. 23, 1995.
Abstract "Layers of BST Materials Push Toward 1 Gbit DRAM", Electronics Times, Oct. 19, 1995.
Abstract "Technologies Will Pursue Higher DRAM Densities", Electronic News (1991), Dec. 4, 1994, p. 12.
Carter William H.: "National Science Foundation (NSF) Forum on Optical Science and Engineering", Proceedings SPIE—The International Society for Optical Engineering, vol. 2524, Jul 11-12, 1995, (Article by N. Joverst titled "Manufacturable Multi-Material Integration Compound Semi-conductor Devices Bonded to Silicon Circuity".
Hayashi Y.: "A New Three Dimensional IC Fabrication Technology, Stacking Thin Film Dual-CMOS Layers", IEDM, 1991, pp. 25.6.1-25.6.4.
Reber M.: "Benefits of Vertically Stacked Integrated Circuits for Sequential Logic", IEEE, 1996, pp. 121-124.
Stern Jon M.: Design and Evaluation of an Epoxy Three-dimensional Multichip Module, IEEE Transactions on Components, Packaging, and Manufacturing Technology—Part B, vol. 19, No. 1, Feb. 1996, pp. 188-194.
Bertin Claude L.: "Evaluation of a Three-dimensional Memory Cube System", IEEE Transactions on Components, Hybrids, and Manufacturing Technology, vol. 16, No. 8, Dec. 1993, pp. 1006-1011.
Watanabe Hidehiro: "Stacked Capacitor Cells for High-density Dynamic RAMs", IEDM, 1988, pp. 600-603.
Web Page: "Stacked Memory Modules", IBM Technical Disclosure Bulletin, vol. 38, No. 5, 1995.
Thakur Shashidhar: "An Optimal Layer Assignment Algorithm for Minimizing Crosstalk for Three VHV Channel Routing", IEDM, 1995, pp. 207-210.
Terril Rob: "3D Packaging Technology Overview and Mass Memory Applications", IEDM, 1996, pp. 347-355.
Inoue Y.: "A Three-Dimensional Static RAM", IEEE Electron Device Letters, vol. 7, No. 5, May 1986, pp. 327-329.
Reber M.: "Benefits of Vertically Stacked Integrated Circuits for Sequential Logic", IEDM, 1996, pp. 121-124.
Kurokawa Takakazu: "3-D VLSI Technology in Japan and an Example: A Syndrome Decoder for Double Error Correction", FGCS—Future, Generation, Computer, Systems, vol. 4, No. 2, 1988, pp. 145-155, Amsterdam, The Netherlands.
Abou-Samra S.J.: "3D CMOS SOI for High Performance Computing", Low Power Electronics and Design Proceedings, 1998.
Yamazaki K.: "4-Layer 3-D IC Technologies for Parallel Signal Processing", International Electron Devices Meeting Technical Digest, Dec. 9-12, 1990, pp. 25.5.1-25.5.4.
Schlaeppi H.P.: "nd Core Memories using Multiple Coincidence", IRE Transactions on Electronic Computers, Jun. 1960, pp. 192-196.
Schlaeppppi H.P.: "Session V: Information Storage Techniques", International Solid-State Circuits Conference, Feb. 11, 1960, pp. 54-55.
De Graaf C. et al.: "A Novel High-Density, Low-Cost Diode Programmable Read Only Memory," IEDM, beginning at p. 189.
Peter K. Najl et al.: "A 256kb 3.0V 1T1MTJ Nonvolatile Magnetoresistive RAM, " 2001 IEEE International Solid-State Circuits Conference, Digest of Technical Papers, ISSCC 2001/Session7/Technology Directions: Advanced Technologies/7.6, Feb. 6, 2001, pp. 122-123 (including enlargement of figures, totaling 9 pages), and associated Visual Supplement, pp. 94-95,4040-405 (enlargements of slides submitted, totaling 25 pages).
Kim C. Hardee et al.: "A Fault-Tolerant 30ns/375 mW 16K = 1 NMOS Static RAM, " IEEE Journal of Solid-State Circuits, Oct. 1981, Vol. SC-16, No. 5, pp. 435-443.
Toshio Wada et al.: "A 15-ns 1024-Bit Fully Static MOS RAM, " IEEE Journal of Solid-State Circuits, Oct. 1978, vol. SC-13, No. 5, pp. 635-639.
Camperi-Ginestet C: "Vertical Electrical Interconnection of Compound Semiconductor Thin-Film Devices to Underlying Silicon Circuitry", IEEE Photonics Technology Letters, vol. 4, No. 9, Sep. 1992, pp. 1003-1006.
Akasaka Yoichi: Three-dimensional Integrated Circuit: Technology and Application Prospect, Microelectronics Journal, vol. 20, No.s 1-2, 1989, pp. 105-112.
Sakamoto Koji: "Architecture des Circuits a Trois Dimension (Architecture of Three Dimensional Devices)", Bulletin of the Electrotechnical Laboratory, ISSN 0366-9092, vol. 51, No. 1, 1987, pp. 16-29.
Akasaka Yoichi: "Three-dimensional IC Trends", Proceedings of the IEEE, vol. 74, No. 12, 1986, pp. 1703-1714.
Hongmei Wang et al.: "Submicron Super TFTs for 3-D VLSI Applications," IEEE Electron Device Letters, Sep. 2000, pp. 439-441, vol. 21, No. 9, IEEE.
K.W. Lee et al.: "Three Dimensional Shared Memory Fabricated Using Wafer Stacking Technology," 2000, IEEE.
John R. Lindsey et al.: "Polysilicon Thin Film Transistor for Three Dimensional Memory," Electrochemical Society Meeting 198th, Oct. 2000, Phoenix, AZ.
Seiichi Aritome: "Advanced Flash Memory Technology and Trends for File Storage Application," IEEE, 2000.
Toshiaki Yamanaka et al.: "Advanced TFT SRAM Cell Technology Using a Phase-Shift Lithography," IEEE Transactions on Electron Devices, Jul. 1995, pp. 1305-1313, vol. 42, No. 7, IEEE.
Sung-Hoi Hur et al.: "A Poly-Si Thin-Film Transistor EEPROM Cell with a Folded Floating Gate," IEEE Transactions on Electron Devices, Feb. 1999, pp. 436-438, vol. 46, No. 2, IEEE.
Jung-Dal Choi et al.: "A 0.15 $\mu$m NAND Flash Technology with 0.11 $\mu$m$^2$ Cell Size for 1 Gbit Flash Memory." IEEE, 2000.
H. Shirai et al.: "A 0.54 $\mu$m$^2$ Self-Aligned, HSG Floating Gate Cell (SAHF Cell) for 256Mbit Flash Memories," IEEE, 1995, pp. 653-656.
Takuya Kitamura et al.: "A Low Voltage Operating Flash Memory Cell with High Coupling Ratio Using Horned Floating Gate with Fine HSG," IEEE, 1998, pp. 104-105.
Ken Takeuchi et al.: "A Duel-Page Programming Scheme for High-Speed Multigigabit-Scale NAND Flash Memories," IEEE Journal of Solid-State Circuits, May. 2001, pp. 744-751, vol. 36, No. 5, IEEE.

C. Hayzelden et al.: "Silicide Formation and Silicide-Mediated Crystallization of Nickel-Implanted Amorphous Silicon Thin Films," J. Appl. Phys., Jun. 15, 1993, pp. 8279-8289, 73 (12), 1993 American Institute of Physics.

David Burnett et al.: "An Advanced Flash Memory Technology on SOI," 1998, pp. 983-986, IEEE.

A. Chatterjee et al.: "Sub-100nm Gate Length Metal Gate NMOS Transistors Fabricated by a Replacement Gate Process," 1997, pp. 821-824, IEEE.

A. Chatterjee et al.: "CMOS Metal Replacement Gate Transistors Using Tantalum Pentoxide Gate Insulator," 1998, pp. 777-780, IEEE.

David K. Y. Liu et al.: "Scaled Dielectric Antifuse Structure for Field-Programmable Gate Array Application," IEEE Electron Device Letters, Apr. 1991, pp. 151-153, vol. 12, No. 4, IEEE.

Singh Jagar et al.: "Characterization of MOSFET's Fabricated on Large-Grain Polysilicon on Insulator," Solid-State Electronics 45, 2001, pp. 743-749, Elsevier Science Ltd.

Zhonghe Jin et al.: "The Effects of Extended Heat Treatment on Ni Induced Lateral Crystallization of Amorphous Silicon Thin Films," IEEE Transactions on Electron Devices, vol. 46, No. 1, Jan. 1999, pp. 78-82, IEEE.

A. Sato. et al. "A 0.5-$\mu$m EEPROM Cell Using Poly-Si TFT Technology," IEEE Transactions on Electron Devices, vol. 40, No. 11, Nov. 1993, p. 2126.

Vivek Subramanian et al.: "High-Performance Germanium-Seeded Laterally Crystallized TFT's for Vertical Device Integration," IEEE Transactions on Electron Devices, vol. 45, No. 9, Sep. 1998, pp. 1934-1939, IEEE.

Vivek Subramanian et al.: "Low-Leakage Germanium-Seeded Laterally-Crystallized Single-Grain 100-nm TFT's for Vertical Integration Applications," IEEE Electron Devices Letters, vol. 20, No. 7, Jul. 1999, pp. 341-343, IEEE.

K.S. Kim et al.: "A Novel Duel String NOR (DuSNOR) Memory Cell Technology Scalable to the 256 Mbit and 1 Gbit Flash Memories," IEDM, 1995, pp. 263-266, IEEE.

Boaz Eitan et al.: "NROM: A Novel Locallzed Trapping, 2-Bit Nonvolatile Memory Cell," IEEE Electron Device Letters, vol. 21, No. 11, Nov. 2000, pp. 543-545, IEEE.

Marvin H. White et al.: "A Low Voltage SONOS Nonvolatile Semiconductor Memory Technology," IEEE Transactions on Components, Packaging, and Manufacturing Technology, Part A., vol. 20, No. 2, Jun. 1997, pp. 190-195, IEEE.

Min-Hwa Chi et al.: "Programming and Erase with Floating-Body for High Density Low Voltage Flash EEPROM Fabricated on SOI Wafers," Proceedings 1995 IEEE International SOI Conference, Oct. 1995, pp. 129-130.

S. Koyama: "A Novel CEll Structure for Giga-bit EPROMs and Flash Memories Using Polysilicon Thin Film Tansistors," Symposium on VLSI Technology Digest of Technical Papers, 1992, pp. 44-45, IEEE.

"3D Chip-On-Chip Stacking," Semiconductor International, Dec. 1991.

Richard W. Lay: "TRW Develops Wireless Multiboard Interconnect System," Electronic Engineering Times, Nov. 5, 1984.

* cited by examiner

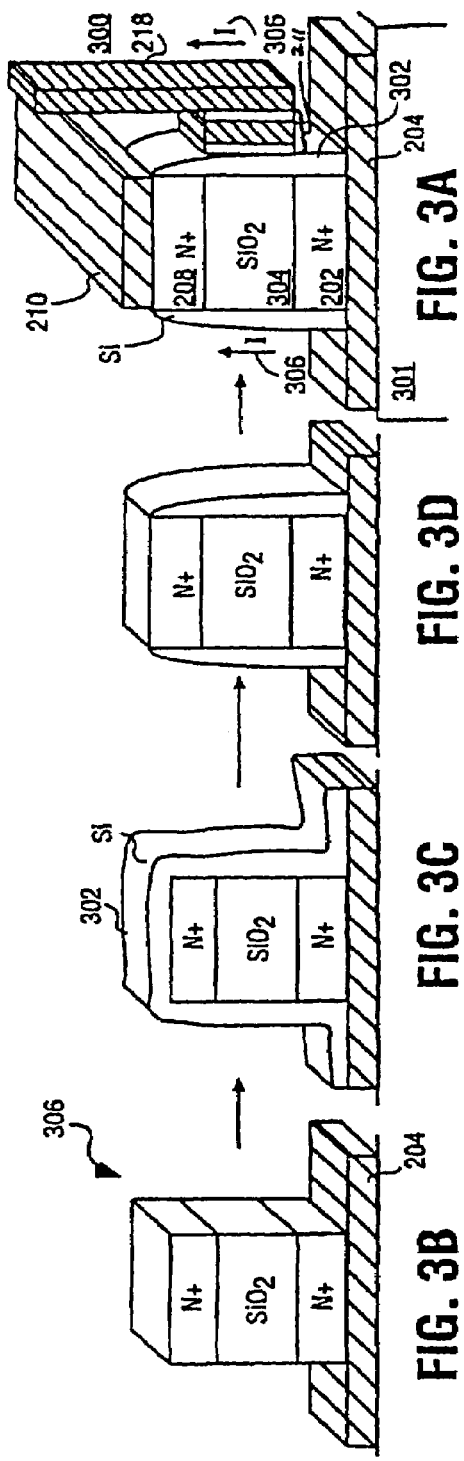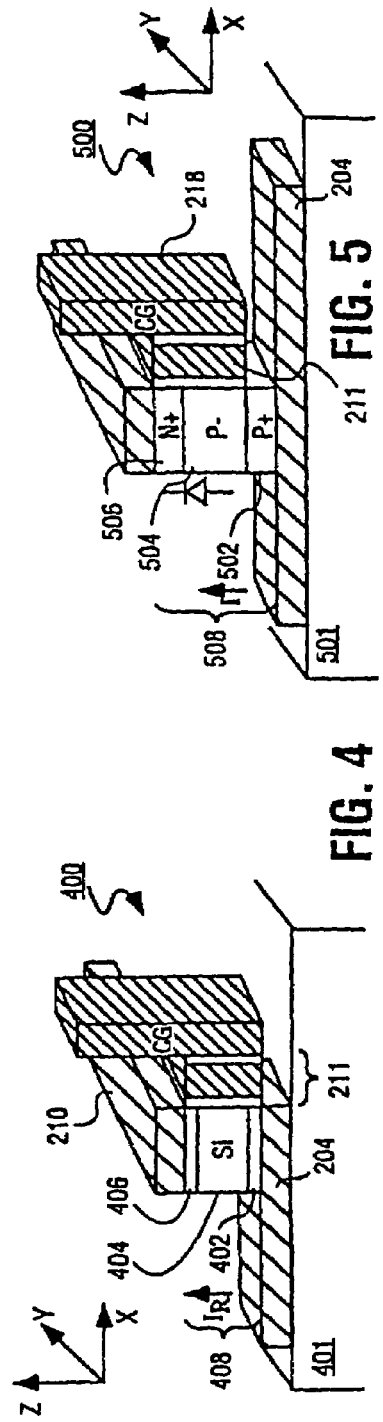

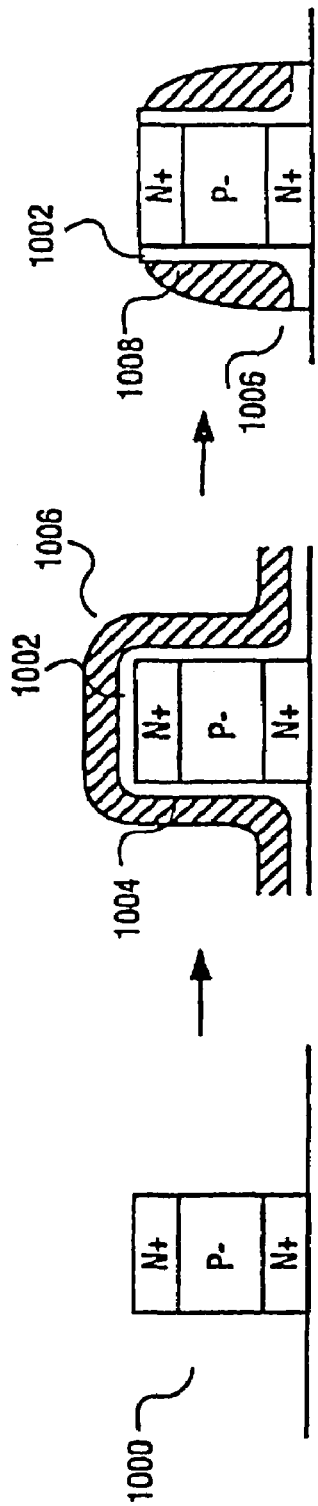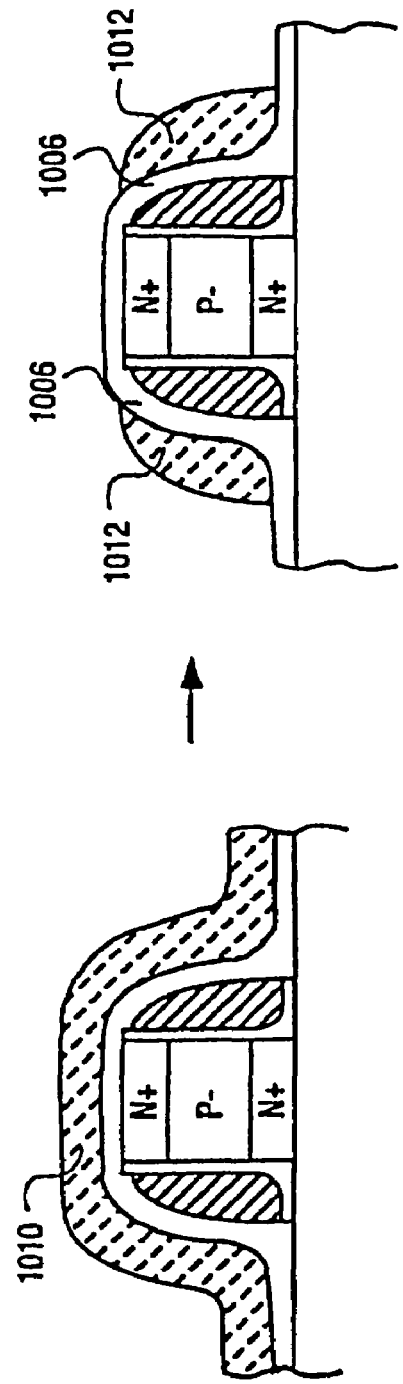

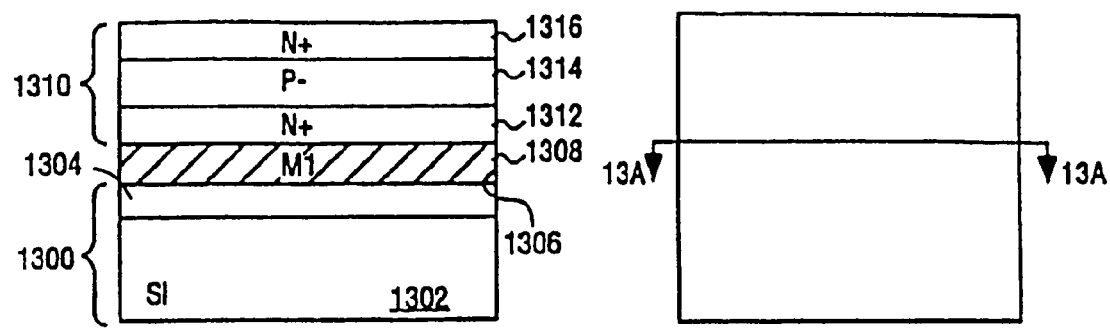
FIG. 13A  FIG. 13B
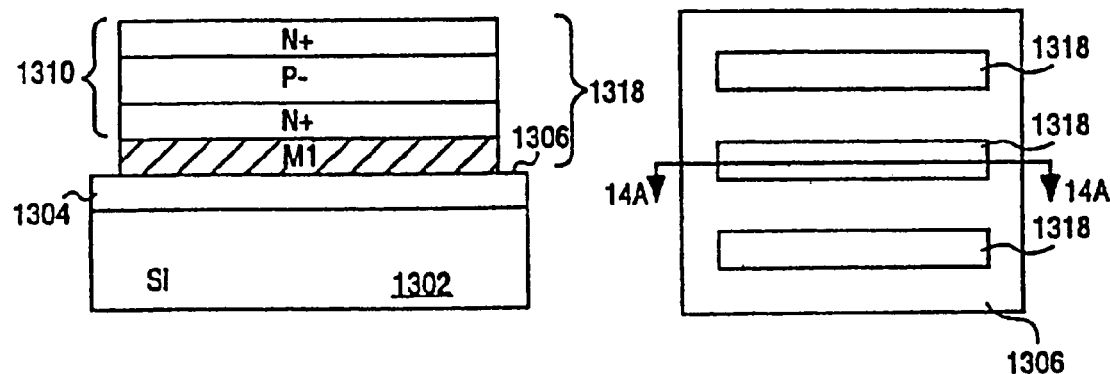
FIG. 14A  FIG. 14B

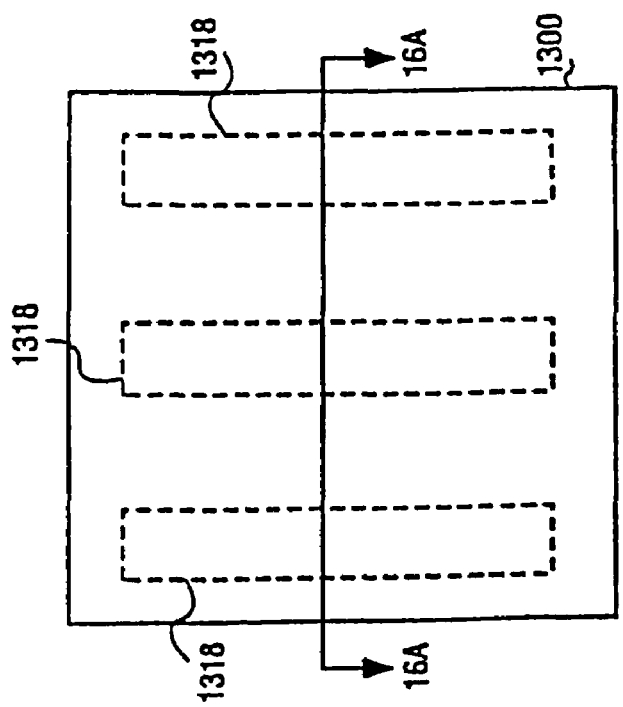
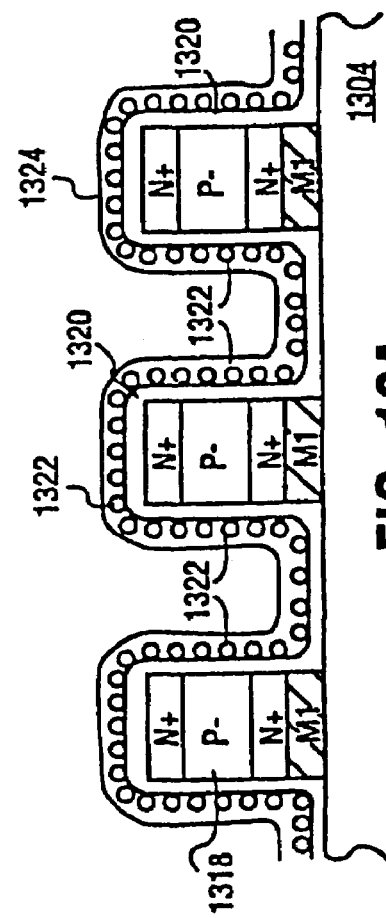
FIG. 16B
FIG. 16A

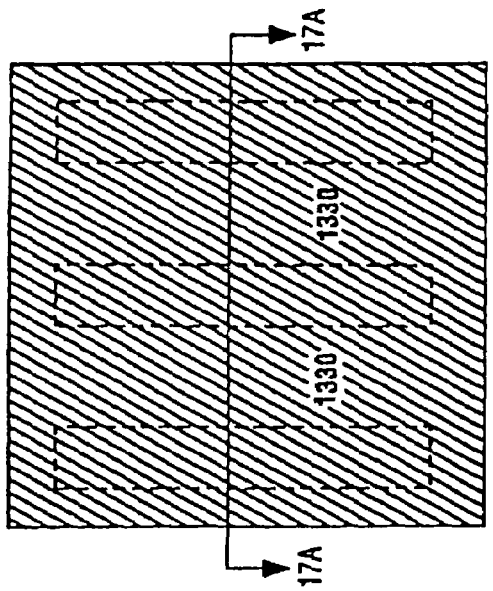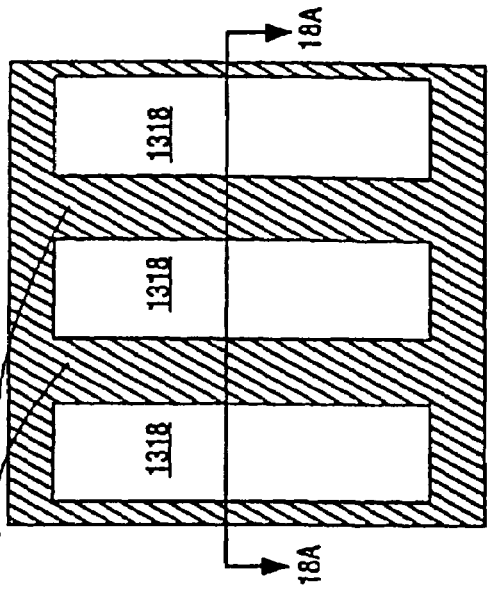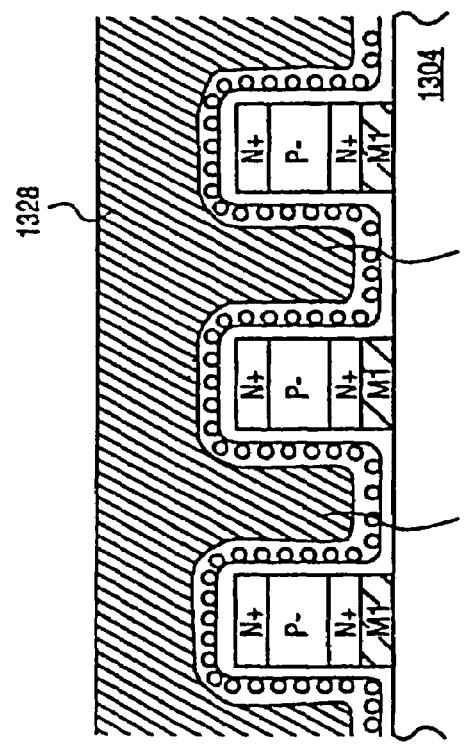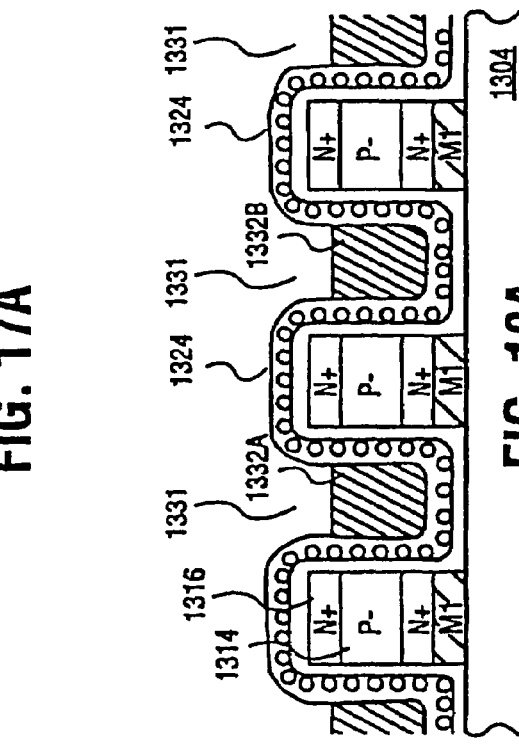

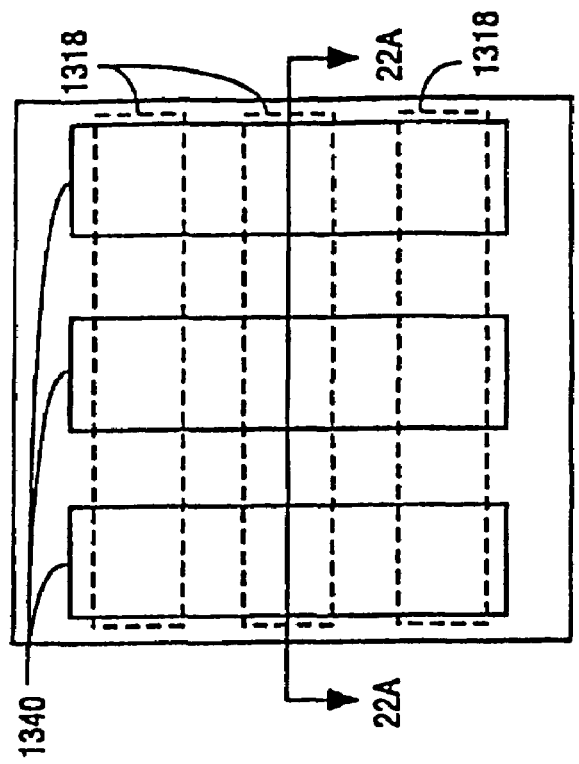
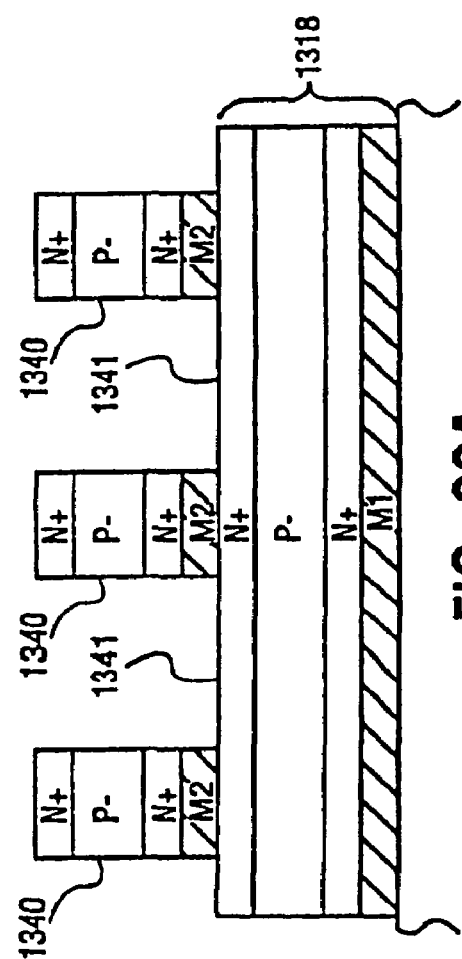
FIG. 22B
FIG. 22A

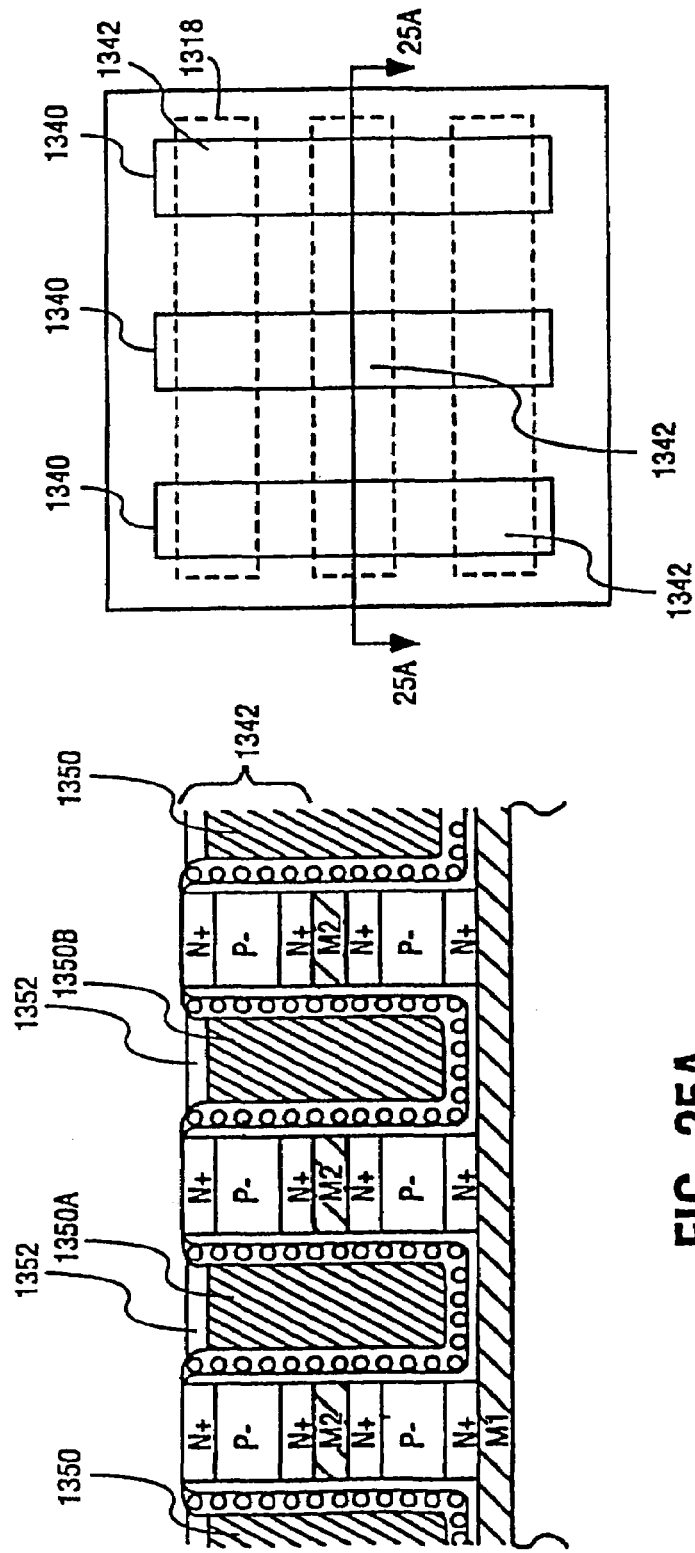
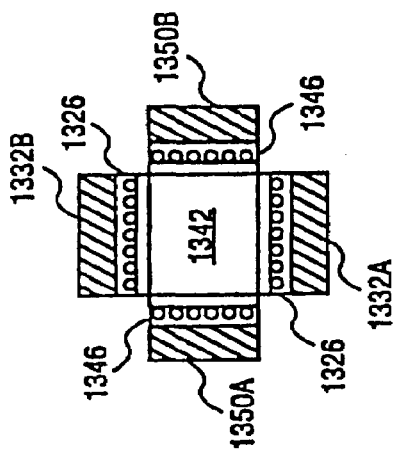
FIG. 25B
FIG. 25A
FIG. 26

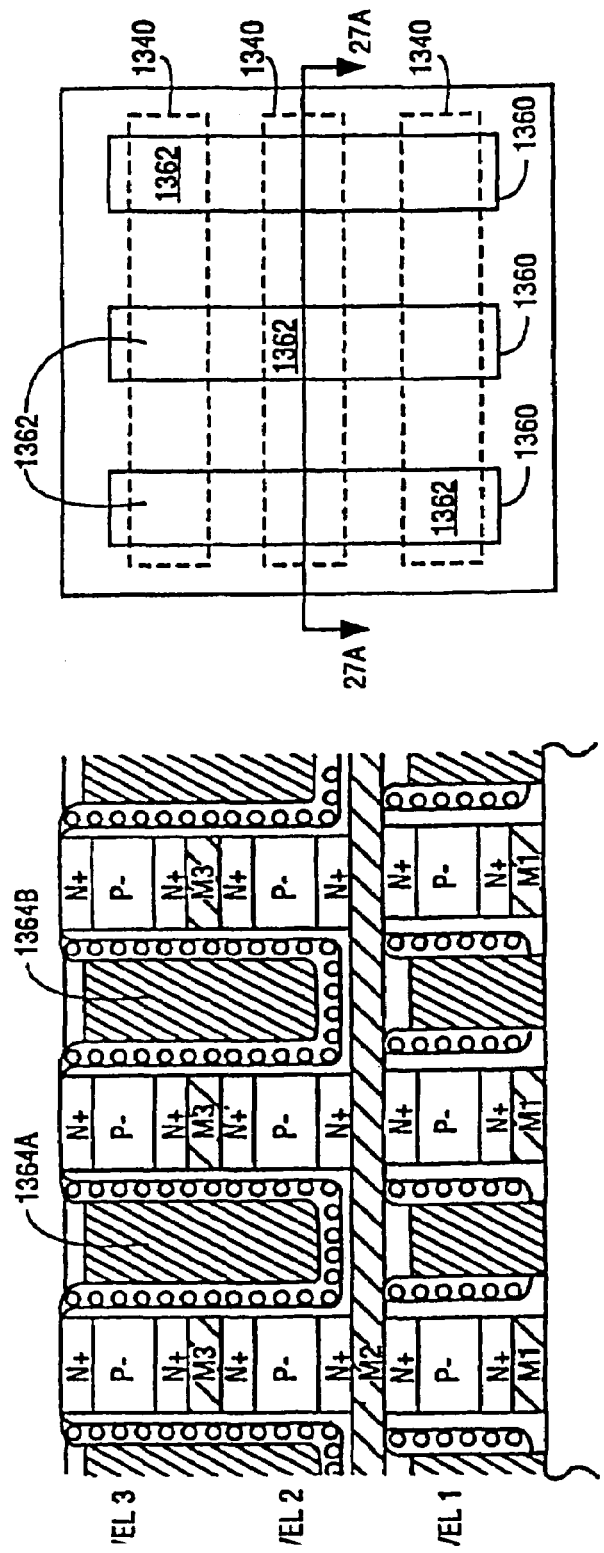
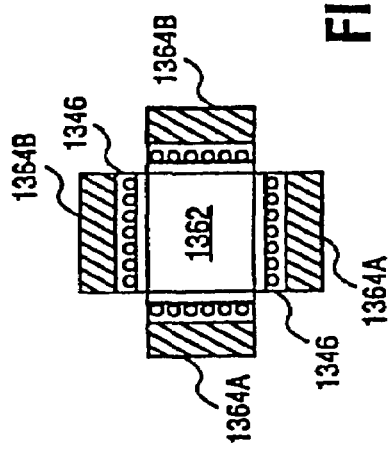
FIG. 27B
FIG. 27A
FIG. 28

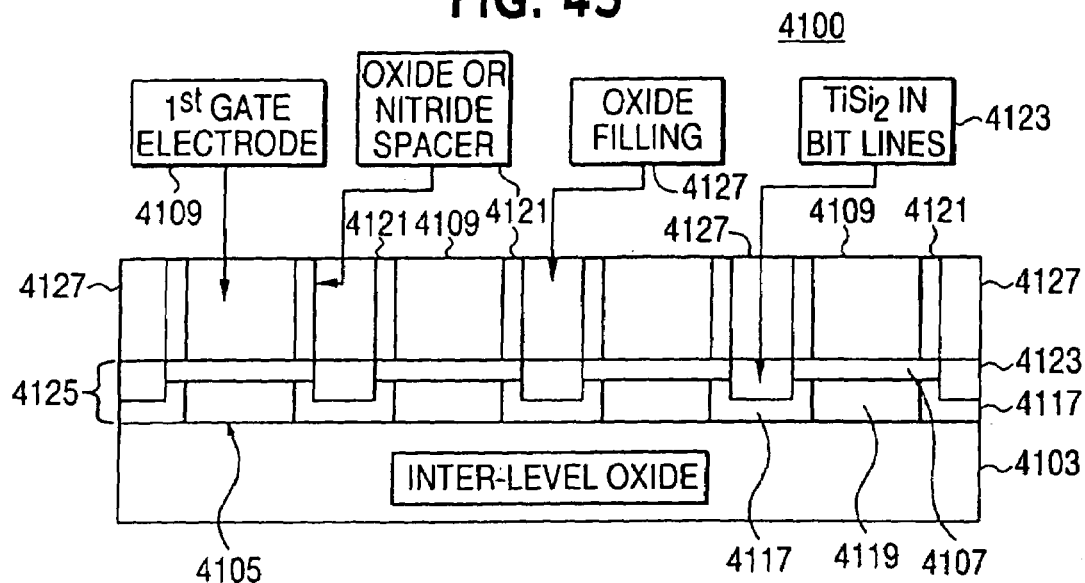
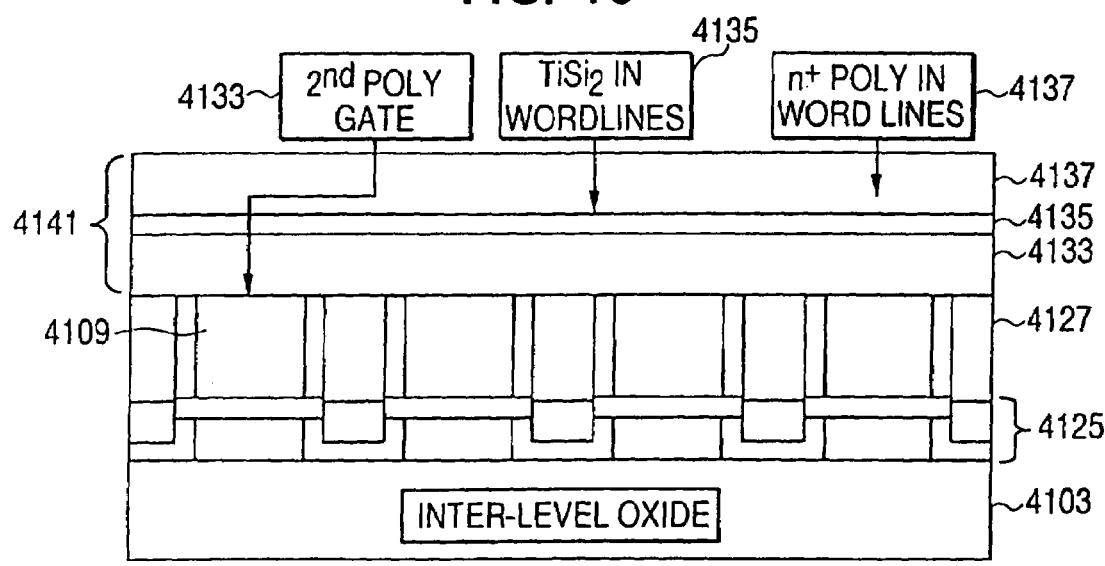

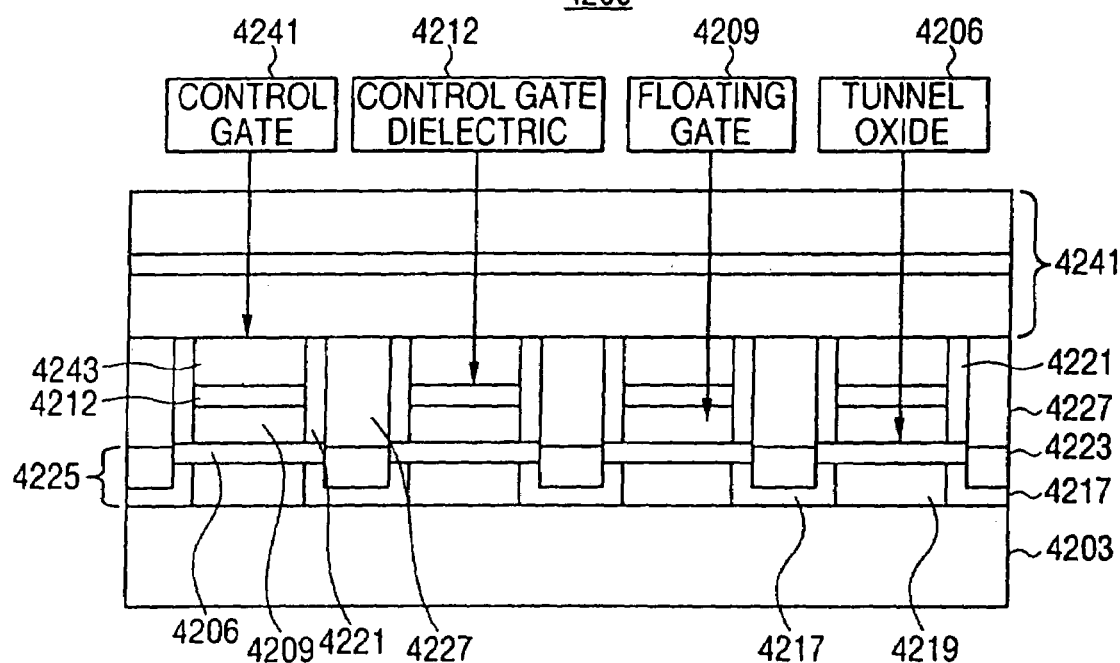

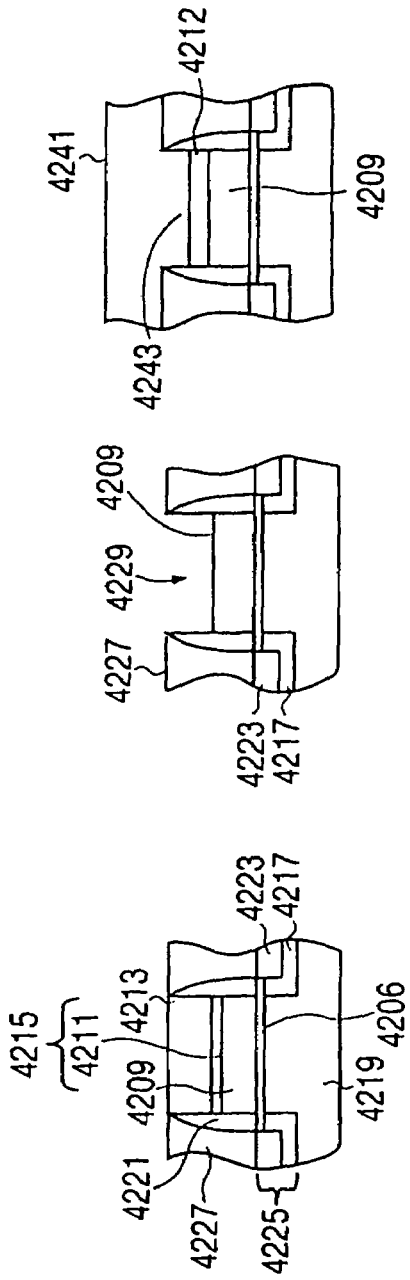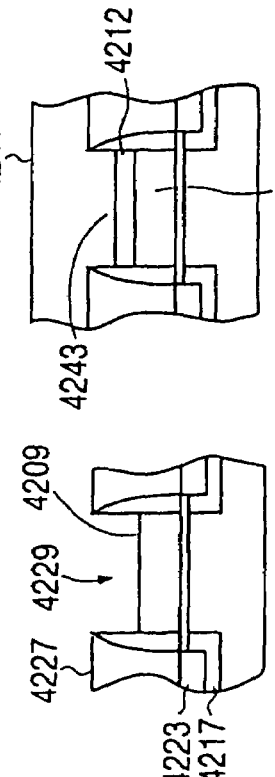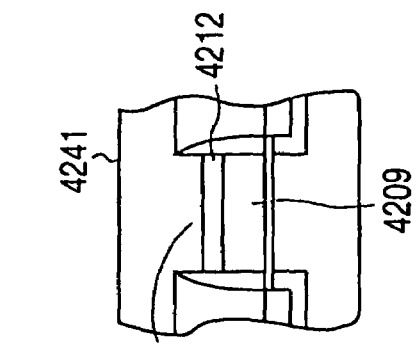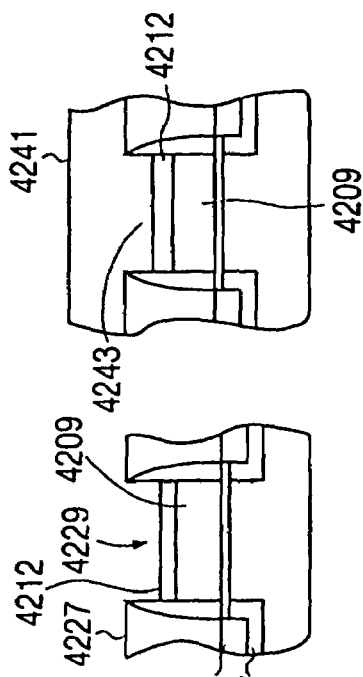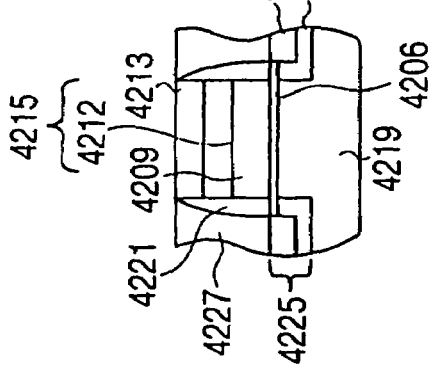

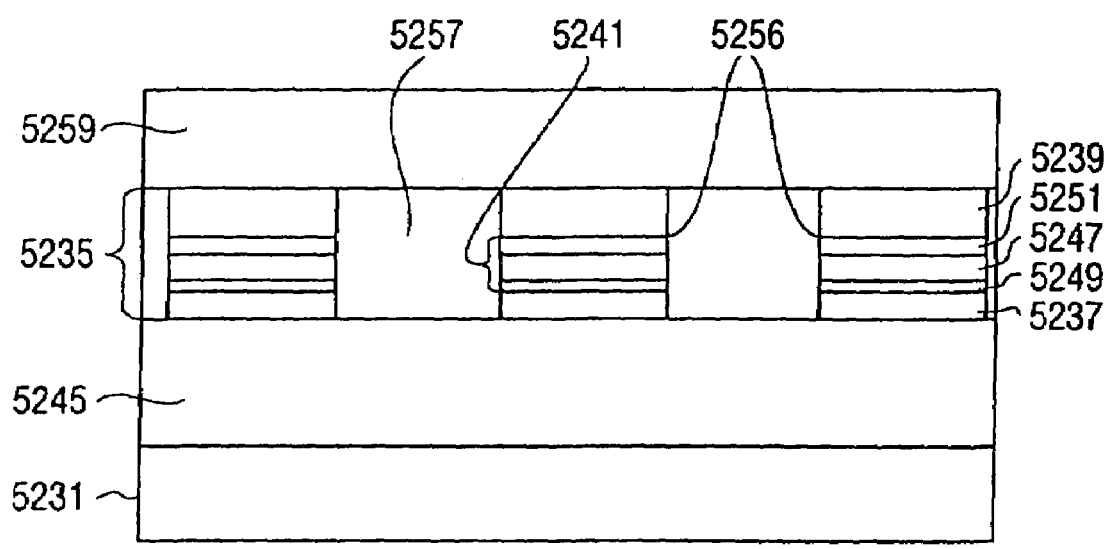

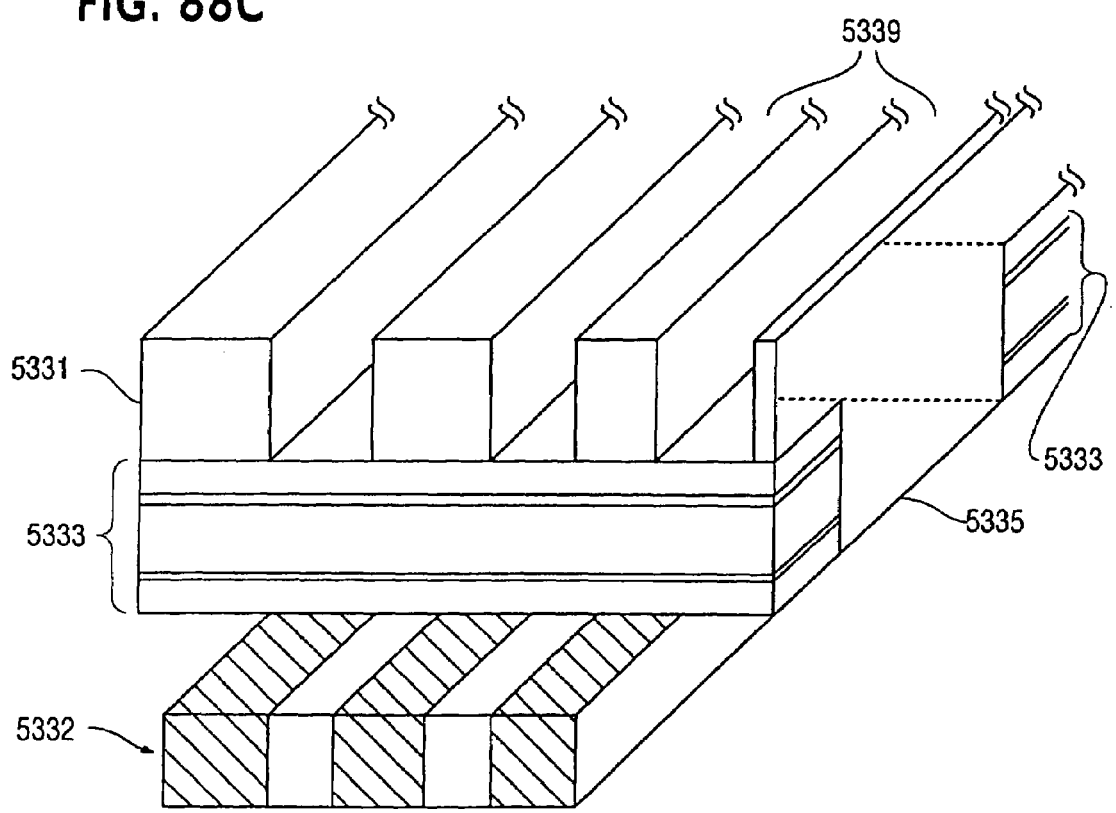

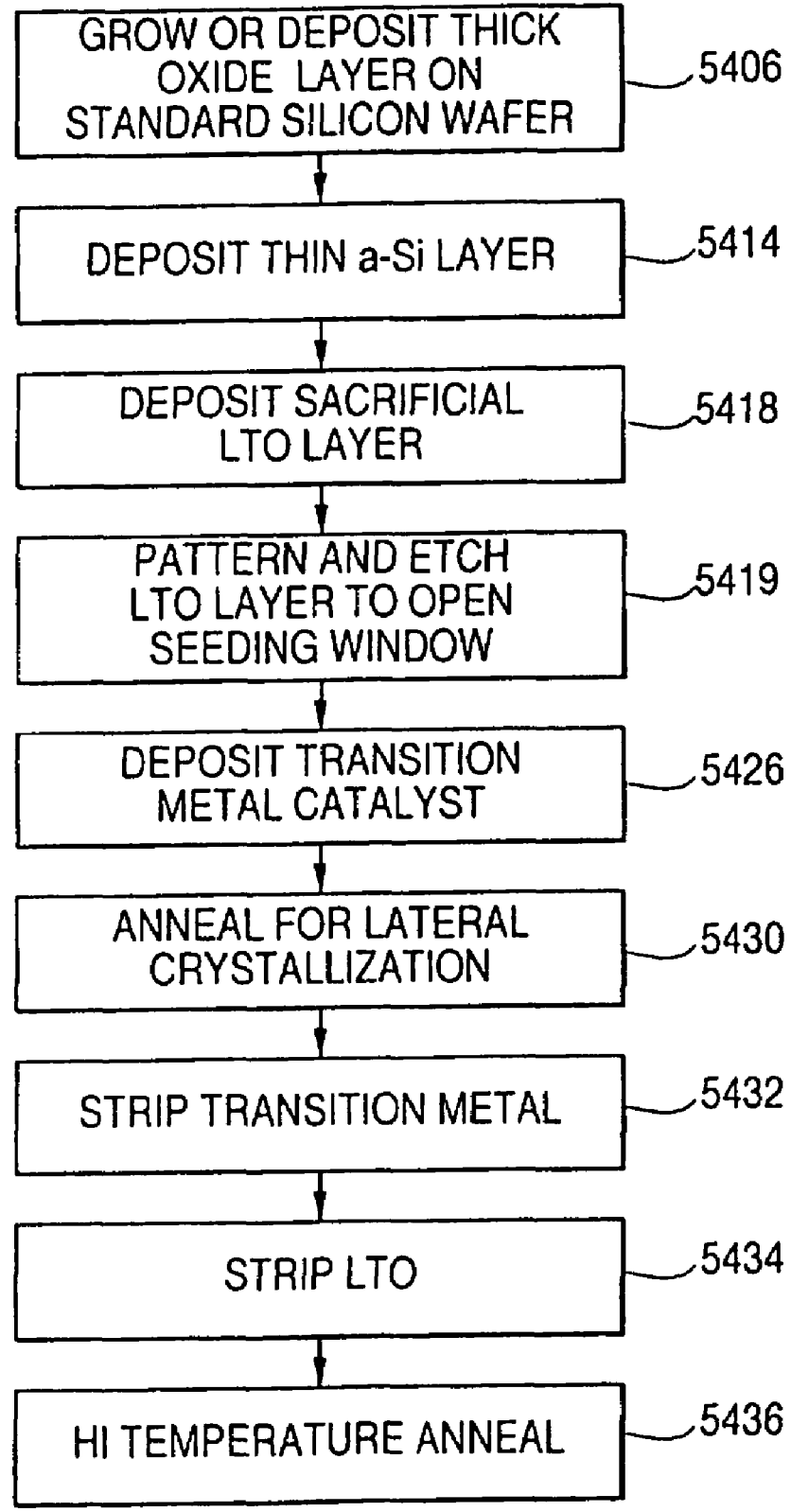

RAIL STACK ARRAY OF CHARGE STORAGE DEVICES AND METHOD OF MAKING SAME

This application is a continuation of U.S. application Ser. No. 09/927,648 filed on Aug. 13, 2001, now U.S. Pat. No. 6,881,994, which is incorporated by reference in its entirety. This application is a continuation-in-part of U.S. application Ser. No. 09/801,233, filed on Mar. 6, 2001 ABN, which is a continuation-in-part of U.S. application Ser. No. 09/745,125, filed on Dec. 21, 2000 ABN, both of which are incorporated by reference in their entirety. This application is also a continuation-in-part of U.S. application Ser. No. 09/639,579 filed on Aug. 14, 2000 ABN, which is incorporated by reference in its entirety. This application is also a continuation-in-part of U.S. application Ser. No. 09/639,702 filed on Aug. 14, 2000 ABN, which is incorporated by reference in its entirety. This application is also a continuation-in-part of U.S. application Ser. No. 09/639,749 filed on Aug. 17, 2000 ABN, which is incorporated by reference in its entirety. This application also claims benefit of priority of provisional application 60/279,855 filed on Mar. 28, 2001, which is incorporated by reference in its entirety.

BACKGROUND OF THE INVENTION

1. Field of the Invention

The present invention relates to semiconductor devices in general and to a three dimensional TFT array in particular.

2. Discussion of Related Art

As integrated circuits and computers have become powerful, new applications have arisen that require the ability to store large amounts of data. Certain applications require a memory with the ability to write and erase data and the ability to store data in a nonvolatile manner. There are many applications which can be enabled by bringing the price per megabyte of semiconductor memory down well below a dollar (US) per megabyte so that it becomes price competitive with, for example: (1) chemical film for the storage of photographic images; (2) Compact Disks (CDs) for the storage of music and textual data for distribution; (3) Digital Versatile Disks (DVDs) for the storage of video and multimedia materials for distribution; and (4) Video Tape and Digital Audio and Video Tape for the storage of consumer audio and video recordings. Such memories should be archival and non-volatile in that they should be able to withstand being removed from equipment and all sources of power for a period of up to about 10 years with no significant degradation of the information stored in them. Such a requirement approximates the typical longevity for CDs, DVDs, magnetic tape and most forms of photographic film.

Presently, such memories are formed with electrically erasable nonvolatile memories such as flash memories and EEPROMs. Unfortunately, these devices are typically fabricated in a single crystalline silicon substrate and therefore are limited to two-dimensional arrays of storage devices, thereby limiting the amount of data that can be stored to the number of devices that can be fabricated in a single plane of silicon.

It has also been known to fabricate nonvolatile memories that employed trapped charge in a dielectric layer. Typically, electrons are trapped in a layer of silicon nitride by, for instance, tunneling a current through the nitride layer. The silicon nitride is formed between a gate insulated from the channel of a field-effect transistor. The trapped charge shifts the threshold voltage of the transistor and thus, the threshold voltage is sensed to determine whether or not charge is trapped in the nitride layer. See U.S. Pat. No. 5,768,192 for an example of such memories.

U.S. Pat. No. 5,768,192, issued to B. Eitan, and the technical article entitled "NROM: A Novel Localized Trapping, 2-Bit Nonvolatile Memory Cell" by B. Eitan et al. in *IEEE Electron Device Letters*, vol. 21, No. 11, November 2000, pp. 543–545 teach a nonvolatile semiconductor memory cell which uses asymmetrical charge trapping in the nitride charge storage layer of the Oxide-Nitride-Oxide (ONO) stack to store two bits in one cell. The cell is written by hot electron injection into the charge storage layer above the drain junction. The cell is read in the opposite direction to which it was written, i.e., voltages are applied to the source and gate, with the drain grounded. The memory cell is constructed in a p-type silicon substrate. However, this silicon-oxide-nitride-oxide-silicon (SONOS) 1TC memory is arranged in an NOR Virtual Ground Array with a cell area of $2.5F^2$ per bit, where F is the minimum feature size. This cell area is larger than desirable, and leads to a less than optimum cell density.

Prior art negative-resistance devices are also known. These devices were discovered around 1972 and are described in Thin-MIS-Structure Si Negative-Resistance Diode, *Applied Physics Letters*, Volume 20, No. 8, beginning on page 269, 15 Apr. 1972. The device described in the article is a junction diode, such as diode 5510 of FIG. 96 and a thin oxide region disposed on the n-type region of the diode, such as the oxide region 5511 of FIG. 96. The device provides a switching phenomenon exhibiting a negative-resistance region as shown in FIG. 97. Note as the potential on the diode is increased in the diode's forward direction, little conduction occurs until the voltage first reaches the voltage shown as point 5512 at which point the device exhibits a negative-resistance. From there the device exhibits a somewhat diode-like characteristic as shown by the segment 5513 in FIG. 97. This switching characteristic is used to fabricate static memory cells (flip-flops) such as shown in U.S. Pat. Nos. 5,535,156 and 6,015,738. Additionally, the basic operation of this device is described in Sze's, *The Physics of Semiconductor Devices*, ($2^{nd}$ edition, Chapter 9.5, pp. 549–553), although this explanation may contain an error in its discussion in polarity.

The device of FIG. 96 comprises a PN junction diode and a thin oxide region. When the diode is forward biased, initially very little current flows because the diode junction voltage is a fraction of the applied voltage, with the balance of the voltage drop across the n– region and oxide region. Holes injected into the n– region from the p region are sufficiently low in number that the tunneling current through the oxide (despite the unfavorable barrier to the hole flow) allows the n– region to remain an n-type region. Similarly, any holes generated within the depletion region are able to pass through the thin oxide while any generated electrons are swept across to the p region and out of the anode contact.

As the applied forward voltage increases, the n– region begins to deplete at the interface with the oxide just as in a normal MOSFET as the threshold voltage is approached. At a high enough voltage, this depletion region extends all the way to the junction to produce punch-through, resulting in a significant injection of holes from the p region into the n– layer. The holes cannot flow well through the oxide and consequently build up near the surface. This causes the n-region to invert more strongly near the oxide interface, and increasing the voltage drop across the oxide, recalling that V=Q/C. The electron tunneling current through the oxide rises by a super-exponential factor, increasing the forward bias across the diode and the current. At the same time holes flood the n− region, raising its conductivity and reducing its voltage drop. Since the voltage across the diode is relatively small (and changes little, even for large changes in current) a large reduction in the n− voltage drop reduces the voltage across the entire structure dramatically (assuming a suitable series resistance in the circuit to avoid device rupture). Thus, the regenerative action of the foregoing description causes a rapid increase in current, accompanied by a rapid decrease in voltage. It is this negative-resistance region that has been exploited to make the SRAM cells described in the above referenced patents.

At higher current levels, the device behaves essentially as an ordinary forward biased diode as most of the voltage is ultimately dropped across the PN junction. Overall, the V-I characteristics of the structure are shown in FIG. 97 with the slope of the segment 5513 being determined in large part by the series resistance coupled to the structure of FIG. 96.

When reverse biased, the diode is in its blocking state and the only current that flows through the oxide is electron leakage current. The reverse junction voltage is a fraction of the applied voltage because some is dropped across the oxide region. It should be noted that electrons carry current through the oxide region in both reverse bias and in a strong forward bias.

Another type of prior art memory device is disclosed in the technical article entitled "A Novel Cell Structure for Giga-bit EPROMs and Flash Memories Using Polysilicon Thin Film Transistors" by S. Koyama in 1992*Symposium on VLSI Technology Digest of Technical Papers*, pp. 44–45. As shown in FIG. 98, each memory cell is a "self-aligned" floating gate cell and contains a polycrystalline silicon thin film transistor electrically erasable programmable read only memory (TFT EEPROM) over an insulating layer. In this device, the bit lines extend in the direction parallel to the source-channel-drain direction (i.e., the bit lines extend parallel to the charge carrier flow direction). The word lines extend in the direction perpendicular to the source-channel-drain direction (i.e., the word lines extend perpendicular to the charge carrier flow direction). The TFT EEPROMs do not contain a separate control gate. Instead, the word line acts as a control gate in regions where it overlies the floating gates.

The layout of Koyama requires two polycide contact pads to be formed to contact the source and drain regions of each TFT. The bit lines are formed above the word lines and contact the contact pads through contact vias in an interlayer insulating layer which separates the bits lines from the word lines. Therefore, each cell in this layout is not fully self-aligned, because the contact pads and the contact vias are each patterned using a non-self aligned photolithography step. Therefore, each memory cell has an area that is larger than desirable, and leads to a less than optimum cell density. The memory cell of Koyama is also complex to fabricate because it requires the formation of contact pads and bit line contact vias. Furthermore, the manufacturability of the device of Koyama is less than optimum because both bit lines and word lines have a non-planar top surface due to the non-planar underlying topography. This may lead to open circuits in the bit and word lines.

The Virtual Ground Array approach to crystalline silicon non-volatile memories has also been known for some time and is an elegant way of aggressively reducing memory cell size. Turning now to FIG. 99, the basic approach utilizes a cross point array 5610 of bitlines in buried n+ diffusion 5612 within a single crystalline silicon p-type substrate 5614 and wordlines formed of polysilicon rails 5616 disposed over the substrate 5614. A transistor is formed from adjacent bitlines 5612 and a p− type channel region 5618 disposed between the adjacent bitlines 5612. A layer of gate oxide 5620 insulates the floating gates 5622, which lie above the channels 5618 and are formed of, for example, polysilicon. An upper dielectric layer 5624 insulates the floating gates 5622 from polysilicon wordlines (WLs) 5616.

"Virtual Ground" refers to the fact that there is no dedicated ground line in the array. Whenever a cell is chosen for read or program, a pair of buried n+ bitlines (BLs) is the source and drain with the source grounded. For example, to select the cell 5624 outlined in FIG. 100, BL(k) and BL(k+1) would be selected as the source and drain (or vice versa) and WL(j) would be selected as the control gate of the device. In one approach, all of the bit lines to the left of BL(k) as shown in FIG. 100 would be held at the same potential as BL(k) and all of the bit lines to the right of BL(k+1) would be held at the same potential as BL(k+1) so that source-drain current would only flow (for read and programming) in the selected cell (all other WLs being grounded).

In all of these approaches, the charge storage medium is a conducting floating gate made of doped polysilicon. By hot electron injection programming (the method of choice in all classic EPROM (erasable programmable read only memory) and single transistor Flash memory cells), electrons are injected onto the floating gate thus changing the threshold voltage of the inherent MOS transistor.

The above discussed SONOS (polysilicon-blocking oxide-nitride-tunnel oxide-silicon) charge trapping approach has reemerged as a viable candidate for non-volatile MTP memories arranged in a virtual ground array structure 5626, as shown in FIG. 101. The array includes n+ buried bitlines 5612 disposed in a single crystalline silicon substrate 5614. An ONO (oxide-nitride-oxide) dielectric stack 5628 insulates bitlines 5612 from polysilicon wordline 5630. The hot electrons are injected into the ONO dielectric stack 5628 near the drain edge during programming where charge is trapped in the nitride layer. Two bits can be stored per memory cell utilizing this approach because hot electrons are injected into the ONO dielectric stack at the programming drain edge. Since the nitride charge storage medium does not laterally conduct, the charge stays where it was injected. Trapped charge near the source of a transistor has a large effect on the transistor's threshold voltage while trapped charge near the drain has little effect on threshold voltage. Accordingly, individual charge zones on either side of the ONO layer may be written and read by simply reversing the drain and source connections for the cell. When the cell is programmed, charge is injected at the zone closest to the drain. If source and drain are reversed for the same cell, another charge may be injected into the same cell but at the "other" drain. Both sides can also be read, thus two bits per cell may be stored and retrieved.

The above described prior art devices are relatively expensive because their density is not optimized.

SUMMARY OF THE INVENTION

According to one preferred embodiment of the present invention, a semiconductor device comprises a monolithic three dimensional array of charge storage devices comprising a plurality of device levels, wherein at least one surface between two successive device levels is planarized by chemical mechanical polishing.

In another preferred embodiment of the present invention, a monolithic three dimensional array of charge storage devices is formed in an amorphous or polycrystalline semiconductor layer over a monocrystalline semiconductor substrate, and driver circuitry is formed in the substrate at least in part under the array, within the array or above the array.

Another preferred embodiment of the present invention provides a memory device comprising a first input/output conductor formed above or on a first plane of a substrate. The memory device also includes a second input/output conductor. A semiconductor region is located between the first input/output conductor and the second input/output conductor at an intersection of their projections. The memory device includes a charge storage medium wherein charge stored in the charge storage medium affects the amount of current that flows between the first input/output conductor and the second input/output conductor.

Another preferred embodiment of the present invention provides a nonvolatile read-write memory cell having an N doped region, a P doped region, and a storage element disposed between the two.

Another preferred embodiment of the present invention provides a method for operating a memory cell. The method comprises the steps of trapping charge in a region to program the cell, and passing current through the region when reading data from the cell.

Another preferred embodiment of the present invention provides an array of memory cells, said array having a plurality of memory cells each comprising at least one semiconductor region and a storage means for trapping charge. The array also has control means for controlling the flow of current through the semiconductor region and the storage means of the cells.

Another preferred embodiment of the present invention provides a nonvolatile stackable pillar memory device and its method of fabrication. The memory device includes a substrate having a first plane. A first contact is formed on or above the plane of a substrate. A body is formed on the first contact. A second contact is formed on the body wherein the second contact is at least partially aligned over the first contact. A control gate is formed adjacent to the charge storage medium. A read current flows between the first contact and the second contact in a direction perpendicular to the plane of the substrate.

Another preferred embodiment of the present invention provides a field effect transistor, comprising a source, a drain, a channel, a gate, at least one insulating layer between the gate and the channel, and a gate line which extends substantially parallel to a source-channel-drain direction and which contacts the gate and is self aligned to the gate.

Another preferred embodiment of the present invention provides a three dimensional nonvolatile memory array, comprising a plurality of vertically separated device levels, each level comprising an array of TFT EEPROMs, each TFT EEPROM comprising a channel, source and drain regions, and a charge storage region adjacent to the channel, a plurality of bit line columns in each device level, each bit line contacting the source or the drain regions of the TFT EEPROMs, a plurality of word line rows in each device level, and at least one interlayer insulating layer located between the device levels.

Another preferred embodiment of the present invention provides an EEPROM comprising a channel, a source, a drain, a tunneling dielectric located above the channel, a floating gate located above the tunneling dielectric, sidewall spacers located adjacent to the floating gate sidewalls, a word line located above the floating gate, and a control gate dielectric located between the control gate and the floating gate. The control gate dielectric is located above the sidewall spacers.

Another preferred embodiment of the present invention provides an array of nonvolatile memory cells, wherein each memory cell comprises a semiconductor device and each memory cell size per bit is about $(2F^2)/N$, where F is a minimum feature size and N is a number of device layers in the third dimension, and where $N>1$ Another preferred embodiment of the present invention provides a method of making an EEPROM, comprising providing a semiconductor active area, forming a charge storage region over the active area, forming a conductive gate layer over the charge storage region and patterning the gate layer to form a control gate overlying the charge storage region. The method also comprises doping the active area using the control gate as a mask to form source and drain regions in the active area, forming a first insulating layer above and adjacent to the control gate, exposing a top portion of the control gate without photolithographic masking, and forming a word line contacting the exposed top portion of the control gate, such that the word line is self aligned to the control gate.

Another preferred embodiment of the present invention provides a method of making an EEPROM, comprising providing a semiconductor active area, forming a tunnel dielectric layer over the active area, forming a conductive gate layer over the tunnel dielectric layer, patterning the gate layer to form a floating gate overlying the tunnel dielectric layer and doping the active area using the floating gate as a mask to form source and drain regions in the active area. The method also comprises forming sidewall spacers adjacent to the floating gate sidewalls, forming a first insulating layer above and adjacent to the sidewall spacers and above the source and drain regions, forming a control gate dielectric layer over the floating gate, and forming a word line over the control gate dielectric and over the first insulating layer.

Another preferred embodiment of the present invention provides a method of forming a nonvolatile memory array, comprising forming a semiconductor active layer, forming a first insulating layer over the active layer, forming a plurality of gate electrodes over the first insulating layer and doping the active layer using the gate electrodes as a mask to form a plurality of source and drain regions in the active layer, and a plurality of bit lines extending substantially perpendicular to a source-drain direction. The method also comprises forming a second insulating layer above and adjacent to the gate electrodes and above the source regions, drain regions and the bit lines, planarizing the second insulating layer, and forming a plurality of word lines over the second insulating layer extending substantially parallel to the source-drain direction.

Another preferred embodiment of the present invention provides a method of making an EEPROM array, comprising providing a semiconductor active area, forming a plurality of dummy blocks above the active area, doping the active area using the dummy blocks as a mask to form source and drain regions in the active area, forming an intergate insulating layer above and between the dummy blocks, planarizing the intergate insulating layer to expose top portions of the dummy blocks, selectively removing the dummy blocks from between portions of the planarized intergate insulating layer to form a plurality of vias between the portions of the intergate insulating layer, forming charge storage regions over the active area in the plurality of vias, forming a conductive gate layer over the charge storage regions, and patterning the conductive gate layer to form a control gate overlying the charge storage region.

Another preferred embodiment of the present invention provides a method of forming a TFT EEPROM, comprising forming a TFT EEPROM comprising an amorphous silicon or a polysilicon active layer, a charge storage region and a control gate, providing a crystallization catalyst in contact with the active layer, and heating the active layer after the step of providing the catalyst to recrystallize the active layer using the catalyst.

Another preferred embodiment of the present invention provides a two- or three-dimensional memory array constructed of thin film transistors disposed above the substrate. Spaced-apart conductors disposed in a first direction form contacts with memory cells formed in rail stacks disposed in a second direction different from the first direction. A local charge trapping medium receives and stores hot electrons injected by thin film transistors formed at the intersections of the spaced-apart conductors and the rail stacks. The local charge trapping medium may be used to store charge adjacent to a transistor drain and by reversing the drain and source lines, two bits per memory cell may be stored, if desired. A programming method insures that stored memory will not be inadvertently disturbed.

Another preferred embodiment of the present invention provides a non-volatile thin film transistor (TFT) memory device that is constructed above a substrate. It employs a source, drain and channel formed of transition metal crystallized silicon. A local charge storage film is disposed vertically adjacent to the channel and stores injected charge. A two- or three-dimensional array of such devices may be constructed above the substrate. Spaced-apart conductors disposed in a first direction form contacts with memory cells formed in rail stacks disposed in a second direction different from the first direction. The local charge storage film receives and stores charge injected by TFTs formed at the intersections of the spaced-apart conductors and the rail stacks. The local charge storage film may be used to store charge adjacent to a transistor drain and by reversing the drain and source lines, two bits per memory cell may be stored, if desired. A programming method insures that stored memory will not be inadvertently disturbed.

Another preferred embodiment of the present invention provides a flash memory array disposed above a substrate, the array comprising a first plurality of spaced-apart conductive bit lines disposed at a first height above the substrate in a first direction, and a second plurality of spaced-apart rail-stacks disposed at a second height in a second direction different from the first direction, each rail-stack including a plurality of semiconductor islands whose first surface is in contact with said first plurality of spaced-apart conductive bit lines, a conductive word line, and charge storage regions disposed between a second surface of the semiconductor islands and the word line.

Another preferred embodiment of the present invention provides a TFT CMOS device, comprising a gate electrode, a first insulating layer adjacent to a first side of the gate electrode, a first semiconductor layer having a first conductivity type disposed on a side of the first insulating layer opposite to the gate electrode, a first source and drain regions of a second conductivity type disposed in the first semiconductor layer, first source and drain electrodes in contact with the first source and drain regions and disposed on a side of the first semiconductor layer opposite to the first insulating layer. The TFT CMOS device further comprises a second insulating layer adjacent to a second side of the gate electrode, a second semiconductor layer having a second conductivity type disposed on a side of the second insulating layer opposite to the gate electrode, second source and drain regions of a first conductivity type disposed in the second semiconductor layer, and second source and drain electrodes in contact with the second source and drain regions and disposed on a side of the second semiconductor layer opposite to the second insulating layer.

Another preferred embodiment of the present invention provides a circuit comprising a plurality of charge storage devices and a plurality of antifuse devices.

Another preferred embodiment of the present invention provides a semiconductor device comprising a semiconductor active region, a charge storage region adjacent to the semiconductor active region, a first electrode, and a second electrode. Charge is stored in the charge storage region when a first programming voltage is applied between the first and the second electrodes, and a conductive link is formed through the charge storage region to form a conductive path between the first and the second electrodes when a second programming voltage higher than the first voltage is applied between the first and the second electrodes.

BRIEF DESCRIPTION OF THE DRAWINGS

FIGS. 3A–3D illustrate an ultra thin channel pillar memory device in accordance with an embodiment of the present invention and its method of fabrication.

FIG. 4 is an illustration of a pillar memory of an embodiment of the present invention having Schottky contacts.

FIG. 5 is an illustration of a gated diode pillar memory in accordance with an embodiment of the present invention.

FIGS. 10A–10E illustrate a method of forming a pillar memory device in accordance with an embodiment of the present invention utilizing a "spacer etch" technique.

FIG. 13 to FIG. 28 illustrate a method of fabricating multiple levels of pillar memories in accordance with an embodiment of the present invention.

FIG. 45 is a side cross-sectional view of the array of the second preferred embodiment after the oxide fill and planarization. The cross-section is perpendicular to the bit lines.

FIG. 46 is a side cross-sectional view of the array of the second preferred embodiment after word line formation. The cross-section is perpendicular to the bit lines.

FIG. 47 is a side cross-sectional view of the array of a preferred embodiment after word line formation. The cross-section is perpendicular to the bit lines.

FIGS. 48A–C and 49A–C illustrate alternative methods of making a TFT of the array of a preferred embodiment.

FIGS. 88A–D illustrate a method of making the CMOS array of FIG. 87.

FIG. 93 is a process flow diagram illustrating a process for fabricating a crystallized amorphous silicon layer for use in a non-volatile TFT memory device in accordance with a specific embodiment of the present invention.

DETAILED DESCRIPTION OF THE PREFERRED EMBODIMENTS

Figure 1A:
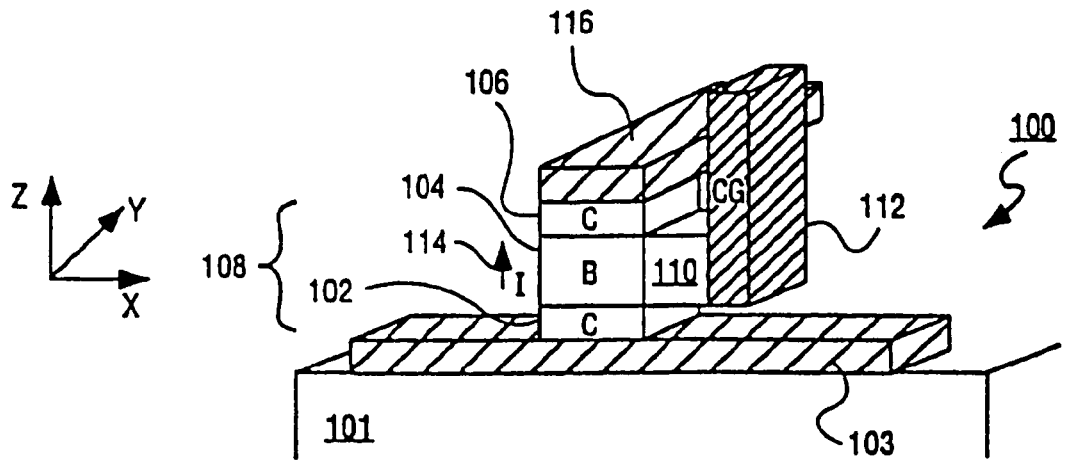
FIG. 1A is an illustration of a pillar memory in accordance with an embodiment of the present invention.

The present inventors have realized that the cost of memory and logic devices would be decreased if the device density was increased. Thus, the present inventors have provided an ultra dense matrix array of charge storage semiconductor devices which has an increased density and a lower cost.

One method of improving device density is to arrange the devices in a monolithic three dimensional array of charge storage devices comprising a plurality of device levels. The term "monolithic" means that layers of each level of the array were directly deposited on the layers of each underlying level of the array. In contrast, two dimensional arrays may be formed separately and then packaged together to form a non-monolithic memory device.

In order to form such a three dimensional array, especially an array having four or more layers, at least one surface between two successive device levels is planarized by chemical mechanical polishing (CMP). In contrast to other planarization methods, such as etch back, chemical mechanical polishing allows a sufficient degree of planarization to stack multiple device levels of a commercially feasible device on top of each other. The inventors have found that chemical mechanical polishing typically achieves flatness on the order of 4000 Angstroms or less within a stepper field (i.e., a peak to peak roughness value of 4000 Angstroms or less in an area on the order of 10 to 50 mm) in three-dimensional memory arrays, even after 4 to 8 layers of the array have been formed. Preferably, the peak to peak roughness of a layer in the array polished by CMP is 3000 Angstroms or less, such as 500 to 1000 Angstroms, within a stepper field. In contrast, etch back alone typically does not afford sufficient flatness to achieve a commercially suitable three-dimensional memory or logic monolithic array.

For example, the term "at least one surface between two successive device levels is planarized by chemical mechanical polishing" includes surfaces formed in the bottom and intermediate device layers, as well as surfaces of the interlayer insulating layers that are disposed in between the device layers. Thus, the surfaces of conductive and/or insulating layers in each intermediate and bottom device level of the array are planarized by chemical mechanical polishing. Thus, if the array includes at least four device levels, then at least three device levels should have at least one surface that is planarized by chemical mechanical polishing. The surfaces of the conductive and/or insulating layers in the top device level may also be planarized by chemical mechanical polishing.

Another method of improving device density is to vertically integrate the driver or peripheral circuits with the memory or logic array. In the prior art, the peripheral circuits were formed in the periphery of the monocrystalline silicon substrate, while the memory or logic array was formed in the other portions of the substrate, adjacent to the peripheral circuits. Thus, the peripheral circuits occupied valuable substrate space in the prior art devices. In contrast, a preferred embodiment of the present invention provides a monolithic three dimensional array of charge storage devices formed in an amorphous or polycrystalline semiconductor layer over a monocrystalline semiconductor substrate, while at least part, and preferably all, the driver (i.e., peripheral) circuitry is formed in the substrate under the array, within the array or above the array. Preferably, the driver circuitry comprises at least one of sense amps and charge pumps formed wholly or partially under the array in the substrate.

Figure 35:
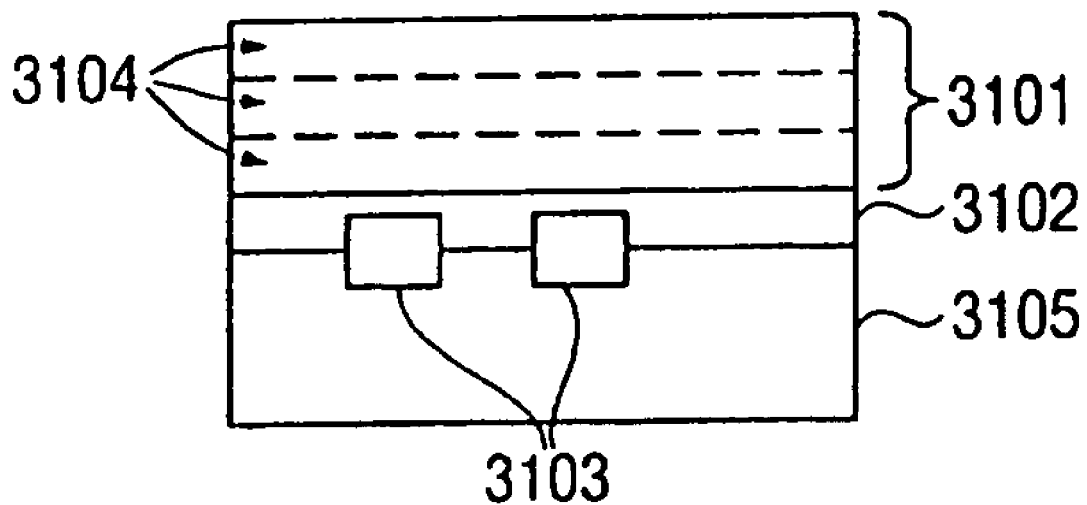
FIGS. 35 and 36 are schematics of a three dimensional array of devices.
Figure 36:
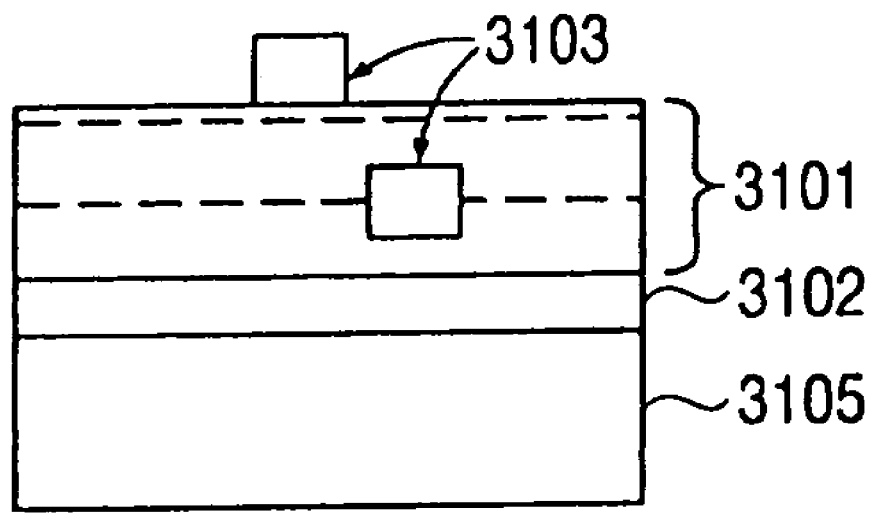

FIG. 35 schematically illustrates an array of charge storage logic or memory devices 3101 formed above an interlayer insulating layer 3102 disposed above a monocrystalline substrate 3105. The array of charge storage logic or memory devices 3101 are thus arranged as a three dimensional monolithic array thin film transistors or diodes in amorphous or polysilicon layers. The array 3101 has a plurality of device levels 3104, preferably separated by interlayer insulating layers. The driver circuits 3103, such as sense amps and charge pumps, are disposed in the monocrystalline substrate 3105, as CMOS or other transistors. FIG. 36 schematically illustrates an array of charge storage logic or memory devices 3101 formed above a monocrystalline substrate 3105 as thin film transistors or diodes in amorphous or polysilicon layers. The driver circuits 3103, such as sense amps and charge pumps, are formed within the array 3101 and/or above the array 3101.

Another method of improving device density is self-alignment and using the same photolithography step to pattern different layers. The device cell area is enlarged by misalignment tolerances that are put into place to guarantee complete overlap between features on different layers. Thus, the present inventors have developed a fully or partially aligned memory cell structure that does not require misalignment tolerances or that requires a reduced number of misalignment tolerances. In such a cell structure, certain device features may be self aligned to other device features, and do not require a photolithography step for patterning. Alternatively, plural layers may be etched using the same photoresist mask or a lower device layer may be etched using a patterned upper device layer as a mask. Particular examples of aligned memory cells will be discussed in more detail below.

The charge storage devices of the array may be any type of semiconductor devices which store charge, such as EPROMs or EEPROMs. In the preferred embodiments of the present invention described in detail below, the charge storage devices are formed in various configurations, such as a pillar TFT EEPROM, a pillar diode with a charge storage region, a self aligned TFT EEPROM, a rail stack TFT EEPROM, and various other configurations. Each of these configurations provides devices with a high degree of planarity and alignment or self-alignment to increase the array density.

For example, in the pillar TFT EEPROM or a pillar diode with a charge storage region, at least one side of the semiconductor active region is aligned to one of the electrodes contacting the semiconductor active region. Thus, in a pillar TFT EEPROM configuration, the semiconductor active region is aligned to both the source and the drain electrodes. This alignment occurs because at least two sides of the active semiconductor region and one of the electrodes are patterned during a same photolithography step (i.e., etched using the same photoresist mask or one layer is used as a mask for the other layer).

In a self-aligned TFT, two sides of the active semiconductor region are aligned to a side of the gate electrode only in the channel portion of the active semiconductor region, but not in the source and drain regions. This alignment occurs because at least two sides of the channel region and the gate electrode are patterned during a same photolithography step (i.e., etched using the same photoresist mask or one layer is used as a mask for the other layer). In contrast, the source and drain regions are not etched.

In the following description, numerous specific details are set forth such as specific thicknesses, materials etc. in order to provide a thorough understanding of the present invention. It will be apparent to one skilled in the art that the present invention may be practiced without these specific details. In other instances, well-known concepts, circuit and fabrication techniques are not set forth in detail in order not to unnecessarily obscure the present invention.

Any feature of any embodiment described below may be used in another embodiment. The first set of embodiments describes various pillar devices, the second set of embodiments describes self-aligned TFT devices and the third set of embodiments describes rail stack TFT devices. The fourth and fifth set of embodiments describes how these devices may be used in a logic or memory circuit. The final set of embodiments describes the use of metal induced crystallization to improve the crystallinity of the device levels.

I. The Pillar Devices

The present embodiment is directed to thin film transistors (TFTs) and diodes arranged in a pillar configuration (i.e., the vertical direction with respect to the substrate, where the length of the device is perpendicular to the substrate) and their method of fabrication. Preferably, the pillar devices form a charge trapping memory that has a vertical read current. The memory includes a first input/output conductor formed on or above a plane of a substrate and a second input/output conductor located above and spaced apart from the first input/output conductor. The first input/output conductor and the second input/output conductor are positioned so that they overlap or intersect one another and preferably intersect perpendicular to one another. A semiconductor region, such as a doped silicon region, is formed between the first input/output conductor and the second input/output conductor at the intersection of the first input/output conductor and the second input/output conductor. A charge storage medium, such as but not limited to a charge trapping dielectric, is formed near the semiconductor region and affects the amount of current that flows through the semiconductor region between the first input/output conductor and the second input/output conductor for a given voltage applied across the first input/output conductor and the second input/output conductor. The amount of current (read current) for a single voltage that flows through the semiconductor region can be used to determine whether or not charge is stored in the charge storage medium and therefore whether or not the memory is programmed or erased. The read current that flows through the semiconductor region between the first input/output conductor and the second input/output conductor flows in a direction perpendicular to the plane of the substrate in which or on which the memory is formed. The structure of the charge trapping memory of the present embodiment, as well as its method of fabrication, is ideally suited for integration into a three dimensional array of memory devices.

As will be discussed below, the charge trapping memory device of the present embodiment can be fabricated with one of two general structures. In one embodiment the charge storage medium is formed adjacent to the semiconductor region and in a second embodiment the charge storage medium is formed above or below the semiconductor region.

1. A Three Terminal Pillar Memory with Adjacent Charge Storage Medium

An embodiment of the present invention is a three terminal nonvolatile stackable pillar memory device. A pillar memory device 100 in accordance with this embodiment of the present invention is broadly illustrated in FIG. 1A. Pillar memory device 100 includes a first contact region 102 formed on a first input/output (I/O) 103 conductor formed on or above a plane (x-y) of a single crystal substrate 101. A semiconductor body 104 is formed directly on the first contact region 102 and a second contact region 106 is formed directly on the body 104. A second I/O conductor 116 is formed on the second contact region 106. The first contact region 102, the body 104, and the second contact (source/drain) region 106 are each vertically aligned with one another to form a pillar 108. Adjacent to and in contact with body 104 is a charge storage medium 110. A control gate 112 is formed adjacent to and in direct contact with the charge storage medium 110. The control gate 112 and charge storage medium 110 are constructed so that they lie laterally adjacent to pillar 108 so that they may electrically communicate with pillar 108. The charge storage medium is the region that electrically screens the control gate and the channel region addressed by the control gate.

The programmed or unprogrammed state of the pillar memory device is determined by whether or not charge is stored in charge storage medium 110. The charge stored in the charge storage medium adds or subtracts from the voltage applied to the control gate, thereby altering the voltage required to form a conducting channel in body 104 to enable a current (e.g., read current $I_R$) to flow between the first and second contact (source/drain) regions. This voltage is defined as the $V_T$. The amount of voltage required to form a conducting channel in body 104 or the amount of current flowing in the body for a given control gate voltage can be used to determine whether or not the device is programmed or unprogrammed. Additionally, multiple bits of data can be stored in a single charge storage medium 110 whereby each different amount of stored charge creates a different $V_T$ each representing a different state of the charge storage medium. Because the charge storage medium can contain multiple states, multiple bits can be stored in a single charge storage medium.

During read operations of device 100, when a conductive channel is formed in body 104, current 114 flows vertically (z) (or perpendicular) with respect to the plane (x-y) of the substrate 101 above which pillar memory device is formed. By creating a memory device with a "vertical" read current path, the pillar memory cell of the present invention can be easily stacked in a three dimensional array with source/drain conductors 103 and 116 running parallel or perpendicular to each other and parallel to the plane of the substrate 101 without requiring the use of vertical interconnect strategies for the source and drain connections. The conductor 112 to the control gate may be run vertically (as shown in FIG. 1A) or horizontally.

Figure 1B:
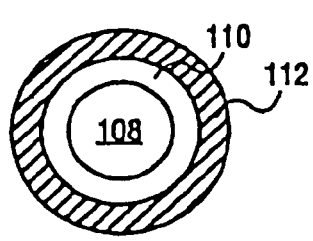
FIG. 1B is an illustration of an overhead view of a pillar memory in accordance with an embodiment of the present invention having a single charge storage medium and single control gate surrounding a pillar.
Figure 1C:
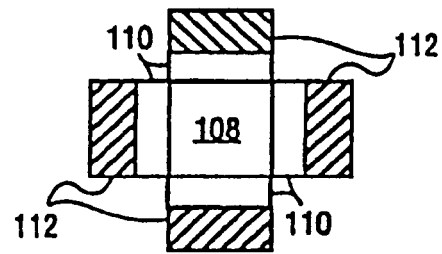
FIG. 1C is an illustration of an overhead view showing a pillar memory in accordance with an embodiment of the present invention having multiple charge storage mediums and multiple control gates.

Although memory device 100 shown in FIG. 1A includes a charge storage medium 110 and a control gate 112 formed on only one side or surface of pillar 108, it is to be appreciated that the pillar memory device of the present invention can be fabricated so that the entire body 110 of the pillar 108 is surrounded by a single charge storage member 110 and a single control gate 112 as shown in FIG. 1B. Additionally, each surface of the pillar 108 can have an independently controlled charge storage member and control gate as shown in FIG. 1C and thereby enable multiple bits of data to be stored in a single pillar memory device of the present invention. The use of multiple charge storage members and control gates enables the storage of multiple values on a single pillar device by determining how much of the channel is exposed to charge. Additionally, each face of body 104 of pillar 108 can have different doping densities to create different threshold voltages for each face to further enable the pillar memory to store additional states and therefore additional bits.

Figure 2:
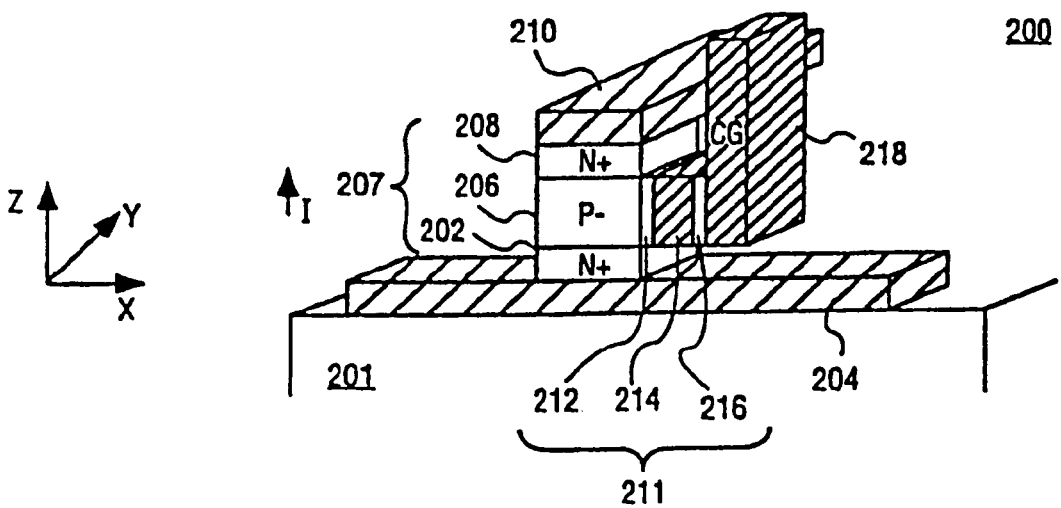
FIG. 2 is an illustration of the pillar memory in accordance with an embodiment of the present invention.

FIG. 2 shows an embodiment of the present invention where the pillar 207 comprises a first source/drain contact region 202 comprising a heavily doped N+ silicon film having a doping density in the range between $1 \times 10^{19}$ to $1 \times 10^{20}$, preferably $1 \times 10^{19}$ to $1 \times 10^{21}$ atoms/cm$^3$, formed on a first input/output 204 (e.g. bit line) formed on or above a substrate 201. A body comprising a lightly doped P– type silicon film 206 having a doping density between $1 \times 10^{16}$ to $1 \times 10^{18}$ atoms/cm$^3$ is formed on and in direct contact with the first N+ source/drain contact region 202. A second source/drain region 208 comprising a heavily doped N+ silicon film having a doping density of $1 \times 10^{19}$ to $1 \times 10^{20}$, preferably $1 \times 10^{19}$ to $1 \times 10^{21}$, atoms/cm$^3$ is formed on and in direct contact with P type silicon film 206, as shown in FIG. 2. A second conductive input/output (e.g. word line/bit line) 210 is formed on the second N+ source/drain region 208. The N+ source/drain films 202 and 208 can have a thickness between 500–1000 Å. The first and second input/outputs 204 and 210 can be formed of a highly conductive material such as but not limited to a metal such as tungsten, a silicide such as titanium silicide or tungsten silicide, or heavily doped silicon. In memory device 200 N+ source/drain region 202, P type silicon body 206 and N+ source/drain region 208 are each substantially vertically aligned with one another to form pillar 207.

Pillar memory 200, shown in FIG. 2, has a charge storage medium 211 comprising a tunnel dielectric 212, a floating gate 214, and a control gate dielectric 216. The tunnel dielectric is formed adjacent to and in direct contact with P type silicon body 206. A floating gate 214 is formed adjacent to and in direct contact with tunnel dielectric 212. Floating gate 214 comprises a conductor such as but not limited to doped silicon, such as N type silicon, or metal such as tungsten. The control gate dielectric 216 is formed adjacent to and in direct contact with floating gate 214. Finally a control gate 218 is formed adjacent to and in direct contact with control gate dielectric 216. Control gate 218 is formed of a conductor such as but not limited to doped silicon or a metal such as tungsten.

The thicknesses of P type silicon film 206 and tunnel dielectric 212 are dependent upon the desired programming and erasing voltage. If low voltage programming operations between 4 to 5 volts are desired, then P-type silicon film 206 can have a thickness between 1000–2500 Å and the tunnel dielectric can have a thickness between 20 and 150 Å, such as 20–50 Å, preferably 80–130 Å. (If a nitride tunnel dielectric 212 is desired it would be scaled slightly thicker.) It is to be appreciated that the thickness of P-type silicon film 206 defines the channel length of the device. If higher voltage (6–10 volts) programming operations are desired the P type silicon film 206 can have a thickness between 6000–7000 Å and tunnel dielectric 212 can have a thickness between 60–100 Å. The control dielectric 216 typically has a thickness on order of tunnel dielectric 212 but is slightly (10–30 Å) thicker, preferably 130 to 180 Å.

Pillar memory 200 is considered programmed or unprogrammed depending upon whether or not charge is stored on floating gate 214. Pillar memory device 200 can be programmed utilizing drain side programming whereby electrons are placed on floating gate 214 by grounding the source region 202 while a relatively high voltage is applied to the drain region 208 and while approximately 4–5 volts, for low voltage operations, or 6–10 volts, for high voltage operations, is applied to control gate 218 in order to invert a portion of P-type silicon region 206 into N type silicon so that a channel region is formed and electrons flow between the source region and the drain region. The high control gate voltage pulls electrons from the inverted channel region through the tunnel dielectric 212 and on to floating gate 214. Because electrons lose some of their energy tunneling through the tunnel oxide, they no longer have enough energy to escape from the floating gate which is surrounded by insulators. Other techniques such as but not limited to source side injection can be used to program memory device 200.

Memory device 200 can be erased by removing stored electrons from floating gate 214. Memory device 200 can be erased by placing a relatively high positive voltage (3 volts) on to the source region, while applying a negative voltage of approximately 4–5 volts in low voltage operations or 6–10 volts for high voltage operations on to control gate 218. The positive voltage on the source region attracts electrons on floating gate 214 and thereby pulls electrons off floating gate 214 through tunnel dielectric 212 and into the source region.

In order to read the state of memory device 200, a voltage (such as 3.3 volts) can be applied to the drain while a given control gate voltage is applied to the control gate. The amount of current (read current) that flows from the drain region through the channel region and into the source region for a given control gate voltage can be used to determine the state of the memory device. Alternatively, one can read the state of memory 200 by sensing the amount of control gate voltage necessary to cause a given read current to flow through body 206. When read current flows between the first and second source/drain regions 202 and 208 through body 206 it flows in a direction perpendicular (z) to the plane (x-y) of the substrate 201 on or above which it is built.

FIG. 3 shows another embodiment of the nonvolatile pillar memory device of the present invention. FIG. 3 shows a three terminal nonvolatile pillar memory device 300 having an ultra thin silicon channel or body 302. Like memory device 200 the ultra thin memory device 300 has a first N+ source/drain contact region 202 formed on a first input/output 204. An insulator 304, such as an SiO$_2$ film or a silicon nitride film, is formed on the first source/drain contact region 202. A second N+ source/drain region 208 is formed on the insulating layer 304. Insulator 304 separates the source/drain regions 202 and 208 from one another and therefore defines the channel length of the device. A thin P-type silicon film 302 having a concentration in the range between $1 \times 10^{16}$ to $1 \times 10^{18}$ atoms/cm$^3$ is formed along the sidewalls of the N+/insulator/N+ stack so that it is adjacent to and in direct contact with the first and second source/drain regions as well as separating insulator 304. The P-type silicon film acts as the channel or body for the device and bridges the gap between source/drain regions 202 and 208. By forming a thin P-type silicon film adjacent to the N+/insulator/N+ stack the channel region can be made extremely thin, between 50–100 Å. The thickness of the P-type silicon film which represents the channel thickness is preferably less than ½ the channel length (i.e. the distance between the source/drain regions 202 and 208) and ideally less than ⅓ the channel length.

Like memory device 200, memory device 300 also includes a charge storage medium 211, and a control gate 218. When transistor 300 is turned on, a portion of the P-type silicon region inverts to form a conductive channel therein so that current can flow from one source/drain region 202 to the other source/drain region 208. The majority of the current path 306 through the ultra thin body 302 or channel from one source/drain region to the other source/drain region is in a direction perpendicular (z) to the plane (x-y) of the substrate above which the device is built.

An ultra thin channel or body transistor can be formed, for example, by using a "spacer etch" technique. For example, as shown in FIG. 3B an N+ silicon/insulator/N+ silicon stack can be blanket deposited over a substrate having a patterned metal I/O 204. The stack is then patterned utilizing well-known photolithography and etching techniques into a pillar 306 is shown in FIG. 3B. A P-type silicon film can then be blanket deposited over the pillar as shown in FIG. 3C. The P-type silicon film is deposited to a thickness desired for the channel thickness of the device. The P-type polysilicon film is then anisotropically etched so that P-type silicon film 302 is removed from horizontal surfaces and remains on vertical surfaces such as the sidewalls of pillar 306. In this way the P-type silicon film is formed adjacent to the pillar and bridges the source/drain regions across the insulator 304. The charge storage medium 211 and control gate 218 can then subsequently be formed as in the other pillar devices.

FIG. 4 shows another embodiment of the three terminal stackable nonvolatile pillar memory device of the present invention. FIG. 4 is a three terminal stackable non-volatile pillar memory device where Schottky contacts form the source and drain regions of the device. The Schottky contact MOSFET 400 of the present invention includes a first metal contact 402 formed on a first input/output 204. A doped silicon body or channel 404 such as N type silicon doped to a concentration level between $1 \times 10^{16}$ to $1 \times 10^{18}$ atoms/cm$^3$ and having a thickness desired for the channel length is formed on metal contact 402. A second metal contact 406 is formed on and in direct contact with silicon body 404. A second I/O is then formed on second metal contact 406. First metal contact 402 and second metal contact 406 are formed of a material such as platinum silicide, tungsten silicide and titanium silicide and to a thickness that forms a Schottky barrier contact with silicon body 404. The first metal contact 402, silicon body 404, and second metal contact 406 are each directly vertically aligned to one another to form a pillar 408 as shown in FIG. 4. Memory device 400 also includes a charge storage medium 211 directly adjacent to and in contact with silicon body 404 as shown in FIG. 4. Additionally, memory device 400 includes a control gate adjacent to and in direct contact with the charge storage medium 211. When a channel is formed in silicon body 404, current (e.g., read current $I_R$) flows from metal contact 402 to metal contact 406 in a direction perpendicular (z) to the surface of the substrate (x-y) on which memory device 400 is formed.

FIG. 5 illustrates another embodiment of a three terminal nonvolatile memory device in accordance with the embodiment of the present invention. FIG. 5 illustrates a gated diode memory device 500. Memory device 500 includes a P+ type silicon film contact region 502 having a dopant density between $1 \times 10^{19}$ to $10 \times 10^{21}$, preferably $1 \times 10^{19}$ to $1 \times 10^{20}$ atoms/cm$^3$ and a thickness between 500–1000 Å. A P– silicon film 504 having a doping density between $1 \times 10^{16}$ to $1 \times 10^{18}$ atoms/cm$^3$ is formed on and in direct contact with P+ silicon film 502. An N+ type silicon contact region 506 having a doping density between $1 \times 10^{19}$ to $10^{21}$, preferably $1 \times 10^{19}$ to $1 \times 10^{20}$, atoms/cm$^3$ and a thickness between 500–1000 Å is formed directly on P– silicon film 504. In an embodiment of the present invention P+ silicon film 502, P– silicon film 504, and N+ silicon film 506 are each vertically aligned with one another to form a pillar 508 as shown in FIG. 5. Memory device 500 also includes a memory storage medium 211 formed adjacent to and in direct contact with P– silicon film 504 and N+ silicon film 506 as shown in FIG. 5. Adjacent to and in direct contact with charge storage medium 211 is a control gate 218. Additionally, like transistors 100, 200, 300, and 400, when gated diode 500 is turned "on" a current (I) travels from P+ silicon film 502 to N– type silicon film 506 in a direction perpendicular (z) to the plane (x-y) of the substrate 501 on or above which device 500 is formed.

Figure 6:
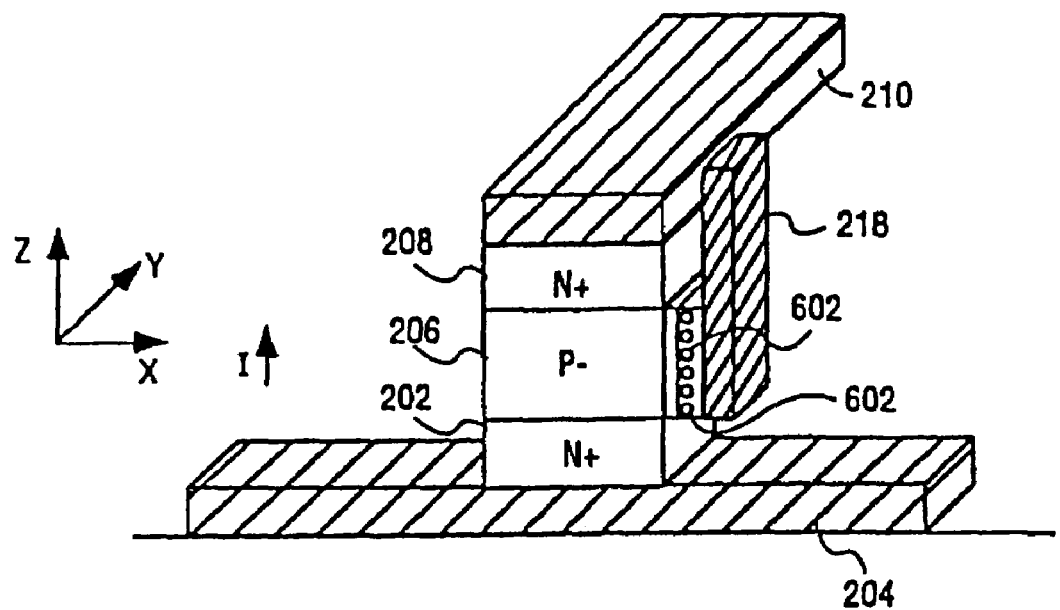
FIG. 6 is an illustration of a pillar memory in accordance with an embodiment of the present invention having a nanocrystal floating gate.

Although devices 200–500 have been shown with a charge storage medium comprising a continuous film floating gate 214 isolated by a tunnel dielectric 212 and a control gate dielectric 216, the floating gate need not necessarily be formed from a continuous conductive film of silicon or metal but can alternatively be formed from a plurality of a electrically isolated nanocrystals 602 as shown in FIG. 6. Nanocrystals are small clusters or crystals of a conductive material that are electrically isolated from one another. An advantage of the use of nanocrystals for the floating gate is that because they do not form a continuous film, nanocrystal floating gates are self isolating. Nanocrystals 602 enable multiple self-isolating floating gates to be formed around a single silicon body 206. For example, with a square or rectangular shaped pillar, a floating gate can be formed on each side of the silicon body or channel enabling four or more isolated floating gates to be formed around a single square pillar. In this way, multiple bits can be stored in each pillar memory. Similarly, because nanocrystals form a non-continuous film, floating gates can be formed after two or more levels of pillars are formed without worrying about shorting of the floating gate of one cell level to the floating gates to adjacent cells lying directly above or below (i.e., vertically adjacent). Yet another advantage of the use of nanocrystals for floating gates is that they experience less charge leakage than do continuous film floating gates.

Nanocrystals 602 can be formed from conductive material such as silicon, tungsten, or aluminum. In order to be self isolating, the nanocrystals must have a material cluster size less than one-half the pitch of the cell so that floating gates from vertically and horizontally adjacent cells are isolated. That is, the nanocrystals or material clusters 602 must be small enough so that a single nanocrystal 602 cannot bridge vertically or horizontally adjacent cells. Silicon nanocrystals can be formed from silicon by utilizing chemical vapor deposition to decompose a silicon source gas such as silane at very low pressure. Similarly, a tungsten nanocrystal floating gate can be formed by chemical vapor deposition by decomposing a tungsten source gas such as $WF_6$ at very low pressures. Still further, an aluminum nanocrystal floating gate can be formed by sputter deposition at or near the melting temperature of aluminum.

Figure 7:
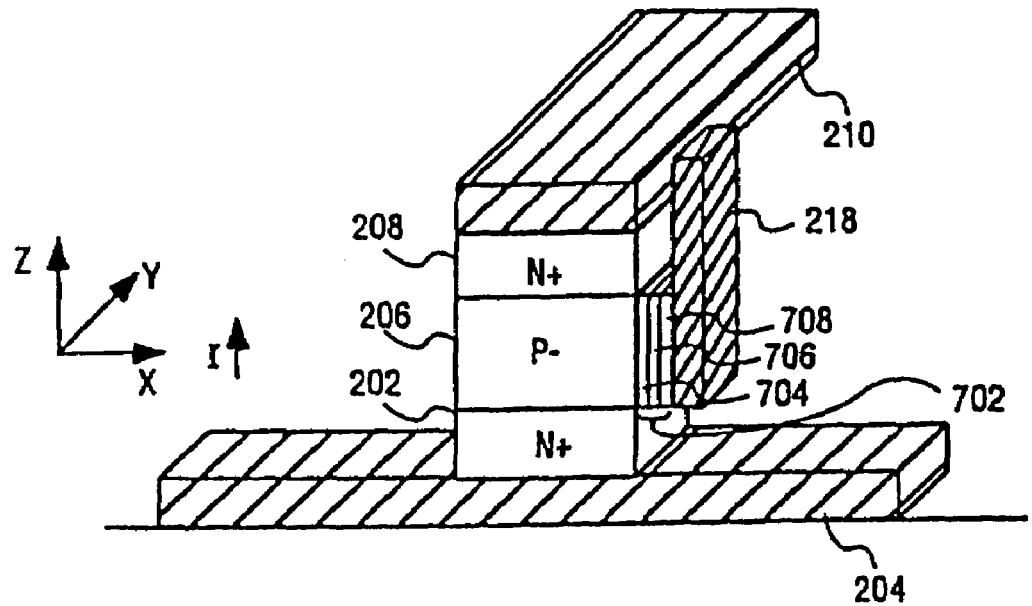
FIG. 7 is an illustration of a pillar memory of an embodiment of the present invention having a charge trapping dielectric.

Additionally, alternative to the use of a dielectric isolated floating gate to store charge in the memory devices of the present invention, one can use a trapping layer formed in the dielectric stack 702 as shown in FIG. 7. For example, the charge storage medium can be a dielectric stack 702 comprising a first oxide layer 704 adjacent to the silicon body or channel, a nitride layer 706 adjacent to the first oxide layer and a second oxide layer 708 adjacent to the nitride layer and adjacent to the control gate 218. Such a dielectric stack 702 is sometimes referred to as an ONO stack (i.e., oxide-nitride-oxide) stack. Other suitable charge trapping dielectric films such as an H+ containing oxide film can be used if desired.

It is to be appreciated that each of the memory devices 200–500 shown in FIGS. 2–5 can be made of opposite polarity by simply reversing the conductivity type of each of the silicon regions in the pillar and maintaining concentration ranges. In this way, not only can NMOS devices be fabricated as shown in FIGS. 2–5, but also PMOS devices can be formed if desired. Additionally, the silicon films used to form the pillars of the device may be single crystal silicon or polycrystalline silicon. Additionally, the silicon film can be a silicon alloy film such as a silicon germanium film doped with N type or P type conductivity ions to the desired concentration.

Figure 8B:
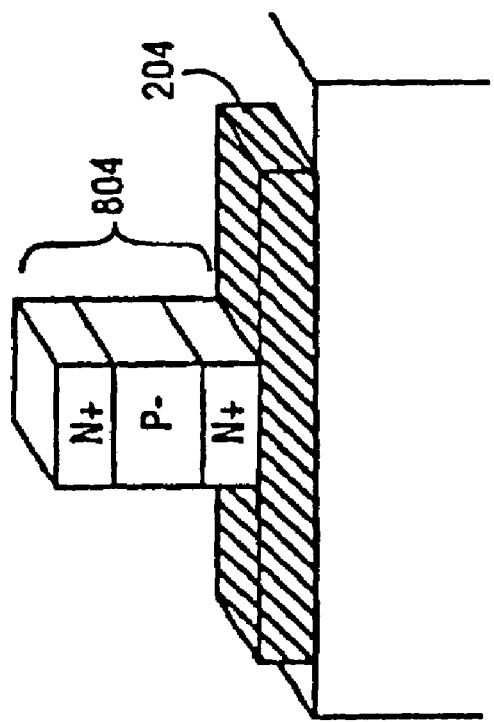
FIGS. 8A and 8B illustrate a method of forming a pillar utilizing an explicit pillar formation process.
Figure 8A:
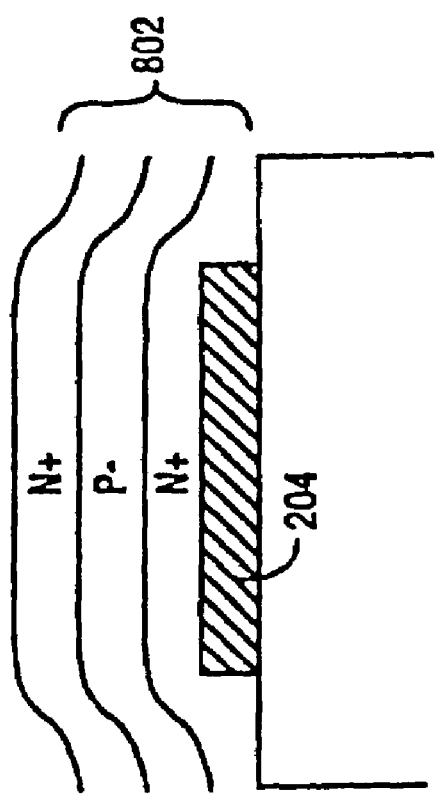

Additionally, as shown in FIGS. 1–3 and 5, the pillars 108, 208, 308, and 508 are fabricated so that the contacts and body are aligned with one another when viewed from the top. This may be achieved by first forming an I/O 204 and then blanket depositing the pillar film stack (e.g., N+/P−/N+) as shown in FIG. 8A. The film stack 802 can then be masked and all three films anisotropically etched in a single step as shown in FIG. 8B to form a pillar 804. An explicit pillar formation step can form a pillar having any desired shape. For example, the pillar 804 can take the shape of a square as shown in FIG. 8B or can take the shape of rectangle, or a circle when viewed from above.

Figure 9B:
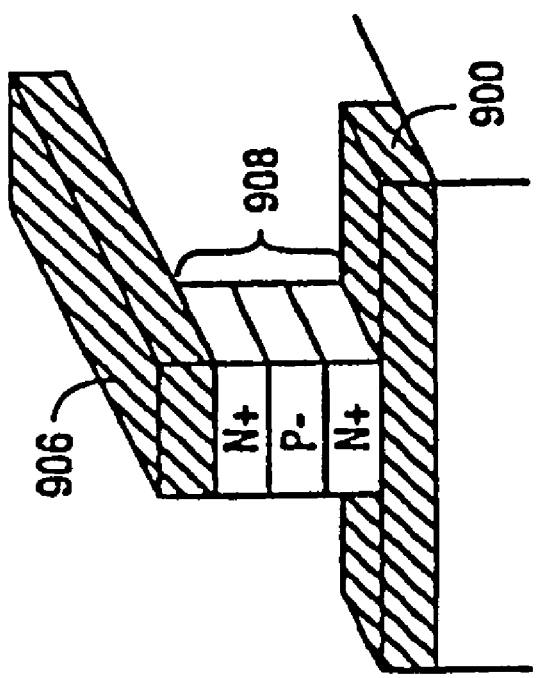
FIGS. 9A and 9B illustrate a method of forming a pillar utilizing an intersection etch technique.
Figure 9A:
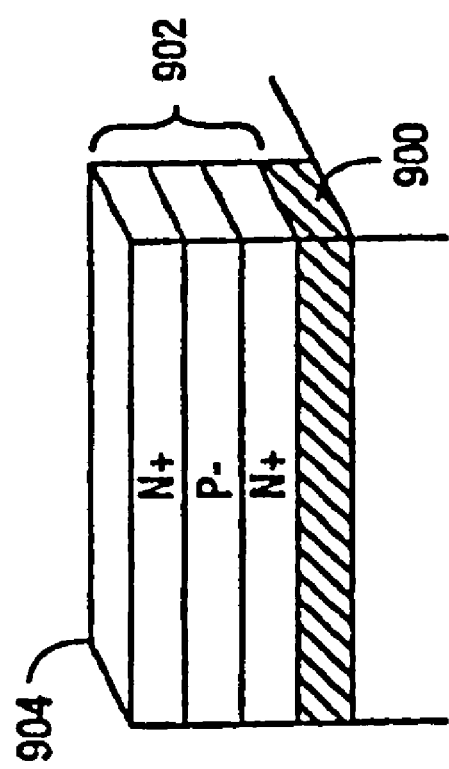

Alternatively, as shown in FIGS. 9A and 9B, a pillar can be formed by the intersection of the patterning of the first and second I/O's. For example, a pillar can be formed by first blanket depositing a first I/O conductor 900 followed by the sequential blanket deposition of the film stack 902 (e.g., N+/P−/N+) of the desired pillar. The first I/O film 900 and the pillar film stack 902 are then etched to form a plurality of pillar strips 904 as shown in FIG. 9a. During subsequent processing to pattern the second I/O, the second I/O 906 is etched in a direction perpendicular or orthogonal to the plurality of strips 904. The etch step used to pattern the second I/O 906 is continued so as to etch away the pillar film stack 902 from the portions of the strip 904 which are not covered or masked by the second I/O 906. In this way, a pillar 908 is formed at the intersection of the first and second I/O's. The pillar 908 is formed in direct alignment with the intersection or overlap of the first and second I/O's. The intersection technique of forming a pillar is advantageous because it saves additional lithography steps.

The charge storage medium of the memory device of the present invention can be formed utilizing a "spacer etch" technique. For example, as shown in FIG. 10A–10E a pillar 1000 or a pillar strip is first formed. A first tunnel dielectric 1002 is then blanket deposited over the pillar 1000. Next, a floating gate material 1004 is blanket deposited over the tunnel dielectric 1002. The floating gate dielectric material is deposited to a thickness desired for the floating gate. The floating gate material can be nanocrystals or can be a continuous conductive film. The floating gate material 1004 and the tunnel dielectric 1002 are then anisotropically etched back to remove them from horizontal surfaces such as the top of pillar 1000 and between adjacent pillars so as to leave a floating gate 1008 isolated by a tunnel dielectric on the sidewalls of the pillar 1000 or strip. If the floating gate is made from a continuous conductive film, as opposed to nanocrystals, then care must be taken to ensure the complete removal of the floating gate material 1004 from between adjacent cells so that the floating gates 1008 of adjacent cells are isolated.

It is to be appreciated that when the floating gate is made of nanocrytals or when the charge storage medium is a trapping dielectric, the films need not necessarily be etched from horizontal surfaces between adjacent cells because these films do not electrically couple adjacent cells. If desired, however, charge trapping dielectric and nanocrystal floating gates can be anisotropically etched back. Next, as shown in FIG. 10D, a control gate dielectric 1006 is blanket deposited over floating gate 1008 and the top of pillar 1000.

A control gate can also be formed using a "spacer etch" technique. In such a case, a control gate material 1010, such as doped polysilicon, is blanket deposited over the control gate dielectric 1006 to the thickness desired of the control gate as shown in FIG. 10D. The control gate material 1010 is then anisotropically etched back as shown in FIG. 10E to remove the control gate material 1010 from horizontal surfaces such as on top of control gate dielectric 1006 and between adjacent pillars or strips and form a control gate 1012 adjacent to control gate dielectric 1006. The control gate dielectric 1006 protects the underlying silicon pillar 1000 from being etched during the anisotropic etch of the control gate material.

Figure 11A:
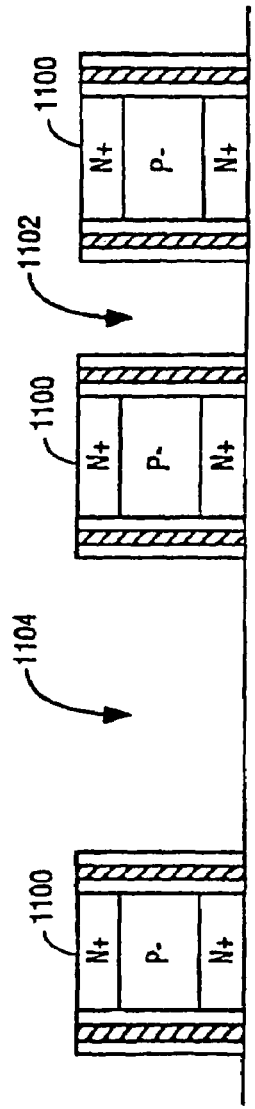
FIGS. 11A–11C illustrate a method of forming a common control gate between adjacent pillar memories as well as showing the isolation of control gates between adjacent pillars.
Figure 11B:
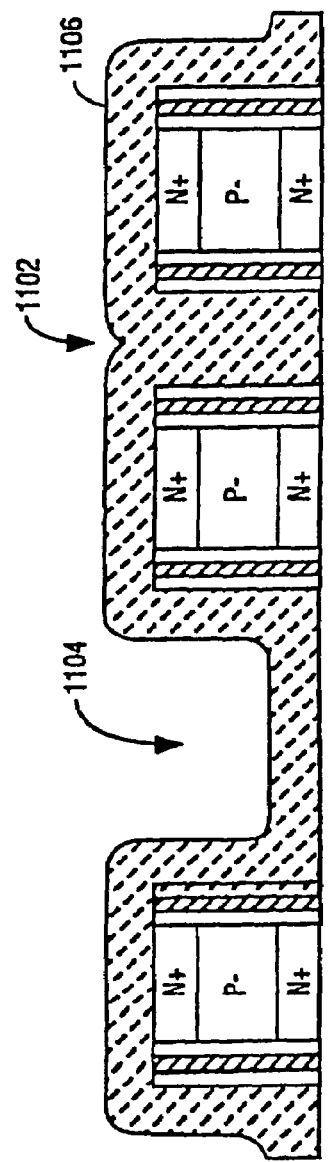
Figure 11C:
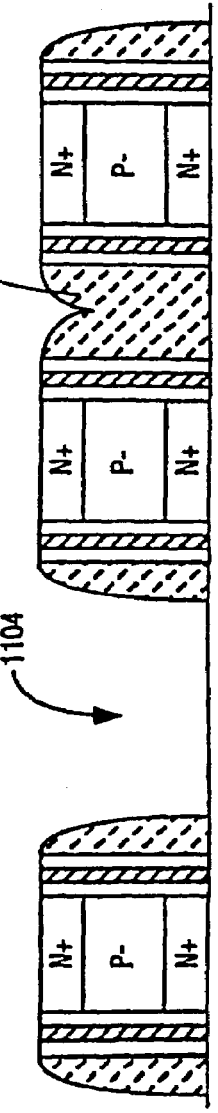

While it is necessary to isolate the floating gate from adjacent cells, the control gate can be shared between horizontal or vertically adjacent cells. Horizontally shared control gates can be achieved by utilizing lithography to form a conductor strip which connects horizontally adjacent transistors. Alternatively, as shown in FIGS. 11A–11C, horizontal coupling of adjacent cells can be achieved by accurately controlling the space between adjacent cells 1100 so that a minimal space 1102 is placed between cells having control gates to be coupled together while larger gaps 1104 are placed between cells having controls gates which are to be isolated as shown in FIG. 11A. In this way, when a control gate material 1106 is deposited, it completely fills the minimum or small gaps 1102 between adjacent cells while leaving only a thin film on the large gaps 1104 between cells to be isolated as shown in FIG. 11B. During the anisotropic etch, the thin control gate material in the large gaps is completely removed, isolating adjacent control gates, while a portion 1108 of the thicker control gate material 1106 in the small gap remains, so that it bridges adjacent cells and couples horizontally adjacent cells as shown in FIG. 11C.

Figure 12A:
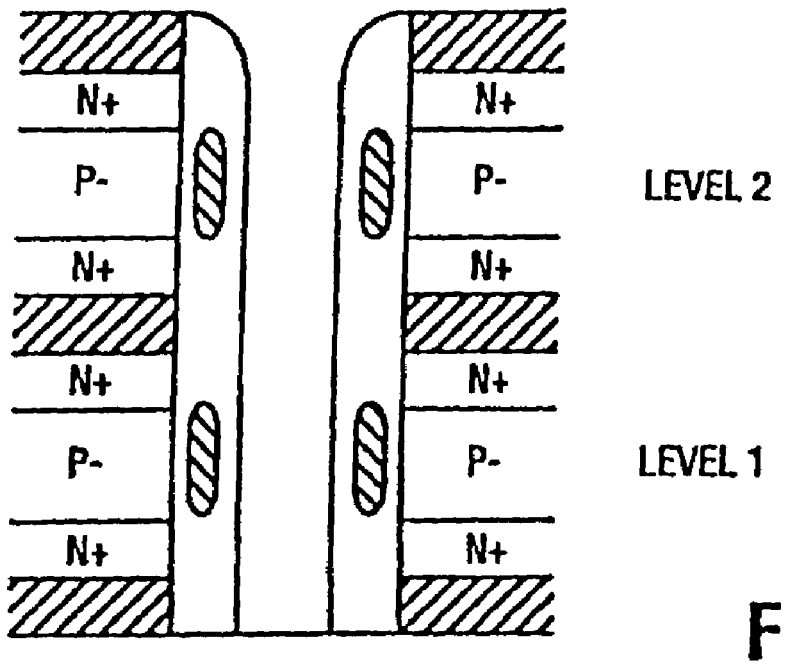
FIGS. 12A and 12B illustrate a method of forming a common continuous film control gate between two or more levels of pillar memories.
Figure 12B:
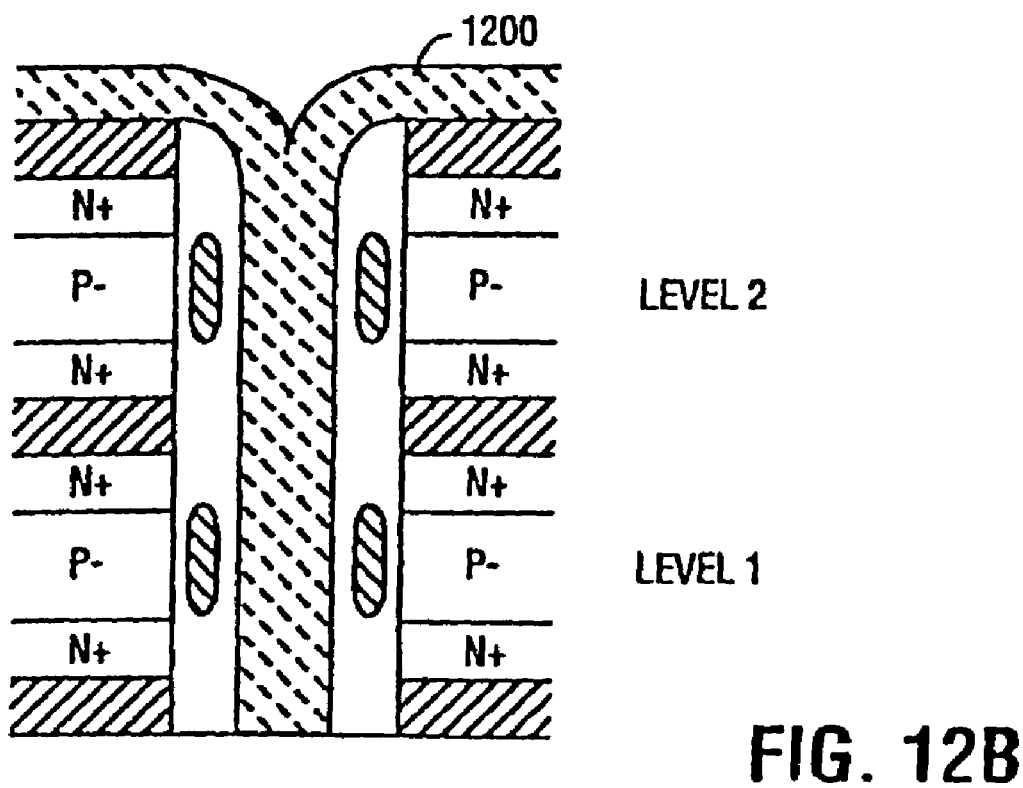

Additionally, vertical sharing of the control gate can be achieved by forming a control gate plug between adjacent cells after two or more levels of pillar have been formed as shown in FIGS. 12A and 12B. A control gate plug can be formed by blanket depositing a conductive film such as a doped polysilicon film or a tungsten film 1200 over and between two or more levels of pillars and then planarizing or patterning the portion of the tungsten film above the pillars to form a plug between pillars. In this way, the control gate would be shared with devices on two or more vertical levels and between horizontally adjacent cells.

A method of integrating the pillar memory device of the present invention into a multi-level array of storage cells will now be described. As shown in FIG. 13, the fabrication starts by providing a substrate 1300 on which the multilevel array of storage devices is to be formed. Substrate 1300 will typically include a lightly doped monocrystalline silicon substrate 1302 in which transistors such as metal oxide semiconductor (MOS) transistors are formed. These transistors can be used as, for example, access transistors or they can be coupled together into circuits to form, for example, charge pumps or sense amps for the fabricated memory devices. Substrate 1300 will typically also include multiple levels of interconnects and interlayer dielectrics 1304 used to couple transistors in substrate 1302 together into functional circuits. The top surface 1306 of substrate 1300 will typically include an insulating layer or passivation layer to protect the underlying transistors and interconnects from contamination. The top surface 1306 will typically contain electrical contact pads to which multilevel arrays of memory devices of the present invention can be electrically coupled in order to make electrical contact with the transistors in silicon substrate 1302. In an embodiment of the present invention, the memory devices are physically isolated and separated from the single crystalline substrate by multiple levels of interconnects and dielectric 1304. The top surface of passivation or insulating layer 1306 will typically be planarized to enable uniform and reliable fabrication of multiple levels of the charge storage devices of the present invention. FIG. 13A shows a cross-sectional view through the substrate while FIG. 13B illustrates an overhead view of the substrate looking down at the plane of the substrate 1300 across which the devices of the present invention are fabricated. According to one embodiment of the present invention, the memory devices are physically separated from monocrystalline silicon substrate 1302. In an alternative embodiment of the present invention, memory devices can be fabricated on a glass substrate 1300 such as used in flat panel displays.

A process of forming a multilevel array of memory devices in accordance with an embodiment of the present invention begins by blanket depositing a first conductor layer 1308 over surface 1306 of substrate 1300. Conductor 1308 can be any suitable conductor such as but not limited to, titanium silicide, doped polysilicon, or a metal such as aluminum or tungsten and their alloys formed by any suitable technique. Conductor layer 1308 is to be used as, for example, a bitline or a wordline to couple a row or column of memory devices together. Next, a stack 1310 of films from which the first level of pillars is to be fabricated is blanket deposited over conductor 1308 as shown in FIG. 13A. For example, in one embodiment the pillar is to comprise an N+ source/drain region, a P− silicon body, and an N+ silicon source/drain region. A suitable film stack 1310 can be formed by first blanket depositing an amorphous silicon film by chemical vapor deposition (CVD) which is in situ doped with N type impurities to a doping density between $1 \times 10^{19}$ to $1 \times 10^{21}$, preferably $1 \times 10^{19}$ to $1 \times 10^{20}$, atoms/cm$^3$. Next, a P− silicon film is deposited over the N+ silicon film 1312, by for example, depositing an amorphous silicon film by chemical vapor deposition and which is in situ doped with P type impurities (e.g., boron) to a dopant density of between $1 \times 10^{16}$ to $1 \times 10^{18}$ atoms/cm$^3$. An N+ silicon film 1316 is then blanket deposited over P− silicon body 1314 by depositing a amorphous silicon film by chemical vapor deposition and in situ doping it to a level between $1 \times 10^{19}$ to $10 \times 10^{21}$, preferably $10 \times 10^{19}$ to $1 \times 10^{20}$, atoms/cm$^3$. The amorphous silicon films can then be converted into polycrystalline silicon through a subsequent anneal. Alternative to in situ doping, the stack of films can be deposited as undoped silicon and then implanted or diffused with dopants.

It is to be appreciated that other memory devices in accordance with the present invention can be fabricated by depositing appropriate film stacks to achieve their pillar configurations such as metal/silicon/metal strip to form a device 400 as shown in FIG. 4, a P+/P−/N+ stack to form a device 500 as shown in FIG. 5, as well as an N+/SiO$_2$/N+ stack to form a device 300 as shown in FIG. 3A. Next, as shown in FIGS. 14A and 14B the blanket deposited film stack 1310 and metal conductor 1308 are patterned utilizing well-known photolithography and etching techniques to form a plurality of pillar strips 1318. The films of the deposited film stack 1310 and metal conductor 1308 are etched in alignment with one another and form strips with vertical sidewalls.

Figure 15A:
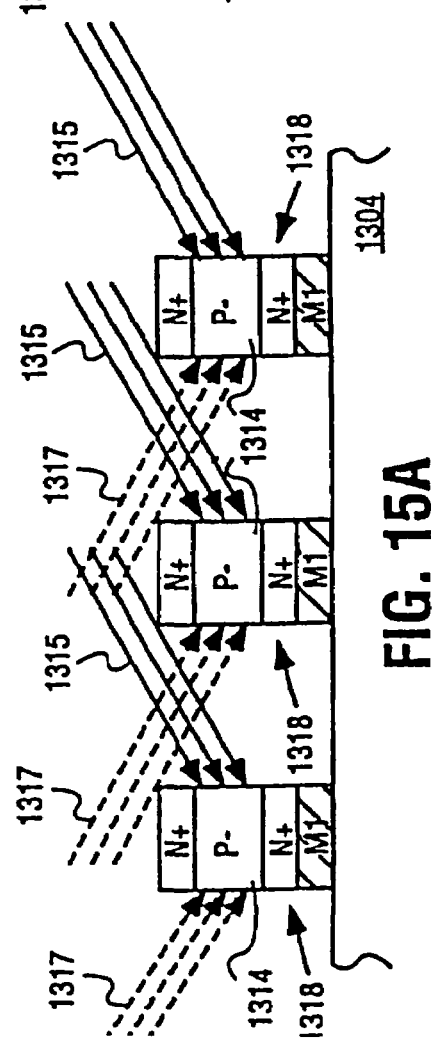
Figure 15B:
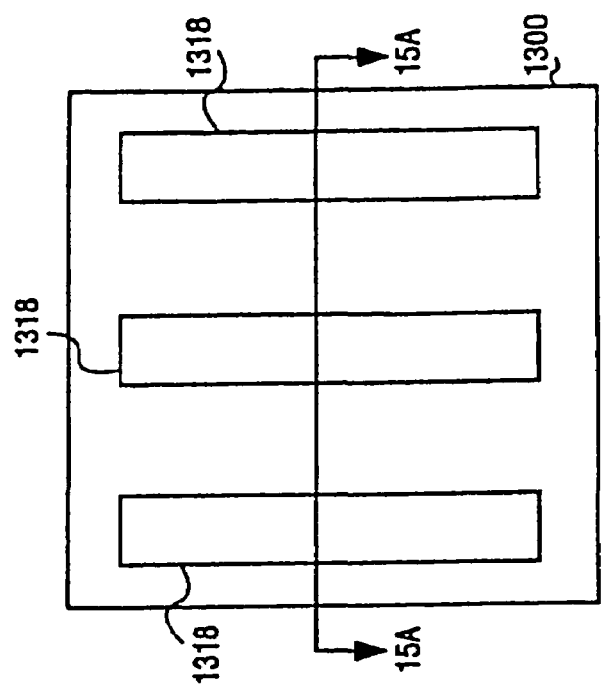

Next, as shown in FIGS. 15A and 15B, if desired, the substrate can be subjected to threshold adjusting ion implantation steps in order to alter the doping density of the surface or face of the P type silicon region on each strip. That is, at this time, a first ion implantation step 1315 can be used to implant one surface of pillar 1318 with P type dopants to increase its P type doping density or can be implanted with N type dopants to counterdope and decrease its P type doping density. Similarly, after the first implant 1315, the substrate can be rotated and subjected to a second ion implantation step 1317 to alter the doping density of the opposite side or face of pillars strips 1318. The threshold adjustment implants should be of a sufficient dose to sufficiently alter the threshold voltage of each face so as to be able to sufficiently distinguish or sense different read currents associated with each face. The angle of the ion implantation step is chosen so that the bulk of the implantation occurs into the surface of the P type body 1314. The angle of the implant is dependent upon the strip height as well as on the spacing between strips 1314.

Next, as shown in FIGS. 16A and 16B, tunnel dielectric 1320 is formed over the sidewalls and the top of strip 1318 as well as on substrate 1300 between strips 1318. Tunnel dielectric can be an oxide, a nitride, a oxynitride, or other suitable dielectric. The tunnel dielectric 1320 is preferably deposited utilizing a plasma deposition or growth process at a temperature of less than 750° C. and preferably less than 600° C. The tunnel dielectric 1320 is formed to a thickness and quality to prevent breakdown and leakage at operating conditions. Next, as also shown in FIGS. 16A and 16B, a floating gate material 1322 is blanket deposited over tunnel dielectric 1320. In a preferred embodiment of the present invention, the floating gate material is formed of nanocrystals.

Silicon nanocrystals can be formed by depositing silicon in a manner whereby silicon has a very high surface diffusivity relative to its sticking coefficient. For example, silicon nanocrystals can be formed by chemical vapor deposition (CVD), by decomposing silane (SiH$_4$) at a very low pressure, between 1 millitorr to 200 millitorr, at a temperature between 250–650° C. In such a process, a very thin deposition, between 50–250 Å, will form little islands 1322 of silicon. If H$_2$ is included with silane during the deposition, higher pressures can be utilized and still obtain nanocrystals. In an alternative embodiment of the present invention, metal nanocrystals such as aluminum nanocrystals, can be formed by sputtering from a metal target at a temperature near the melting temperature of the metal, so that the metal agglomerates and forms nanocrystals. Tungsten nanocrystals can be formed by chemical vapor deposition utilizing a reactant gas mix comprising a tungsten source gas such as WF$_6$ and germane (GeH$_4$). In still yet another embodiment of the present invention, a continuous film of floating gate material can be deposited and then caused to precipitate (by heating) to cause islands to form in the film.

It is to be appreciated that although nanocrystals are preferred for the floating gate because of their self isolating quality, the floating gate can be formed from a continuous film such as, but not limited to, a metal such as tungsten or a silicon film such as polycrystalline or amorphous silicon doped to the desired conductivity type (typically N+ silicon for an N+/P−/N+ pillar). If a continuous film is used as floating gate material 1322, the film 1322 would be anisotropically etched at this time to remove the portion of the floating gate material 1322 between strips 1318 to electrically isolate the strips.

Next, as also shown in FIGS. 16A and 16B, a control gate dielectric 1324 is blanket deposited over and onto floating gate material or nanocrystals 1322. The control gate dielectric 1324 is a deposited dielectric of, for example, an oxide or oxynitride film formed by a plasma enhanced deposition process to reduce the deposition temperature. The control gate dielectric 1324 has a thickness similar to the tunnel dielectric 1320 but slightly, e.g., 20–30 Å, thicker. The control gate dielectric 1324 is used to isolate the floating gate from a subsequently formed control gate. The thickness and quality of the control gate dielectric depends upon the program threshold voltage for programming and unprogramming the memory cell. As discussed above, the thickness of the tunnel dielectric as well as the thickness of the P type silicon body or channel are dependent upon the programming voltage desired.

Next, as shown in FIGS. 17A and 17B, a control gate material 1328 is blanket deposited on and over strips 1318. The control gate material is formed to a thickness at least sufficient to fill the gaps between adjacent strips. Typically, a conformal film deposited to a thickness of at least one-half the width of the gap 1330 will ensure complete filling of gap 1330. In an embodiment of the present invention, the control gate material 1328 is a doped polycrystalline silicon film formed by chemical vapor deposition. Alternatively, the control gate can be formed from other conductors such as a blanket deposited tungsten film formed by chemical vapor deposition utilizing $WF_6$. Next, as shown in FIGS. 18A and 18B, the control gate film 1328 is planarized back by for example, chemical mechanical polishing until the top surface of the control gate is substantially planar with the control gate dielectric on the top of strips 1318. A plasma etch process is then utilized to recess 1331 the top surface of the control gate material below the top surface of strips 1318 and preferably to slightly above the top source/body junction (e.g., junction of N+ silicon film 1316 and P− silicon film 1314) as shown in FIG. 18A. The control gate dielectric 1324 on the top of strips 1318 protects strips 1318 from etching during the recess etch. After the recess etch, control gates 1332A and B have been formed.

Figure 19B:
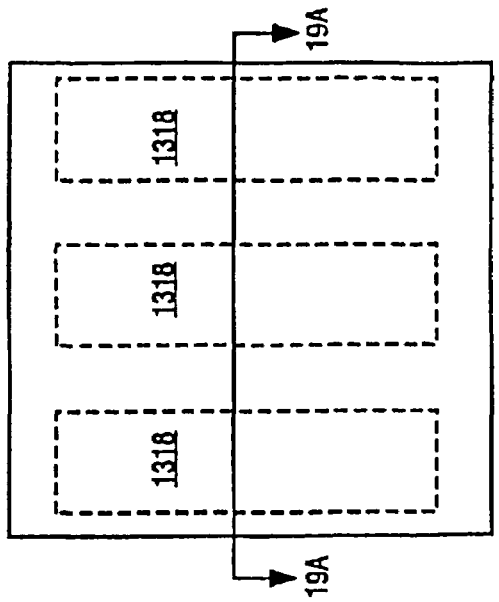
Figure 19A:
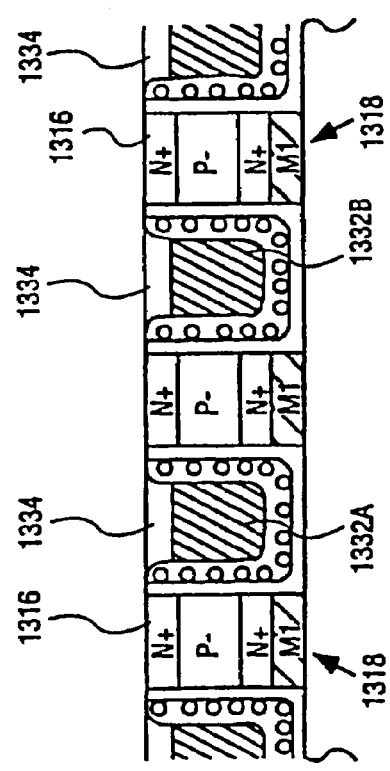

Next, an interlayer dielectric (ILD) 1334 such as an oxide, is blanket deposited over the top of strips 1318 as well as on and into recesses 1331 over control gate 1332. The deposited oxide layer 1334, as well as the control gate dielectric, the nanocrystals, and tunnel dielectric on the top of strips 1318 are then polished or etched back as shown in FIGS. 19A and 19B to reveal and open the surface of the top source/drain region (e.g., N+ film 1316) of each pillar strip 1318.

Figure 20B:
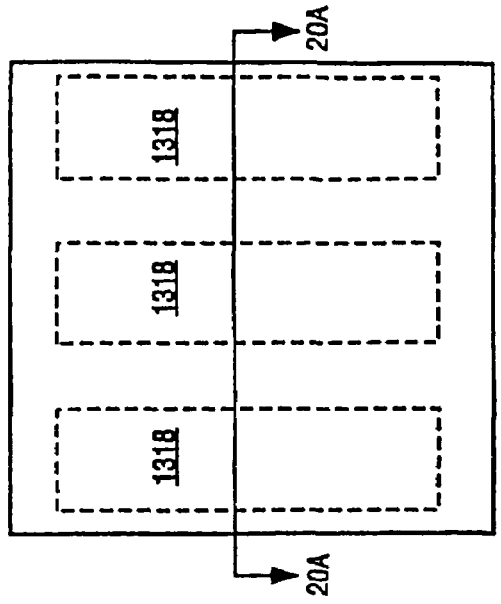
Figure 20A:
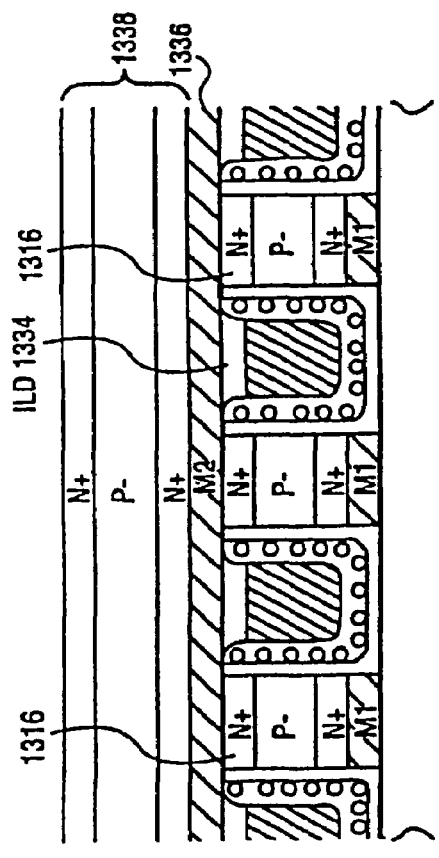

Next, as shown in FIGS. 20A and 20B, a second conductor layer 1336 is blanket deposited over and in contact with the top source/drain region (N+ source/drain region 1316) as well as over and onto ILD 1334. The second conductive layer 1336 will be used to form a second input/output (e.g., a bitline or a wordline) for the first level of memory devices and will be used to form a first input/output (e.g., a wordline or a bitline) for the second level of memory devices. Second conductive layer 1336 can be formed of materials and to thicknesses similar to first conductive layer 1308.

Next, a film stack 1338, such as an N+/P−/N+ stack, used to form the second level of pillars, is blanket deposited over second conductive layer 1336 as shown in FIGS. 20A and 20B. The film stack 1338 can be formed with the same materials and to the same thickness as used for film stack 1310. Alternatively, if a different type of memory device is desired, then a film stack corresponding to that device type would be formed.

Figure 21B:
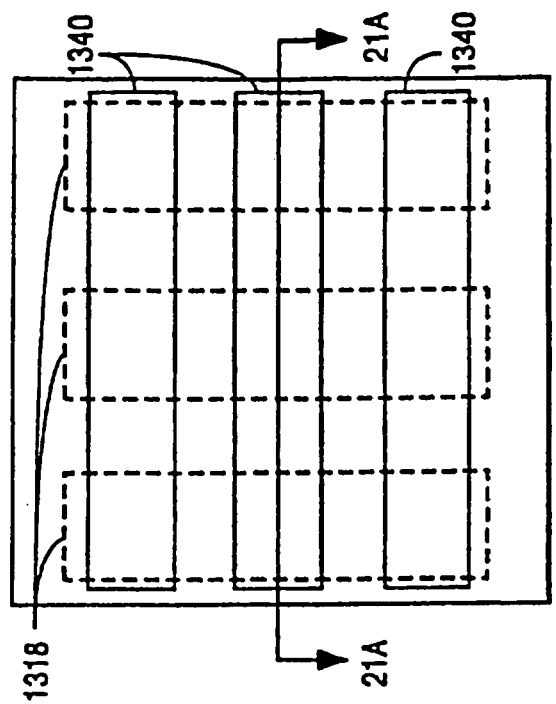
Figure 21A:
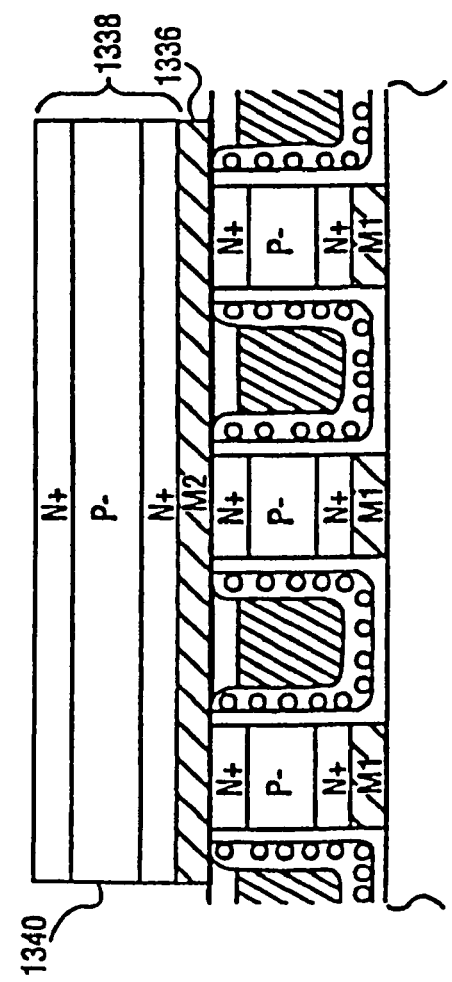

Next, as illustrated in FIGS. 21A and 21B, the second pillar stack 1338 and the second conductive layer 1336 are patterned with well-known photolithography and etching techniques to form a plurality of second pillar strips 1340 orthogonal or perpendicular to the first plurality of pillar strips 1318. It is to be appreciated that the films of the second pillar stack 1338 and the second conductive layer 1336 are etched in alignment with one another to form a strip with substantially vertical sidewalls.

FIGS. 22A and 22B show the substrate of FIGS. 21A and 21B rotated 90°.

Figure 23B:
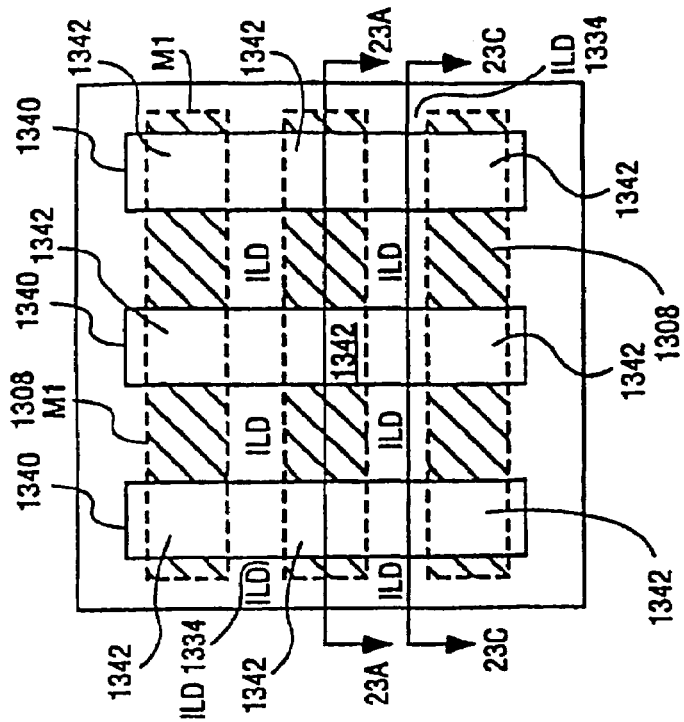
Figure 23A:
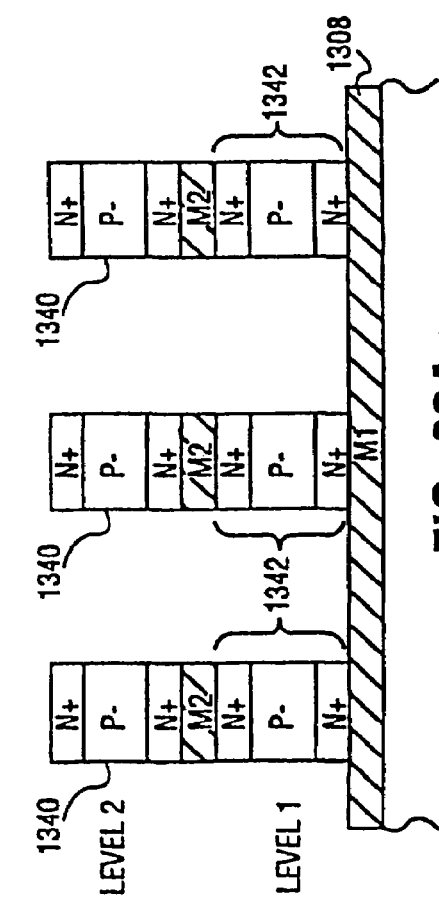
Figure 23C:
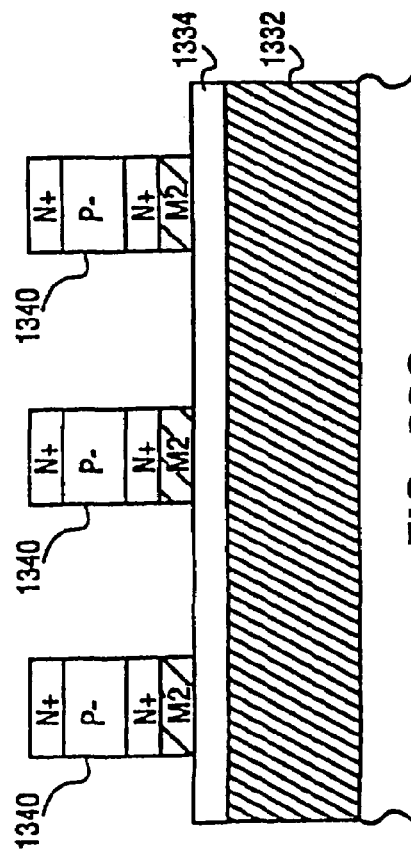

Once the second pillar film stack 1338 and second conductor 1336 have been patterned by etching into a strip 1340, the etch is continued to remove the portion 1341 of the first pillar strips 1318 not covered or masked by the second pillar strips 1340 as shown in FIGS. 23A and 23B. The etch is continued until the first conductive layer 1308 is reached. In this way, as shown in FIGS. 23A and 23B, a first level of square or rectangular pillars 1342 have been formed from first pillar strips 1318 at the intersections or overlaps of the first and second I/O 1308 and 1336 (shown as M1 and M2 in FIG. 23A). In an embodiment of the present invention square pillars having a width of less than 0.18 μm are formed. It is to be appreciated that the etch step preferably uses an etch that can selectively etch the pillar strip with respect to the ILD 1334 and the tunnel and control gate dielectrics. For example, if the pillar comprises doped silicon and the ILD and the tunnel and control gate dielectrics are oxides, then a plasma etch utilizing $Cl_2$ and HBr can etch silicon without significantly etching the oxide ILD or tunnel and control gate dielectrics. It is to be appreciated that ILD 1334 protects the underlying silicon control gate 1332 from being etched as shown in FIG. 23C. Additionally, the purpose of ILD 1334 is to electrically isolate control gates 1332 from subsequently formed control gates for the second level of pillars.

At this time, if desired, the substrate can be subjected to successive ion implantation steps to alter the doping density of each newly revealed surface of P type body 1314 of pillar 1342 (see FIG. 23A) in order to alter the doping density of each face and therefore the threshold voltage of each face.

Figure 24:
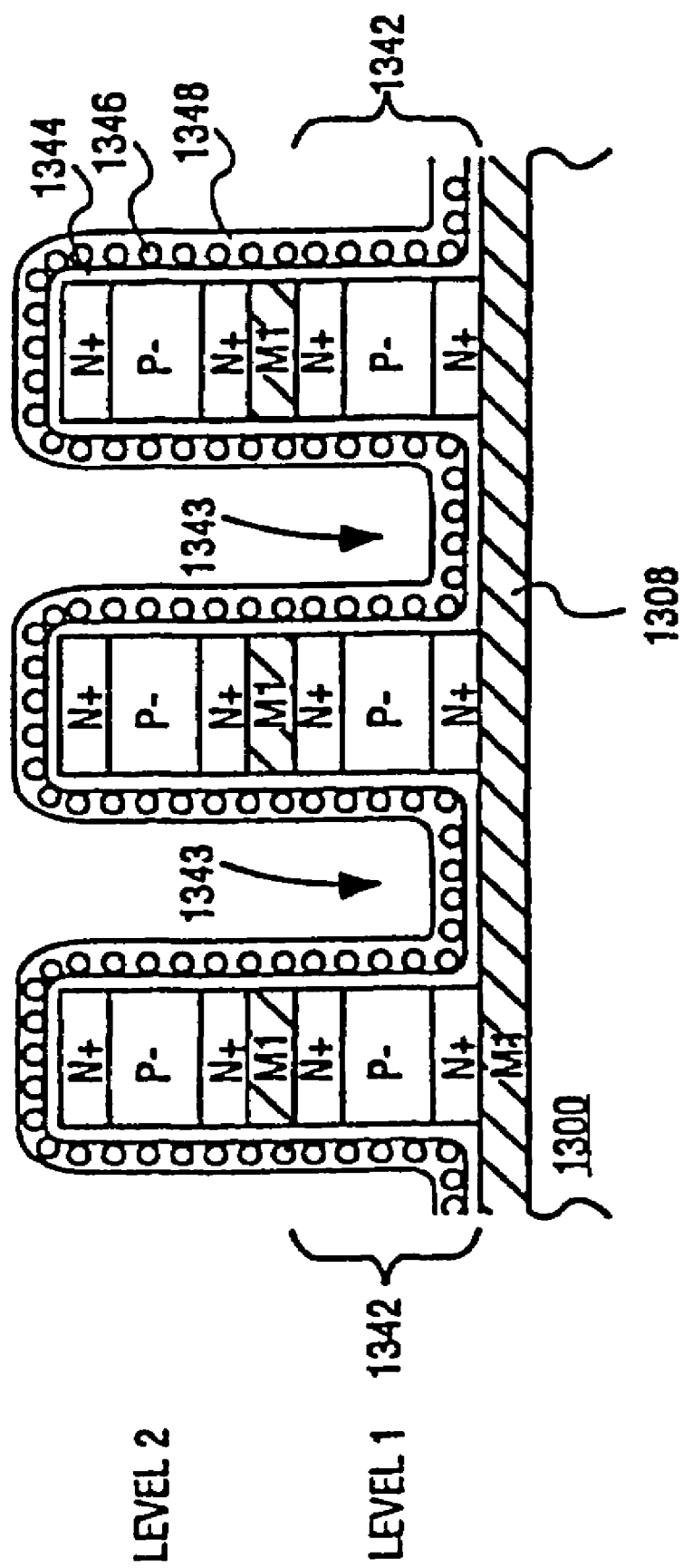

Next, as shown in FIG. 24, a tunnel dielectric 1344, a nanocrystal floating gate material 1346, and a control gate dielectric 1348 are each successively blanket deposited over substrate 1300 to form a tunnel dielectric/floating gate/control gate on the sidewalls of pillar devices 1342 as well as along the sidewalls of the second pillar strip 1340 (see FIG. 23A). This film stack also forms along the top surface of the second pillar strips 1340 as well as on the first conductor 1308 between the first level of pillars 1342 and on ILD 1334.

The floating gate material need not be anisotropically etched to remove floating gate material from gaps 1343 between adjacent pillars 1342 in order to isolate the pillars because although the floating gate material is conductive the non-continuous nature of the nanocrystals provides isolation between the pillars. In this way, the tunnel dielectric, floating gate, and control gate dielectric can be used to isolate a subsequently formed control gate from the first metal conductor. Additionally, because the floating gate 1346 is formed from nanocrystals, it is self isolating from the floating gate positioned directly above in Level 2 even though they have been formed at the same time.

Next, as shown in FIG. 25A a control gate 1350 is formed between second pillar strip 1340 as well as in the gaps 1343 between pillars 1342. The control gate can be formed as discussed above with respect to FIGS. 17–20 whereby a control gate film, such as doped polysilicon, is blanket deposited to fill the gaps 1343 between adjacent pillars 1342 as well as the gaps between second pillar strips 1340. Optionally, the control gate film would then be polished and recessed back below the top surface of the N+ source/drain regions and a second ILD 1352 formed in the recesses as shown in FIG. 25A to allow additional layers to be added. ILD 1352, the tunnel dielectric/floating gate/control gate dielectric on the top of the second pillar strip 1340 would then be polished back to reveal the top N+ source/drain regions of strips 1340.

At this point, the fabrication of the first level of memory devices is complete. Each pillar 1342 on the first level includes a separate floating gate and control gate on each face of the pillar for a total of four independently controllable charge storage regions as shown in FIG. 26. That is, as illustrated in FIG. 26, pillar 1342 contains a first pair of control gates 1332A and B formed along laterally opposite sidewalls of the pillar 1342. The control gates 1332A and B are each also shared with the horizontally adjacent pillars. Pillar 1342 also contains a second pair of control gates 1350A and B formed along laterally opposite third and fourth faces of pillar 1342. Each control gate 1350 will be shared with the subsequently formed pillar memory device position vertically above, in Level 2, as well as with horizontally adjacent pillars 1342 in the same level. Because pillar 1342 contains four independently controllable control gate and four associated and isolated floating gates, each pillar memory device 1342 is able to store multiple states.

The process as described with respect to FIGS. 20–25 can be repeated again to complete the fabrication of memory devices on the second level and to begin the fabrication of the memory device on the third level. That is, as shown in FIGS. 27A and 27B (FIG. 26 rotated 90°) the steps of FIGS. 20–25 can be repeated to form third pillar strips 1360 orthogonal to the second pillar strips 1340 which are used to pattern the second pillar strips 1340 into a plurality of second pillars 1362 on a second level and to form a second pair of control gates 1364 adjacent to the second pillars.

In this way, a second level of memory pillars 1362 are fabricated which contain four independently controllable control gates and four associated and isolated floating gates. A first pair of control gates 1350A and B are formed along laterally opposite sidewalls of the second level of pillars 1362 and are shared with memory pillar 1342 located on the first level as well as with horizontally adjacent cells. A second pair of control gates 1364A and B are formed along the third and fourth laterally opposite faces of the second level of pillars 1362 and are shared with the subsequently formed pillars in the third level of the memory array.

The above described processes can be repeated as many times as desired to add additional levels of pillar memory to the array. The final level of memory cells can be patterned from a pillar stack strip while patterning the final I/O.

Although the three terminal memory pillar devices of the present invention have been shown integrated into a three dimensional memory array in a specific preferred embodiment, it is to be appreciated that other methods may be utilized to fabricate a three dimensional memory array without departing from the scope of the present invention.

Figure 29A:
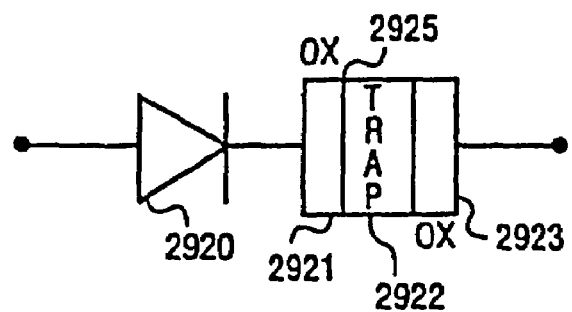
FIG. 29A is a representation of a memory cell of an embodiment of the present invention.

2. Memory Cells Utilizinq a Charge Storage Medium Located Above or Below a Semiconductor Region In FIG. 29A, the cell comprises a diode and a stack comprising regions 2921, 2922 and 2923. The region 2921 comprises a first dielectric region and the region 2923 comprises a second dielectric region. Disposed between these regions is a storage region 2922 which is used to trap charge. It is primarily this region that retains charge and thus provides the "memory" of the cell. As will be described below, charge can be electrically placed within the region 2922, electrically sensed and electrically removed from the region 2922.

The region 2921 comprises an oxide with a thickness, typically between 1–5 nm, and preferably 2–3 nm. In one embodiment, the region 2921 is referred to in this application as a tunnel dielectric. The region 2922 is a region that stores trapped charge, as known in the prior art such as a nitride region (discussed in more detail below). In one embodiment, the region 2922 is referred to in this application as a storage dielectric. The region 2923, which may comprise an oxide, acts as a barrier for retaining a trapped charge and in one embodiment is referred to in this application as a blocking dielectric. It may have thicknesses similar to those of region 2921.

Figure 29B:
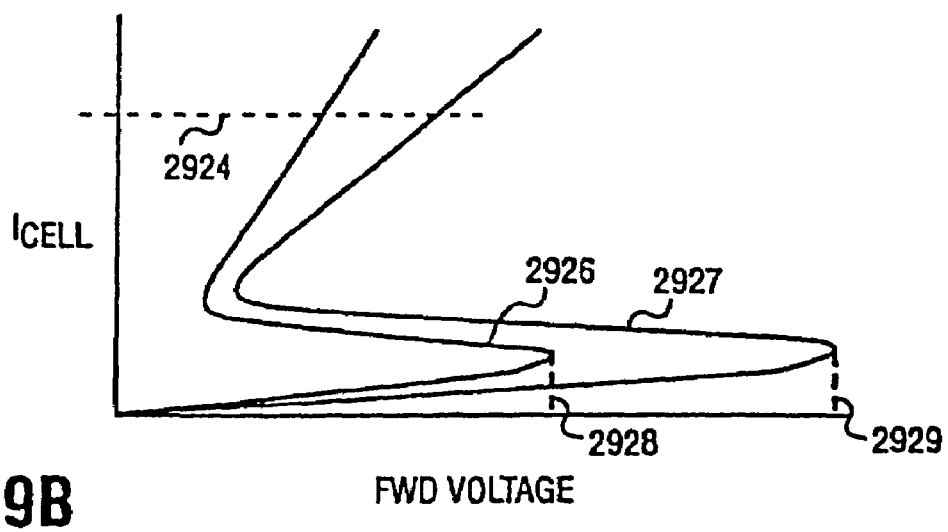
FIG. 29B is a graph illustrating the characteristics of the cell of FIG. 29A.

Because electrons carry the forward current in the diode once punch through occurs, these are the species that are trapped at the tunnel dielectric-storage dielectric interface 2925 and within the region 2922. Note that these electrons are of a polarity to encourage the premature inversion of the N region at the interface region 2921. Thus, stored electrons reduce the voltage at which first appears the negative-resistance portion of the cell's characteristic, see curve 2926 versus curve 2927 of FIG. 29B.

In one embodiment, programming consists of applying a sufficient forward bias to the diode to cause the device to conduct and allowing forward current to persist long enough for sufficient charge to become trapped thereby shifting the voltage threshold from the peak forward voltage shown for curve 2927 to the peak forward voltage shown for curve 2926. While throughout the discussion that follows, binary programming is discussed, multiple bits may be stored per cell by employing multiple values of threshold shifts. By analogy, some flash memories store 2–4 bits per cell or even more.

Reading (sensing) may be performed by applying a forward voltage that falls between the peaks 2928 and 2929. If current in excess of a predetermined threshold value flows, the cell is programmed; if conduction does not occur it is not programmed. The conduction that does flow through a programmed cell during a read operation reinforces the trapped charge.

Erasing is accomplished by applying a sufficient reverse bias to the memory cell that electrons tunnel out of the traps, through the blocking oxide 2923 or through the flow of holes so as to neutralize the trapped electrons. This action necessarily requires the diode to operate in breakdown, so the erase voltage will require at least the lower end of a breakdown voltage.

A. Two Terminal Cell in a Substrate

Figure 30:
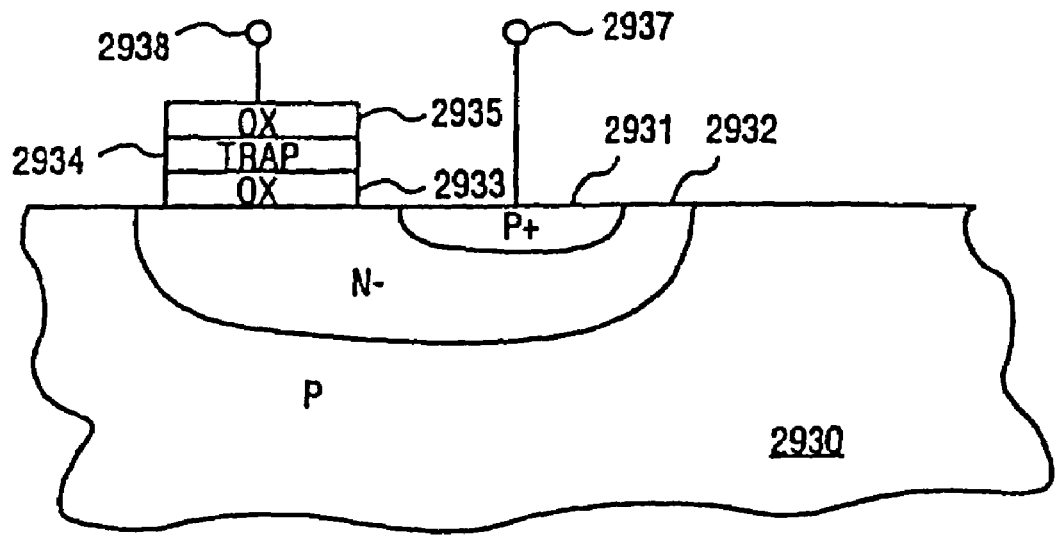
FIG. 30 is a cross-sectional elevation view of a two terminal cell built in accordance with an embodiment of the present invention.

Referring to FIG. 30, a first embodiment of the invented memory cell is illustrated disposed in a p-type substrate 2930. A diode (steering element of the cell) is formed in the substrate comprising an n− region 2932, doped, for instance to a level of $5 \times 10^{16} - 10^{18}$ cm$^{-3}$, and a p+ region 2931, doped to >$10^{19}$ cm$^{-3}$ formed within the n– region 2932. These regions may be formed with well-known methods such as diffusion or ion implantation.

A storage stack comprising a dielectric (e.g., oxide) region 2933, trapping layer 2934 and a second dielectric (e.g., oxide) region 2935 is formed on the region 2932.

The dielectric region 2933 may be a grown oxide layer or a deposited silicon dioxide region. When comprising oxide, this region may be 1–5 nm thick. Ordinary processing may be used to form these regions.

The trapping region 2934 and the other trapping regions discussed in this application may be formed from a compound of nitrogen as well as other materials. In the prior art, silicon nitride (nitride) was most commonly used for this purpose. Other layers that may be used that have compounds of nitrogen are oxynitride (ON) and oxide-nitride-oxide (ONO). Other materials, alone or in combination, that exhibit charge trapping characteristics can be used. For instance, alumina ($Al_2O_3$) and silicon dioxide with insulated regions of polysilicon exhibit these characteristics. The trapping region is generally between 2–20 nm thick, and preferably 3–10 nm thick.

The regions 2933 and 2934 have thicknesses determined by factors well-known in the art for SONOS memories. For example, the tunnel dielectric region needs to be thin enough to permit tunneling without excess voltage drop and to provide longevity, while the trapping dielectric region must be thick enough not to allow significant spontaneous detrapping of charge. As mentioned above, typical thicknesses are in the range of 1–5 nm, and preferably 2–3 nm for the oxide region 2933 and 3–10 nm for the trapping region where nitride is used.

The layer 2935 is an oxide or other dielectric region which may have the same thickness as region 2933. Other dielectrics that may be used include perovskites, ceramics, diamond (and diamond-like films), silicon carbide, and undoped silicon (including polysilicon). This region may be formed by well-known deposition techniques. The region 2933, as previously mentioned, is referred to as a tunnel dielectric layer and is responsible, at least in part, for the negative-resistance characteristics previously discussed. The layer 2935, on the other hand, prevents trapped charge from region 2934 from leaking to, for instance, contact 2938. Hence, layer 2935 is sometimes referred to as the blocking dielectric.

The storage stack comprising regions 2933, 2934 and 2935 may be fabricated in a single, continuous process where, for instance, gas mixtures in a deposition chamber are altered to first provide oxide then nitride and finally oxide again. Because of the relative thinness of these regions, the entire stack may be laid down in a matter of seconds.

To operate the cell of FIG. 30 first assume that upon manufacturing the trapping layer is neutral, that is, there is no trapped charge in the trapping region 2934. To place charge in the region 2934 the anode contact 2937 is brought to a positive potential relative to the contact 2938 in order to forward bias the diode defined by the regions 2931 and 2932 until the potential reaches the voltage 2929 shown in FIG. 29B. Now tunneling occurs through the oxide 2933 as well as the oxide 2935 and charge is trapped within the region 2934. The amount of charge trapped depends on total current flow and the trapping efficiency of the region 2934.

To sense the presence of this charge, a potential is applied between lines 2937 and 2938 again to forward bias the diode defined by regions 2931 and 2932. However, this time the potential is in a range greater than the voltage 2928 shown in FIG. 29B but less than the voltage 2929. If current in excess of a predetermined threshold flows, then it is known that charge is trapped in the region 2934. On the other hand, if such current flow does not occur, it is known that little or no charge has been stored in the layer. In this way it can be determined whether the cell is programmed or not programmed for the binary data case. As previously mentioned, different levels of charge may be placed in the trapping layer 2934, and the voltage at which said current flow occurs (say between voltages 2928 and 2929) can be determined. This corresponds to the amount of charge in the layer 2934 that can be used to provide more than one bit of data from an individual cell.

It should be noted that during a read operation the read current passes through a programmed cell, and then passes through the region 2933, trapping region 2934 and the oxide region 2938. This is unlike the typical sensing that occurs where trapped charge is used to shift a threshold voltage in, for example, a field-effect transistor where the current does not pass through the trapped charge region itself when reading the state of the cell. As mentioned earlier, when the current does pass through the region 2934 for reading it, in effect, refreshes the cell; that is if the cell was originally programmed it will remain programmed when the data is read from the cell.

Care must be taken when reading data from the cell not to exceed a current represented by line 2924. If a current exceeds this limit, for example, 5000–10,000 amps/cm$^2$, one or both of the oxide regions 2933 or 2935 may be permanently damaged and may likely provide a short circuit or open circuit.

To erase the data in the cell the diode is reverse biased: that is, the anode is brought negative relative to the cathode. When sufficient potential is applied, the diode breaks down and (e.g., avalanches, Zeners, or punches through) and strips the charge from the region 2934. It may be necessary to float the substrate 2930 during erasing to prevent forward biasing the junction between layer 2932 and the substrate 2930. Other isolation methods such as shallow-trench isolation (STI) or silicon-on-insulator (SOI) may be used as well.

B. Three Terminal Cell in the Substrate

Figure 31:
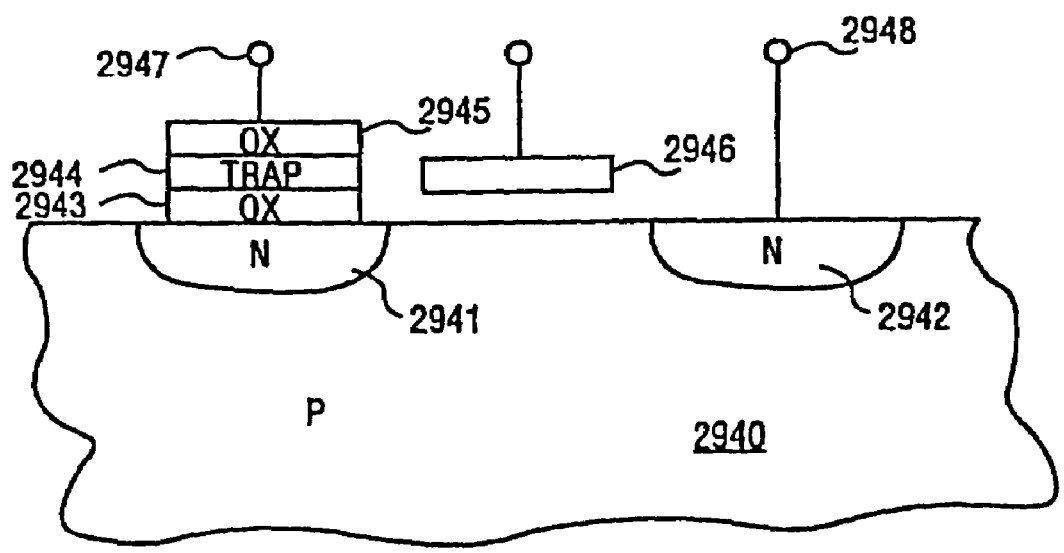
FIG. 31 is a cross-sectional elevation view of a three terminal cell built in accordance with an embodiment of the present invention.

In FIG. 31 the cell incorporates a field-effect transistor having a source and drain region and a gate 2946. Regions 2941 and 2942 are formed in alignment with gate 2946 in the substrate 2940 as is well-known in the art. A stack comprising an oxide region 2943, trapping region 2944 and oxide region 2945 are formed on region 2941. The regions 2943, 2944 and 2945 may be the same as regions 2933, 2934 or 2935 of FIG. 30.

In this embodiment, rather than forward biasing a diode, a positive potential is applied to gate 2946 and contact 2948 is maintained positive relative to contact 2947. This is done for programming and reading of the cell. To erase the cell, contact 2948 is negative relative to contact 2947, causing trapped charge to be removed from the region 2944. For both the embodiments of FIGS. 30 and 31 it may be more desirable in some memory arrays to erase an entire array at one time through the substrate by reverse biasing, say, the region 2941 and substrate 2940. If desired, the cells of FIGS. 30 and 31 may be formed above the substrate rather than in the substrate and/or stacked in three dimensions.

C. Three-Dimensional Embodiment Employing Rail-Stacks

In U.S. application Ser. No. 09/560,626, filed Apr. 28, 2000, and its co-pending continuation-in-part, U.S. application Ser. No. 09/814,727, filed on Mar. 21, 2001 both assigned to the assignee of the present invention and entitled "Three-Dimensional Memory Array Method of Fabrication," a three-dimensional memory array fabricated on the substrate and employing rail-stacks is disclosed. The technology described in this patent application may be used to fabricate three-dimensional charge trapping or storage memories in accordance with the present embodiment of present invention, as discussed below.

Figure 32:
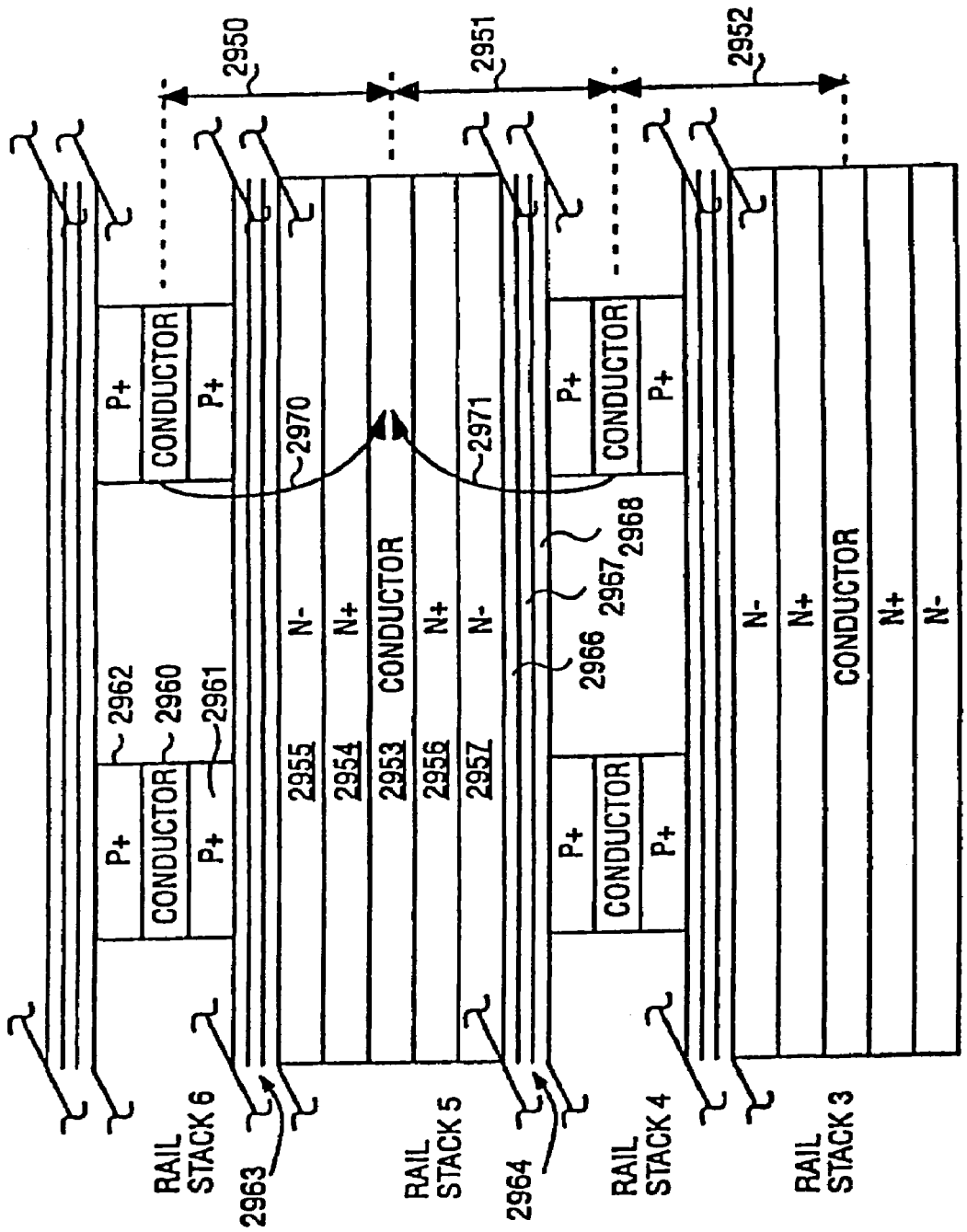
FIG. 32 is a cross-sectional elevation view of a three-dimensional memory array employing rail stacks built in accordance with an embodiment of the present invention.

In FIG. 32, three full levels of a memory array are shown, specifically levels 2950, 2951 and 2952. Each level comprises a plurality of parallel, spaced-apart rail-stacks. Rail-stacks 3 and 5 of FIG. 32 extend in a first direction and rail-stacks 4 and 6 extend in a second direction, typically perpendicular to the first direction. Each of the rail-stacks of FIG. 32 includes a conductor or input/output at the center of the rail stack and semiconductor regions disposed on both sides of the conductor. For the embodiment of FIG. 32, first alternate rail-stacks, for instance rail-stacks 3 and 5, are fabricated from n type polysilicon disposed on the conductors. The second alternate rail-stacks 4 and 6 have p– type polysilicon on the conductors.

More specifically, referring to rail stack 5, it includes the center conductor or input/output 2953, for instance, an aluminum or silicide conductor, n+ regions 2954 and 2956 disposed on both sides of the conductor and n– regions 2955 and 2957 disposed on the regions 2954 and 2956, respectively. The n+ regions may be doped to a level of >$10^{19}$ cm$^{-3}$ and the n– regions to a level of $5 \times 10^{16}$–$10^{18}$ cm$^{-3}$. Rail-stacks 4 and 6 again include a conductor or input/output, such as conductor 2960 with p+ regions disposed on both sides of the conductor shown as p+ regions 2961 and 2962 for one of the rail-stacks. The fabrication of these regions and the entire set of rail-stacks is described in the above-referenced application, which is hereby incorporated by reference herein.

In the above-referenced application, a blanket layer of an anti-fuse material is used between the rail-stacks. With the present invention three blanket layers are used between each level of rail-stacks. Specifically, layers 2963 are disposed between the rail-stacks 5 and 6 and layers 2964 between the rail-stacks 4 and 5. The layers 2963 and 2964 correspond to the layers 2933, 2934 and 2935 of, for example, FIG. 30. Thus, layer 2964 comprises a dielectric (e.g., oxide) layer 2966 which may have a thickness of 1–5 nm, and preferably 2–3 nm, a trapping layer 2967 such as a silicon nitride layer which may have a thickness of 2–20 nm, and preferably 3–10 nm, and a dielectric (e.g., oxide) layer 2968 which may have a thickness similar to that of layer 2966. The materials described above for forming the regions 2933, 2934 and 2935 of FIG. 30 apply to the layers 2966, 2967 and 2968 of FIG. 32.

A cell in the array of FIG. 32 occurs at the intersection of the rail-stacks. For the embodiment of FIG. 32, the storage stack is disposed between the p and n regions of a diode. That is, the storage stack is embedded in the steering element. For example, conductor 2960 provides access to one of the cells through the p region 2961. The layers 2963 are disposed between the p region 2961 and n– region 2955. The other contact for this two terminal cell is through region 2954 onto conductor 2953.

The cells of FIG. 32 are programmed, read and erased in the same manner as described above for the cell of FIG. 30.

With the configuration of FIG. 32 the diodes in adjacent pairs of memory array levels "point" to a common conductor. More specifically, referring to FIG. 32, the illustrated cells at memory array level 2950 have their cathodes connected to conductor 2953. The illustrated cells in memory level 2951 also have their cathodes connected to conductors 2953. This simplifies fabrication, programming, reading and erasing since the conductor 2953 serves two sets of cells.

In the above-referenced application there are several embodiments having different rail-stack configurations that may be used to fabricate a three-dimensional array using a preferred storage stack of the present invention.

D. Three-Dimensional Embodiment Employing Pillar Diode Structures

In U.S. Pat. No. 6,034,882 a three-dimensional memory array is disclosed employing a plurality of levels, each level having parallel, spaced-apart conductors. The conductors at the alternate levels are perpendicular to one another. Pillar structures are formed at the intersection of a conductor in adjacent levels. The structures, as described in the patent, are formed in alignment with the conductors. The fabrication technology described in this patent may be used to fabricate memory arrays employing the cell having a charge storage or trapping region of the present embodiment.

Figure 33:
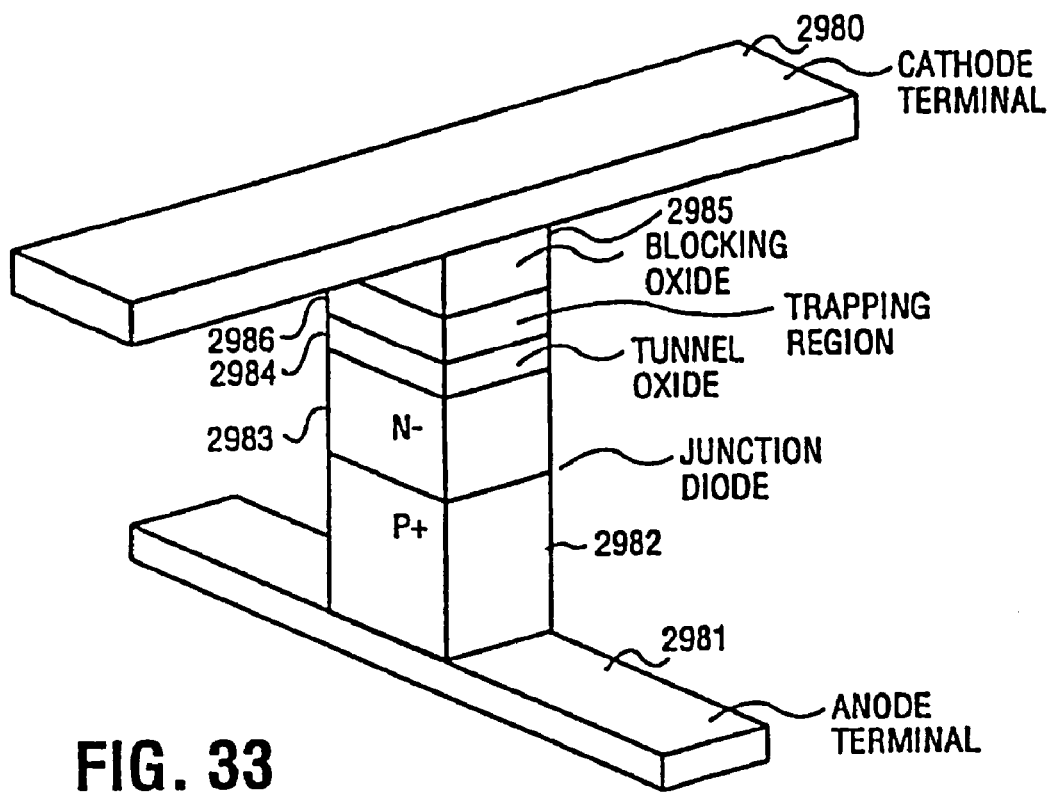
FIG. 33 is a perspective view of a cell formed as a pillar above a substrate in accordance with an embodiment of the present invention.

Referring to FIG. 33 a single level of the three-dimensional memory is illustrated having a conductor or input/output 2981 at one level and a conductor 2980 at the next level in the array. A pillar structure is formed in alignment with the conductors 2980 and 2981. This pillar structure forms a cell in accordance with the present invention. Specifically, referring to FIG. 33, the cell includes a steering element comprising a junction diode comprising the p+ region 2982, n– region 2983 and the storage stack. As shown in FIG. 33 the storage stack comprises a tunnel oxide region 2984, a trapping region 2986 and a blocking oxide 2985.

As described in the above patent, the conductors 2980 and 2981 are shared with cells disposed above and below the single cell shown in FIG. 33.

Figure 34:
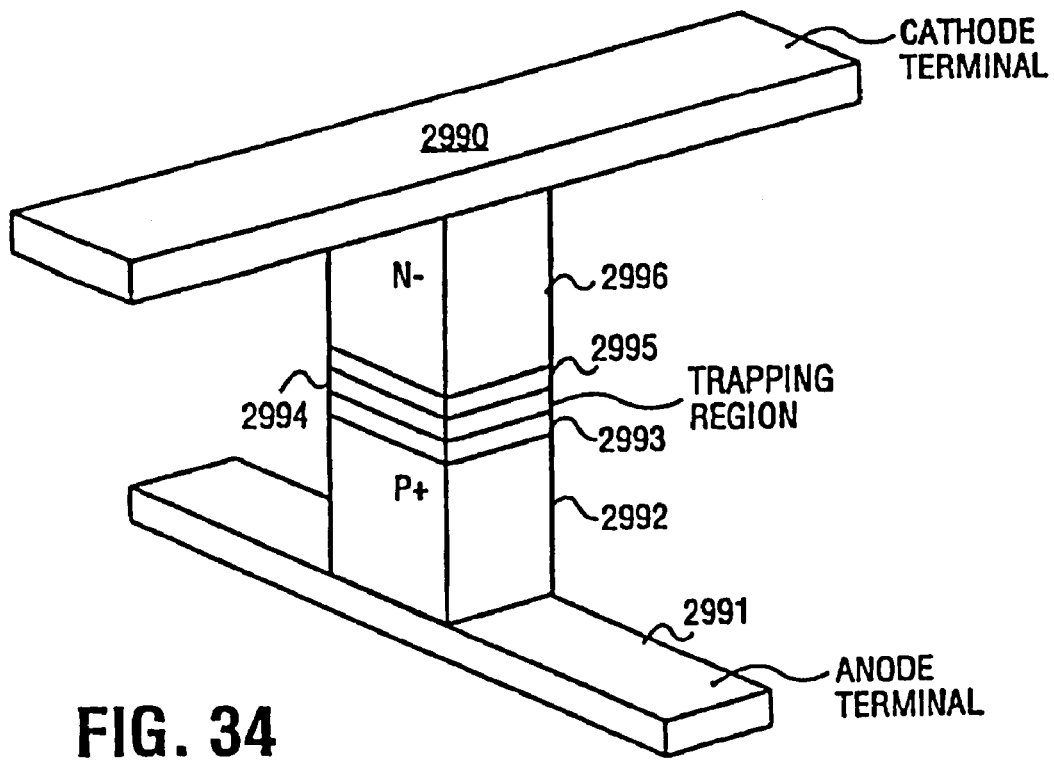
FIG. 34 is another embodiment of a cell formed as a pillar.

FIG. 34 shows another embodiment where again there are spaced-apart, parallel conductors or input/output at one level such as conductor 2991 and parallel, spaced-apart conductors at the next level such as conductor 2990. A pillar structure is again fabricated between the conductors 2990 and 2991 as taught by the above-referenced patent. The difference, however, between the structure of FIGS. 33 and 34 is that the storage stack comprising the blocking oxide 2993, trapping region 2994 and tunnel oxide 2995 is disposed between the p and n regions of the diode. Specifically, the p+ region 2992 of the diode is in contact with the blocking oxide 2993 and the n– region 2996 is in contact with the tunnel oxide 2995.

The thicknesses of the various regions shown in FIGS. 33 and 34 and the doping for the polysilicon diode may be similar to embodiments previously discussed in this application. The programming, reading and erasing of the structures of FIGS. 33 and 34 are also performed as described above for the other embodiments. For the embodiments of FIGS. 32, 33 and 34 the array of cells is disposed above a substrate with the peripheral circuits being formed in the substrate.

II. Self-Aligned EEPROM TFT Array

Another cell configuration that differs from pillar configuration is the self aligned TFT. The present inventors have realized that memory and logic cell area is enlarged by misalignment tolerances that are put into place to guarantee complete overlap between features on different layers. Thus, the present inventors have developed a fully aligned memory or logic cell structure which does not require misalignment tolerances. Therefore, such a cell structure has a smaller area per bit (i.e., per cell) and uses fewer mask steps. The fully aligned cell structure increases array density and decreases die size and cost. Furthermore, by optionally stacking the cells vertically in the Z-direction, the array density is further increased, which leads to further decreases in the die size and cost.

As described with respect to the preferred embodiments of the present invention, there are several different ways of achieving a fully aligned or self-aligned memory or logic cell. In cases of memory or logic cells containing an EEPROM, full alignment may be achieved by self alignment of the word line to the control gate. Preferably, the word line extends substantially parallel to the source-channel-drain direction of the EEPROM, while the bit line extends substantially perpendicular to the source-channel-drain direction of the EEPROM. In this configuration, bit line contact pads (i.e., source and drain electrodes) and bit line contact vias are not required because the bit lines may be formed in self alignment with the EEPROM gate(s) directly on the source and/or drain regions of the EEPROMs. Furthermore, since the EEPROMs are fully self aligned, the bit and word lines may have a substantially planar upper surface, which improves the reliability of the device.

Preferably, the EEPROMs are TFTs arranged in a three dimensional virtual ground array (VGA) non volatile flash memory, where each vertically separated level is separated from an adjacent level by an interlayer insulating layer. However, the EEPROMs may be formed in a single level array or in a bulk semiconductor substrate. The preferred aspects of the present embodiment may also be applied to non volatile flash memory architectures other than VGA, e.g., to NOR-type memory and Dual String NOR (DuS-NOR) memory. Furthermore, the present invention is not limited to TFT EEPROM flash memory arrays, and also encompasses other semiconductor devices within its scope. For example, the self aligned transistors may be MOSFETs in a bulk substrate or non-EEPROM TFTs formed over an insulating substrate. These self aligned transistors may be used as non-flash EEPROMs (i.e., EEPROMs where each transistor is erased separately), UV erasable PROMs (EPROMs), mask ROMs, dynamic random access memories (DRAMs), liquid crystal displays (LCDs), field programmable gate arrays (FPGA) and microprocessors.

FIGS. 37–44 illustrate a method of making a TFT EEPROM nonvolatile flash memory array 4001 according to the first preferred embodiment of the present invention.

Figure 37:
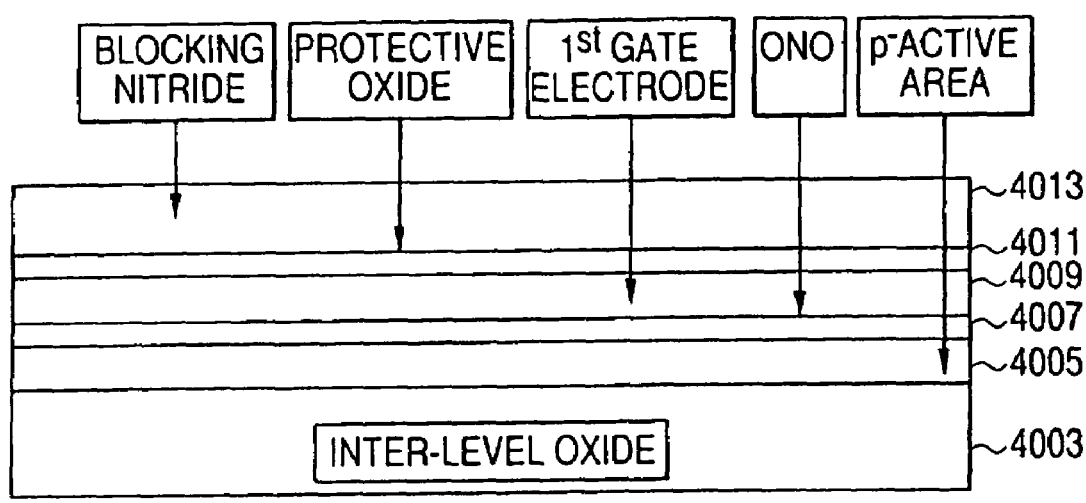
FIG. 37 is a side cross-sectional view of a wafer after ONO dielectric, first gate electrode, protective oxide and blocking nitride layers have been deposited in a method according to an embodiment of the present invention.

First, a substrate having an insulating surface (i.e., a Silicon-On-Insulator (SOI) substrate) is provided for the formation of the memory array. The substrate may comprise a semiconductor (i.e., silicon, GaAs, etc.) wafer covered with an insulating layer, such as a silicon oxide or nitride layer, a glass substrate, a plastic substrate, or a ceramic substrate. In a preferred aspect of the first embodiment, the substrate is a monocrystalline bulk silicon substrate that has received prior processing steps, such as forming CMOS (complementary metal oxide semiconductor) transistors in the substrate. The CMOS transistors may comprise peripheral or driver circuitry for the memory array. In the most preferred aspect, the circuitry comprises row and column address decoders, column input/outputs (I/O's), and other logic circuitry. However, if desired, the driver circuitry may be formed on an insulating substrate, such as a silicon-on-insulator substrate, a glass substrate, a plastic substrate, or a ceramic substrate. The silicon-on-insulator substrate may be formed by any conventional method, such as wafer bonding, Separation by Implantation of Oxygen (SIMOX), and formation of an insulating layer on a silicon substrate. After the peripheral circuitry is completed, an interlayer insulating layer 4003 is conformally deposited over the circuitry as shown in FIG. 37. The interlayer insulating layer 4003 may comprise one or more of any suitable insulating layers, such as silicon oxide, silicon nitride, silicon oxynitride, PSG, BPSG, BSG, spin-on glass and/or a polymer dielectric layer (such as polyimide, etc.). The interlayer insulating layer 4003 is preferably planarized using chemical-mechanical polishing (CMP), but in other embodiments can be planarized by etch back and/or any other means.

A semiconductor active area layer 4005 is then deposited over the insulating layer 4003 to complete the SOI substrate. The semiconductor layer will be used for the transistor active areas. Layer 4005 may have any desired thickness, such as 20 to 120 nm, preferably 70 nm, and is chosen so that in depletion regime the space charge region below the transistor gate extends over the entire layer. Preferably, the semiconductor layer 4005 comprises an amorphous or polycrystalline silicon layer doped with first conductivity type dopants. For example, layer 4005 may be p-type doped by in-situ doping during deposition, or after deposition by ion implantation or diffusion.

If desired, the crystallinity of the semiconductor layer 4005 may be improved by heating the layer 4005. In other words, an amorphous silicon layer may be recrystallized to form polysilicon or a grain size of a polysilicon layer may be increased. The heating may comprise thermal or laser annealing the layer 4005. If desired, catalyst induced crystallization may be used to improve the crystallinity of layer 4005. In this process, a catalyst element such as Ni, Ge, Mo, Co, Pt, Pd, a silicide thereof, or other transition metal elements, is placed in contact with the semiconductor layer 4005. Then, the layer 4005 is thermally and/or laser annealed. During the annealing, the catalyst element either propagates through the silicon layer leaving a trail of large grains, or serves as a seed where silicon crystallization begins. In the latter case, the amorphous silicon layer then crystallizes laterally from this seed by means of solid phase crystallization (SPC).

It should be noted that the deposition of amorphous or polysilicon layer 4005 may be omitted if a single crystal SOI substrate is used. In this case, using the SIMOX method, oxygen ions are implanted deep into a single crystal silicon substrate, forming a buried silicon oxide layer therein. A single crystal silicon layer remains above the buried silicon oxide layer.

Next, the surface of the active area layer 4005 is preferably cleaned from impurities and a native oxide is removed. A charge storage region 4007 is then formed on the layer 4005. In the first preferred embodiment of the present invention, the charge storage region 4007 comprises an oxide-nitride-oxide (ONO) dielectric triple layer. This dielectric comprises a first (bottom) $SiO_2$ layer, also called a tunnel oxide, a charge storage $Si_3N_{4-x}O_{1.5x}$ layer, where x is 0 to 1, and a second (top) $SiO_2$ layer, also called a blocking oxide. The tunnel oxide is either grown by thermal oxidation on the active area layer 4005, or deposited over the active area layer by atmospheric pressure, low pressure or plasma enhanced chemical vapor deposition (APCVD, LPCVD or PECVD) or other means. The tunnel oxide has a thickness of 1.5 nm to 7 nm, preferably 4.5 nm. The charge storage silicon nitride or silicon oxynitride ($Si_3N_{4-x}O_{1.5x}$) layer is deposited over the tunnel oxide, and its thickness is at least 5 nm, preferably 5–15 nm, most preferably 6 nm. The blocking oxide layer is arranged on the surface of the charge storage layer and has a thickness of 3.5 nm to 9.5 nm, preferably 5.0 nm. The charge storage and blocking layers may be deposited by APCVD, LPCVD, PECVD, or other means, such as sputtering.

It should be noted that different materials and different layer thicknesses may be used as desired. For example, the charge storage layer need not necessarily be formed from $Si_3N_{4-x}O_{1.5x}$. For example, in an alternative aspect of the first embodiment, the charge storage layer may be formed from a plurality of electrically isolated nanocrystals, such as silicon, tungsten or aluminum nanocrystals dispersed in a silicon oxide, nitride or oxynitride insulating layer. If a nanocrystal charge storage layer is used, then the tunnel and/or the blocking oxide layers may be omitted if desired.

After the charge storage region 4007 (i.e., the ONO dielectric) formation, a first gate layer 4009 is deposited over the charge storage region. The first gate layer 4009 may comprise any conductive layer, such as n⁺-doped polysilicon. Such a polysilicon layer may have any appropriate thickness, such as 50 to 200 nm, preferably 100 nm, and any appropriate dopant concentration, such as $10^{19}$–$10^{21}$ cm⁻³, preferably $10^{20}$ cm⁻³.

If desired, an optional protective layer 4011, such as a protective silicon oxide layer, is formed on the surface of the first gate layer 4009. Layer 4011 may have any appropriate thickness, such as, for example 3–10 nm, preferably 5 nm. Materials other than silicon oxide may be used for layer 4011, if desired.

A sacrificial blocking layer 4013 is then deposited over the protective layer 4011. In a preferred aspect of the first embodiment, the blocking layer is made of any conductive or insulating material which may be selectively etched with respect to other layers of the device. Preferably, the blocking layer 4013 comprises a silicon nitride layer. The blocking layer may have any thickness. Preferably the blocking layer 4013 has the thickness that is desired for the whole control gate or an upper part of a control gate, as will be described in more detail below. For example, layer 4013 has a thickness of 100 to 250 nm, preferably 160 nm. FIG. 37 shows the device cross section at this stage of processing.

Figure 38:
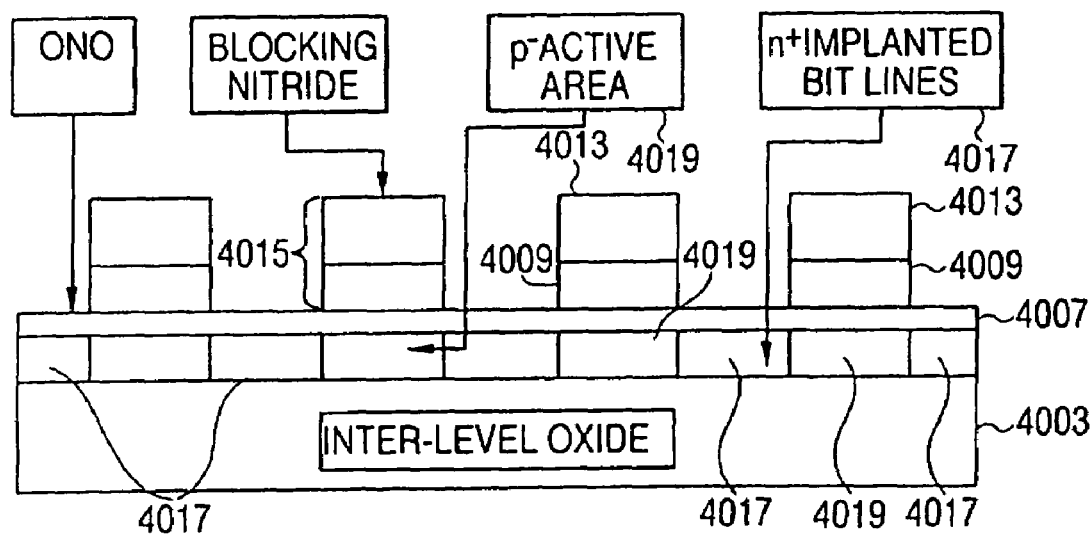
FIG. 38 is a side cross-sectional view of a memory array after bit line patterning and source/drain implantation. The cross-section is perpendicular to the bit lines.

Next, a bit line pattern is transferred to the in process device wafer or substrate using a reverse bit line mask, as shown in FIG. 38. In this mask, clear areas define the bit lines, and the opaque (i.e., dark) areas define the space between the bit lines. For example, a positive photoresist layer (not shown in FIG. 38) is formed over the blocking layer 4013 and then exposed through the reverse bit line mask and developed. Of course, if a negative photoresist is used, then the clear and the opaque areas of the mask are reversed.

The mask features are etched into the blocking nitride 4013, the protective oxide 4011, and the first gate layer 4009, using the photoresist layer as a mask, to form a plurality of gate stacks 4015. The ONO dielectric 4007 serves as an etch stop layer. Then, the photoresist layer is stripped from the patterned gate stacks 4015. The photoresist may be removed after the blocking nitride 4013 is etched, in which case the nitride may be used as a hard mask for etching the first gate layer 4009. The gate stacks 4015 include a patterned first gate electrode 9, an optional protective oxide 4011 and a patterned blocking layer 4013. If desired, a thin layer of silicon nitride, oxynitiride or oxide is grown to seal the first gate electrode 4009 sidewalls.

Transistor source and drain regions 4017 are formed by self-aligned ion implantation, using the gate stacks 4015 as a mask. The photoresist layer may be left on the gate stacks during this implantation or removed prior to the implantation. The ion implantation is carried out through the ONO dielectric 4007. However, if desired, the portions of the ONO dielectric 4007 between the gates 4009 may be removed prior to the ion implantation.

Channel regions 4019 of the active layer 4005 are located below the gate electrodes 4009. The regions 4017 are doped with a second conductivity type dopant different from the first conductivity type dopant of the channels 4019. Thus, if the channels 4019 are p-type doped, then the source and drain regions 4017 are n-type doped, and vice-versa. FIG. 38 shows the device at this stage in the processing.

It should be noted that in a memory array, the designations "source" and "drain" are arbitrary. Thus, the regions 4017 may be considered to be "sources" or "drains" depending on which bit line a voltage is provided. Furthermore, since no field oxide regions are preferably used in this memory array, each region 4017 is located between two gate electrodes 4009. Therefore, a particular region 4017 may be considered to be a "source" with respect to one gate 4009, and a "drain" with respect to the other gate 4009.

Figure 39:
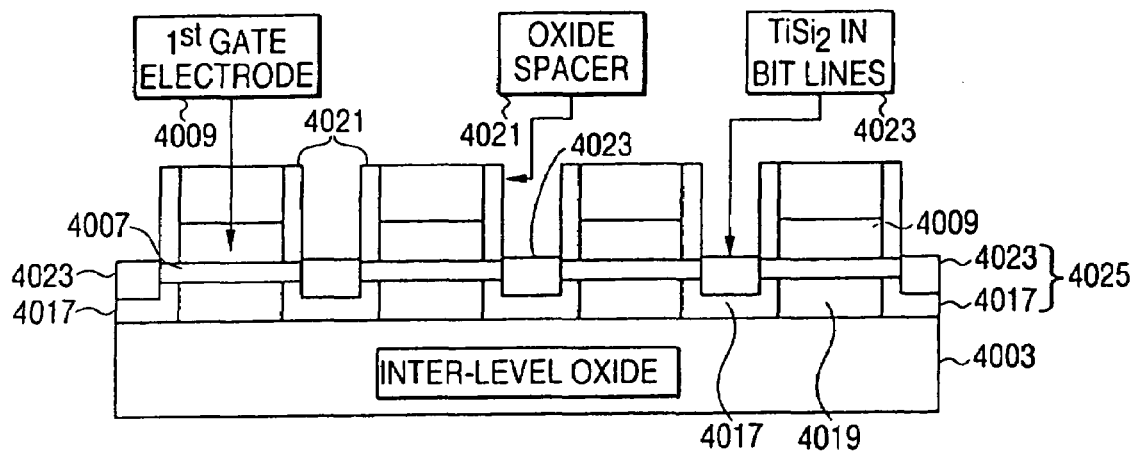
FIG. 39 is a side cross-sectional view of the array after salicide process. The cross-section is perpendicular to the bit lines.

Next, gate stack sidewall spacers 4021 are formed on the sidewalls of the gate stacks 4015, as shown in FIG. 39. Preferably, the spacers 4021 comprise silicon oxide, if the blocking layer 4013 comprises silicon nitride. However, the spacers may comprise any material which allows the blocking layer 4013 material to be selectively etched without substantially etching the spacers 4021. For example, the spacers 4021 may comprise silicon nitride if the blocking layer 4013 comprises silicon oxide. The spacers 4021 are preferably formed by conformal deposition of a silicon oxide layer over the stacks 4015, followed by an anisotropic oxide etch. The spacer etch process concludes with an etch process for the ONO dielectric to expose the source and drain regions 4017. Doping in the source and drain regions 4017 may be increased at this time by additional self-aligned ion implantation, using the gate stacks 4015 and spacers 4021 as a mask, if desired. If so, the implantation before spacer formation may be used to form lightly doped source/drain (LDD) extensions.

The salicide process is then used to form suicide regions 4023 in the silicon source and drain regions 4017 in a self-aligned fashion. The salicide process comprises three steps. First a layer of metal, such as Ti, W, Mo, Ta, etc., or a transition metal such as Co, Ni, Pt or Pd is blanket deposited over the exposed regions 4017, the sidewall spacers 4021 and the blocking layer 4013 of the gate stacks 4015. The device is annealed to perform a silicidation by direct metallurgical reaction, where the metal layer reacts with the silicon in regions 4017 to form the silicide regions 4023 over regions 4017. The unreacted metal remaining on the spacers 4021 and the blocking layer 4013 is removed by a selective etch, e.g., by a piranha solution. The silicide regions 4023 and the doped silicon regions 4017 together comprise the bit lines 4025. FIG. 39 shows the device at this stage in fabrication.

Figure 40:
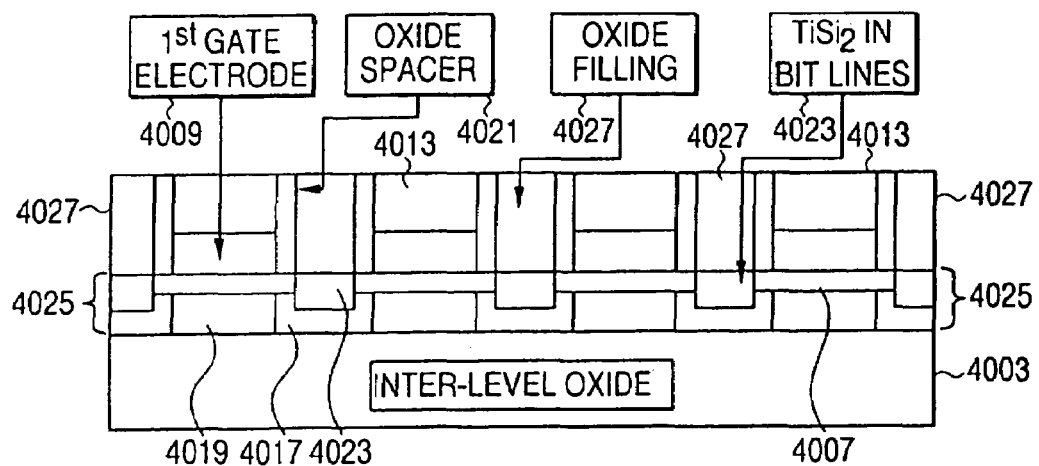
FIG. 40 is a side cross-sectional view of the array after the oxide fill and planarization. The cross-section is perpendicular to the bit lines.

A conformal insulating layer 4027 is then deposited to fill the trenches above the bit lines 4025 and between the sidewall spacers 4021. The insulating layer 4027 may comprise any insulating material, such as silicon oxide, silicon oxynitride, PSG, BPSG, BSG, spin-on glass, a polymer dielectric layer (such as polyimide, etc.), and/or any other desired insulating material that is different than the material of the blocking layer 4013. The insulating layer 4027 is then planarized using chemical-mechanical polishing (CMP), etch back and/or any other means to expose the upper surface of the silicon nitride blocking layer 4013 on the gate stacks 4015. FIG. 40 shows the device after the planarization step.

Figure 41:
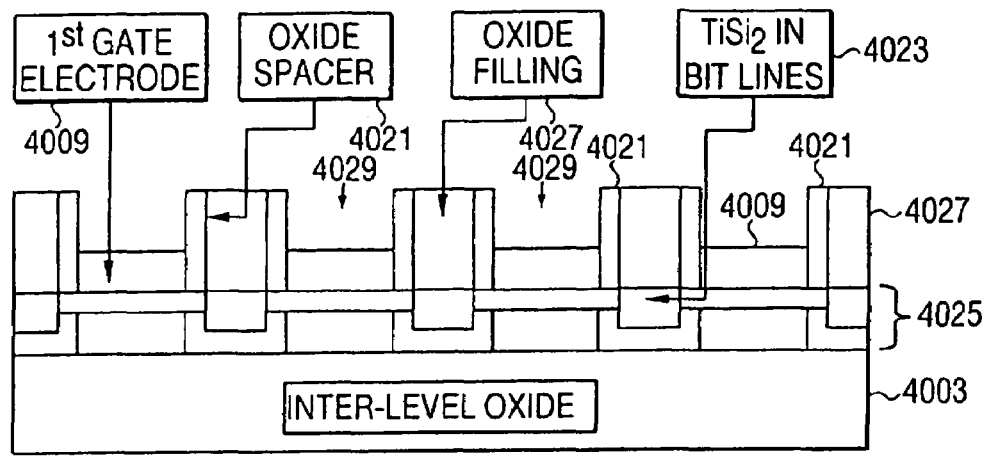
FIG. 41 is a side cross-sectional view of the array after the blocking layer is removed. The cross section is perpendicular to the bit lines.

Next, the blocking silicon nitride layer 4013 is etched selectively without substantially etching the spacers 4021 and the insulating layer 4027. The protective oxide layer 4011, if present, is then removed by etching it from the upper surface of the first gate electrodes 4009 in the stacks 4015. These etching steps form a gate contact via 4029 above each gate 4009, as shown in FIG. 41. The width of the gate contact via 4029 is substantially the same as the width of the first gate electrode 4009 because the via sidewalls are the inner sidewalls of the sidewall spacers 4021. Therefore, the gate contact vias 4029 are self aligned to the gates 4009 because the vias 4029 are bounded by the sidewall spacers 4021 which extend above the gates 4009. No photolithographic masking steps are needed to form the gate contact vias 4029.

Figure 42:
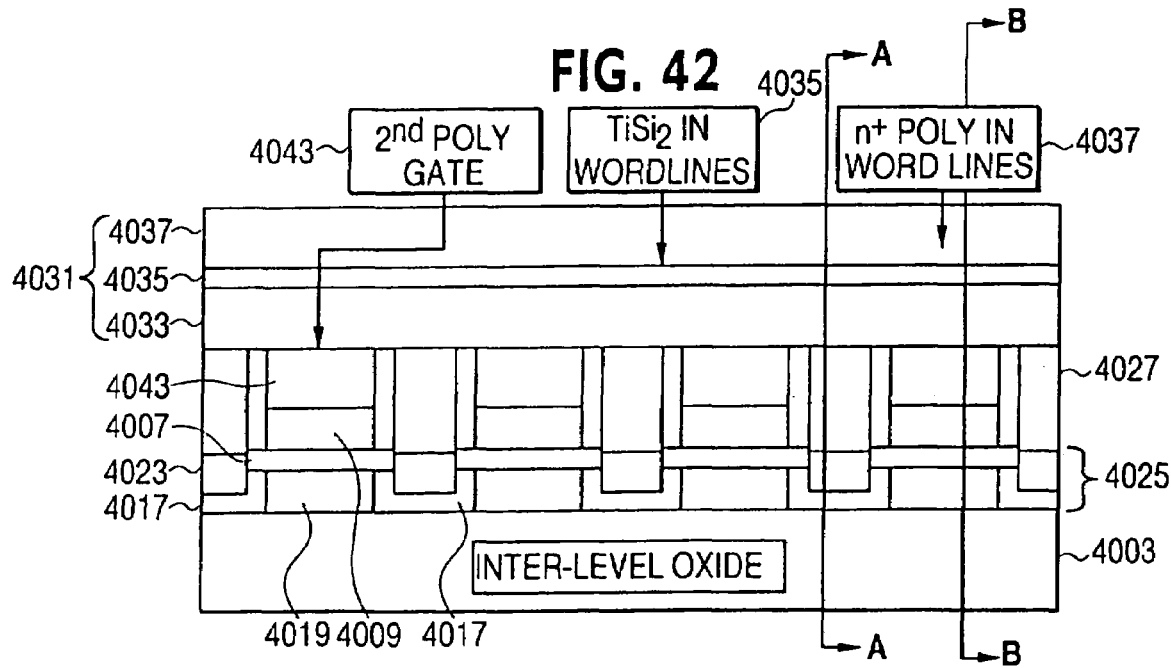
FIG. 42 is a side cross-sectional view of the array during word line formation. The cross-section is perpendicular to the bit lines.

A second gate electrode conductive material 4031 is then deposited over the entire device, as shown in FIG. 42. Preferably, the material 4031 comprises a multilayer stack comprising a first n$^+$-doped polysilicon layer 4033, a silicide layer 4035 (such as a TiSi or WSi, etc) and a second n$^+$-doped polysilicon layer 4037. The polysilicon layers 4033 and 4037 are preferably 100–300 nm thick, such as 200 nm thick. The suicide layer 4035 is preferably 50 to 100 nm thick, such as 60 nm thick. Alternatively, the second gate material can also be formed from a single layer of silicide, metal, or any other combination of heavily doped amorphous or polycrystalline silicon, silicide, and metal that makes a good ohmic contact with the first gate electrodes 4009.

Figure 43:
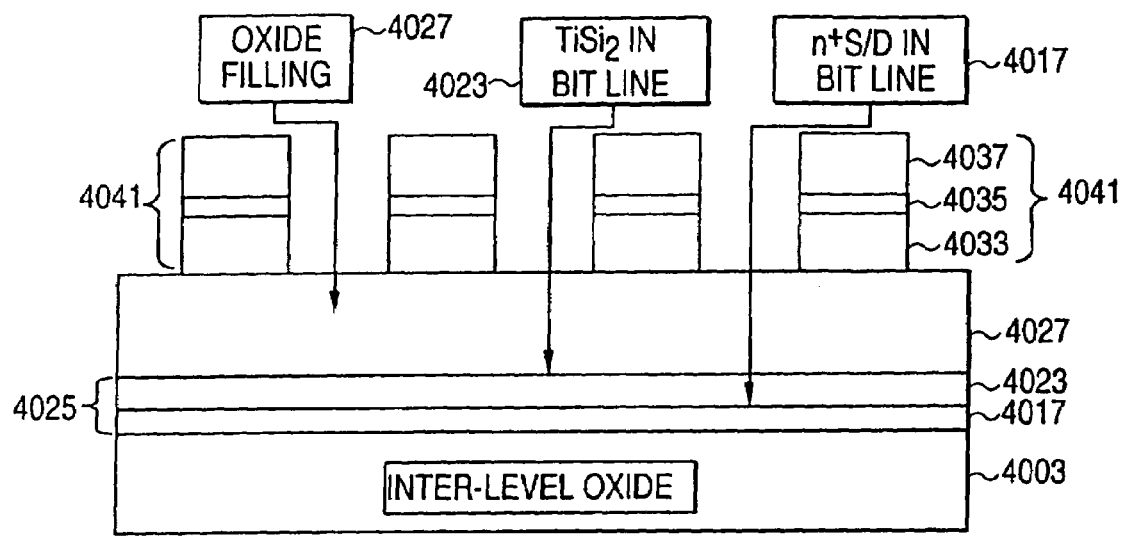
FIG. 43 is a side cross-sectional view of the array after word line formation along line A—A in FIG. 42. The cross-section is perpendicular to the word lines and passes through a bit line.
Figure 44:
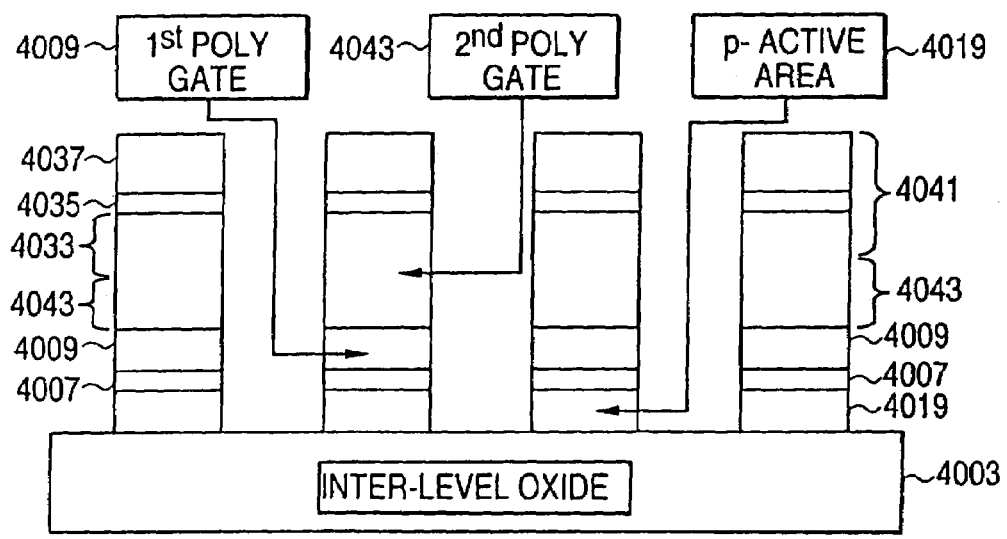
FIG. 44 is a side cross-sectional view of the array after word line formation along line B—B in FIG. 42. The cross-section is perpendicular to the word lines and passes through a transistor channel.

Next, a photoresist layer (not shown) is applied over the material 4031 and is exposed through the word line mask and developed. The photoresist layer is used as a mask to etch the second gate electrode material 4031 to form a plurality of word lines 4041. The ONO stack 4007 and the exposed active area layer 4005 are then etched using the word lines 4041 as a mask. The photoresist layer may be left on the word lines 4041 during this etching step or it may be removed prior to this etching step. The bottom insulating layer 4003 under the active area layer 4005 and the intergate insulating layer 4027 over the bit lines 4025 serve as etch stop layers. Thus, the second gate electrode material 4031 is patterned into a plurality of word lines 4041 which overlie the intergate insulating layer 4027 as shown in FIG. 43, and into upper portions 4043 of the first gate electrodes, where the material 4031 extends into the vias 4029, as shown in FIG. 44. FIG. 43 is a cross section along line A—A in FIG. 42 and FIG. 44 is a cross section along line B—B in FIG. 42. Therefore, the word lines 4041 are self aligned to the control gates 4009/4043, since a photolithography step is not required to align the word lines to the gates.

If desired, the exposed active area 4005 and gate electrode 4009/4043 sidewalls may be optionally sealed by growing a thin layer of silicon nitride or oxide on them, for example by thermal nitridation or oxidation. This completes construction of the memory array. An insulating layer is then deposited, and if necessary planarized, over the word lines 4041.

The word line photolithography step does not require misalignment tolerances, since the word lines are patterned using the same mask as the charge storage regions 4007 and the active layer 4005 (i.e., channel regions 4019) of each TFT in the cell. Therefore, the word lines 4041 are not only self aligned to the control gate 4009/4043 of the TFT EEPROM by being deposited in the self aligned vias 4029, but the word lines 4041 are also self aligned to the charge storage regions 4007 and the channel regions 4019 of each memory cell. By using a fully self aligned memory cell, the number of expensive and time consuming photolithography steps is reduced. Furthermore, since no misalignment tolerances for each cell are required, the cell density is increased. Another advantage of the device of the first embodiment is that since a thick intergate insulating layer 4027 is located between the bit lines 4025 and the word lines 4041, the parasitic capacitance and a chance of a short circuit between the bit lines and the word lines are decreased.

FIGS. 45 and 46 illustrate a method of making a TFT EEPROM nonvolatile flash memory array according to the second preferred embodiment of the present invention. The method of the second preferred embodiment is the same as that of the first embodiment illustrated in FIGS. 37–44, except that the sacrificial blocking layer 4013 is omitted.

FIG. 45 illustrates an in-process semiconductor device 4100 according to the second preferred embodiment. The device 4100 illustrated in FIG. 45 is at the same stage in processing as the device 4001 in FIG. 40. The device 4100 contains the interlayer insulating layer 4103, the active layer 4105, the charge storage region 4107 (e.g., an ONO stack or isolated nanocrystals), source and drain regions 4117, channel regions 4119, silicide regions 4123 and bit lines 4125.

The gate electrode 4109 of the device 4100 is made thicker than the gate electrode 4009 in the first embodiment. For example, the gate electrode 4109 may have any appropriate thickness, such as 160 to 360 nm, preferably 260 nm. Since the blocking 4013 layer is omitted, the gate sidewall spacers 4121 are formed on the patterned gate electrode 4109 covered by a protective silicon oxide layer (not shown) after the formation of the source and drain regions 4117. The sidewall spacers 4121 extend to the top of the gate electrode 4109. The silicide regions 4123 are then formed on the source and drain regions 4117 by depositing a metal layer and reacting the metal layer with the source and drain regions 4117. No silicide is formed on the gate electrode 4109, which is covered by the silicon oxide protective layer, and on the sidewall spacers 4121. The insulating layer 4127 is then deposited between the sidewall spacers 4121 and over the gate electrodes 4109. Preferably, the layer 4127 is silicon oxide, but may comprise any other insulating material, as in the first embodiment. Layer 4127 is then planarized to expose the upper surface of the gate electrode 4109. The insulating layer 4127 is preferably planarized by CMP, but may be planarized by etch back and/or any other means. During the planarization, the protective silicon oxide layer is also removed to expose the upper surface of the gate electrode 4109, as shown in FIG. 45.

Since the selective nitride blocking layer 4013 etch step is not performed in the second embodiment, the spacers 4121 may be composed of silicon nitride, rather than silicon oxide. Silicon nitride spacers are advantageous because they conform to the underlying topography better than oxide spacers. The spacers 4121 and the gate 4109 may act as a polish or etch stop during the planarization of layer 4127.

After the gate electrodes 4109 are exposed, the memory array of the second preferred embodiment is completed just like the array in the first preferred embodiment. As in the first embodiment, one or more conductive layers is/are deposited directly over the tops of the sidewall spacers 4121 and exposed gate electrodes 4109. For example, the conductive layers may comprise a silicide 4135 layer between polysilicon layers 4133 and 4137. As shown in FIG. 46, the conductive layer(s) is/are then patterned to form a plurality of word lines 4141, which contact the exposed gate electrodes 4109. During the same patterning step, the charge storage region 4107 and the active layer 4105 are also patterned, as in the first embodiment. Therefore, the word lines 4141 are self aligned to the control gate electrodes 4109, since a photolithography step is not required to align the word lines to the gates.

If desired, the exposed active area 4105 and gate electrode 4109 sidewalls may be optionally sealed by growing a thin layer of silicon nitride or oxide on them, for example by thermal nitridation or oxidation. This completes construction of the memory array. An insulating layer is then deposited, and if necessary planarized, over the word lines 4141.

The word line photolithography step does not require misalignment tolerances, since the word line is patterned using the same mask as the charge storage regions 4107 and the active layer 4105 of each TFT in the cell. Therefore, the word lines 4141 are not only self aligned to the control gate 4109 of the TFT EEPROM by being deposited directly over the exposed upper surfaces of the gates 4109 and spacers 4121, but the word lines 4141 are also self aligned to the charge storage regions 4107 and the channel regions 4119 of each memory cell. By using a fully self aligned memory cell, the number of expensive and time consuming photolithography steps is reduced. Since no misalignment tolerances are required, the cell density is increased. Furthermore, eliminating blocking nitride deposition and selective etch steps of the first embodiment, reduces the step count by three, which simplifies the process flow.

FIG. 47 illustrates a TFT EEPROM nonvolatile flash memory array 4200 according to the third preferred embodiment of the present invention. The device and method of the third preferred embodiment are the same as that of the first or the second embodiments illustrated in FIGS. 37–46, except that the charge storage region comprises an electrically isolated floating gate rather than the ONO stack or isolated nanocrystals as in the first or the second preferred embodiment.

As shown in FIG. 47, the non-volatile transistor (i.e., the TFT EEPROM) is constructed as a floating-gate field effect transistor. In this case, the dielectric triple layer consisting of the ONO stack or the oxide layer containing electrically isolated nanocrystals is replaced with a tunnel dielectric, such as tunnel silicon oxide layer 4206. The tunnel oxide 4206 has a thickness of 5 to 10 nm, preferably 7 nm. The tunnel oxide layer 4206 is formed over the active area 4205, as in the first and second embodiments.

The first gate electrode 4209 is formed and patterned on the tunnel oxide layer 4206, as in the first and second embodiments. However, in the third embodiment, the first gate electrode 4209 comprises a floating gate rather than a control gate. The floating gate 4209 is self-aligned to the transistor channel 4219, as in the first and second embodiments.

The device illustrated in FIG. 47 is at the same stage in processing as the device in FIG. 42. The device contains the substrate 4203, the source and drain regions 4217, channel regions 4219, sidewall spacers 4221 adjacent to floating gate 4209 sidewalls, silicide regions 4223, bit lines 4225 and insulating layer 4227.

The other deviation from the first and second embodiments is the formation of a control gate dielectric 4212 over the floating gate 4209, as shown in FIG. 47. The control gate dielectric may have any appropriate thickness, such as 8 to 20 nm, preferably 12 nm. The control gate dielectric 4212 may be grown on the control gate by thermal oxidation or deposited by CVD or other means. The control gate dielectric may comprise silicon oxide, silicon nitride, silicon oxynitride, or an ONO stack. The control gate 4243 and word lines 4241 are then deposited and patterned over the control gate dielectric 4212 as in the first and second preferred embodiments to complete the device shown in FIG. 47. The control gate dielectric 4212 and the control gate 4243 are located inside the sidewall spacers 4221.

FIGS. 48A–C and 49A–C illustrate two alternative preferred methods of making one TFT (i.e., one cell) in the device 4200 shown in FIG. 47. According to the first preferred method, a gate stack 4215 comprising a floating gate 4209, a protective layer 4211 and an optional sacrificial blocking layer 4213 are formed over the tunnel dielectric 4206. The source and drain regions 4217 are implanted into the active area 4205 using the gate stack 4215 as a mask, such that a channel region 4219 is formed below the tunnel dielectric 4206. Then, sidewall spacers 4221 are formed over the gate stack 4215. An insulating layer 4227 is formed adjacent to the spacers and planarized to expose the blocking layer 4213, as shown in FIG. 48A.

Then, as shown in FIG. 48B, the protective layer 4211 and the blocking layer 4213 are removed by etching. This forms the gate contact via 4229. The via 4229 sidewalls are the sidewall spacers 4221 which extend above the floating gate 4209.

A control gate dielectric 4212 is then formed, for example, by thermal oxidation, on the exposed floating gate 4209 inside the via 4229 as shown in FIG. 48C. Then, one or more conductive layers are deposited over the gate contact via 4229 and the insulating layer 4227. These layer(s) are patterned to form a control gate 4243 in the via 4229 and a word line 4241 above layer 4227. The control gate dielectric 4212 separates the control gate 4243 from the floating gate 4209.

According to the second preferred method, a gate stack 4215 comprising a floating gate 4209, the control gate dielectric 4212 and a sacrificial blocking layer 4213 are formed over the tunnel dielectric 4206. The source and drain regions 4217 are implanted into the active area 4205 using the gate stack 4215 as a mask, such that a channel region 4219 is formed below the tunnel dielectric 4206. Then, sidewall spacers 4221 are formed over the gate stack 4215. An insulating layer 4227 is formed adjacent to the spacers and planarized to expose the blocking layer 4213, as shown in FIG. 49A.

Then, as shown in FIG. 49B, the blocking layer 4213 is removed by etching to expose the control gate dielectric 4212. This forms the gate contact via 4229. The via 4229 sidewalls are the sidewall spacers 4221 which extend above the floating gate 4209 and the dielectric 4212. The blocking layer 4213 may consist of a heavily doped polysilicon, in which case it may be left in the via 4229, if desired.

As shown in FIG. 49C, one or more conductive layers are deposited over the gate contact via 4229 and the insulating layer 4227. These layer(s) are patterned to form a control gate 4243 in the vias 4229 and a word line 4241 above layer 4227. The control gate dielectric 4212 separates the control gate 4243 from the floating gate 4209.

In the methods of FIGS. 48A–C and 49A–C, the word line 4241 is self aligned to the control gate 4243, to the control gate dielectric 4212 and to the floating gate 4209.

Figure 50:
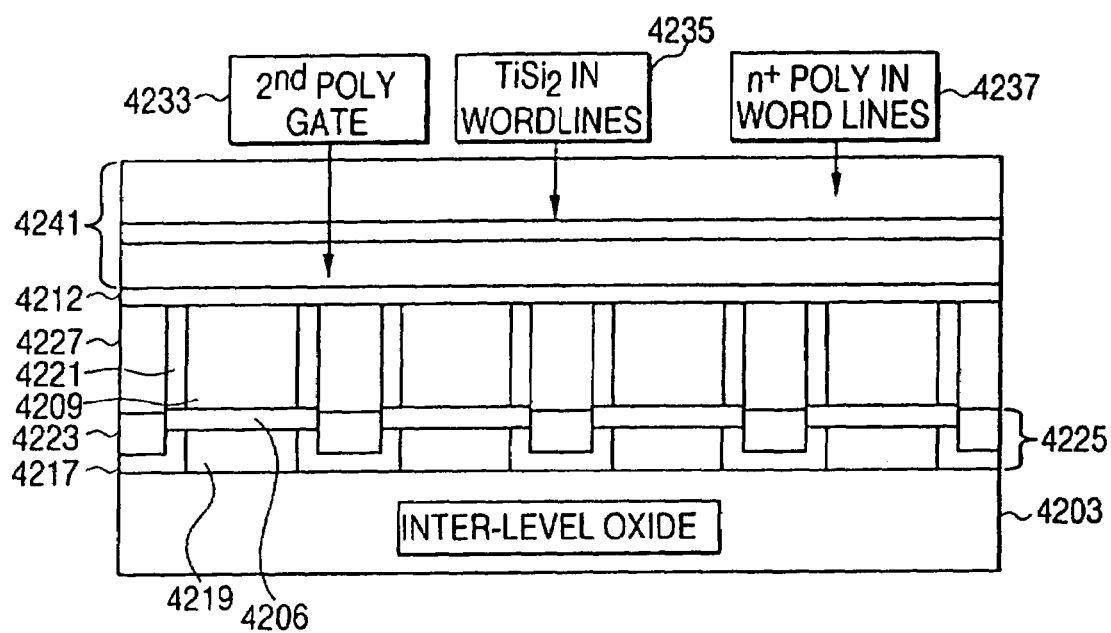
FIGS. 50 and 51 are side cross-sectional views of the array of two preferred aspects of a preferred embodiment after word line formation. The cross-section is perpendicular to the bit lines.

FIG. 50 illustrates a TFT EEPROM nonvolatile flash memory array 4300 according to a first preferred aspect of the fourth preferred embodiment of the present invention. The device and method of the fourth preferred embodiment is the same as that of the third preferred embodiment illustrated in FIG. 47, except that the control gate dielectric is located above the sidewall spacers. Furthermore, the blocking layer 4213 is omitted. As shown in FIG. 50, the sidewall spacers 4221 extend to the top of the floating gate 4209, similar to the device of the second preferred embodiment. The control gate dielectric 4212 is deposited over the floating gates 4209, the sidewall spacers 4221, and the insulating layer 4227. The word line 4241 is then deposited and patterned over the control gate dielectric 4212, as in the first and second preferred embodiments. In the device of FIG. 50, the word line 4241 acts both as a word line and as a control gate. Thus, a separate control gate may be omitted. The word line 4241 is self aligned to the floating gates 4209. The word line 4241 may comprise one or more layers, such as the silicide layer 4235 between polysilicon layers 4233 and 4237.

Figure 51:
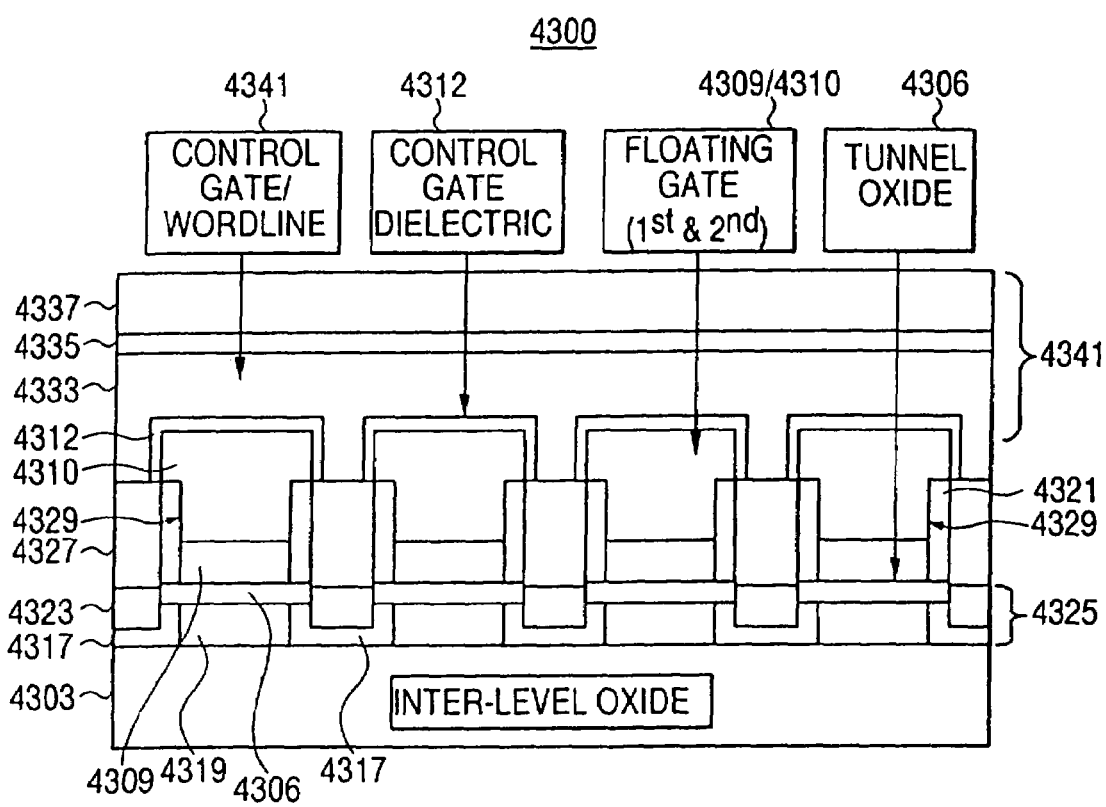

FIG. 51 illustrates a TFT EEPROM nonvolatile flash memory array 4300 according to the second preferred aspect of the fourth preferred embodiment of the present invention. The device and method of this preferred aspect are the same as those illustrated in FIG. 50, except that an upper portion of the floating gate extends above the sidewall spacers. The device illustrated in FIG. 51 is at the same stage in processing as the device in FIGS. 47 and 50. As shown in FIG. 51, the device contains the interlayer insulating layer 4303, the tunnel dielectric 4306, the source and drain regions 4317, channel regions 4319, silicide regions 4323, bit lines 4325 and insulating layer 4327.

The device illustrated in FIG. 51 includes the processing steps illustrated in FIGS. 48A–B and described above. Thus, a lower portion of the floating gate 4309 is exposed in a gate contact via 4329 between the sidewall spacers 4321 which extend above the lower portion of the floating gate, similar to that shown in FIG. 48B. However, instead of forming a control gate dielectric 4312 in the via 4329, an upper portion of the floating gate 4310 is deposited in the via. The upper portion of the floating gate 4310 is formed by depositing a conductive layer, such as a doped polysilicon layer, over the vias 4329, the spacers 4321 and the insulating layer 4327, such that it contacts the exposed lower portion of the floating gate 4309 in the via 4329. The conductive layer is patterned using photolithography into an upper floating gate portion 4310 such that it extends vertically above the sidewall spacers 4321. Preferably, the conductive layer also extends horizontally above the spacers 4321. Thus, the upper gate portions 4310 have a "T" shape. Then, the control gate dielectric 4312 is formed on the exposed upper surface of the upper portion of the floating gate 4310 by thermal growth, CVD and/or various other deposition techniques (such as sputtering, etc.). One or more conductive layers 4333, 4335, 4337 are then deposited over the control gate dielectric 4312 and are patterned into word lines 4341. The conductive layers may be, for example, a silicide layer 4335 sandwiched between doped polysilicon layers 4333, 4337, as in the first preferred embodiment. In the fourth preferred embodiment, the word lines 4341 serve as the control gates of the TFTs. Since the top surface of the floating gate 4309/4310 in the fourth embodiment is larger than in the third embodiment, the area between the floating gate and the control gate/word line is increased in the TFT of the fourth embodiment compared to the third embodiment. The increase in area between the floating gate and the control gate/word line is advantageous because it increases the capacitive coupling between the floating gate and the control gate/word line.

In a preferred aspect of the fourth embodiment, the top surface of the upper portion of the floating gate 4310 is textured or roughened to further increase the capacitive coupling between the floating gate and the control gate/word line. For example, at least the upper portion of the floating gate 4310 may be made of hemispherical grain silicon (HSG), or the upper surface of the floating gate may be roughened by etching or coarse polishing. In other words, the upper portion of the floating gate may be textured or roughened similar to the texturing or roughening methods used to texture or roughen bottom conductive plates of DRAM capacitors.

While the first through fourth preferred embodiments describe and illustrate a TFT EEPROM nonvolatile flash memory array, the present invention should not be considered to be so limited. For example, rather than a self aligned word line in a TFT EEPROM array, any gate line may be self aligned to a MOSFET (i.e., metal oxide semiconductor field effect transistor) gate according to the preferred embodiments of the present invention. Furthermore, the EEPROM array may be formed in a bulk silicon substrate rather than over an interlayer insulating layer.

The first through the fourth preferred embodiments describe and illustrate a cross-point array of word lines and bit lines at a horizontal level and a method of making thereof. Each memory cell consists of a single programmable field effect transistor (i.e., TFT), with its source and drain connected to the $j^{th}$ bit line and the $(j+1)^{st}$ bit line, respectively, and a control gate being either connected to or comprising the $k^{th}$ word line. This memory arrangement is known as the NOR Virtual Ground (NVG) Array (also referred to as VGA). If desired, the memory array may also be arranged in non volatile flash memory architectures other than VGA, such as NOR-type memory or Dual String NOR (DuSNOR) memory, for example. The DuSNOR architecture, where two adjacent cell strings share a common source line but use different drain lines, is described in K. S. Kim, et al., IEDM-95, (1995) page 263, incorporated herein by reference. The DuSNOR memory may be fabricated using the same process as the VGA memory, except that an additional masking step is used to pattern the active area layer to separate the drain regions of adjacent cells. The process sequence of the first through third preferred embodiments of the present invention requires only two photolithographic masking steps. One masking step is for gate patterning/self aligned bit line formation. The other masking step is for word line patterning. The methods of the preferred embodiments of the present invention exploit self-alignment to reduce alignment tolerances between the masks. The memory cell area achieved with the foregoing process is about $4F^2$, where F is the minimum feature size (i.e. 0.18 microns in a 0.18 micron semiconductor process). The term "about" allows for small deviations (10% or less) due to non-uniform process conditions and other small deviations from desired process parameters. If the charge storage medium used in the transistor is not conductive, e.g., it is formed from nitride or oxy-nitride (i.e. using the ONO charge storage medium), or electrically isolated nanocrystals, the localized nature of charge storage can be exploited to store two bits per cell. In this case, the effective cell area per bit equals about $2F^2$.

Figure 52:
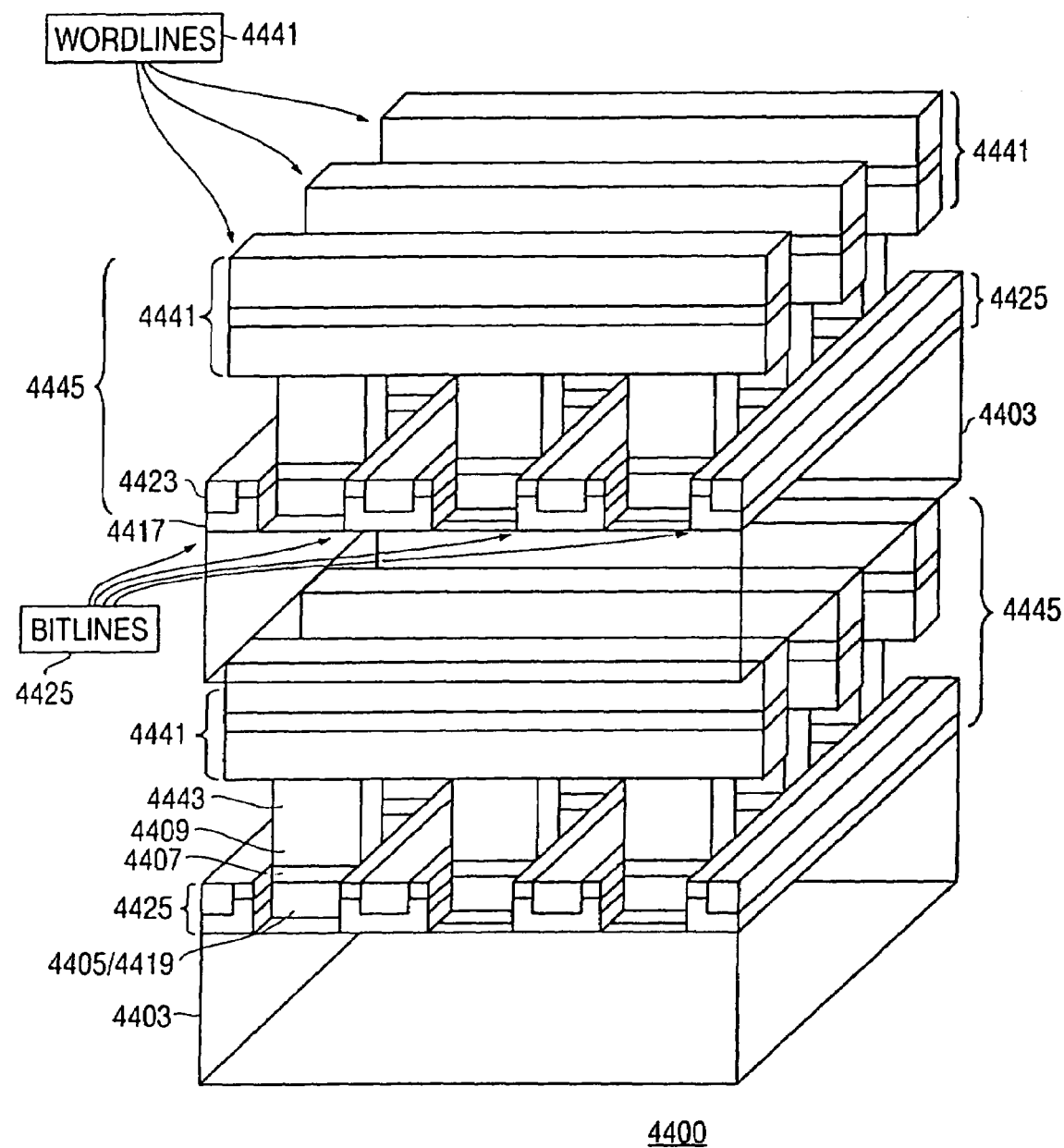
FIG. 52 is a three dimensional view of a three dimensional array of a preferred embodiment.

The NVG array of the first through fourth preferred embodiments is very suitable for vertical stacking of horizontal planar NVG arrays. FIG. 52 illustrates a three dimensional memory array 4400 according to a fifth preferred embodiment of the present invention. The three dimensional memory array contains a three dimensional array of TFT EEPROMs made according to the first, second, third or fourth preferred embodiment. Each TFT EEPROM contains a channel 4419, source and drain regions 4417, a control gate 4443, control gate sidewall spacers (not shown for clarity in FIG. 52) and a charge storage region 4407 between the channel and the control gate 4409. The charge storage region may comprise an ONO dielectric, isolated nanocrystals or a floating gate.

The memory array also contains a plurality of bit line columns 4425, each bit line contacting the source or the drain regions 4417 of a plurality of TFT EEPROMs. The columns of the bit lines 4425 extend substantially perpendicular to the source-channel-drain direction of the TFT EEPROMs (i.e., a small deviation from the perpendicular direction is included in the term "substantially perpendicular"). It should be noted that the columns of the bit lines 4425 may extend substantially perpendicular to the source-channel-drain direction of the TFT EEPROMs throughout the entire array 4400 or only in a portion of the array 4400. The bit lines in each device level are shaped as rails which extend under the intergate insulating layer. The bit lines include the buried diffusion regions formed during the source and drain doping steps and the overlying silicide layers. The source and drain regions are formed in the bit lines where the word lines intersect (i.e., overlie) the bit lines and the doped regions are located adjacent to the EEPROM channel regions.

The memory array also includes a plurality of word line rows 4441. Each word line contacts the control gates 4443 of a plurality TFT EEPROMs 4400 (or the word lines comprise the control gates). The rows of word lines extend substantially parallel to the source-channel-drain direction of the TFT EEPROMs (i.e., a small deviation from the parallel direction is included in the term "substantially parallel"). It should be noted that the rows of the word lines 4441 may extend substantially parallel to the source-channel-drain direction of the TFT EEPROMs throughout the entire array 4400 or only in a portion of the array 4400. The plurality of word lines 4441 are self aligned to the control gates 4443 of the array of TFT EEPROMs (or the word lines themselves comprise the control gates). If floating gates, but not control gates are included in the array, then the word lines are self aligned to the floating gates and to the control gate dielectric.

Each device level 4445 of the array is separated and decoupled in the vertical direction by an interlayer insulating layer 4403. The interlayer insulating layer 4403 also isolates adjacent word lines 4441 and adjacent portions of the active areas 4405 below the respective word lines 4441 in each device level 4445. The effective cell area per bit in the resulting three dimensional memory array is about $2F^2/N$, where N is the number of device levels (i.e., N=1 for a two dimensional array and N>1 for a three dimensional array). The array of nonvolatile memory devices 4400 comprises a monolithic three dimensional array of memory devices. The term "monolithic" means that layers of each level of the array were directly deposited on the layers of each underlying level of the array. In contrast, two dimensional arrays may be formed separately and then packaged together to form a non-monolithic memory device.

Each cell in one level 4445 of the memory array can be formed using only two photolithographic masking steps. However, additional masking steps may be needed to form contacts to the bit lines 4425. In a sixth preferred embodiment of the present invention, a conductive layer is formed over the array of memory devices. The conductive layer is then patterned to form a plurality of word lines or word line contact layers and at least one bit line contact layer which contacts at least one of the plurality of the bit lines. Thus, a separate bit line contact deposition and patterning step may be avoided, since the same conductive layer may be patterned to form the word lines/word line contacts and the bit line contacts. Of course, if desired, the word lines/word line contacts and the bit line contacts may be made from different materials and/or patterned using different masks.

Figure 53:
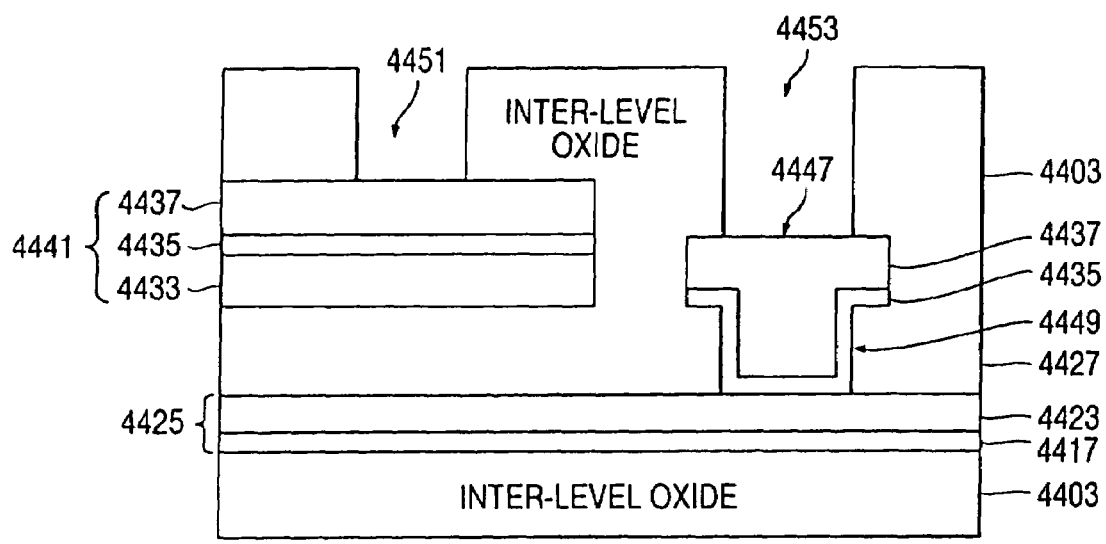
FIG. 53 is a side cross-sectional view of a word line contact conductor and bit line contact conductor at the same level. Openings are made for the next level contacts.

FIG. 53 illustrates a bit line contact 4447 according to one preferred aspect of the sixth preferred embodiment. In FIG. 53, a first doped polysilicon layer 4433 is formed over the inter-gate insulating layer 4427. A bit line contact via 4449 is then formed in the insulating layer 4427 in which a top portion of the bit line 4425 is exposed. A silicide layer 4435 and a doped polysilicon layer 4437 are then deposited, such that the silicide layer 4435 contacts the bit line 4425 through the via hole. The layers 4433, 4435 and 4437 are then photolithographically patterned using the same mask to form both the plurality of word lines 4441 and a plurality of bit line contacts 4447. An upper interlayer insulating layer 4403 is then formed over the word lines 4441 and bit line contacts 4447. Word line contact vias 4451 and bit line contact layer contact vias 4453 are formed in the insulating layer 4403 for formation of further contacts. It should be noted that the word lines 4441 and the bit line contact layer 4447 are not limited to the materials described. The layers 4441 and 4447 may comprise one or more polysilicon, silicide or metal layers. Furthermore, while the gate line 4441 and the contact 4447 are located in the same level of the device, the contact 4447 may extend into a lower level of the array to contact a bit line or a word line in the lower level of the array, if desired.

Figure 54:
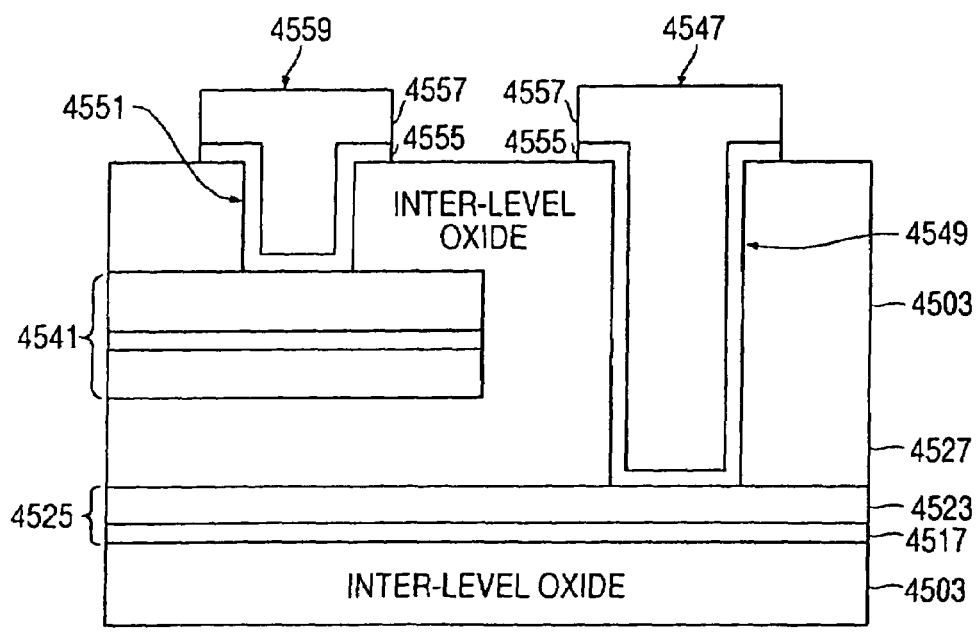
FIG. 54 is a side cross-section view of a word line contact conductor in level N+1 and word line and bit line contact conductors in level N. Landing pads are made in level N+1 conductor for the next level contacts.

FIG. 54 illustrates a bit line contact 4547 according to another preferred aspect of the sixth preferred embodiment. In this embodiment, at least one bit line contact via 4549 extends through at least one interlayer insulating layer 4503 between different levels of the array. In FIG. 54, the word line 4541 is first patterned and an interlayer insulating layer 4503 is deposited thereon. Word line contact vias 4551 and bit line contact vias 4549 are formed in the insulating layer 4503. The bit line contact via 4549 extends through the intergate insulating layer 4527 to the bit line 4525, which comprises the doped region 4417 and the silicide region 4423.

Then one or more conductive layers, such as silicide layer 4555 and doped polysilicon layer 4557 are deposited on the interlayer insulating layer 4503 and in the vias 4551 and 4549. The one or more conductive layer(s) 4555, 4557 are then photolithographically patterned using the same mask to form both a word line contact 4559, the bit line contact 4547, and plurality of word lines in the memory layer above the memory layer shown.

The word line and bit line contacts can reach down to lower levels, e.g., every other lower level, or several lower levels at the same time. Thus, in FIG. 54, the bit line contact 4547 and the word line contact 4559 are formed in the N+1 level of the array, and extend to the word lines 4541 and the bit lines 4525 in the Nth level of the array. The word line contacts and bit line contacts connect the word lines and the bit lines with the peripheral circuits located in the semiconductor substrate below the first device level of the array (or located elsewhere in the array, such as above or within the array, but preferably at least in part vertically integrated or aligned with the array). Landing pads are made in level N+1 conductor for the next level contacts.

FIGS. 55 through 61 illustrate a method of making a TFT EEPROM nonvolatile flash memory array according to the seventh preferred embodiment of the present invention. The method of the seventh preferred embodiment starts in the same way as that of the first, second, third, or fourth embodiments illustrated in FIGS. 37–51, except that a sacrificial dummy block which holds the place of the gate electrode is used in the process. A transistor formed by this method is called a replacement-gate transistor. The array made by the seventh preferred embodiment may be formed as three dimensional array shown in FIG. 52, having an effective cell area per bit of about $2F^2/N$.

Figure 55:
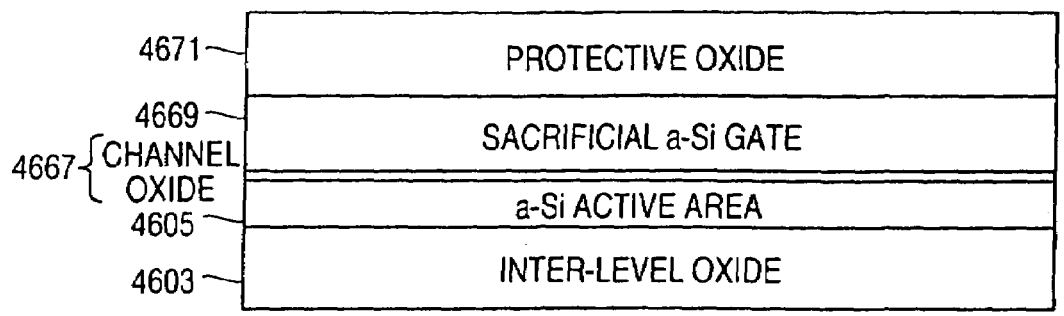
FIGS. 55–61 are side cross-sectional views of a method of making the array of a preferred embodiment. The cross-section is perpendicular to the bit lines.
Figure 56:
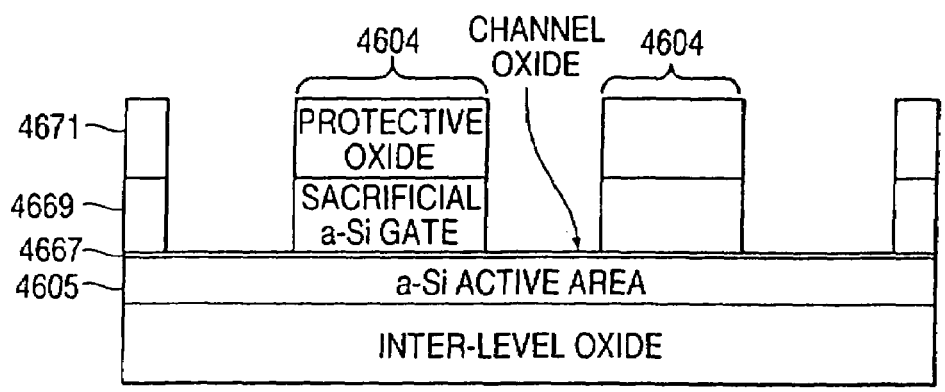

As in the previously described embodiments, the process starts with a deposition of a semiconductor active area, such as an amorphous silicon or polycrystalline silicon layer 4605 over an interlevel insulating layer 4603, as shown in FIG. 55. Then, a plurality of sacrificial dummy blocks 4604 are formed over the active layer 4605, as shown in FIG. 56. The sacrificial dummy blocks 4604 may comprise one or more materials, at least one of which may be selectively etched with respect to the material of an intergate insulating layer 4627 to be formed later. For example, if the intergate insulating layer 4627 comprises silicon oxide, then the dummy blocks may comprise silicon nitride, silicon oxynitride, polysilicon or other materials which may be selectively etched with respect to silicon oxide.

Preferably, the active layer 4605 comprises amorphous silicon and the dummy blocks 4604 are formed of a material which is deposited at a temperature below 600° C. to avoid recrystallizing the amorphous silicon layer 4605 into a polysilicon layer with a small grain size. For example, the dummy blocks 4604 may be formed by depositing a low temperature PECVD silicon nitride layer over the active layer 4605 and patterning the silicon nitride layer into a plurality of dummy blocks 4604 using photolithography.

In a preferred aspect of the seventh embodiment, the dummy blocks 4604 comprise a plurality of layers, including a sacrificial channel dielectric layer 4667, a sacrificial gate layer 4669, and a protective oxide layer 4671, as shown in FIG. 55. Layers 4669 and 4671 are patterned using a reverse bit line mask, similar to that illustrated in FIG. 38 of the first preferred embodiment, to form the dummy blocks 4604, as shown in FIG. 56. Since all layers 4667, 4669, 4671 above the active layer are sacrificial, lower quality materials may be used for these layers. For example, low temperature silicon oxide (LTO) or PECVD silicon oxide may be used for the channel dielectric layer 4667. Thus, layer 4667 may be deposited at a low temperature (i.e., below 600° C.) to avoid recrystallizing the amorphous silicon active layer 4605 into a polysilicon layer with a small grain size. If desired, all layers of the dummy blocks 4604 may be deposited at temperatures below 600° C. In this case, the amorphous state of layer 4605 is preserved until a subsequent salicide formation on the source and drain regions 4617. The silicide 4623 on the source and drain regions 4617 may act as a catalyst for lateral crystallization of amorphous silicon in the source and drain regions 4617 to form a polycrystalline silicon active layer 4605 with a large grain size.

Figure 57:
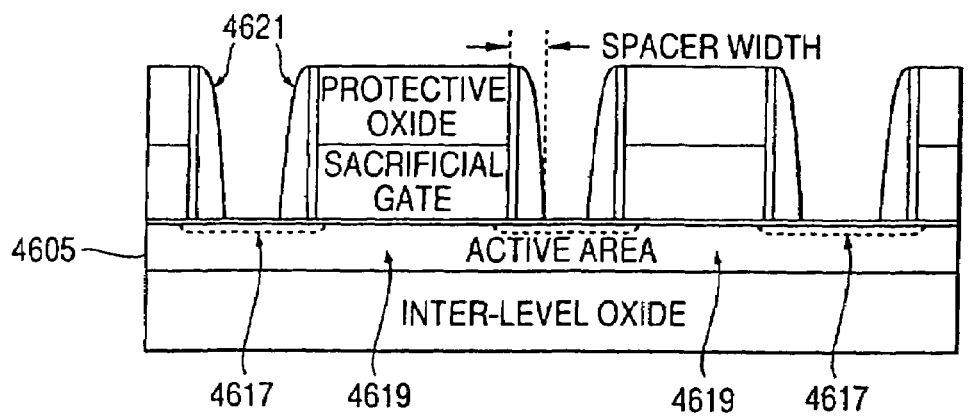

Subsequently, TFT source and drain regions 4617 are implanted into the active layer 4605 using the dummy blocks as a mask. The channel layers 4619 are located in layer 4605 between regions 4617 and below the blocks 4604. If the dummy blocks 4604 contain a polysilicon layer, then preferably, sidewall spacers 4621 are formed on the dummy block 4604 sidewalls to separate silicide from the source/drain junctions, to prevent subsequent silicide formation on the dummy blocks and to increase flexibility in source/drain engineering. The spacers 4621 may be composed of silicon oxide or silicon nitride, or two different layers, as shown in FIG. 57. If desired, an additional implantation may be performed into the source and drain regions 4617 using the blocks 4604 and spacers 4621 as a mask. If the dummy blocks 4604 do not contain polysilicon (i.e., are composed of silicon nitride), then the spacers 4621 may be omitted.

Figure 58:
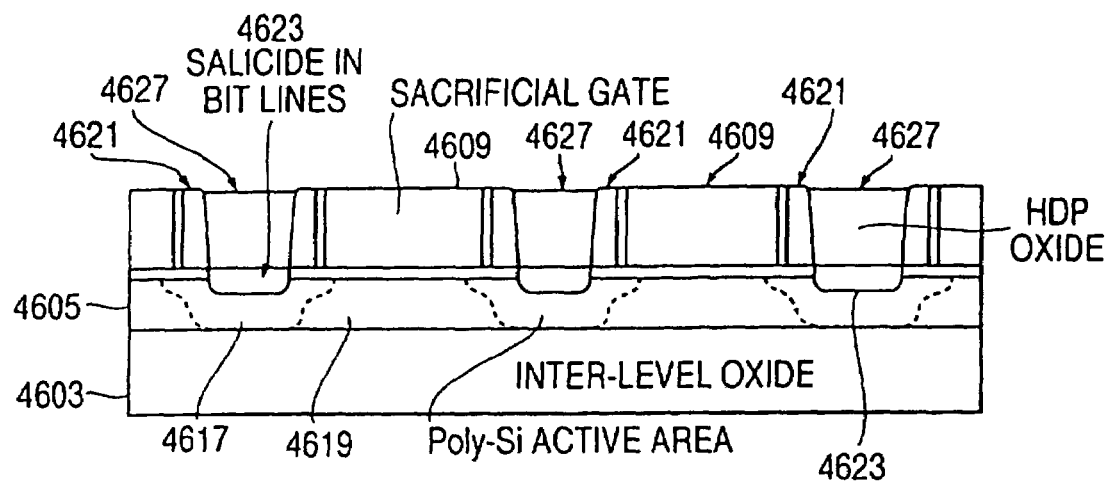

A metal layer, such as Ti, W, Mo, Ta, etc., or a transition metal such as Co, Ni, Pt or Pd is blanket deposited over the exposed regions 4617 and the dummy blocks 4604. The device is annealed to perform a silicidation by direct metallurgical reaction, where the metal layer reacts with the silicon in regions 4617 to form the silicide regions 4623 over regions 4617, as shown in FIG. 58. The unnreacted metal remaining on the dummy blocks 4604 is removed by a selective etch, e.g., by a piranha solution. The active layer 4605 is then recrystallized by laser or thermal annealing using the silicide regions 4623 as a catalyst. Alternatively, if desired, the active layer 4605 may be recrystallized simultaneously with the silicide 4623 formation, or the active layer 4605 may be recrystallized by laser or thermal annealing before the formation of the dummy blocks 4604.

After the formation of the buried bit lines 4625 which contain the source and drain regions 4617 and the silicide 4623 regions, a conformal intergate insulating layer 4627 is deposited between and above the dummy blocks 4604. Preferably, layer 4627 comprises silicon oxide (HDP oxide), as in the other preferred embodiments. The layer 4627 is then planarized by CMP and/or etchback to expose the top portions of the dummy blocks 4604. For example, if the dummy blocks 4604 contain a silicon oxide protective layer 4671 and silicon oxide spacers 4621, then these layers may be removed together with the top portion of layer 4627 during planarization. In this case, the top portions of the sacrificial gates 4669 are exposed after planarization, as shown in FIG. 58.

Figure 59:
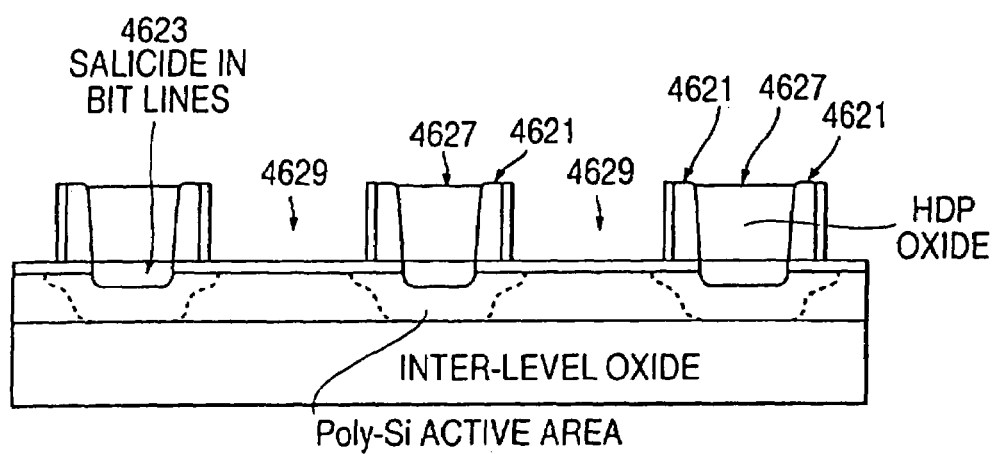

Next, the dummy blocks 4604 are selectively etched (i.e., removed) without substantially etching the intergate insulating layer 4627. For example, if the dummy blocks 4604 include the sacrificial polysilicon gates 4609, then these sacrificial gates 4609 are selectively etched without substantially etching the spacers 4621 and the intergate insulating layer 4627. If the dummy blocks include a sacrificial gate dielectric layer 4667, then this layer 4667 can be removed using plasma etch back or wet etch methods. As shown in FIG. 59, a plurality of vias 4629 are formed in locations where the dummy blocks 4604 were previously located.

Figure 60:
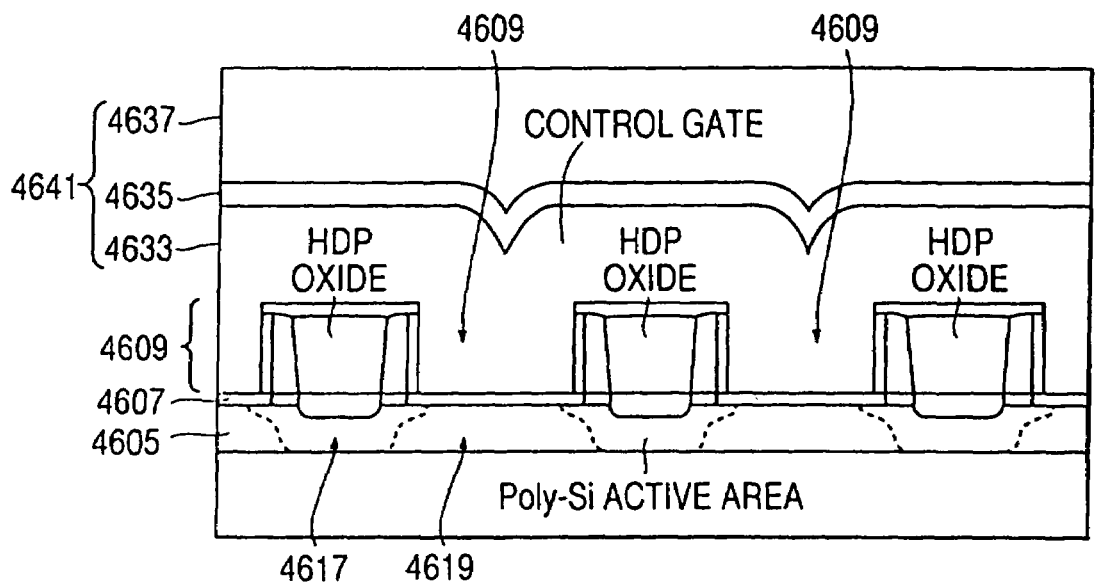
Figure 61:
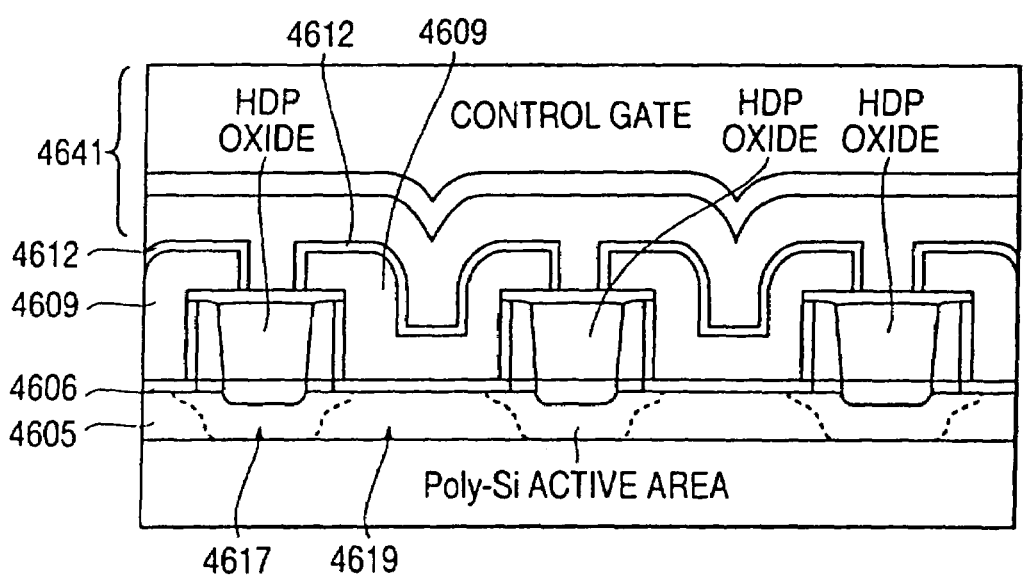

After the surface of the active layer 4605 above the channel regions 4619 is exposed by removing the dummy block materials, the "real" or permanent gate dielectric material is immediately grown and/or deposited on the exposed regions. Preferably, this dielectric comprises a charge storage region 4607 selected from the ONO triple layer or the plurality of electrically isolated nanocrystals, as shown in FIG. 60. Alternatively, this dielectric may comprise a tunnel dielectric 4606 if the TFT EEPROM contains a floating gate 4609, as shown in FIG. 61. The charge storage layer 4607 is located on the bottom of the vias 4629 above the channel regions 4619. The charge storage layer 4607 also contains vertical portions located on the sidewalls of the intergate insulating layer 4627 (or on the sidewalls of the spacers 4621, if the spacers are present) and horizontal portions located above the intergate insulating layer 4627, as shown in FIG. 60.

Subsequently, a conductive material is deposited over the intergate insulating layer 4627 and the charge storage regions 4607. The conductive material may comprise polysilicon or a combination of polysilicon 4633, 4637 and silicide 4635 layers, as in the other embodiments. The conductive material fills the vias 4629 and overlies the charge storage layer 4607. The conductive material is then patterned to form a plurality of word lines 4641, as in the other embodiments. The active layer 4605 and the charge storage layer 4607 is then patterned using the word lines 4641 as a mask as in the other embodiments. The portions of the word lines 4641 located in the vias 4629 comprise the control gates 4609 of the TFT EEPROMs, as shown in FIG. 60. If a floating gate TFT EEPROM is desired, then a floating gate 4609 and a control gate dielectric 4612 may be formed in the vias 4629 prior to forming the control gates/word lines 4641, as shown in FIG. 61.

In an eighth preferred embodiment of the present invention, the TFTs in a plurality of the levels of the three dimensional array of FIG. 52 undergo a recrystallization and/or a dopant activation step at the same time. This reduces the device fabrication time and cost. Furthermore, if each level of the array were subjected to a separate crystallization and/or dopant activation annealing, then the lower levels would undergo more annealing steps than the upper levels. This may lead to device non uniformity because the grain size may be larger in the active areas of the lower levels and/or the source and drain regions may have a different dopant distribution in the lower levels than in the upper levels.

Thus, in a first preferred aspect of the eighth embodiment, amorphous silicon or polysilicon active areas of TFTs in a plurality of levels are recrystallized at the same time. Preferably, TFTs in all levels are recrystallized at the same time. The recrystallization may be effected by thermal annealing in a furnace or by rapid thermal annealing (RTA) in an RTA system. The thermal annealing may be carried out at 550 to 800° C. for 6–10 hours, preferably at 650 to 725° C. for 7–8 hours.

Furthermore, since a silicide layer 4423 contacts the source and drain regions 4417, the silicide may act as a catalyst for recrystallization, especially if nickel, cobalt or molybdenum silicide is used. The metal atoms diffuse though the active areas of the TFTs, leaving behind large grains of polysilicon. Thus, recrystallizing the amorphous silicon or polysilicon active areas after depositing the bit line metallization leads to larger grains and allows the use of lower recrystallization temperatures, such as 550 to 650° C. Furthermore, no separate metal deposition and patterning for metal induced crystallization is required. Thus, each level of the array may be subjected to a recrystallization anneal after the bit line metallization is formed for this level. Alternatively, all levels of the array may be subjected to a recrystallization anneal after the bit line metallizations for every level of the array have been formed. Furthermore, in an alternative aspect of the eighth embodiment, silicide formation step and the recrystallization steps may be carried out during the same annealing step for each level of the array.

In a second preferred aspect of the eighth embodiment, the doped regions in a plurality of levels are activated at the same time. Preferably, the doped regions in all of the levels are activated at the same time. The doped regions comprise the TFT source and drain regions as well as any other doped region formed in the three dimensional array. Preferably, the doped regions are activated by subjecting the array to an RTA treatment. However, if desired, the activation may be carried out by thermal annealing at about 700 to about 850° C. for 20 to 60 minutes. The activation may be carried out before or after the crystallization anneal.

In a third preferred aspect of the eighth embodiment, the recrystallization and dopant activation are carried out in the same annealing step of a plurality of levels or for all the levels of the array. The annealing step should be conducted at a sufficiently high temperature and for a sufficient length of time to activate the dopants and to recrystallize the TFT active areas, without causing the source and drain region dopants to diffuse into the channel regions of the TFTs. Preferably, the combined recrystallization and dopant activation annealing step comprises an RTA treatment.

Figure 62:
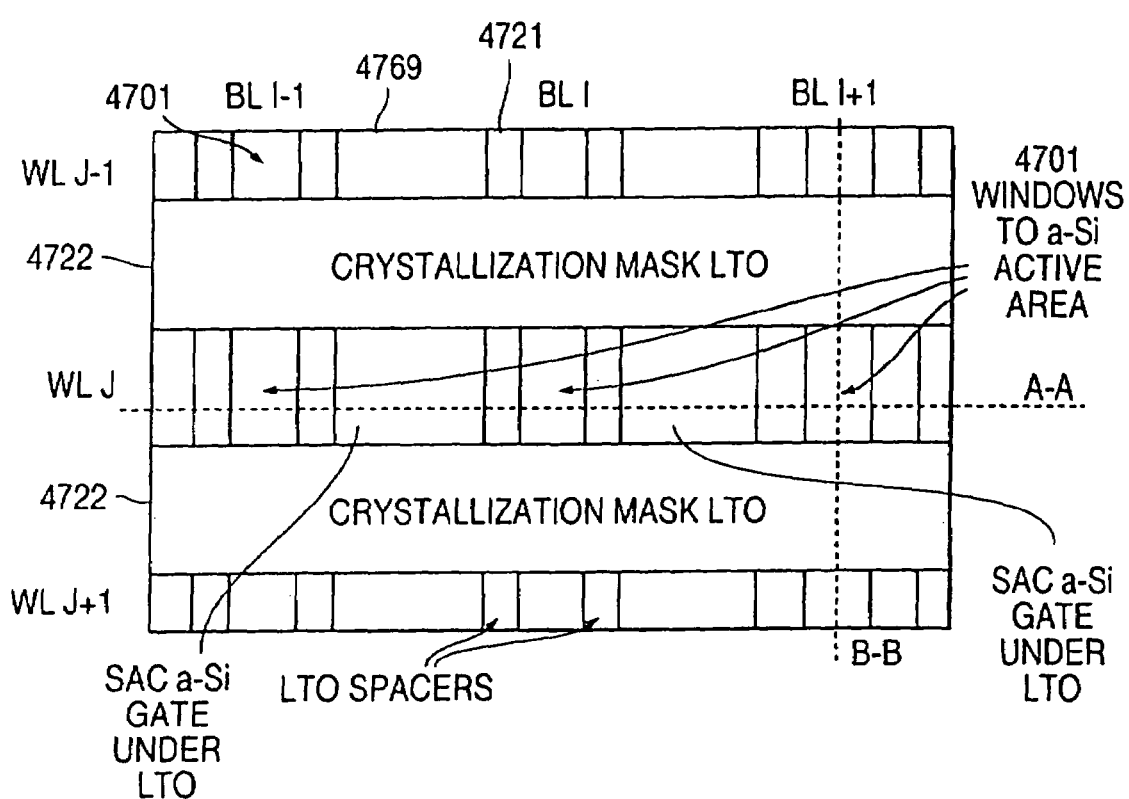
FIG. 62 is a top view of the array of a preferred embodiment of the present invention after forming crystallization windows.
Figure 63:
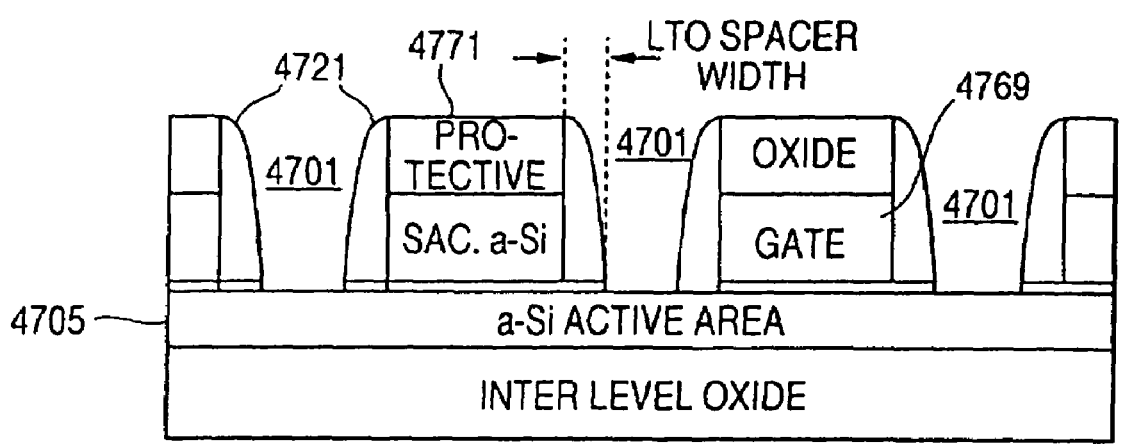
FIGS. 63 and 64 are side cross-sectional views along lines A—A and B—B, respectively, in FIG. 62. The cross-section is perpendicular to the bit lines in FIG. 63 and parallel to the bit lines in FIG. 64.
Figure 64:
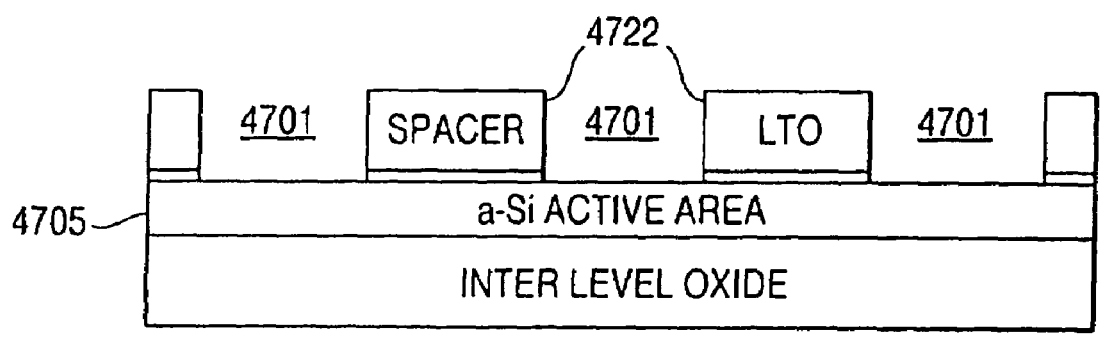

In a fourth preferred aspect of the eighth embodiment, an extra photolithographic masking step is provided to form crystallization windows used to deposit the crystallization catalyst material. For example, as shown in FIG. 62, the material 4722 used to form sidewall spacers 4721 is patterned using a separate photolithographic mask to form the crystallization windows 4701. Thus, in the replacement-gate transistor method shown in FIGS. 55–61, the crystallization windows 4701 are formed in the low temperature oxide (LTO) layer used to make sidewall spacers after the reverse bit line pattern is etched into the protective oxide 4771 and the sacrificial gates 4769. Crystallization mask features are etched into the oxide layer 4722 to clear the surface of the active layer 4705. Simultaneously, sidewall spacers 4721 are formed on the sacrificial gates 4769. Then, the photoresist (not shown) is stripped. FIGS. 63 and 64 illustrate cross-sections along lines A—A and B—B in FIG. 62, respectively. If desired, the crystallization windows may also be added to the process of the first through the fourth embodiments. Such windows would be formed during the formation of the sidewall spacers in those embodiments.

Figure 65:
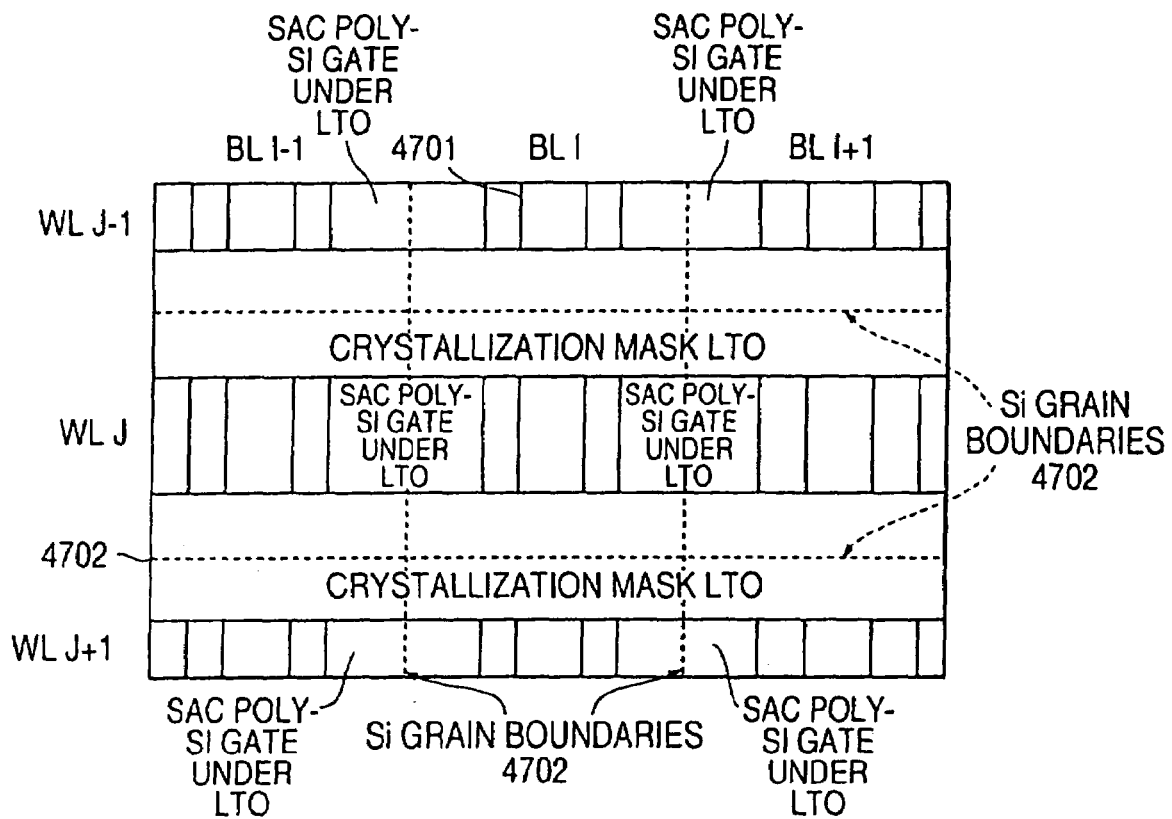
FIG. 65 is a top view of the array of a preferred embodiment after the crystallization of the active layer.

Next, a catalyst, such as Ni, Ge, Fe, Mo, Co, Pt, Pd, Rh, Ru, Os, Ir, Cu, Au, a silicide thereof, or other transition metal elements or their silicides, is deposited. The catalyst comes in contact with the amorphous silicon active layer 4705 only in the open windows 4701. The catalyst material may be deposited as a solid layer or as a catalyst solution. Alternatively, the catalyst may be ion implanted or diffused into the active layer 4705. Then, the device is annealed for several hours at a temperature below 600° C., preferably at 550° C. This low anneal temperature is preferred to minimize spontaneous nucleation in the amorphous silicon. Polysilicon grains in the present embodiment start growing from the seed regions in the windows 4701 and grow laterally. At the completion of anneal, the grain boundaries 4702 are aligned as shown in FIG. 65. Then, the catalyst is removed. A solid catalyst layer may be removed by selective etching, while catalyst atoms in the recrystallized polysilicon may be removed by gettering, such as by annealing the device in a chlorine containing gas. The LTO oxide layer 4722, which comprises the boundaries of crystallization windows 4701, is then removed by selective etching, and the device is completed as in the other embodiments. It should be noted that the word lines (WL in FIGS. 62 and 65) are subsequently formed over the regions where the crystallization windows 4701 used to be formed. Since the crystallization begins in the windows 4701, the grain boundaries 4702 which are parallel to the word lines are located away from the window regions, in the regions of the active layer 4705 between the word lines. These regions of the active layer 4705 between the word lines are removed after the formation of the word lines. Therefore, since the channel regions of the TFTs are located below the word lines, these TFT channel regions contain fewer grain boundaries, and substantially no grain boundaries which are parallel to the word lines.

III. Rail Stack TFTs

The following preferred embodiments provide an array of TFTs with a charge storage region, such as EEPROM TFTs, arranged in a rail stack configuration. The embodiments described herein are in the context of a non-volatile reprogrammable semiconductor memory and methods of fabrication and utilization thereof. Those of ordinary skill in the art will realize that the following detailed description of the embodiments of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The present embodiment is directed to a two- or, more preferably, a three-dimensional many-times-programmable (MTP) non-volatile memory. The memory provides a bit cell size of $2F^2/N$ where F is the minimum feature size (e.g., 0.18 microns in a 0.18 micron semiconductor process and 0.25 microns in a 0.25 micron semiconductor process) and N is the number of layers of devices in the third (i.e., vertical) dimension. Thus, for a 0.18 micron process with 8 devices stacked vertically, the effective bit cell size projected on the substrate is only about 0.0081 square microns. As a result, a 50 mm$^2$ chip with 50% array efficiency in a 0.18 micron technology and with 8 layers of memory devices would have approximately 3.1 billion memory cells for a capacity of approximately 386 megabytes with two bits stored per cell and 193 megabytes with one bit stored per cell. The three-dimensional versions of the memory use an extension to three dimensions of the "virtual ground array" commonly used with single crystalline silicon memory devices. The preferred memory process architecture uses N+ doped polysilicon rails perpendicular to rail stacks of P− doped polysilicon/charge trapping layer/N+ polysilicon in a cross-point array forming NMOS transistor memory devices with a SONOS charge trapping layer which may be duplicated vertically. Of course a PMOS memory can also be made.

Adjacent pairs of N+ polysilicon rails and a rail stack of P− doped polysilicon/charge trapping layer/N+ doped polysilicon define the source, drain and gate, respectively, of a unique NMOS memory device. Programming and erasing change the threshold voltage of this NMOS. With hot electron injection programming, two bits per NMOS can be stored and erasing can be performed either with hot hole injection or with Fowler-Nordheim tunneling.

Figure 80:
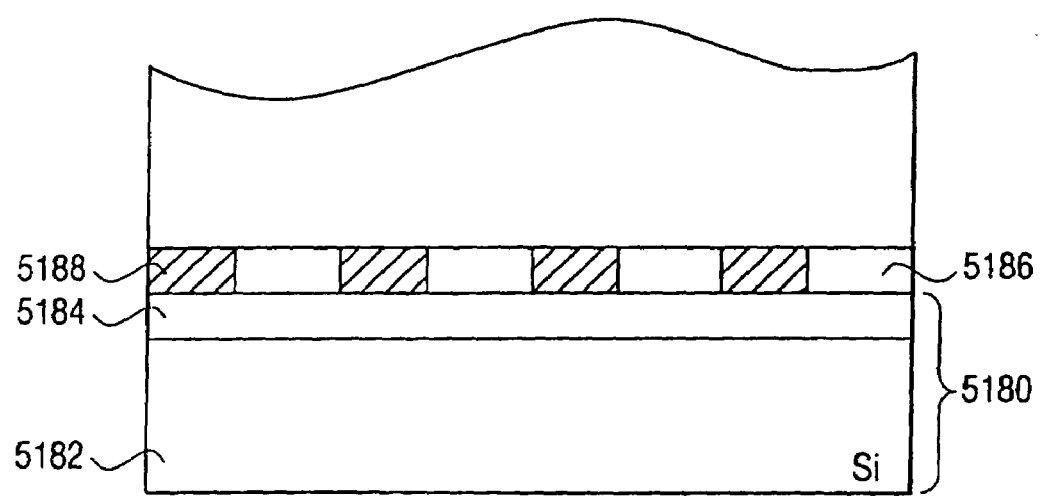
FIG. 80 is a cross-sectional drawing of a substrate in accordance with a specific embodiment of the present invention.

Turning now to FIG. 80, a method of integrating memory devices in accordance with a specific embodiment of the present invention into a multi-level array of storage cells will now be described. The fabrication starts by providing a substrate 5180 on which the multilevel array of storage devices is to be formed. Substrate 5180 will typically include a lightly doped monocrystalline silicon substrate 5182 in which transistors such as metal oxide semiconductor (MOS) transistors are formed. These transistors can be used as, for example, access transistors or they can be coupled together into circuits to form, for example, charge pumps or sense amps for the fabricated memory devices. Substrate 5180 will typically also include multiple levels of interconnects and interlayer dielectrics 5184 used to couple transistors in substrate 5182 together into functional circuits. The top surface 5186 of substrate 5180 will typically include an insulating layer or passivation layer to protect the underlying transistors and interconnects from contamination. The top surface 5186 will typically contain electrical contact pads to which multilevel arrays of memory devices of the present invention can be electrically coupled in order to make electrical contact with the transistors in silicon substrate 5182. In an embodiment of the present invention, the memory devices are physically isolated and separated from the single crystalline substrate by multiple levels of interconnects and dielectric 5184. The top surface of passivation or insulating layer 5186 will typically be planarized to enable uniform and reliable fabrication of multiple levels of the memory devices of the present invention. According to the present invention, the memory devices are physically separated from monocrystalline silicon substrate 5182. In an alternative embodiment of the present invention, memory devices can be fabricated on a glass substrate 5180 such as used in flat panel displays.

A process of forming a multilevel array of thin film transistor (TFT) memory devices above the substrate in accordance with an embodiment of the present invention begins by blanket depositing a first conductor layer 5188 over surface 5186 of substrate 5180. Conductor 5188 can be any suitable conductor such as, but not limited to, titanium silicide, doped polysilicon, or a metal such as aluminum or tungsten and their alloys formed by any suitable technique. Conductor layer 5188 is to be used as, for example, a bitline or a wordline to couple a row or column of memory devices together. Next, a planarization is performed by depositing or growing an insulating layer such as a silicon oxide over conductor layer 5188 to fill spaces between bit lines. A conventional chemical mechanical polishing (CMP) step completes the planarization and exposes the bitlines.

Figure 66:
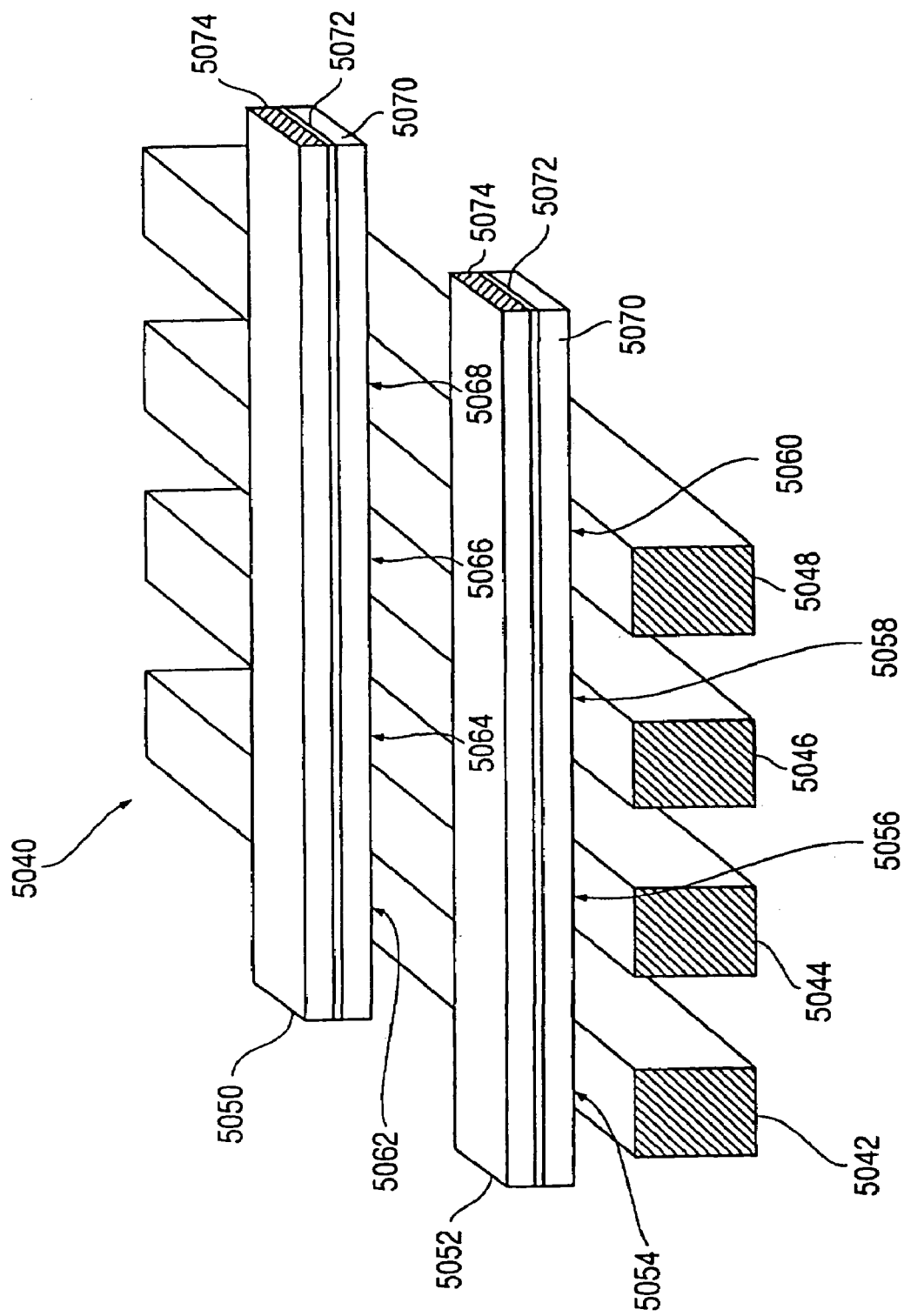
FIG. 66 is a drawing showing a front perspective view of a two-dimensional memory array in accordance with a specific embodiment of the present invention.

Turning now to FIG. 66, a specific embodiment of the present invention is illustrated in front perspective view. In this embodiment, a 2-dimensional memory array 5040 includes a first plurality of spaced-apart conductors such as N+ doped polysilicon bit lines 5042, 5044, 5046, 5048 disposed in a first direction a first height over (not in contact with) the substrate (not shown). A second plurality of spaced-apart "rail stacks" 5050, 5052 are disposed in a second direction different from the first direction (and preferably orthogonally) at a second height above the substrate so that they are above bit lines 5042, 5044, 5046 and 5048 and in contact therewith at intersection points 5054, 5056, 5058, 5060, 5062, 5064, 5066, 5068. Each rail stack 5050, 5052 in this embodiment includes at least a layer of P− doped polysilicon 5070 which may be formed, for example, by depositing an amorphous silicon film by chemical vapor depositing (CVD) and which is in situ doped with P type impurities (e.g., Boron) to a dopant density of about $1 \times 10^{16}$ to about 1×10$^{18}$ atoms/cm$^3$. The amorphous silicon films can then be converted into polycrystalline silicon through a subsequent anneal step. Alternatively, instead of in situ doping, undoped silicon can be grown or deposited and then implanted or diffused with dopants. Over layer 5070 is disposed a charge trapping layer 5072 comprising a charge trapping medium as discussed below, and a conductive wordline 5074 which may comprise N+ doped (or P+ doped) polysilicon disposed over the charge trapping layer 5072. A planarized oxide material (not shown in FIG. 66) may be deposited in the spaces between and above adjacent bit lines and rail stacks. A conventional chemical mechanical polishing (CMP) process may be used to accomplish the planarization.

The memory array structure of FIG. 66 can now be easily extrapolated to three dimensions. To do this, the CMP planarized oxide layer over wordlines 5050, 5052 is used. The planarized isolation layer (or interlayer insulating layer) prevents shorting one set of wordlines with the next set of bit lines. Then another layer of bit lines 5042, 5044, 5046, 5048 is constructed over the isolation layer followed by an oxide deposition and a CMP step, followed by a deposition of another set of wordlines. This process can be repeated a number of times, as desired. In accordance with a specific embodiment of the present invention, eight layers of memory array (or more) are stacked one upon another to provide 8 times the bit density of the non-three-dimensional version.

Figure 67:
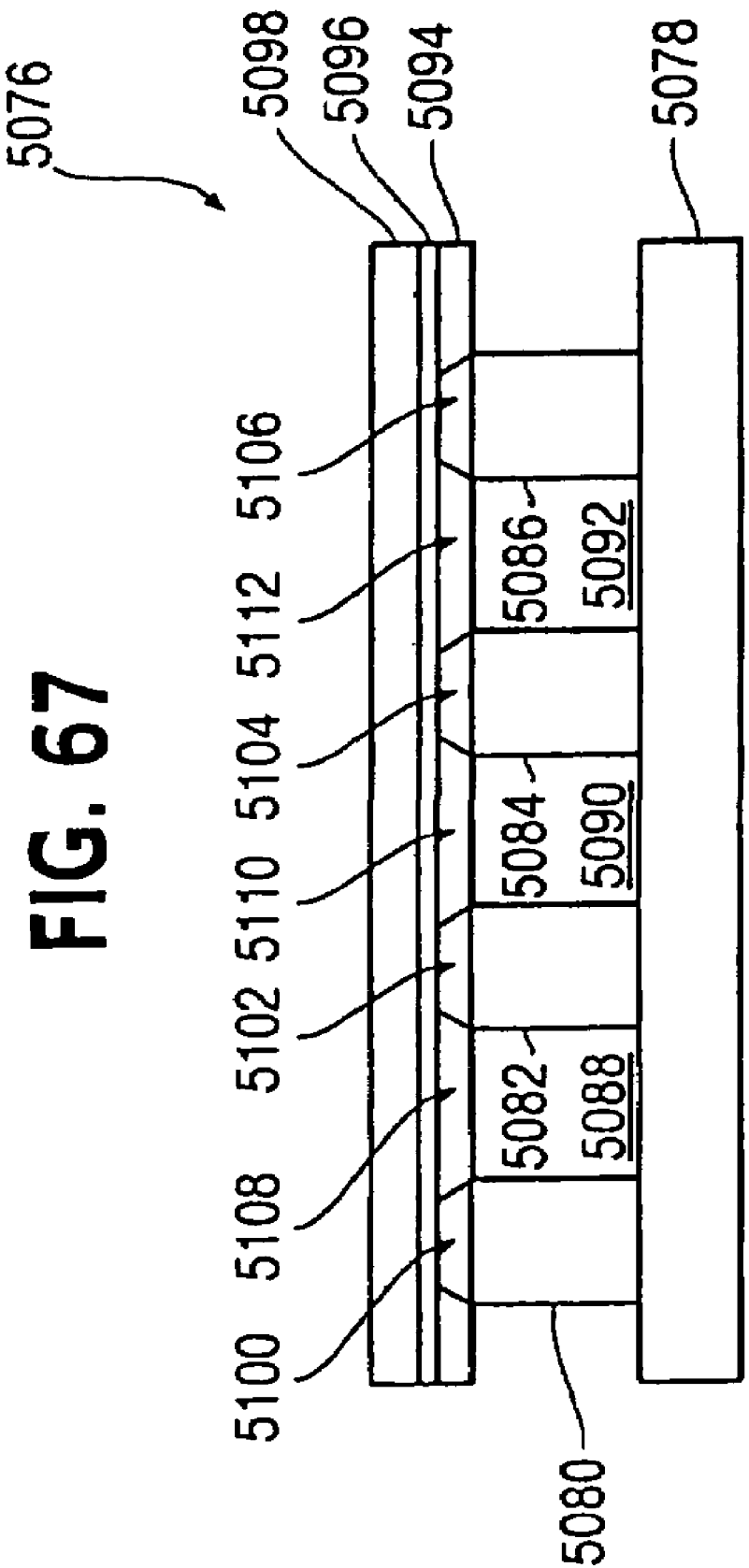
FIG. 67 is a drawing showing an elevational cross sectional view of a two-dimensional memory array in accordance with a specific embodiment of the present invention.

Turning now to FIG. 67, another specific embodiment of the present invention is illustrated. In this embodiment a 2-dimensional array 5076 includes an isolation layer 5078 electrically separating it from the substrate (not shown). The isolation layer may be any conventional isolation/insulation layer such as a silicon oxide. Over isolation layer 5078 is disposed a plurality of spaced-apart bit lines 5080, 5082, 5084, 5086. Bit lines 5080, 5082, 5084, 5086 are preferably formed of N+ doped polysilicon although P+ doped polysilicon could also be used as could any suitable electrical conductor. A deposition step is used to fill the regions 5088, 5090, 5092 between adjacent bit lines 5080, 5082, 5084, 5086 with a filler material. The filler material must be an electrical insulator. Again, silicon oxide is convenient although other materials could also be used. A CMP step is then used to planarize and expose the bit lines. A layer 5094 of a semiconductor material such as P− doped polysilicon is then disposed over and in contact with bit lines 5080, 5082, 5084, 5086. An ONO layer 5096 is disposed over the semiconductor layer 5094 and a conductive wordline 5098 is disposed over ONO layer 5096. In accordance with a presently preferred embodiment, the bit lines 5080, 5082, 5084, 5086 and the wordlines 5098 are formed of N+ doped polysilicon. When thermally processed, N+ out diffusion regions 5100, 5102, 5104, 5106 are formed in P− doped semiconductor layer 5094. The channels 5108, 5110, 5112 between adjacent N+ out diffusion regions become channels of NMOS transistors whose threshold voltages are controlled by the presence or absence of trapped charge in the nitride layer of ONO dielectric stack 5096.

Those of ordinary skill in the art will realize that semiconductors of the opposite conductivity types may also be used. Where a conductor other than doped polysilicon is used for the wordlines and bit lines it will be necessary to form a doped region in semiconductor layer 5094 in some way other than by out diffusion.

Figure 68:
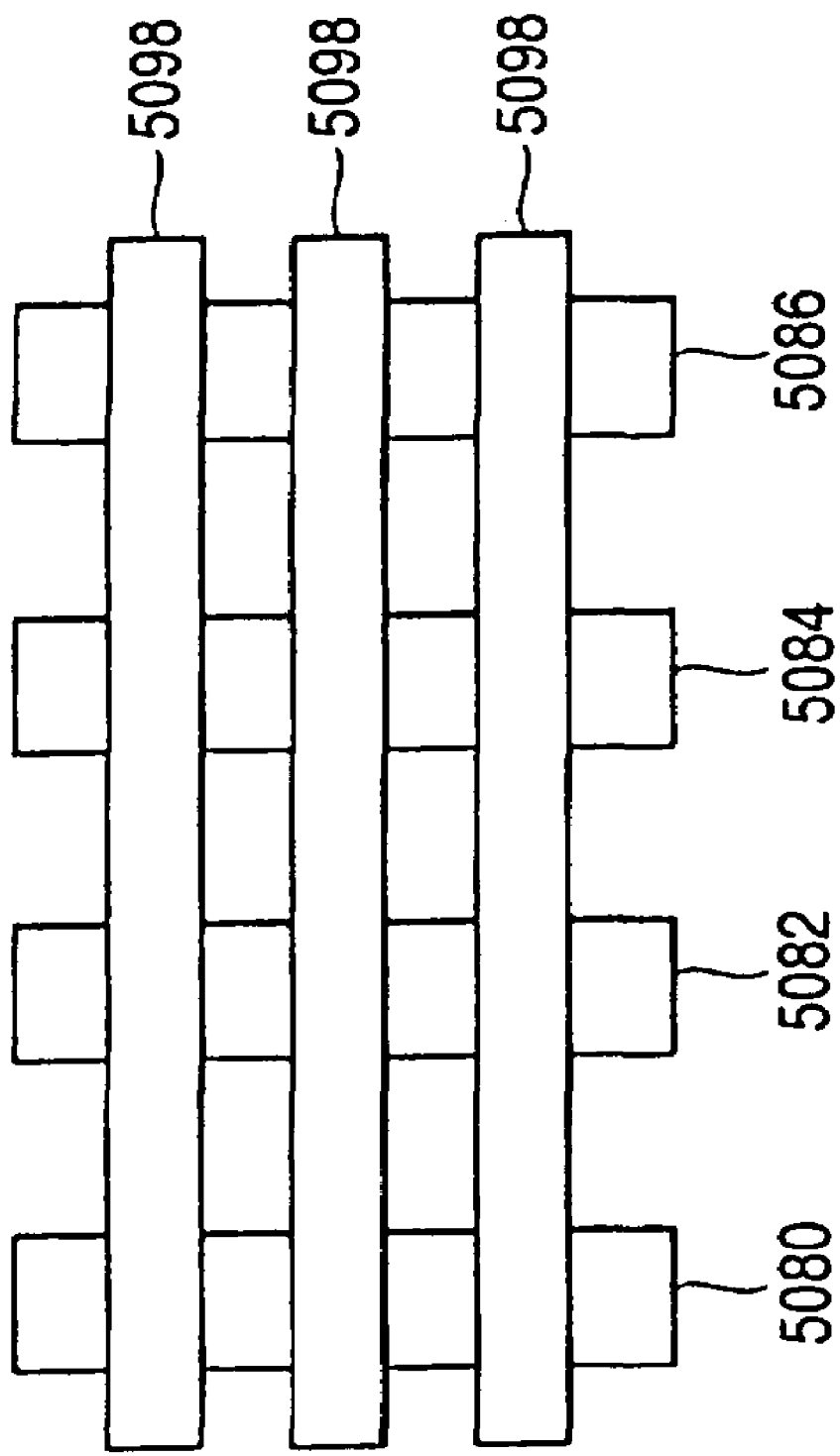
FIG. 68 is a drawing showing a top plan view of a memory array in accordance with a specific embodiment of the present invention.

FIG. 68 is a top plan view of the memory array of FIG. 67. As shown in FIG. 68, the wordlines 5098 are arranged over the bit lines 5080 in a cross point array. While the wordlines and the bitlines are arranged perpendicular (i.e., at a 90 degree angle) to each other in FIG. 68, an angle between the wordlines and bitlines may differ from 90 degrees. Furthermore, outside the boundaries of the memory array, the wordlines and the bitlines may change directions and even be parallel to each other. Furthermore, the term "rail stack" or "rail" preferably refers to conductors arranged in straight lines. However, if desired, the rails or rail stacks may have bends, twists or turns, if desired.

Figure 69:
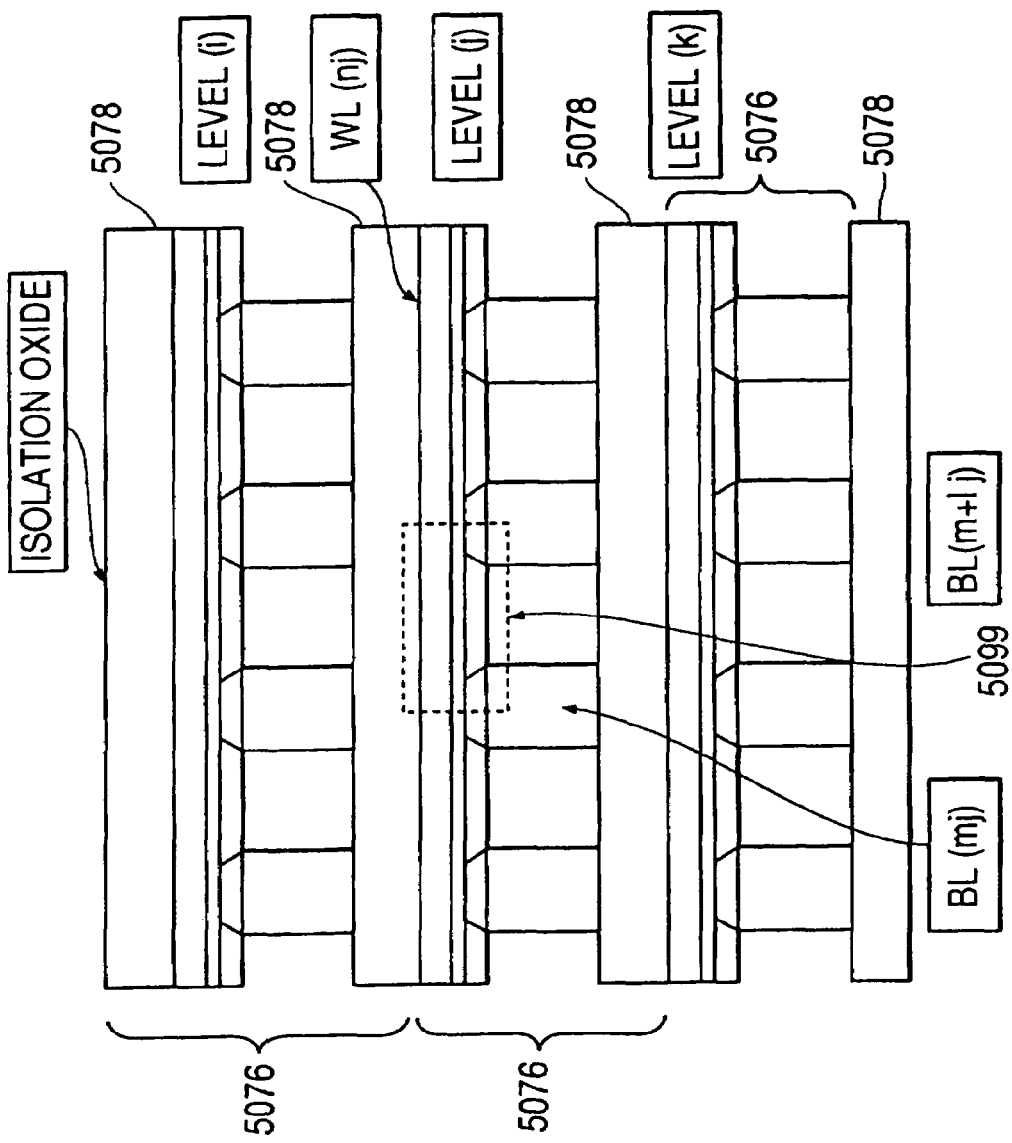
FIG. 69 is a drawing showing an elevational cross sectional view of a three-dimensional memory array in accordance with a specific embodiment of the present invention.

Turning now to FIG. 69 the memory array of FIG. 67 is extrapolated to a monolithic three-dimensional array. The term "monolithic" means that layers of each level of the array were directly deposited on the layers of each underlying level of the array. In contrast, two dimensional arrays may be formed separately and then packaged together to form a non-monolithic memory device. Each device level 5076 is preferably identical to that shown in FIG. 67 and an isolation layer (i.e., interlayer insulating layer) 5078 separates each level. A single cell (i.e., a TFT EEPROM) 5099 is delineated by the dashed line in FIG. 69. The cell 5099 is located in device level "j" at the intersection of word line (n,j) and bit lines (m,j) and (m+1,j).

Figure 70:
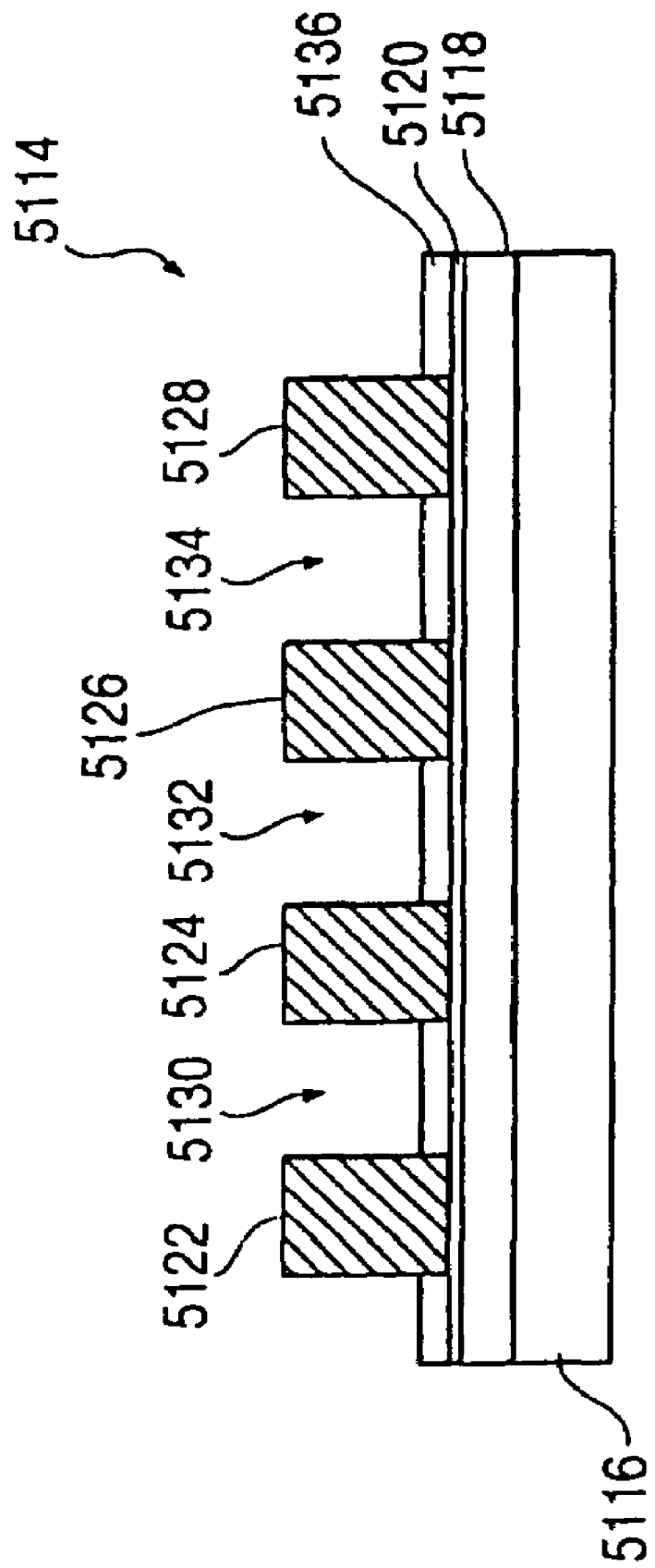
FIG. 70 is a drawing showing an elevational cross sectional view of a two-dimensional memory array in accordance with a specific embodiment of the present invention.

Turning now to FIG. 70, another specific embodiment of the present invention is illustrated. In this embodiment, an array of bottom gate TFTs is formed. A two-dimensional memory array 5114 is disposed above a substrate. An isolation layer 5116 is disposed to separate memory array 5114 from the substrate (not shown) or another level of memory array (not shown). A plurality of spaced-apart wordlines 5118 are disposed over isolation layer 5116. Over wordline 5118 are disposed a film of a charge trapping medium 5120, such as an ONO dielectric stack. Over the charge trapping medium 5120 is disposed a plurality of spaced-apart bitlines 5122, 5124, 5126, 5128. In the space 5130, 5132, 5134 between bit lines 5122, 5124, 5126, 5128 is disposed a film of semiconductor material 5136. This may be deposited into spaces 5130, 5132, 5134 or it may be deposited or grown over charge trapping medium 5120 and then masked and etched so that bitlines 5122, 5124, 5126, 5128 are formed after it has been formed. This version of the memory array approximates turning the design of FIG. 69 upside down. In this way, the bitlines are trenches that would be filled by N+ doped polysilicon. Prior to filling, n-type implantation is carried out to form the MOS devices' sources and drains. In addition, a refractory metal may be used at the bottom of the trenches instead of dopant to form the sources and drains.

Figure 71:
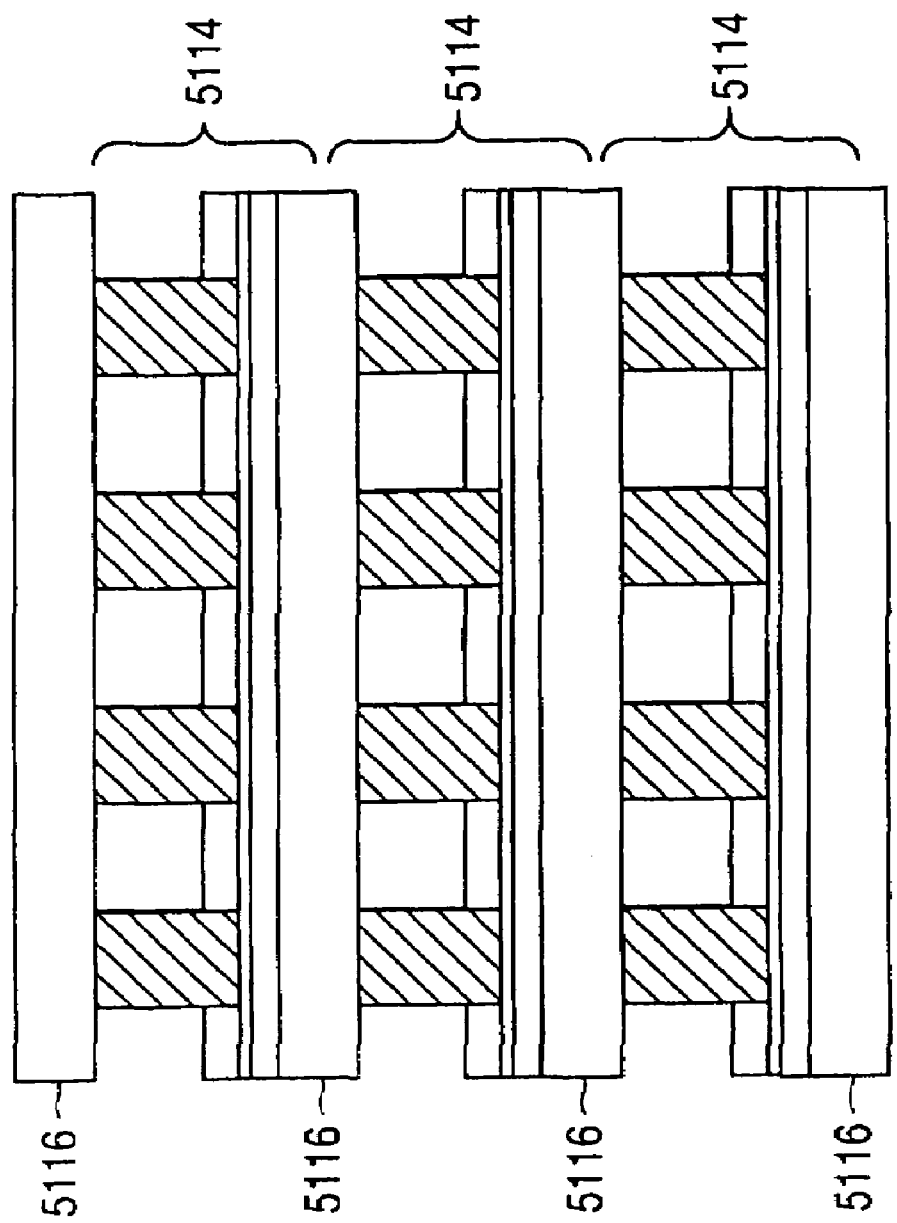
FIG. 71 is a drawing showing an elevational cross sectional view of a three-dimensional memory array in accordance with a specific embodiment of the present invention.

Turning now to FIG. 71 the memory array of FIG. 70 is extrapolated to a monolithic three-dimensional array. Each level 5114 is preferably identical to that shown in FIG. 70 and an isolation layer 5116 separates each level.

Figure 72:
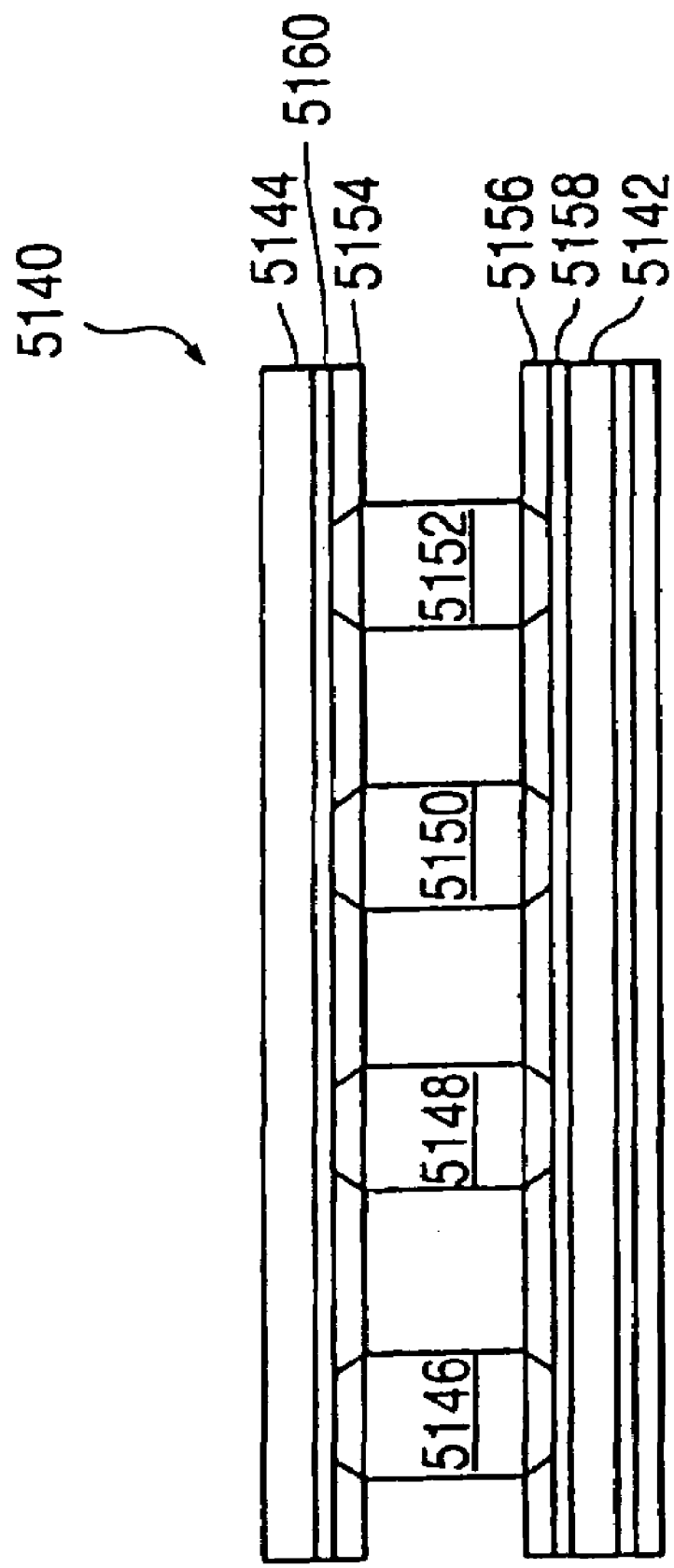
FIG. 72 is a drawing showing an elevational cross sectional view of a memory array in accordance with a specific embodiment of the present invention.

Turning now to FIG. 72, another specific embodiment of the present invention is illustrated, where each bit line acts as a bit line for TFTs in two device levels. In this embodiment a memory array 5140 includes a lower word line 5142 and an upper word line 5144. Bitlines 5146, 5148, 5150, 5152 are disposed between upper wordline 5144 and lower wordline 5142. In a manner similar to that of FIG. 67 and FIG. 69, an upper semiconductor film 5154 is disposed between bitlines 5146, 5148, 5150, 5152 and upper wordline 5144. Lower semiconductor film 5156 is disposed between bitlines 5146, 5148, 5150, 5152 and lower wordline 5142. Out diffusion regions are formed adjacent to bitlines 5146, 5148, 5150, 5152 in upper semiconductor film 5154 and lower semiconductor film 5156. A lower charge storage medium film 5158 is disposed between lower wordline 5142 and lower semiconductor film 5156. An upper charge storage medium film 5160 is disposed between upper wordline 5144 and upper semiconductor film 5154. Notice that in this embodiment the layers are copied in a mirror image fashion.

Figure 73:
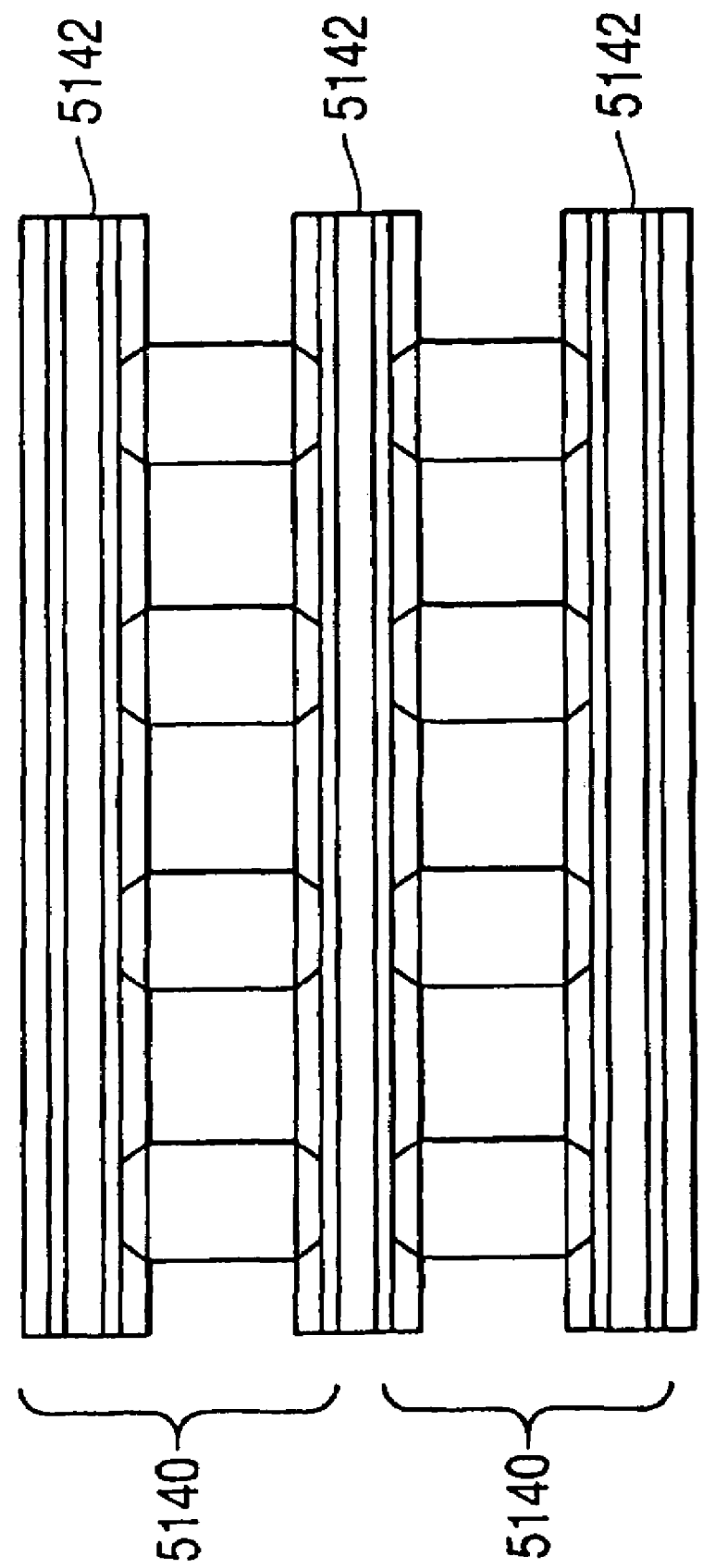
FIG. 73 is a drawing showing an elevational cross sectional view of a three-dimensional memory array in accordance with a specific embodiment of the present invention.

Turning now to FIG. 73, the memory array of FIG. 72 is extrapolated to a monolithic three dimensional array. Each device level 5140 may be thought of as containing two word lines and two TFT active regions and a plurality of bit lines disposed between the active regions. Alternatively, each device level may be thought of as a single wordline 5142 being disposed between two TFT active regions. Thus, each device level contains either one wordline level and two bitline levels or one bitline level and two wordline levels. Each TFT active region shares both a bitline and a wordline with another TFT active region disposed in a different horizontal plane.

An alternative bottom gate TFT embodiment is illustrated in FIGS. 81A–81H. The approach of FIGS. 81A–81H is somewhat similar to that of FIG. 70. Layer 5116 is an isolation layer such as an oxide separating the memory array structure 5114 from other memory array levels or from the substrate. Layer 5118 is a conductive wordline layer. Layer 5120 is an O—N—O dielectric stack. Layer 5136 is a film of semiconductor material (p-type when the wordlines and bitlines are N+ polysilicon).

Figure 81A:
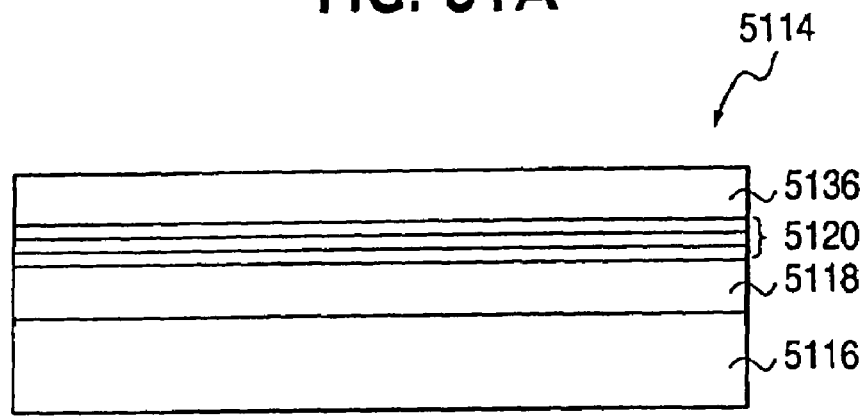
FIGS. 81A–81H illustrate steps in the fabrication of a memory array in accordance with a specific embodiment of the present invention.
Figure 81B:
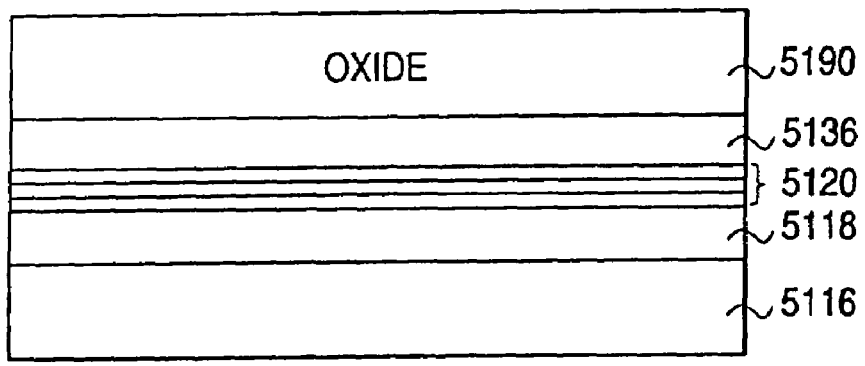
Figure 81C:
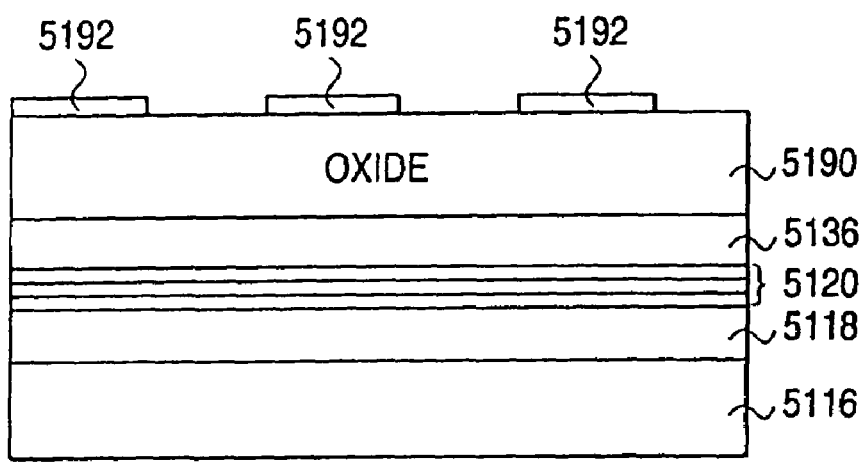
Figure 81D:
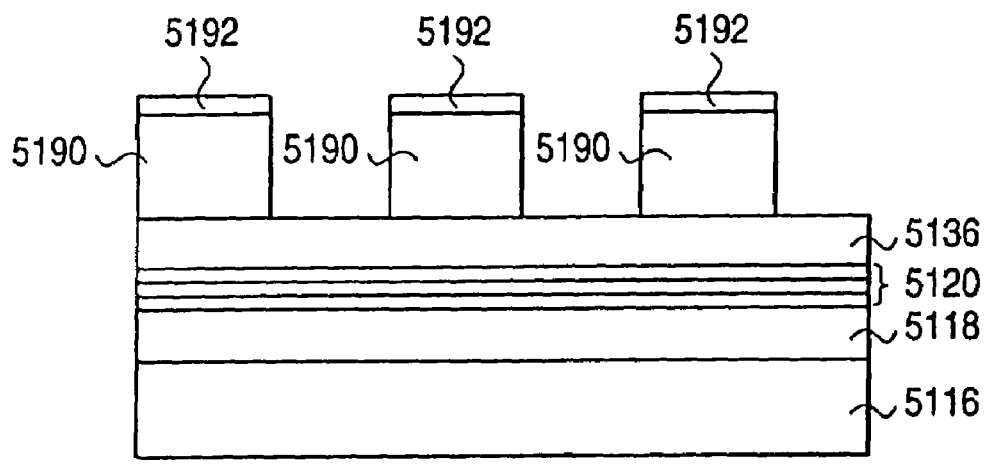

In FIG. 81B an oxide layer 5190 is deposited or grown. In FIG. 81C the oxide layer 5190 is masked with a mask 5192 (i.e., a photoresist mask). In FIG. 81D the unmasked portions of the oxide layer 5190 are etched in a conventional manner.

Figure 81E:
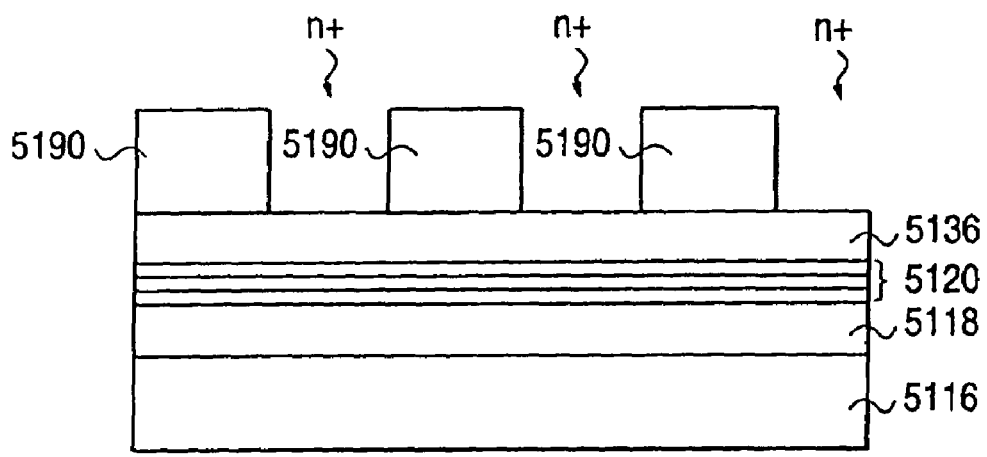
Figure 81F:
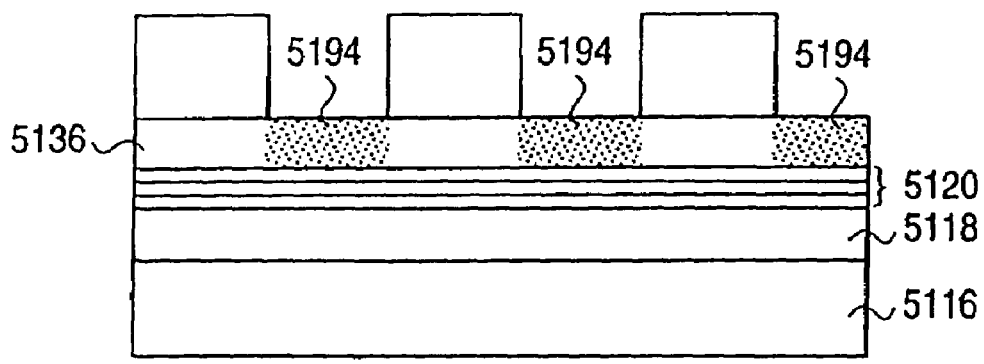
Figure 81G:
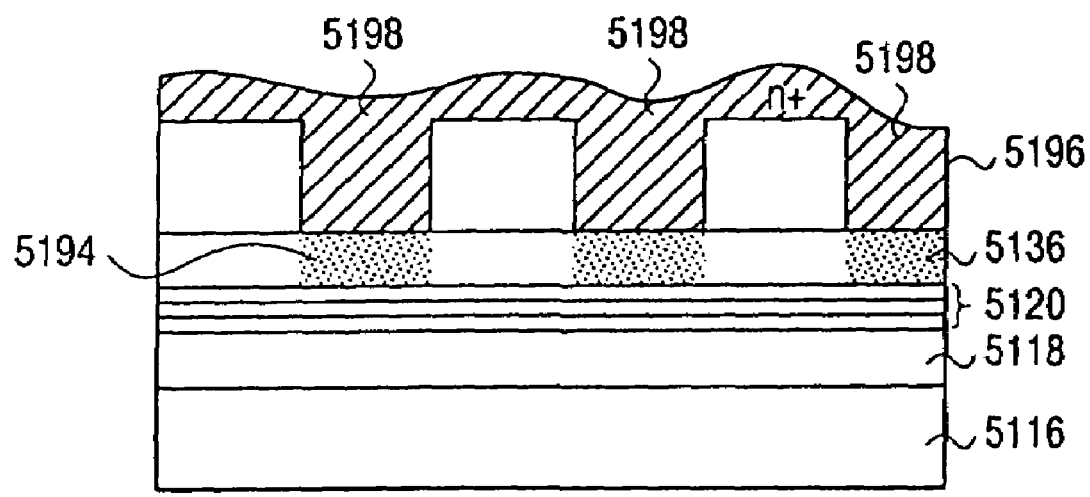
Figure 81H:
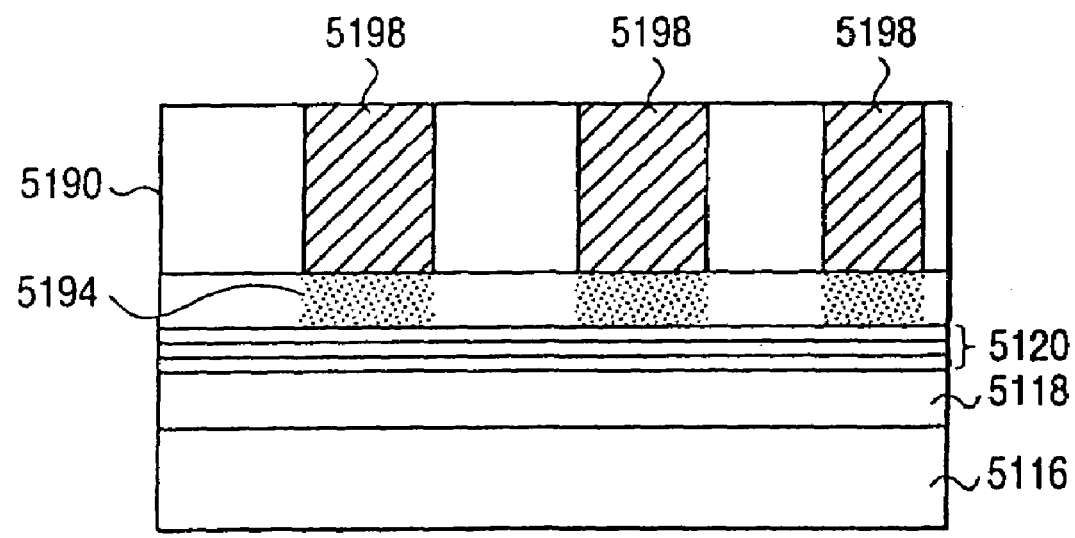

In FIG. 81E the mask 5192 is removed and semiconductor layer 5136 is implanted with n-type ions to form an N+implantation region 5194 at each opening in the oxide layer 5190 as illustrated in FIG. 81F. In FIG. 81G an N+ layer 5196 is deposited to fill gaps in the oxide and form bitline 5198 of N+ material in contact with N+ implantation regions 5194 so as to provide a contact with the O—N—O layer 5120. In FIG. 81H the N+ layer 5196 is CMP planarized as shown to form the bitlines 5198, to complete an NMOS TFT array. Of course a PMOS TFT array may be constructed by reversing the conductivity types of the layers and dopants. A multilayer version of the memory array of FIGS. 81A–81H can be constructed by forming additional device levels separated by an isolation layer.

Figure 82A:
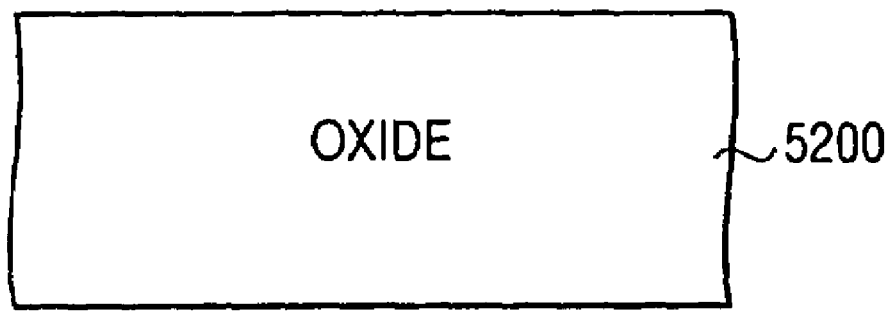
FIGS. 82A–82I illustrate steps in the fabrication of a memory array in accordance with a specific embodiment of the present invention.
Figure 82B:
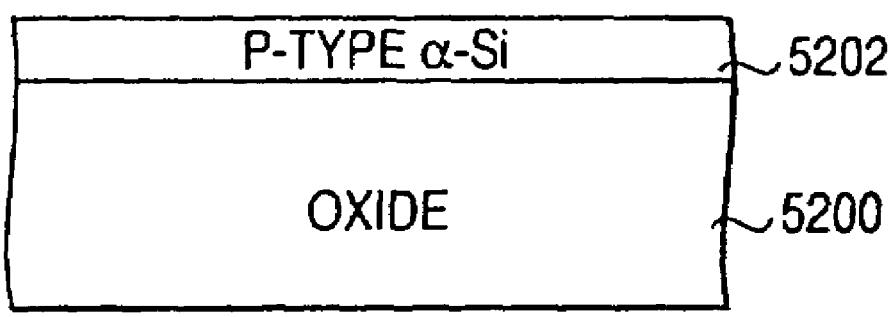
Figure 82C:
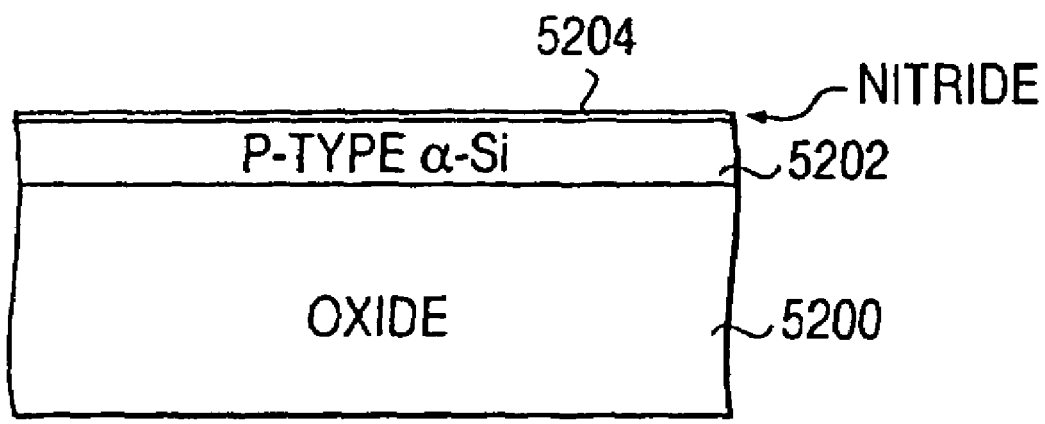

Another alternative embodiment of a top gate TFT array is illustrated in FIGS. 82A–82I. In FIG. 82A an oxide or isolation layer 5200 is disposed above a substrate (not shown). In FIG. 82B a layer of semiconductor material of a first conductivity type 5202 is disposed over oxide layer 5200. The semiconductor material may be P– doped amorphous silicon. Over this in FIG. 82C is deposited a hard nitride CMP-stop layer 5204 to stop the CMP process from polishing into layer 5202.

Figure 82D:
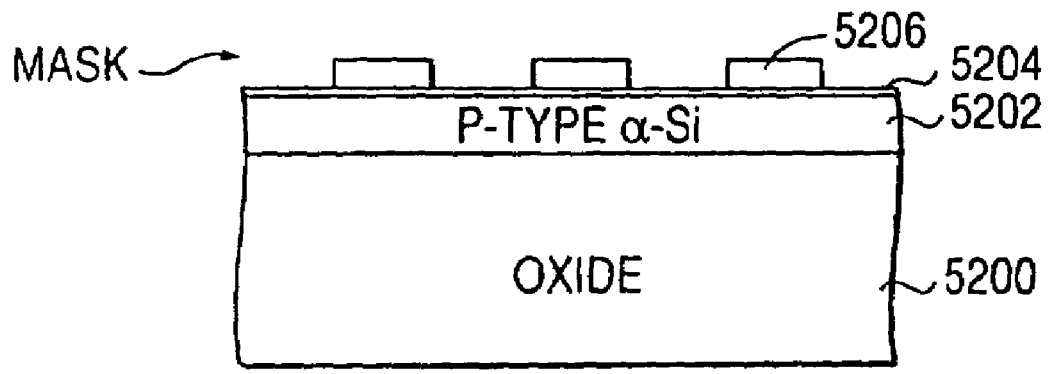
Figure 82E:
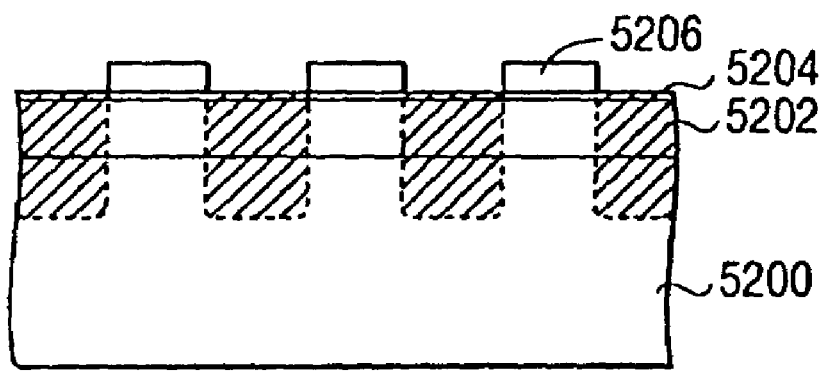
Figure 82F:
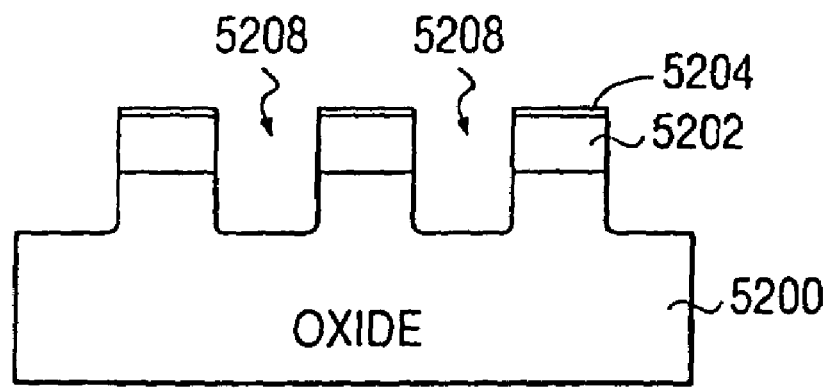
Figure 82G:
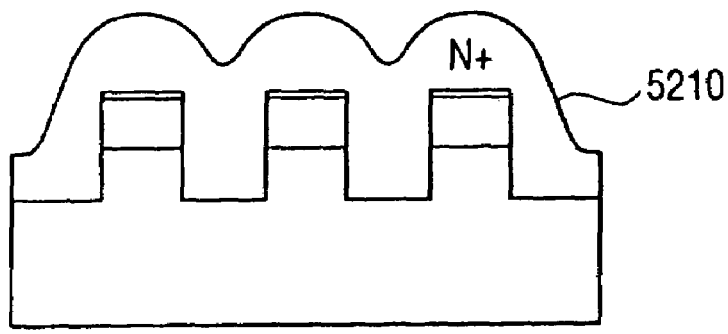
Figure 82H:
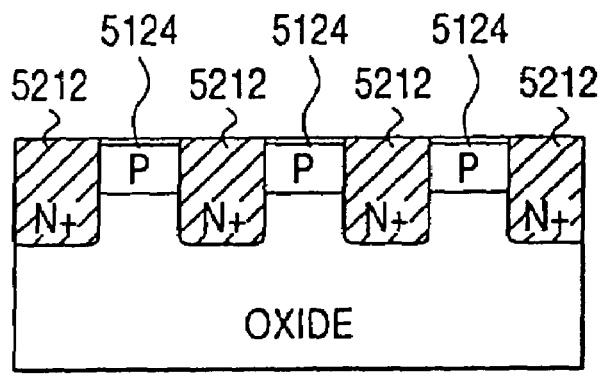
Figure 82I:
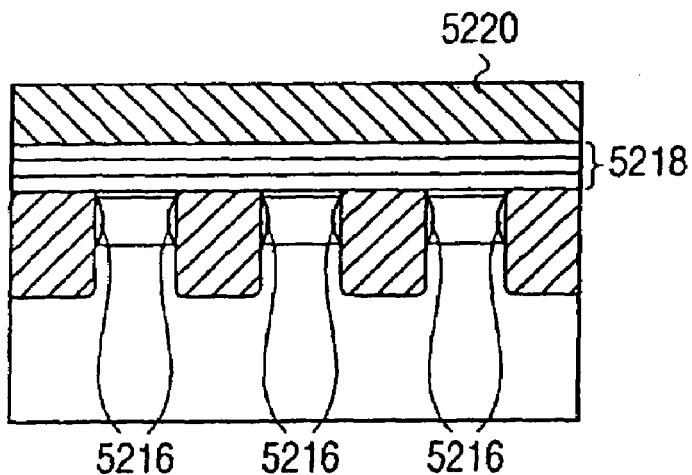

In FIG. 82D the memory array under construction is masked with mask 5206, as a photoresist mask. In FIG. 82E an etch is being carried out to form apertures or trenches 5208 as shown in FIG. 82F. In FIG. 82G a conductive layer 5210 is deposited, such as n+ doped polysilicon. In FIG. 82H this layer 5210 is CMP polished down leaving N+ bitlines 5212 with P– doped regions 5214 between them. After thermal processing, out diffusion regions 5216 are formed as shown in FIG. 82I. Furthermore, the amorphous silicon layer 5202 is recrystallized into a polysilicon layer.

In FIG. 82I a local charge storage film 5218 is disposed over bitlines 5212 and a conductive film 5220 is disposed over local charge storage film 5218. The conductive film 5220 is patterned to form a wordline. The charge storage film 5218 is also patterned to form rail stacks which include the wordline and the charge storage film.

Figure 77:
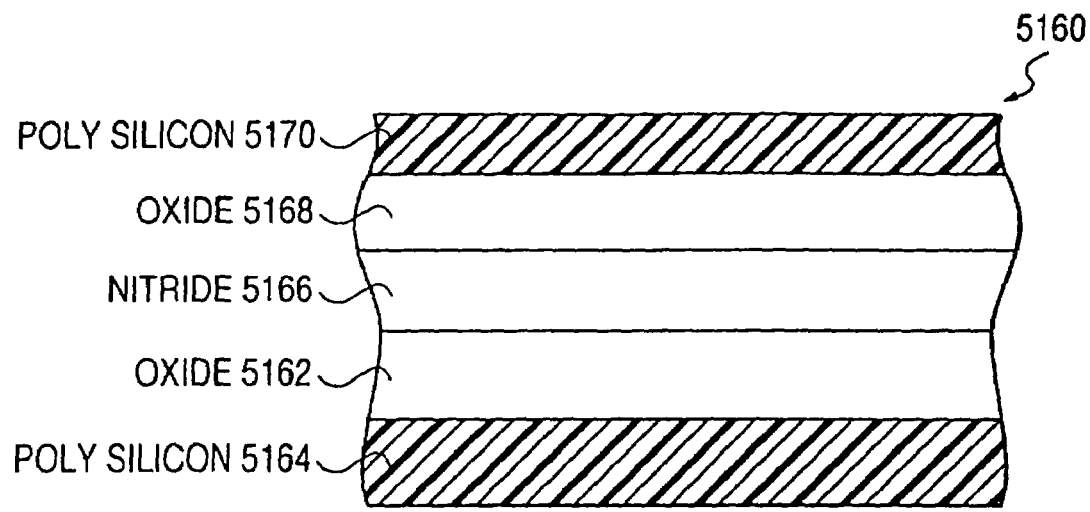
FIG. 77 is a cross sectional drawing illustrating a SONOS on a dielectric stack.

The charge storage medium film used herein (also referred to herein as a "local charge storage film") needs to be able to retain a localized charge, i.e., it must not laterally conduct. In one embodiment, a charge trapping layer may be formed in a dielectric stack 5160 as shown in FIG. 77. For example, the charge storage medium can be a dielectric stack 5160 comprising a first oxide layer 5162 adjacent to a polysilicon film 5164, a nitride layer 5166 adjacent to the first oxide layer 5162 and a second oxide layer 5168 adjacent to the nitride layer 5166 and adjacent to a polysilicon control gate 5170. Such a dielectric stack 5160 is sometimes referred to as an ONO stack (i.e., oxide-nitride-oxide) stack. Other suitable charge trapping dielectric films such as silicon implanted or silicon-rich oxides can be used if desired.

Figure 78:
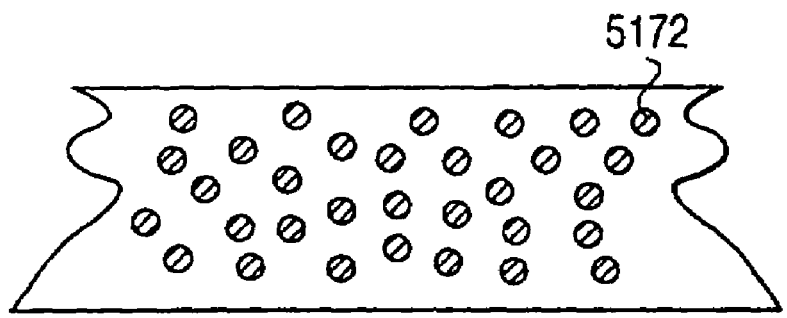
FIG. 78 is a cross-sectional drawing illustrating a nanocrystalline charge storage medium.

The charge storage medium film may alternatively be formed from a plurality of electrically isolated nanocrystals 5172 as shown in FIG. 78. Nanocrystals are small clusters or crystals of a conductive material which are electrically isolated from one another. An advantage of the use of nanocrystals for the charge storage medium is that because they do not form a continuous film, nanocrystals are self isolating. Nanocrystals 5172 enable multiple self-isolating charge storage areas to be formed.

Nanocrystals 5172 can be formed from conductive material such as silicon, tungsten or aluminum. In order to be self isolating the nanocrystals must have a material cluster size less than one-half the pitch of the cell so that floating gates from vertically and horizontally adjacent cells are isolated. That is, the nanocrystals or material clusters 5172 must be small enough so that a single nanocrystal 5172 cannot bridge vertically or horizontally adjacent cells. Silicon nanocrystals can be formed by depositing silicon in a manner whereby silicon has a very high surface diffusivity relative to its sticking coefficient. For example, silicon nanocrystals can be formed by chemical vapor deposition (CVD), by decomposing silane ($SiH_4$) at a very low pressure, in a range of about 1 millitorr to about 200 millitorr, at a temperature in a range of about 250° to about 650° C. In such a process, a very thin deposition, in a range of about 50 Å to about 250 Å, will form little islands of silicon. If $H_2$ is included with silane during the deposition, higher pressures can be utilized and still obtain nanocrystals. In an alternative embodiment of the present invention, metal nanocrystals such as aluminum nanocrystals, can be formed by sputtering from a metal target at a temperature near the melting temperature of the metal, so that the metal agglomerates and forms nanocrystals. Tungsten nanocrystals can be formed by chemical vapor deposition at very low pressures by utilizing a reactant gas mix comprising a tungsten source gas such as $WF_6$ and germane ($GeH_4$). In still yet another embodiment of the present invention, a continuous film of floating gate material can be deposited and then caused to precipitate (by heating) to cause islands to form in the film.

It is to be appreciated, that although nanocrystals are preferred for the floating gate, because of their self isolating quality, the floating gate can be formed from a continuous film such as, but not limited to, a metal such as tungsten or a silicon film such as polycrystalline or amorphous silicon doped to the desired conductivity type (typically N+ silicon). If a continuous film is used as a local charge storage film, the film would be anisotropically etched at this time to remove portions of it in order to electrically isolate strips of the film.

Similarly, small pieces of floating gate material, such as heavily doped polysilicon, may form a local charge storage medium when embedded in an insulator such as an oxide layer.

Figure 76:
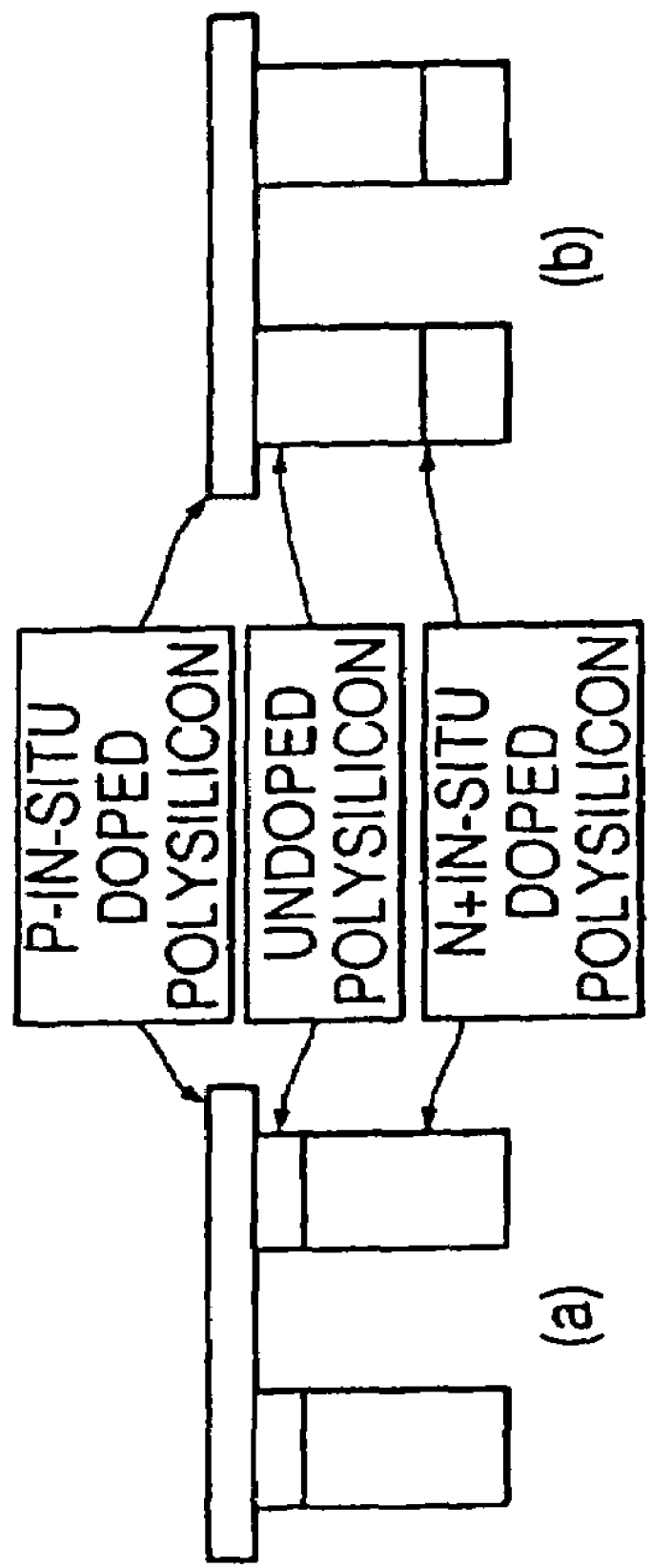
FIG. 76 is a drawing illustrating a method of fabrication of memory cells in accordance with a specific embodiment of the present invention.

An issue with using N+ out diffusion in a multi-level device is that the various levels will be exposed to different thermal processing. That is, the bottom layer will be exposed to each thermal processing step while the top layer is only exposed to the last thermal processing steps. Since it is undesirable to have the MOS memory transistors exhibiting substantially different performance characteristics depending upon level in the array and it is undesirable to allow lateral diffusion to swamp the MOS memory transistors, care needs to be given to the thermal budget and mechanisms for forming source/drain regions. Where N+ doping is used for the bitline and P− doping for the semiconductor film, it is possible to use antimony as the dopant instead of phosphorous as antimony exhibits a smaller diffusivity than phosphorous. It is also possible to engineer the dopant profile in the bitline polysilicon to allow different out diffusions. This is shown in FIG. 76 in schematic representation. After polysilicon dopant diffusion is characterized for various thermal budgets for the polysilicon depositions, one can easily determine how far away the N+ in situ doped material should be from the P− doped body region as a function of memory level within the array. Antimony could also be used here and could be directly implanted, if desired. In FIG. 76, the bitlines denoted (a) are closer to the top level of the memory array than are the bitlines denoted (b). In other words, bitlines (a) are located above bitlines (b) in the array. During the thermal treatment, the dopants in the bitlines will diffuse upwards throughout the entire bit lines and outdiffuse into the P− polysilicon layer to form the source and drain regions. Thus, the source and drain regions in plural levels will be evenly doped.

Turning now to FIG. 69, to program the first bit in the selected cell in FIG. 69, WL(n,j) is pulsed high (9–13V, high impedance) while BL(m,j) is grounded and BL(m+1,j) is pulsed high (3–8V, lower impedance). All BL's to the left of BL(m,j) on the $j^{th}$ level are held at ground while all BL's to the right of BL(m+1,j) on the $j^{th}$ level are held at the same voltage as BL(m+1,j). All other WL's on the $j^{th}$ level are held at ground to make sure that all other MOS devices between BL(m,j) and BL(m+1,j) are off. All other BL's and WL's on all other layers can be left floating. This means that the selected cell MOS device is uniquely on and powered to optimize hot carrier generation and programming into the charge trapping dielectric close to the drain (defined by BL(m+1,j)).

To read the first bit, BL(m+1,j) is now the source and BL(m,j) is the drain. The former is grounded and the latter is raised to a read voltage (~50 mV to 3V, preferably 1–3V) while WL(m,j) is pulsed to a read voltage (~1–5V). Again, all BL's to the left of BL(m,j) are held at the same potential as BL(m,j) and all BL's to the right of BL(m+1,j) are grounded. All other WL's on the same level are grounded to shut off all other MOS devices between the same two BL's. All other BL's and WL's on all other levels can be left floating.

To program and read the second bit in the same cell, the voltages on BL(m,j) and BL(M+1,j) are reversed compared to the above.

Notice that the body region of the MOS memory transistor is floating and can be made thin (defined by the deposition tool, e.g., preferably several hundred Angstroms). By making this region thin, snapback of the device can be avoided and so rapid increase in programming currents can also be avoided.

Erasing of the memory can take place in blocks and may employ a combination of slow Fowler-Nordheim tunneling and hot hole injection. The erase current will be small since the MOS body is floating resulting in very little band-to-band tunneling and avalanche breakdown. Erase can take place with the wordlines either grounded or held negative (~−5V) and all bitlines held at some positive voltage. The erase procedure will take over 100 ms and can be done at each memory level up to the full memory at one time.

Figure 74:
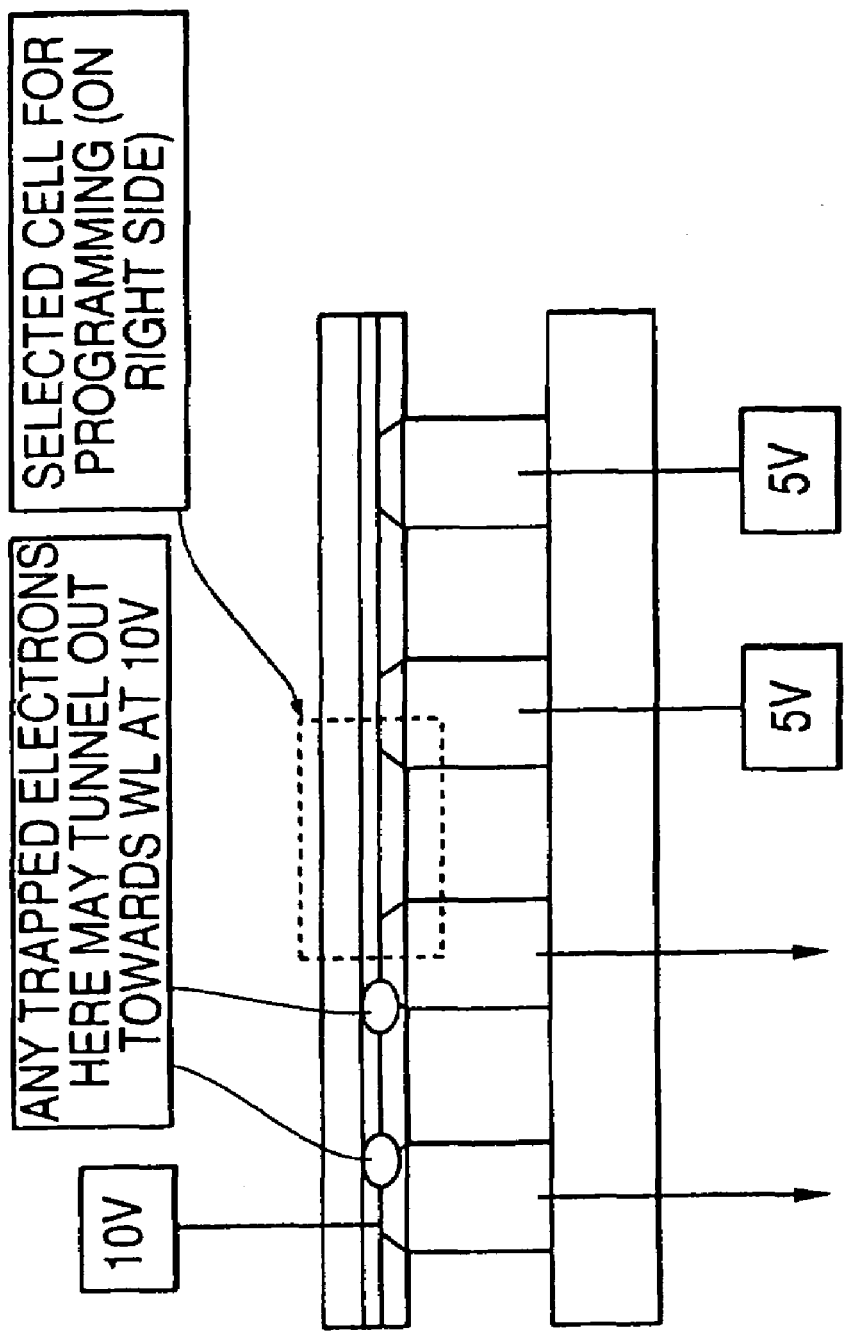
FIGS. 74 and 75 are drawings illustrating methods for programming memory cells in accordance with a specific embodiment of the present invention.

Non-selected bits with common wordline should be able to withstand the programming voltage on the wordline for a worst case period of time. FIG. 74 shows this in schematic detail in one level of the matrix.

If each bit (i.e. half cell) needs time t to program and there are N cells on each WL then, in a worst case, a programmed bit would experience (2 N−1)t of time where the programming voltage would be applied to the WL. The gate stress program disturb would be fine if any programmed cell did not shift its Vt by a certain "minimal" amount. Since programming is achieved using hot electrons, the times and voltages are short and small respectively compared to voltages and times needed to tunnel out of charge traps. In addition, the total stress on any one bit may be effectively reduced by floating unselected bitlines during the programming of the selected cell. In this way, only the selected bitline at ground will experience a true full programming voltage across the dielectric(s).

Figure 75:
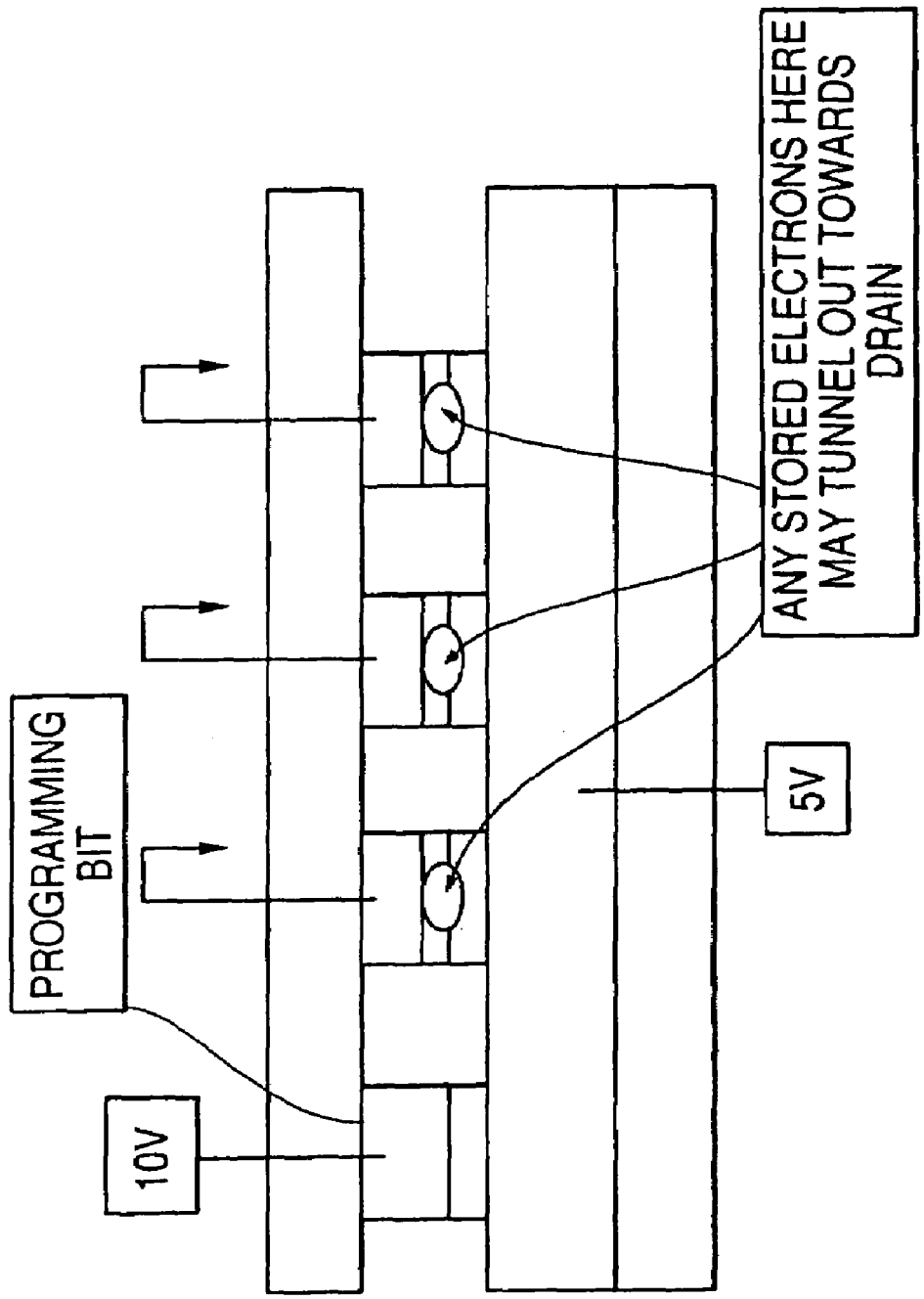

Non-selected bits with a bitline in common with the selected bit should be able to withstand the programming voltage on the drain for a worst case period of time. FIG. 75 shows this in schematic detail where a cross section along a bitline is shown.

Again, if there are M cells on any one bitline and it takes time t to program any one bit, then the worst case drain stress on a programmed bit will be (M−1)t in time. So the Vt shift in a programmed bit after experiencing such a stress should be minimal.

Read disturb or "soft write" occurs if the hot carriers generated during a read of the cell are sufficient to eventually (over 10 years lifetime) program a previously erased (unwritten) bit. Accelerated testing is usually carried out here to make sure that the read voltages required do not shift the threshold voltage of a neutral cell by more than a minimal amount.

In the devices set forth above, N+ or P+ doped polysilicon should be doped to a dopant density of about $1 \times 10^{19}$ to $1 \times 10^{21}$ atoms/cm$^3$ and have a thickness preferably in a range of about 500 Å to about 1000 Å. P− or N− doped semiconductor films should be doped to a dopant density of about $1 \times 10^{16}$ to about $1 \times 10^{18}$ atoms/cm$^3$.

Figure 79:
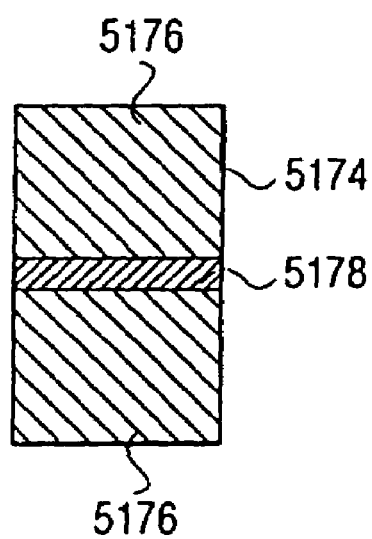
FIG. 79 is a cross-sectional drawing of a bitline of doped polysilicon having a refractory metal silicide formed therein to improve lateral conductivity.

It is to be appreciated that each of the memory devices shown can be made of opposite polarity by simply reversing the conductivity type of each of the silicon regions and maintaining dopant concentration ranges. In this way, not only can NMOS devices be fabricated, but also PMOS devices can be formed if desired. Additionally, the silicon films used to form the device may be recrystallized single crystal silicon or polycrystalline silicon. Additionally, the silicon film can be a silicon alloy film such as a silicon germanium film doped with n-type or p-type conductivity ions to the desired concentration.

Where it is desired to increase the lateral conductivity of polysilicon wordlines and bitlines, a layer of a conductive metal may be deposited in the wordline or bitline as illustrated in FIG. 79. In FIG. 79 bitline 5174 is formed of polysilicon 5176 which is heavily N+ doped. This makes it electrically conductive. To further reduce electrical resistance, a layer of a refractory electrically conductive metal such as titanium 5178 may be disposed within the bitline 5174, or on one or more surface of the polysilicon 5176. When subjected to normal silicon processing temperatures the titanium forms a silicide with the polysilicon that is highly conductive in a lateral direction.

IV. Flash Memory Array in a Rail Stack Configuration

In the previous embodiments, the TFTs were arranged in a virtual ground array (VGA). In a VGA illustrated in the previous embodiments, the programming of each EEPROM occurs by hot carrier injection. In hot carrier injection, a voltage is placed across a diode (i.e., between a source and a drain of a TFT EEPROM). The hot carriers (i.e., hot electrons and holes) that are travelling from source to drain through the channel of the TFT EEPROM are injected into the charge storage region which is disposed adjacent to the channel. This procedure is a relatively high power event.

For low power portable applications where both program/erase and read power are important, a flash nonvolatile memory using Fowler-Nordheim tunneling ("FN tunneling") for both program and erase may be used. FN tunneling results from applying a voltage across a dielectric. Thus, in a TFT EEPROM, a voltage is applied between a control gate and a source and/or a drain) region of the TFT, for writing and erasing the TFT EEPROM. This is in contrast with hot carrier injection programming, where a voltage is applied between the source and the drain regions.

A flash memory array which uses FN tunneling for program and erase is advantageous because thousands of bits in such a flash memory array may be programmed at the same time.

Also, FN tunneling is a very efficient way of programming since most (close to 100%) of the current goes to program the device. This is in contrast with hot carrier injection where only about 1–2% of the source-drain current goes to program the device.

Thus, in a preferred embodiment of the present invention, charge storage devices, such as TFT EEPROMs, are arranged in a flash memory array configuration. The TFT EEPROMs may be arranged in the pillar, self-aligned TFT or rail stack configurations of the previous embodiments. Preferably, the TFT EEPROMs are arranged in the rail stack configuration.

The VGA is not compatible with FN tunneling since the whole channel polysilicon inverts along the length of the pulsed-high word line and will then program cells in addition to the one that needs programming. Therefore, the FN tunneling rail stack (crosspoint) flash array differs from the VGA in that in the FN tunneling array the active polysilicon layer is patterned into polysilicon islands to allow FN tunneling programming. Thus, an extra photolithographic masking step is added to the process of making the rail stack array during which the polysilicon active layer is etched into islands in each device cell. The same photoresist mask can be used to define (i.e., etch) the charge storage regions in each cell.

Figure 83A:
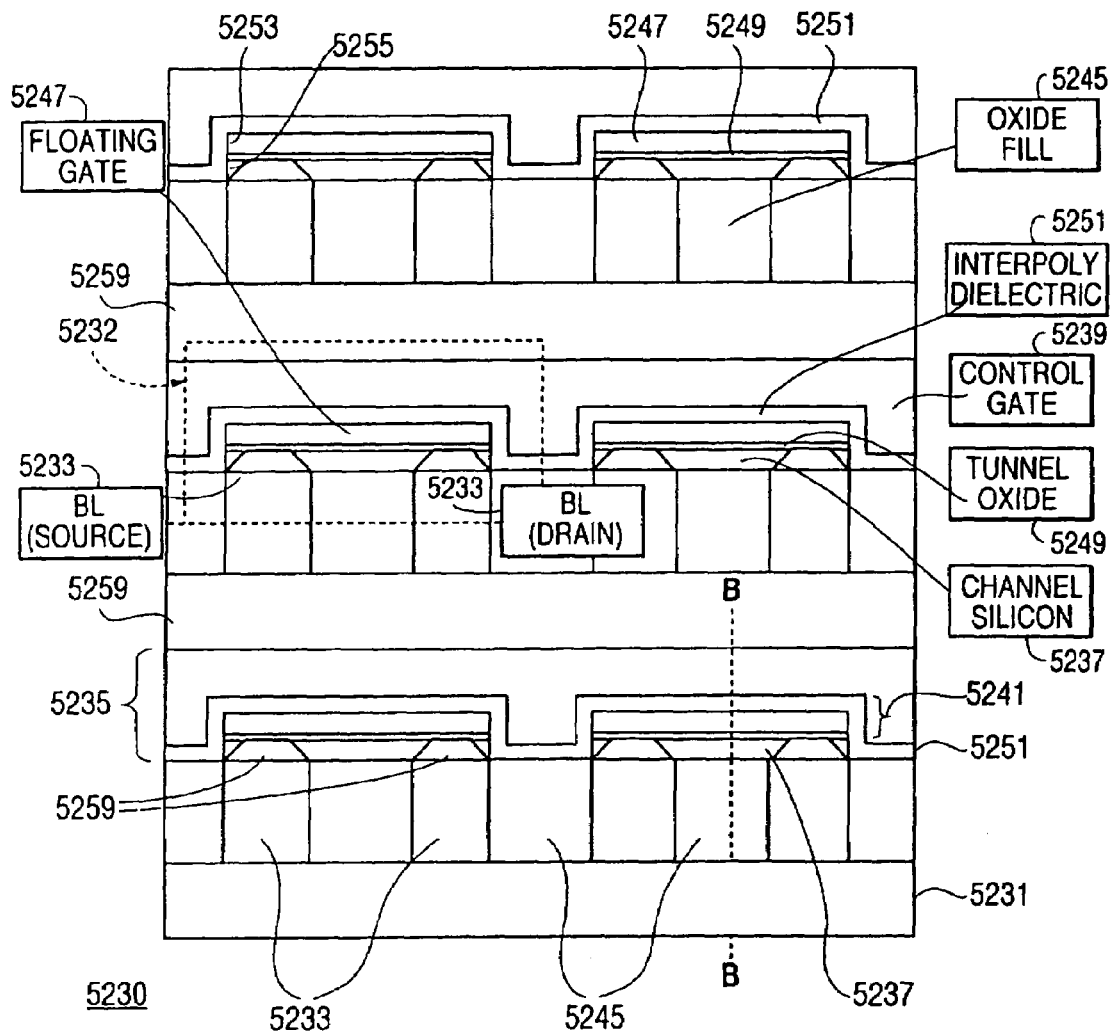
FIGS. 83–85 illustrate flash memory arrays according to a preferred embodiment of the present invention.

FIG. 83A illustrates a flash memory array in a rail stack configuration according to a preferred embodiment of the present invention. FIG. 83B shows a cross sectional view along line B—B in FIG. 83A.

In FIG. 83A, the flash memory array 5230 is preferably formed over a planarized interlayer insulating layer 5231, such as a CMP planarized silicon oxide layer. Layer 5231 is formed over a substrate (not shown) as in the previous embodiments. Each device of the array (shown by dashed lines 5232 in FIG. 83A) is thus a TFT because it is formed over an insulating layer.

The array 5230 contains a first plurality of spaced-apart conductive bit lines 5233 disposed at a first height above the substrate in a first direction. The array also contains a second plurality of spaced-apart rail-stacks 5235. The rail stacks are disposed at a second height in a second direction different from the first direction. Preferably, the bit lines 5233 and the rail stacks 5235 are arranged perpendicular to each other. The TFT EEPROM 5232 is formed at the intersection of the rail stacks 5235 and the bit lines 5233.

Each rail-stack 5235 includes a plurality of semiconductor islands 5237, which comprise the active regions of the TFT EEPROMs 5232. One surface of the islands 5237 is in contact with the bit lines 5233. Each rail stack 5235 also includes a conductive word line 5239 and a charge storage region 5241 disposed between a second surface of the semiconductor islands 5237 and the word line 5239.

The semiconductor islands 5237 preferably comprise polysilicon of a first conductivity type (i.e., P− or N−). However, the islands may comprise amorphous silicon if desired. The polysilicon islands 5237 include source and drain regions 5243 of a second conductivity type (i.e., N+ or P+). The source and drain regions 5243 are located at contacting intersections between the bit line conductors 5233 and the rail stacks 5235.

The bit lines 5233 preferably comprise polysilicon of the second conductivity type (i.e., N+ or P+). The bit lines 5233 contact the source and drain regions 5243. Preferably, the source and drain regions are formed by outdiffusion of dopants from the bit lines. Furthermore, an optional metal or a metal suicide layer (not shown in FIG. 83A) may be disposed in contact with the bit lines 5233 to increase the conductivity of the bit lines. The space between said spaced-apart bit line conductors 5233 is filled with a planarized insulating filler material 5245, such as silicon oxide.

The charge storage regions 5241 may comprise a dielectric isolated floating gate, electrically isolated nanocrystals or an O—N—O dielectric stack, as in the previous embodiments. An exemplary array having a dielectric isolated floating gate is illustrated in FIGS. 83A and B. Thus, in the example of FIGS. 83A and B, the charge storage region 5241 comprises a polysilicon floating gate 5247 between a tunnel dielectric 5249, such as a silicon oxide layer, and a control gate dielectric 5251 (also known as the intergate or interpoly dielectric) made of a material such as silicon oxide or an ONO layer stack.

As shown in FIGS. 83A and B, the lateral sides 5253 of the tunnel dielectric 5249 and the floating gate 5247 are aligned to the lateral sides 5255 of the semiconductor islands 5237. The control gate dielectric 5251 extends between the semiconductor islands 5237 and contacts the planarized insulating material 5245 between the semiconductor islands 5237. If desired, the floating gate 5247 may be made from hemispherical grain polysilicon which has a textured surface to maximize the control gate to floating gate coupling. Alternatively, the coupling may be increased by increasing the floating gate height, by forming horns or protrusions in the floating gate, or by roughening the floating gate surface.

The word line 5239 comprises a polysilicon layer of a second conductivity type (i.e., N+ or P+) and a metal or a metal silicide layer in contact with the polysilicon layer. The word line 5239 acts as a control gate of the TFT EEPROM in locations where it overlies the charge storage regions 5241. Thus, formation of a separate control gate for each TFT is not required.

In one preferred aspect of this embodiment, the rail stacks 5235 are disposed above the bit lines 5233, as shown in FIGS. 83A and B. However, if desired, the rail stacks 5235 may be disposed below the bit lines 5233 in each device level, as described with respect to FIG. 70 in a previous embodiment (i.e., bottom gate TFT EEPROMs are formed).

As shown in FIG. 83B, the word line 5239, the charge storage regions 5241 and the semiconductor islands 5237 (i.e., the rail stacks 5235) are aligned in a plane 5256 perpendicular to the substrate and parallel to a source to drain direction. The rail stacks 5235 are separated by a second planarized insulating layer 5257, such as silicon oxide.

While the flash memory array may comprise a two dimensional array, preferably, the flash memory array comprises a monolithic three dimensional array comprising a plurality of device levels. For example, three device levels are shown in FIG. 83A. The device levels are separated by an interlayer insulating layer 5259, such as a silicon oxide layer. If desired, layers 5257 and 5259 may comprise the same silicon oxide layer which is deposited above and between the rail stacks 5259, and then planarized by CMP.

To program the selected TFT EEPROM 5232, either its drain bit line or its source bit line 5233 (or both) are grounded while the positive programming voltage is applied to the selected word line 5239 adjacent to the device 5232 (which is a high impedance node). All other word lines on the same device level are grounded while all other bit lines on the same level device can float or are placed at a slight positive voltage. This means that only the selected cell 5232 experiences the programming voltage across it. Through capacitive coupling, the floating gate 5247 is pulled high while the source and/or drain 5243 are grounded. Electrons tunnel to the floating gate 5247 from the source and/or drain 5243 and an inversion channel is formed in the silicon channel 5237. The current to program such a cell to get a threshold voltage shift of about 5V in approximately one millisecond is several picoamps.

To erase the cell, the same bit lines 5233 can be grounded and a negative voltage pulse is applied to the selected word line 5239. All other word lines can either be grounded or can float. All other bit lines float or are placed at a slight negative voltage. A plurality (or all) of EEPROM cells in the array can be erased at the same time by pulsing a plurality of word lines to a high negative value while all bit lines are grounded. Alternatively, the selected wordline is grounded while the selected cell's bit lines are pulsed positive. All other word lines float or are pulsed slightly positive while all the other bitlines are grounded.

Programming and erasing using FN tunneling alone allows use of low current programming and erasing, which lends itself to "massive parallelism" in programming and erasing. Therefore, many cells 5232 can be programmed in parallel. For example, to get 5V shift, one thousand cells would need about 2 nA in total current and would program in about 1 microsecond per cell, average. During programming and erasing, the parasitic leakage currents are small because no large voltages are placed across polysilicon diodes (i.e., source/channel/drain junctions). During reading, the parasitic leakage currents are also small because source to drain voltages are also small. A programming voltage of 10–20V may be used to program the cells. In the above approach of FIGS. 83A and B, a small cell size is achieved. However, only positive threshold voltages (for NMOS TFT EEPROMs shown in FIGS. 83A and B) are attainable, since otherwise large amounts of parasitic bit line to bit line leakage results. In order to allow both positive and negative threshold voltages in each cell, an access transistor (i.e., a TFT MOSFET) is added to each cell in a second preferred aspect of the flash memory array, as shown in FIG. 84.

Figure 84:
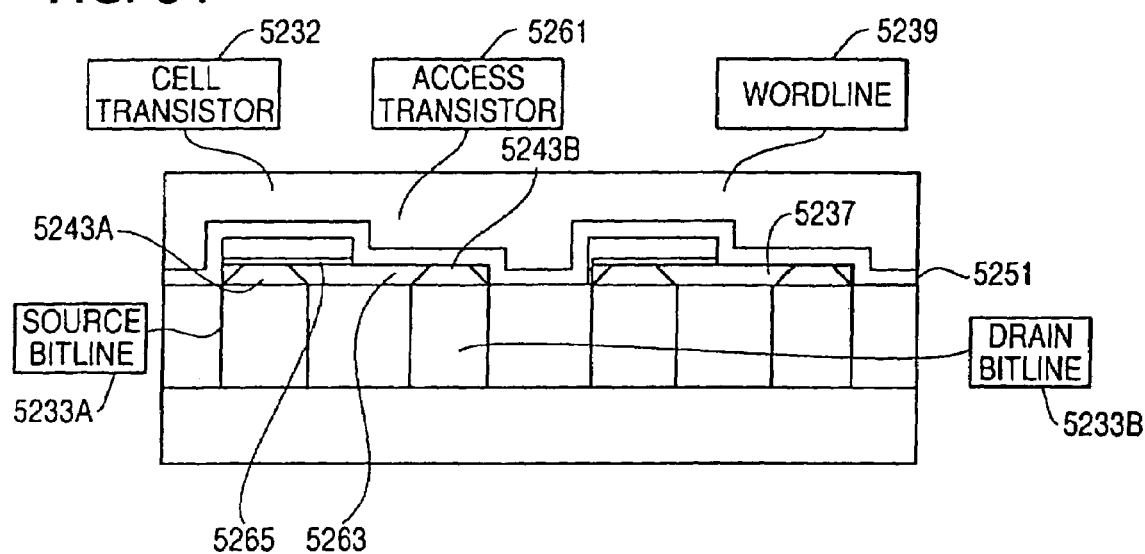

FIG. 84 illustrates a built-in access transistor 5261 in each cell whose threshold voltage can be set to a slight positive value. By using the access transistor 5261, the actual cell transistor (i.e., the TFT EEPROM 5232) can have a negative threshold voltage without introducing bit line leakage and avoiding special erase-and-check algorithms that prevent over-erase. Furthermore, the access transistor can also reduce the defect-based TFT band-to-band tunneling leakage that may occur at negative gate voltages and could be problematic in programmed cells (i.e., floating gate full of electrons), (see S-H Hur et al., "A Poly-Si Thin-Film Transistor EEPROM Cell with Folded Floating Gate", IEEE Trans. Elect. Dev., vol. 46, pp. 436–438, February 1999, incorporated herein by reference).

As shown in FIG. 84, the semiconductor islands 5237 contain adjacent channel regions 5263, 5265 of the access transistor 5261 and the EEPROM 5232, respectively, between the common source 5243A and drain regions 5243B. The word lines 5239 form control gates of the EEPROMs and gate electrodes of the access transistors. An insulating layer 5251 forms a common control gate dielectric of the EEPROM and a gate insulating layer of the access transistor. The floating gate 5247 and a tunnel dielectric 5249 are located between the word line 5239 and the channel region 5265 of the EEPROM 5232.

To program the floating gate 5247 of a cell 5232/5261, its source bit line 5233A is grounded, its drain bit line 5233B floats, and a high positive voltage pulse is applied to the selected cell's word line. This tunnels electrons to the floating gate. All other bit lines on the same device level are left floating or are placed at a slight positive voltage while all other word lines on the same level are grounded. To read, the selected cell's word line is pulsed to a read voltage of above the access transistor's threshold voltage while the cell's source bit line is grounded and drain bit line is set at a low positive voltage, such as 1 to 3 V. All other bit lines at the same level are left floating or grounded while all word lines at the same level are grounded. To erase the cell, its word line is pulsed to a high negative value while its source bit line is grounded. To erase the whole array, all word lines can be pulsed to a high negative value while all source bit lines are grounded.

Figure 85:
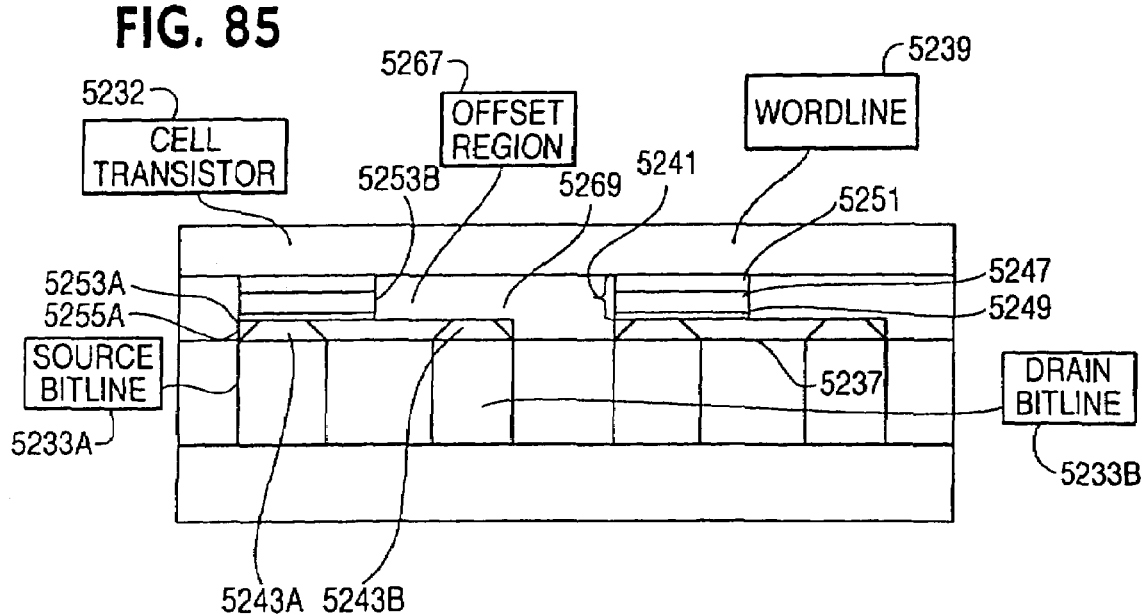

In another preferred aspect of the flash memory array, a gate to drain offset region 5267 is provided to reduce TFT band-to-band defect related drain leakage, as shown in FIG. 85. Thus, in the example of FIG. 85, the word line 5239 and the charge storage region 5241 are offset apart from the drain region 5243B. A thick insulating layer 5269 is located between the semiconductor islands 5237 and the word lines 5239 in the offset region 5267. The floating gates 5247, the tunnel dielectric 5249 and the control gate dielectric 5251 have aligned lateral sides 5253A and B. Only one of the lateral sides 5253A is aligned to the lateral side 5255A of the semiconductor islands 5237. The islands 5237 have a greater width than the floating gates 5247, the tunnel dielectric 5249 and the control gate dielectric 5251.

If desired, ONO or isolated nanocrystal charge storage regions may be used instead of the floating gate charge storage regions in the embodiments of FIGS. 84 and 85.

Furthermore, the devices of FIGS. 84 and 85 may be formed in a bottom gate configuration (i.e., with the bit lines above the word lines) if desired.

In the flash memory array of FIGS. 83A and B, each cell size per bit is about $8F^2/N$ to about $10F^2/N$, where F is a minimum feature size and N is a number of device levels in the array. In the flash memory array of FIGS. 84 and 85, each cell size per bit is about $9F^2/N$ to about $11F^2/N$. Thus, a cell size per bit of about $8F^2/N$ to about $11F^2/N$, may be achieved. This cell size compares favorably with cell sizes of commercially available flash memory arrays, which range from $7.7F^2$ to $13.9F^2$. If the access transistors and contacts are factored in the effective cell size of the commercially available devices, then due to redundancy, their cell size ranges from $9.8F^2$ to $19.2F^2$. However, when the flash memory array of the present embodiment is formed as a three dimensional array (i.e., N>1), then the cell size per bit of the flash memory array of the present embodiment is significantly smaller than that of the prior art. For example, for N=2, the cell size is about $4F^2$ to about $5.5F^2$. For N>2, the cell size is even smaller.

The method of making the flash memory array of FIGS. 83–85 is illustrated in FIG. 86. FIGS. 86A–D illustrate a method of making the flash memory array where the word lines are disposed above the bit lines in each device level. A plurality of spaced-apart bit line conductors 5233 are formed at a first height above the substrate (not shown) by etching a first conductive layer using a first photoresist mask. The bit line conductors 5233A and B extend in a first direction, as shown in FIG. 86A. Preferably, the bit lines comprise polysilicon and metal or metal silicide layers. A first insulating layer 5245 is deposited above and between the bit line conductors 5233A, B. The insulating layer 5245 is planarized by CMP until the top surface of the bit line conductors 5233A, B is exposed.

Figure 86A:
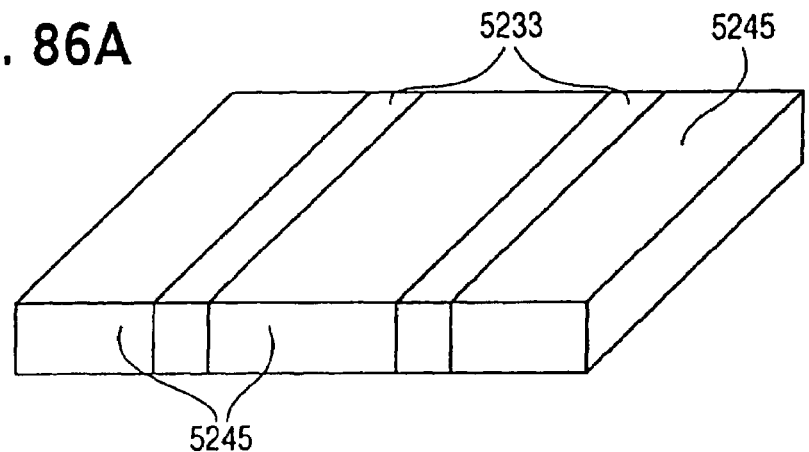
FIGS. 86A–86J illustrate methods of making the arrays of FIGS. 83–85.
Figure 86B:
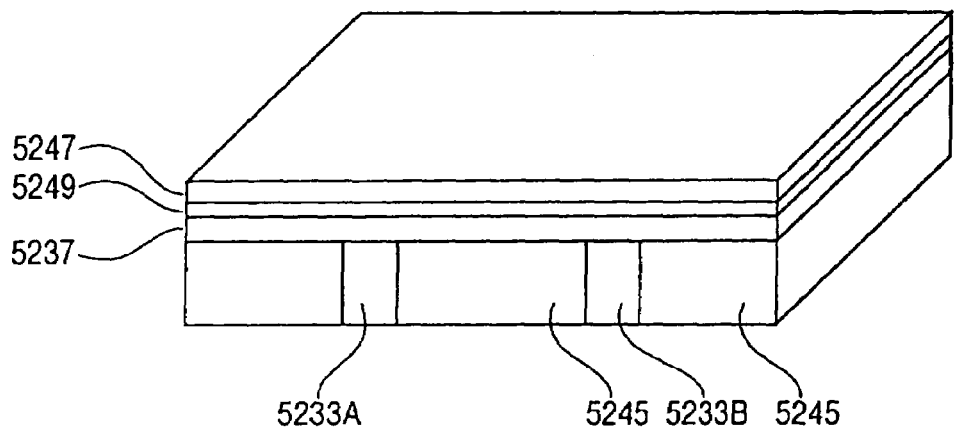

A stack of layers including a first semiconductor layer 5237 and a charge storage film are deposited on the exposed bit line conductors 5233A, B and the planarized insulating layer 5245, as shown in FIG. 86B. Layer 5237 may be an amorphous silicon or a polysilicon layer. In FIG. 86B, the charge storage film comprises a tunnel dielectric layer 5249 and a floating gate polysilicon layer 5247. Alternatively, the charge storage film may be an ONO stack or dielectrically isolated nanocrystals.

Figure 86C:
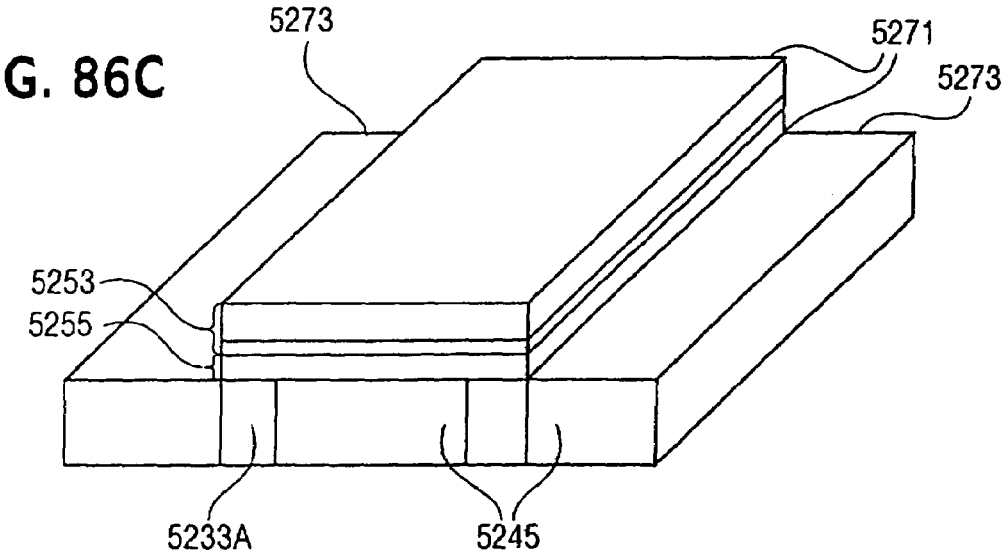

A second photoresist layer (not shown) is formed on the stack and photolithographically patterned into a mask. Using this photoresist layer as a mask, the stack of layers 5237, 5249 and 5247 is etched to form a plurality of first rail stacks 5271 (only one such rail stack is shown in FIG. 86C for clarity). The first rail stack 5271 extends in the same or substantially the same direction as the bit line conductors 5233 in a plane parallel to the substrate. Each of the first rail stacks 5271 contains a semiconductor rail 5237 and a charge storage region rail 5247/5249. The first rail stacks 5271 have at least one aligned lateral edge 5253/5255. In FIG. 86C, the first rail stacks 5271 have two such aligned lateral edges since each first rail stack is patterned using the same photoresist mask, which is removed after the etching step.

Figure 86D:
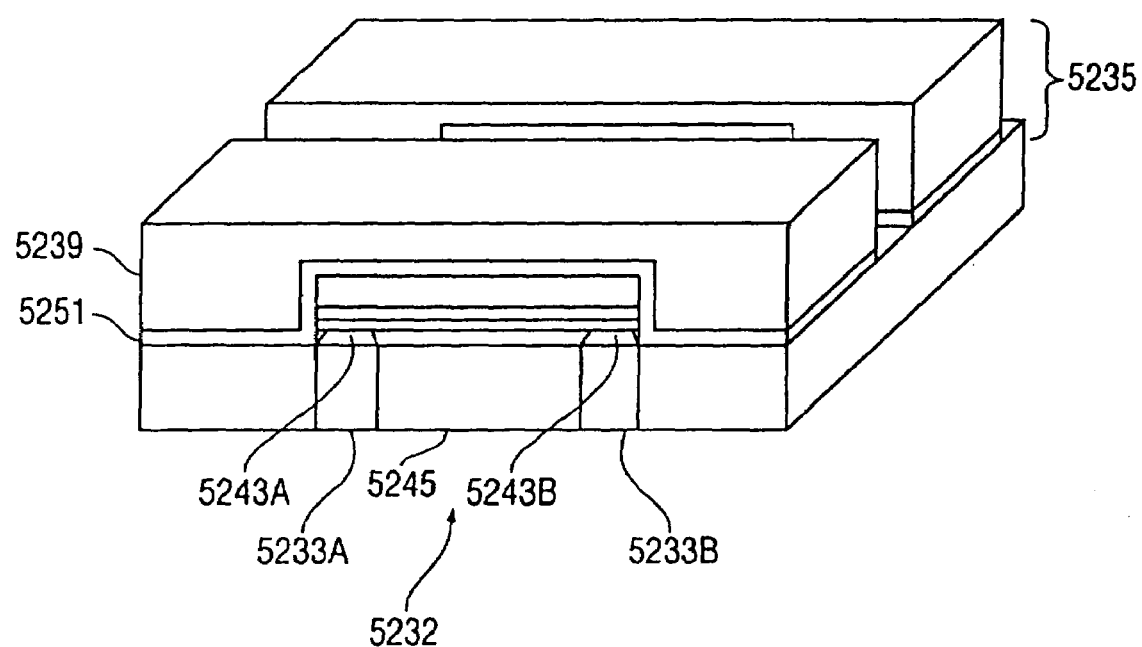

If floating gate type EEPROMs are to be formed, then the control gate insulating layer 5251 is deposited over the first rail stacks 5271 and in the spaces 5273 between the first rail stacks, as shown in FIG. 86D. Thus, layer 5251 extends beyond the lateral edges of the first rail stacks 5271. If an ONO or isolated nanocrystal type EEPROMs are to be formed, then the semiconductor layer 5237 would be deposited and patterned into first rail stacks 5271 after deposition. Then the ONO or the nanocrystal containing layer would be deposited over the patterned first rail stacks 5271, followed by the deposition of a conductive layer 5239 for the word-line.

A second conductive layer 5239 is deposited over the control gate insulating layer 5251. Preferably, layer 5239 comprises polysilicon and metal suicide sublayers. A third photoresist mask (not shown) is formed over the second conductive layer 5239. The second conductive layer 5239, the control gate dielectric 5251 and the first rail stacks 5271 are then etched to form a plurality of second rail stacks 5235, as shown in FIG. 86D. The second rail stacks comprise the patterned second conductive layer which forms the word line 5239, charge storage region islands 5247/5249/5251 and the semiconductor islands 5237.

The source 5243A and drain 5243B regions are formed by outdiffusing dopants of a second conductivity type (i.e., N+ or P+) into the semiconductor islands 5237 of a first conductivity type (i.e., P– or N–) from the first plurality of spaced-apart conductors. The source and drain regions may be formed at any time during the fabrication sequence after the semiconductor layer 5237 is deposited on the bit line conductors 5233A, 5233B. For example, the device may be annealed after the formation of the second rail stacks 5235 to outdiffuse the dopants into the source and drain regions and to recrystallize the amorphous silicon layer 5237 into a polysilicon layer (or to increase the layer 5237 grain size). The outdiffusion anneal and the crystallization anneal may occur during the same or during separate heating steps. For example, the recrystallization anneal may take place right after layer 5237 is deposited.

The side surfaces of the second rail stacks 5235 are aligned in a plane perpendicular to the substrate and parallel to a direction which extends from the source 5243A to the drain 5243B of the TFT EEPROM 5232, as shown in FIG. 83B. The control gate dielectric 5251 is disposed between the word line 5239 and the first insulating layer 5245. Since the control gate dielectric is part of the first rail stacks 5235, the control gate dielectric 5251 is aligned in a plane perpendicular to the substrate and parallel to a source to drain direction to the semiconductor islands 5237, the tunnel dielectric 5249, the floating gates 5247 and the control gates 5239, as shown in FIG. 83B. The first rail stacks 5271 are converted into islands during the etching of the second rail stacks 5235.

A second insulating layer 5257 is then deposited over the second rail stacks 5235 and planarized by CMP to be level with the second rail stacks, as shown in FIG. 83B. An interlayer insulating layer 5259 is then deposited over the second insulating layer 5257 and the second rail stacks 5235. If desired, a single insulating layer may be deposited above and between the second rail stacks 5235 to form the second insulating layer 5257 and the interlayer insulating layer 5259. The single layer is then planarized by CMP.

If desired, a plurality of additional device levels of the array may be monolithically formed above layer 5259 to form a three dimensional monolithic array having at least three device levels, as shown in FIG. 83A. Each device level is preferably separated by an interlayer insulating layer.

Figure 86E:
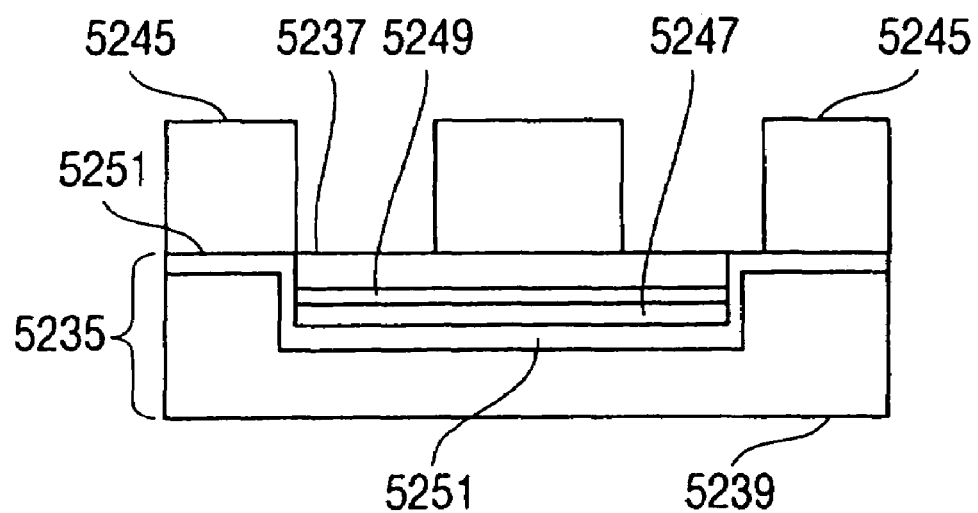

In an alternative method of making the flash memory array, the word line in each device level may be formed below the bit line conductors (i.e., bottom gate TFT EEPROMs rather than top gate TFT EEPROMs are formed). In the alternative method, the second rail stacks 5235 comprising the gate lines 5239, the charge storage regions 5251/5247/5249 and the semiconductor islands 5237 are formed first, as shown in FIG. 86E. Then, the first insulating layer 5245 is formed on the semiconductor islands of the second rail stacks 5235. The first insulating layer 5245 may also be formed between the second rail stacks if desired. Alternatively, another insulating layer is formed between the second rail stacks and planarized by CMP prior to the formation of the first insulating layer 5245.

Figure 86F:
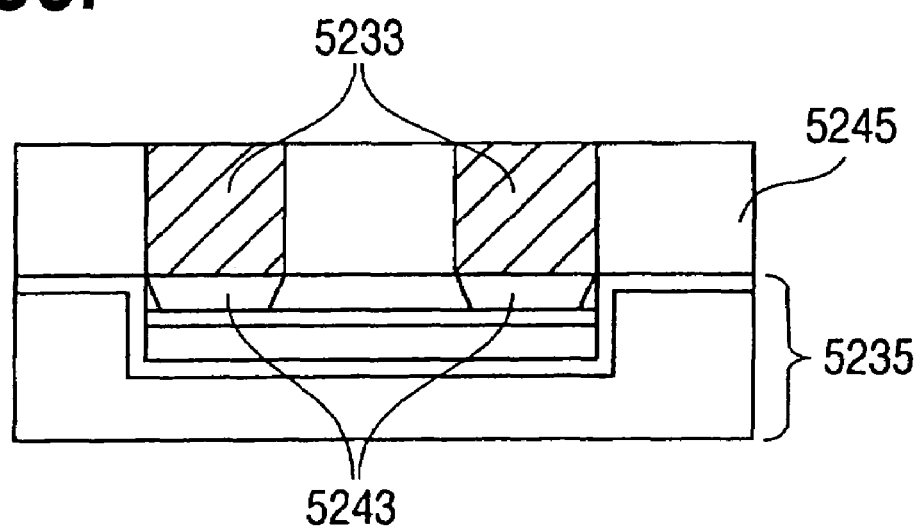

Trenches are then formed in the first insulating layer 5245. Source and drain regions 5243 are formed in the semiconductor islands 5237 by ion implanting (or diffusing) dopant ions through the trenches. The photoresist layer (not shown) used during the etching of the trenches may be removed before or after the ion implantation. A second conductive layer (such as a layer comprising polysilicon and silicide sublayers) is formed in the trenches and over the first insulating layer, as shown in FIG. 86F. The second conductive layer is then planarized by CMP to form the bit line conductors 5233 overlying the semiconductor islands 5237. Alternatively, the source and drain regions 5243 may be formed by outdiffusion from the bit line conductors 5233 rather than by ion implantation.

Similar methods may be used to form the flash memory array having TFT EEPROMs with an access transistor, as shown in FIG. 84 or having TFT EEPROMs with a drain offset region, as shown in FIG. 85. In these methods, the stack of layers which includes a tunnel dielectric layer 5249 and a floating gate layer 5247 are deposited over the first semiconductor layer 5237, as shown in FIG. 86C. The stack of layers is then patterned to form first rail stacks 5271 which include semiconductor rails 5237 having a first width and charge storage region rails 5247/5249 having a second width smaller than the first width, such that the first rail stacks have one aligned lateral edge and drain portions of the semiconductor rails 5237 are exposed.

Figure 86G:
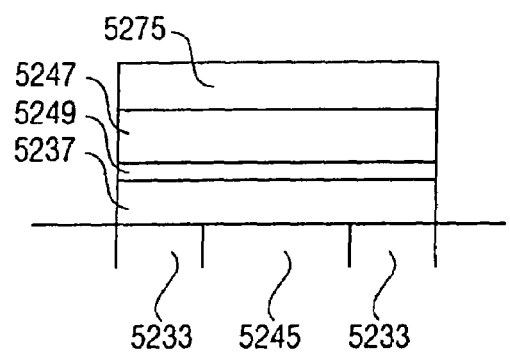
Figure 86H:
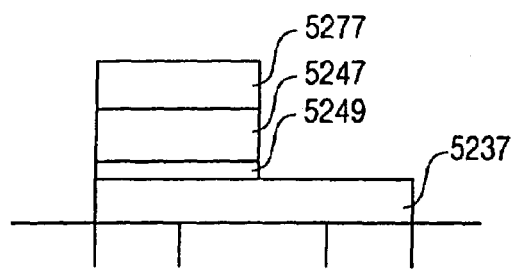

Such a structure may be achieved by two different etching methods. The first etching method includes forming a first photoresist mask 5275 having a first width over the stack, as shown in FIG. 86G. The first semiconductor layer 5237, the tunnel dielectric layer 5249 and the floating gate layer 5247 are then etched using the first photoresist mask 5275, as shown in FIG. 86G. A second photoresist mask 5277, having a second width smaller than the first width, is then formed over the floating gate layer 5247. The tunnel dielectric layer 5249 and the floating gate layer 5247 but not the first semiconductor layer 5237 are then etched using the second photoresist mask as shown in FIG. 86H.

Figure 86I:
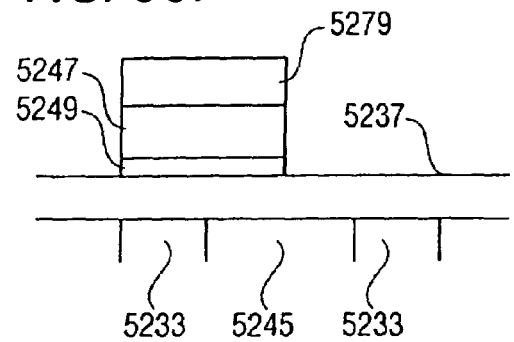
Figure 86J:
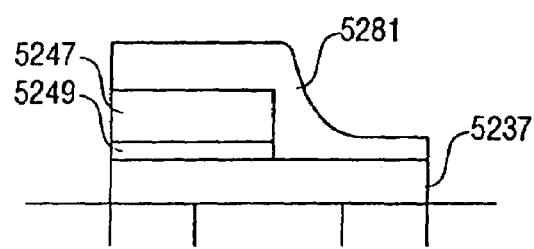

The second etching method includes forming a first photoresist mask 5279 having a first width over the stack and etching the tunnel dielectric layer 5249 and the floating gate layer 5247 using the first photoresist mask 5279 to expose a portion of the first semiconductor layer 5237, as shown in FIG. 86I. Then a second photoresist mask 5281, having a second width larger than the first width, is formed over the floating gate layer 5247 and over an exposed portion of the first semiconductor layer 5237 (it is possible that there may be some misalignment between layer 5281 and layers 5249/5249). The first semiconductor layer 5237 is then etched using the second photoresist mask 5281, as shown in FIG. 86J.

To form the TFT EEPROMs with an access transistor 5261 of FIG. 84, a control gate dielectric layer 5251 is formed over the patterned floating gates 5247 and over the exposed portions of the semiconductor rails 5237 of the first rail stacks 5271. The control gate dielectric layer 5251 functions as a gate dielectric of the access transistor 5261 over the exposed portions of the semiconductor rails 5237.

To form the TFT EEPROMs with a drain offset region 5267 of FIG. 85, the control gate dielectric layer 5251 is patterned at the same time as the floating gate layer 5247 and the tunnel dielectric layer 5249, to expose the drain portion and part of the channel silicon of the semiconductor rails 5237. A second insulating layer 5269 is then formed over the control gate dielectric 5251 and the exposed portion of the semiconductor rails 5237, as well as between the semiconductor rails 5237 to isolate the semiconductor rails from each other. Layer 5269 is relatively thick, having a thickness that is the same as or greater than the thickness of the charge storage regions 5241. Layer 5269 is then planarized by CMP to expose the top portion of the charge storage regions. The word line 5239 is then formed over the second insulating layer 5269 to form the offset regions 5267.

The nonvolatile, multiprogrammable flash memory array of the preferred embodiment provides many-times-programmable cells in a crosspoint (i.e., rail stack) array. FN tunneling is used for program and erase. This allows many cells to be written in parallel and provides high density, low power file storage. In addition, the cell sizes per layer compare very favorably with cell sizes of commercially available flash memories.

V. CMOS Array for Logic and Memory Circuits

In the previous embodiments, arrays of NMOS or PMOS devices were described. However, in another preferred embodiment of the present invention, an array of CMOS (complementary metal oxide semiconductor) transistors is provided. Preferably, adjacent NMOS and PMOS transistors have a common gate. However, the adjacent NMOS and PMOS transistors may have separate gates if desired. The array of CMOS devices may comprise an array of vertical pillar CMOS devices, an array of self aligned CMOS TFTs or an array of rail stack TFTs, as described in any previous embodiment. The CMOS devices are preferably formed as a three dimensional monolithic array above the substrate. However, the CMOS devices may also be formed in a two dimensional array in or above a semiconductor substrate, if desired.

The NMOS and PMOS transistors of the CMOS array may be formed adjacent to each other in the same device level in an alternating fashion (i.e., as alternating NMOS and PMOS transistors). However, in a preferred embodiment of the present invention, the one charge carrier type transistors (i.e., NMOS or PMOS) are formed above the other charge carrier type transistors (i.e., PMOS or NMOS) with a common gate line (also known as a word line in memory devices) between them. Thus, the array preferably comprises a plurality of vertically stacked, common gate CMOS transistors.

Figure 87:
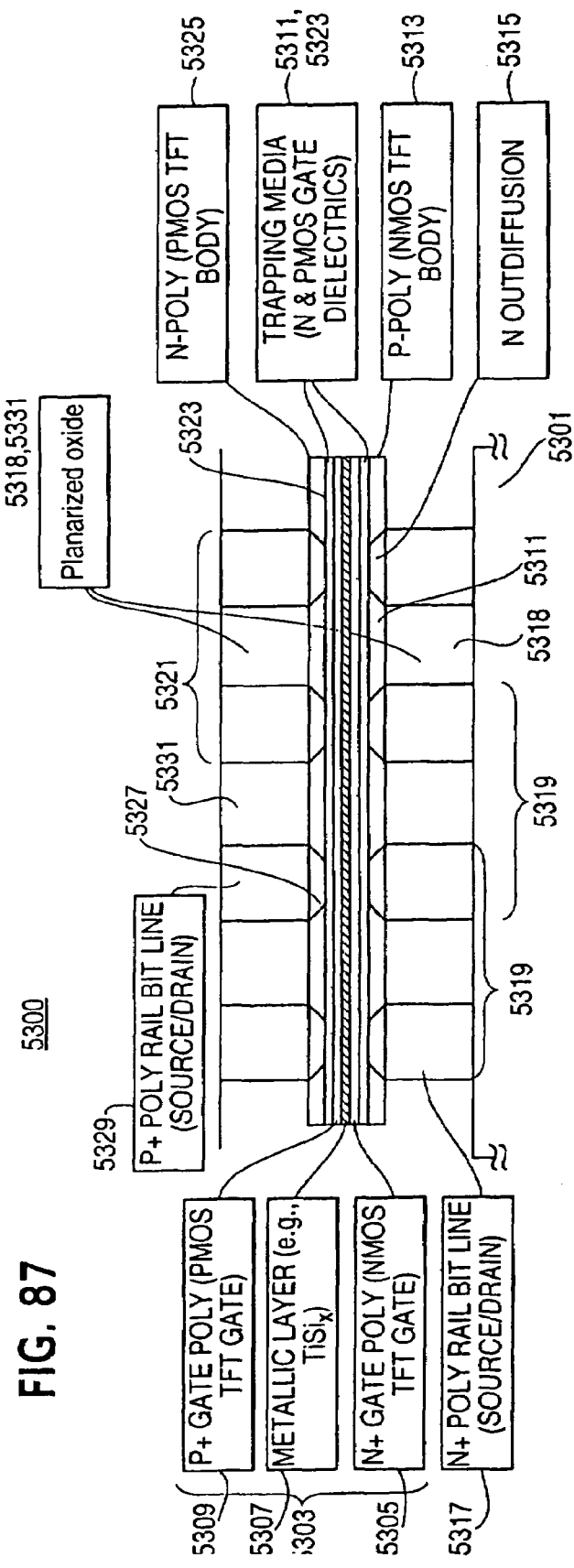
FIG. 87 illustrates a CMOS array according to a preferred embodiment of the present invention.

FIG. 87 illustrates one device level of a vertically stacked, common gate CMOS array in a rail stack configuration according to a preferred embodiment of the present invention. It should be noted that the array may also be arranged in a self aligned TFT or pillar configurations described previously. The CMOS array in FIG. 87 is similar to the array illustrated in FIG. 73, except that transistors of different charge carrier type are formed on either side of the gate line. In FIG. 87, the NMOS transistors are arranged below the PMOS transistors. However, it should be understood that the PMOS transistors may be arranged below the NMOS transistors if desired.

In FIG. 87, the array of CMOS devices 5300 is preferably formed over a planarized interlayer insulating layer 5301, such as a CMP planarized silicon oxide layer. Layer 5301 is formed over a substrate (not shown) as in the previous embodiments. Each CMOS device is thus a CMOS TFT because it is formed over an insulating layer. However, the CMOS devices may be formed in a monocrystalline silicon substrate, if desired.

The array includes a plurality of gate lines (i.e., word lines) 5303 (only one gate line is shown in the cross sectional view of FIG. 87). Preferably the gate line comprises a first N+ polysilicon layer 5305, a silicide layer 5307, such as a TiSi$_x$ or WSi$_x$ layer, over the first polysilicon layer and a second P+ polysilicon layer 5309 above the silicide layer. The gate line 5303 acts as a gate electrode in each TFT. Thus, no separate gate electrodes connected to the gate lines are required.

A first insulating layer 5311 is disposed adjacent to a first side of the gate electrode 5303. This insulating layer 5311 may be a conventional gate dielectric. Preferably, the insulating layer 5311 is a charge storage layer (i.e., charge trapping media), such as an ONO stack or isolated nanocrystals, to form charge storage CMOS TFTS, such as EEPROM CMOS TFTs. If floating gate type EEPROM CMOS TFTs are desired, then a floating gate and a control gate dielectric may be added between the insulating layer 5311 and the gate line 5303.

A p-type semiconductor layer 5313, such as a P− polysilicon layer, is disposed on a side of the first insulating layer opposite to the gate 5303. This layer contains the NMOS TFT bodies. N+ source and drain regions 5315 are disposed in layer 5313. The portions of layer 5313 between regions 5315 comprise NMOS TFT channel regions.

Preferably, the source and drain regions 5315 are formed by outdiffusion of n-type dopants from the source and drain electrodes (i.e., bit lines) 5317. However, regions 5315 may be formed by any other method, such as by masking and ion implantation. The electrodes 5317 contact the source and drain regions 5315 and are disposed on the bottom of the p-type semiconductor layer 5313 (i.e., on the side of layer 5313 opposite to the first insulating layer 5311). Preferably, the electrodes 5317 comprise N+ polysilicon rails which extend in a direction perpendicular to the gate line 5303. If desired, an optional metal or metal silicide layer is formed in contact with electrodes 5317 to increase their conductivity. However, the electrodes 5317 may comprise metal or metal silicide instead of the heavily doped polysilicon, if desired. A planar insulating filler layer 5318, such as silicon oxide, is disposed between the source and drain electrodes 5317.

Thus, each NMOS TFT 5319 is located between adjacent source and drain regions 5315 and comprises a portion of layers 5305, 5311, 5313 and 5317, as illustrated in FIG. 87. The PMOS TFTS 5321 are located above the NMOS TFTs 5319.

The PMOS TFTs 5321 include a second insulating layer 5323 adjacent to a second side of the gate electrode 5303. In FIG. 87, layer 5323 is located on the P+ polysilicon layer 5309 of the gate line 5303. The insulating layer 5323 may be a conventional gate dielectric. Preferably, the insulating layer 5323 is a charge storage layer (i.e., charge trapping media), such as an ONO stack or isolated nanocrystals, to form charge storage CMOS TFTS, such as EEPROM CMOS TFTs. If floating gate type EEPROM CMOS TFTs are desired, then a floating gate and a control gate dielectric may be added between the insulating layer 5323 and the gate line 5303.

An n-type semiconductor layer 5325, such as an N− polysilicon layer, is disposed above the second insulating layer 5323. Layer 5325 is disposed on the opposite side of layer 5323 from the gate electrode 5303. P+ source and drain regions 5327 are disposed in layer 5325, such that regions of layer 5325 between the source and drain regions 5327 comprise channel regions of PMOS TFTs. Source and drain electrodes 5329 are disposed over the N− polysilicon layer 5325 and in contact with the source and drain regions 5329. Thus, the electrodes 5329 are disposed on top side of the N− polysilico layer 5325 opposite to the second insulating layer 5323. A planar insulating filler layer 5331, such as silicon oxide, is disposed between the source and drain electrodes 5329. If desired, an optional metal or metal silicide layer is formed in contact with electrodes 5329 to increase their conductivity.

Thus, each PMOS TFT 5321 is located between adjacent source and drain regions 5327 and comprises a portion of layers 5309, 5323, 5325 and 5329, as illustrated in FIG. 87. A TFT EEPROM CMOS device (5319 and 5321) is formed at each intersection of the first and the third spaced-apart electrodes or conductors 5317, 5329 and the common gate line 5303. If desired, the CMOS structure may be inverted and the PMOS TFTs formed below NMOS TFTs. It should be noted that NMOS and PMOS electrodes (i.e., bit lines) do not have to fall directly on top of each other, although they preferably should have the same pitch. NMOS and PMOS transistors thus can have different channel lengths, but the pitch (and thus array size) will be limited by the longer of the two channel lengths. In one preferred aspect, TFTs of one conductivity type (i.e., NMOS or PMOS TFTs) contain a charge storage layer or region, while TFTs of the other conductivity type (i.e., PMOS or NMOS) do not have a charge storage region or layer. Thus, the CMOS of this aspect comprises one EEPROM TFT and one non-EEPROM TFT.

The TFT CMOS device array 5300 illustrated in FIG. 87 is highly planar and compact. The NMOS source and drain electrodes 5317 comprise polysilicon rails which extend above the interlayer insulating layer 5301 in a first plane parallel to the substrate surface. The p-type polysilicon layer 5313 extends above the source and drain electrodes 5317 in a second plane. The gate line 5303 extends above layers 5317, 5313 and 5311 in a third plane. The n-type polysilicon layer 5325 extends above the gate line 5303 in a fourth plane. The PMOS source and drain electrodes 5329 comprise polysilicon rails which extend above the n-type semiconductor layer 5325 in a fifth plane. Each of the five planes does not intersect any of the other planes.

The TFT CMOS array 5300 is also self aligned. The gate electrode 5303, the first insulating layer 5311, the p-type semiconductor layer 5313, the second insulating layer 5323 and the n-type semiconductor layer 5325 comprise a rail stack which is located in a plane parallel to the substrate. The rail stack extends perpendicular to the source and drain electrodes 5317, 5329. Thus, the gate electrode 5303, the first insulating layer 5311, the p-type semiconductor layer 5313, the second insulating layer 5323 and the n-type semiconductor layer 5325 are self aligned in a plane perpendicular to the substrate and parallel to the source to drain direction, as will be described in more detail below.

The TFT CMOS array 5300 is preferably arranged in a monolithic three dimensional array comprising a plurality of device levels vertically separated by one or more interlayer insulating layers. Each device level the array contains TFT CMOS devices 5300, as in the previous embodiments. A peripheral or driver circuit (not shown) is arranged in the substrate, preferably below the array and at least in partial vertical alignment with the array, or alternatively, within or above the array and at least in partial vertical alignment with the array.

Figure 88A:
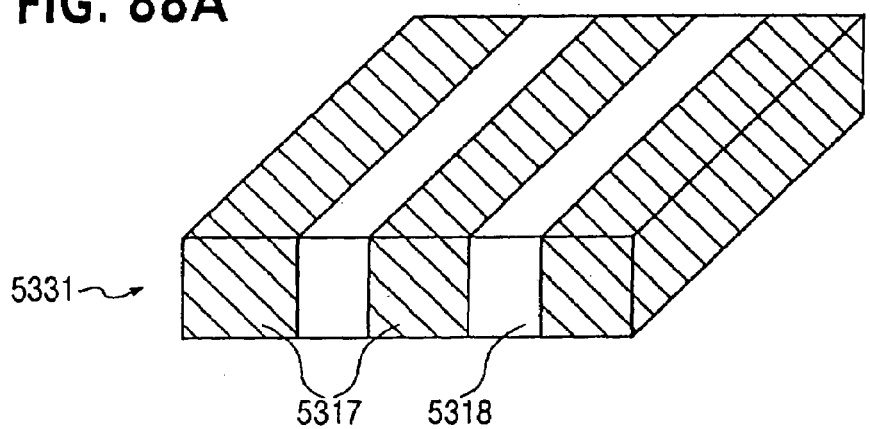

FIGS. 88A–D illustrate a method of making the rail stack TFT CMOS array 5300 according to a preferred embodiment of the present invention. First, an N+ polysilicon layer is deposited and patterned to form the source and drain electrodes or conductors 5317. An insulating layer 5318, such as a silicon dioxide layer, is then deposited over and between the conductors 5317. Layer 5318 is then planarized by CMP to form a planarized block 5331, as shown in FIG. 88A. The top surfaces of the conductors 5317 are exposed in the top surface of the block.

Figure 88B:
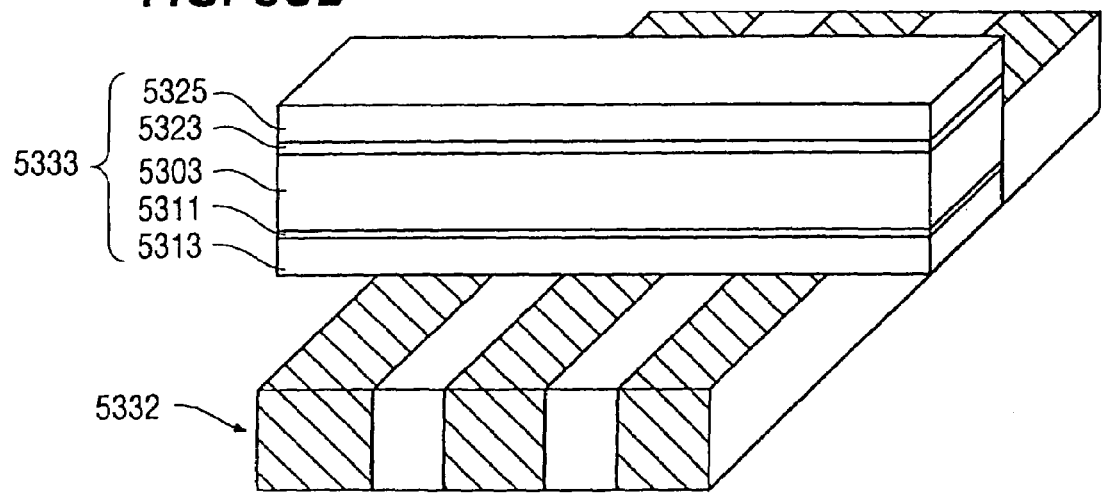

A stack of layers is then deposited on the block 5332. These layers include the p-type polysilicon (or amorphous silicon) layer 5313, the first insulating or local charge storage film 5311, the gate layer 5303, the second insulating or charge storage film 5323 and the n-type polysilicon (or amorphous silicon) layer 5325. A photoresist mask (not shown) is then formed over this stack, and the stack of layers is patterned to form a plurality of rail stacks 5333 (only one rail stack 5333 is shown in FIG. 88B for clarity). The mask may be removed after all the layers have been patterned. Since all of the layers in rail stack 5333 are patterned during the same step, the layers in the rail stack 5333 are self aligned in a plane perpendicular to the substrate (i.e., the sides of the rail stack 5333 are planar). The rail stacks 5333 are disposed above the block 5332. The rail stacks extend in a different direction from the direction of the electrodes 5317. Preferably, the rail stack 5333 and the electrodes 5317 extend in perpendicular directions within the array, as shown in FIG. 88B.

An insulating layer 5331, such as a silicon oxide layer, is then deposited over the rail stack 5333, such that it fills in the spaces 5335 between the rail stacks 5333, as shown in FIG. 88C. Layer 5331 is then planarized by CMP. A photoresist mask (not shown) is formed on layer 5331, and parallel trenches 5339 are etched in layer 5331 using the mask. The trenches extend parallel to the electrodes 5317 and perpendicular to the rail stacks 5333, as shown in FIG. 88C.

If desired, optional sidewall spacers (not shown) are formed on the sidewalls of the rail stack 5333 before the deposition of layer 5331. Preferably, the spacers are made from an insulating material that is different from the material of layer 5331. The spacers are preferably made of silicon nitride. The spacers protect the sidewalls of the stack 5333 during the etching of the trenches. The spacers keep the trench etch from extending too far past the top of the gate lines in the area between gate lines, to protect against gate to source/drain shorts.

Using layer 5331 and/or the photoresist as a mask, p-type ions (i.e., boron or $BF_2$) are implanted into the exposed n-type semiconductor layer 5325 through the trenches 5339. The ions form P+ source and drain regions 5327 in layer 5325, as shown in FIG. 88D.

A p-type polysilicon layer is then deposited over layer 5331 and in the trenches 5339. The polysilicon layer is planarized by CMP or etched back to form a plurality of spaced apart P+ electrodes 5329 embedded in the planarized insulating layer 5331. The electrodes 5329 are located above the rail stacks 5333 and contact the P+ source and drain regions 5327. Since the electrodes 5329 and source and drain regions 5327 are formed during the same lithography step, there is no misalignment between the electrodes 5329 and source and drain regions 5327. Alternatively, the source and drain regions 5327 may be formed by outdiffusion from the electrodes 5329 rather than by ion implantation into the trenches 5339.

The array is annealed to form N+ source and drain regions 5315 by outdiffusion from N+ electrodes 5317 and to recrystallize the amorphous or polysilicon semiconductor layers 5313 and 5325. The outdiffusion and recrystallization may be carried out during the same or different annealing steps at any desired point in the fabrication process.

Figure 88D:
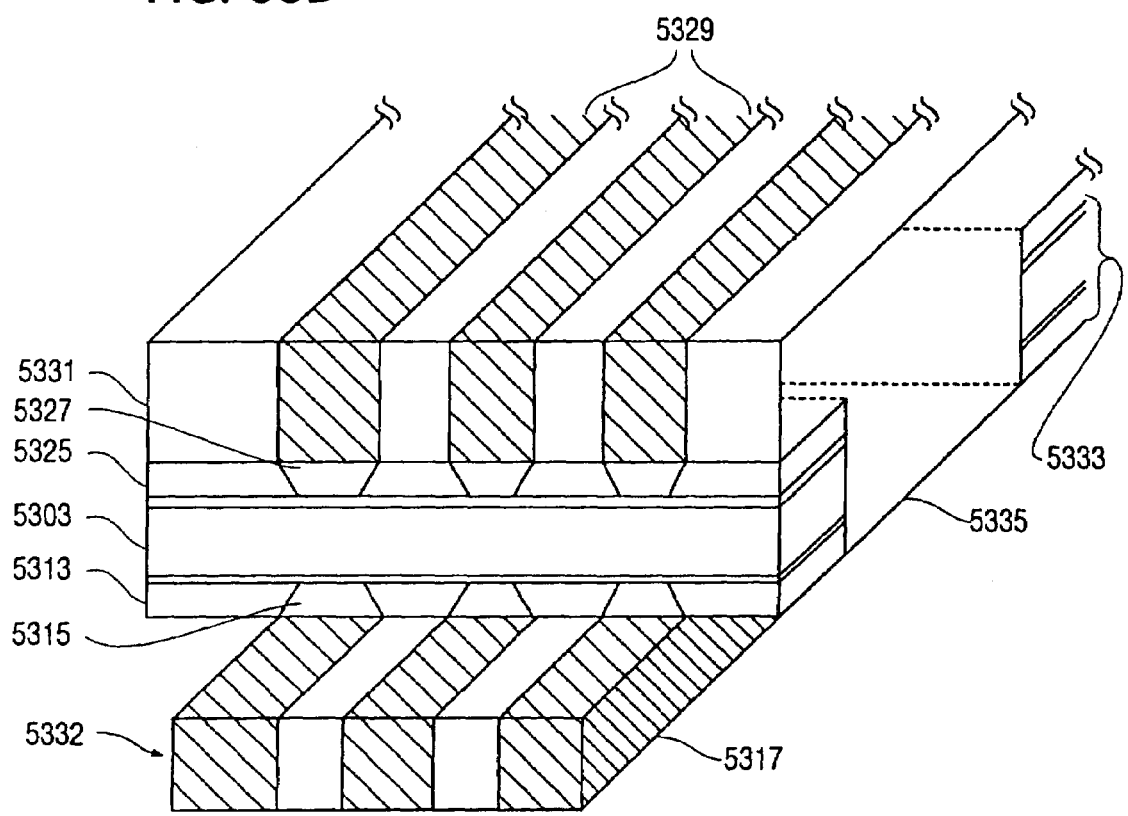

If desired, an interlayer insulating layer is formed over the array shown in FIGS. 87 and 88D, and another device level containing another array of TFT CMOS EEPROM devices 5300 is monolithically formed thereon. Routing metallization layers (preferably a metal layer other than aluminum) may be formed in the interlayer insulating layer. Additional interlayer insulating layers and device levels may be formed over the second level of the array if desired, to form at least three device layers. In another alternative aspect of this embodiment, a second rail stack containing a gate line is formed directly on top of the PMOS electrodes 5329 without an intervening interlayer insulating layer. Thus, the PMOS electrodes 5329 would contain source and drain regions in two rail stacks. In other words, plural device levels may be formed without intervening interlayer insulating layers to form a three dimensional monolithic array. This arrangement offers more transistors with fewer processing steps, but with less programming flexibility.

Figure 89:
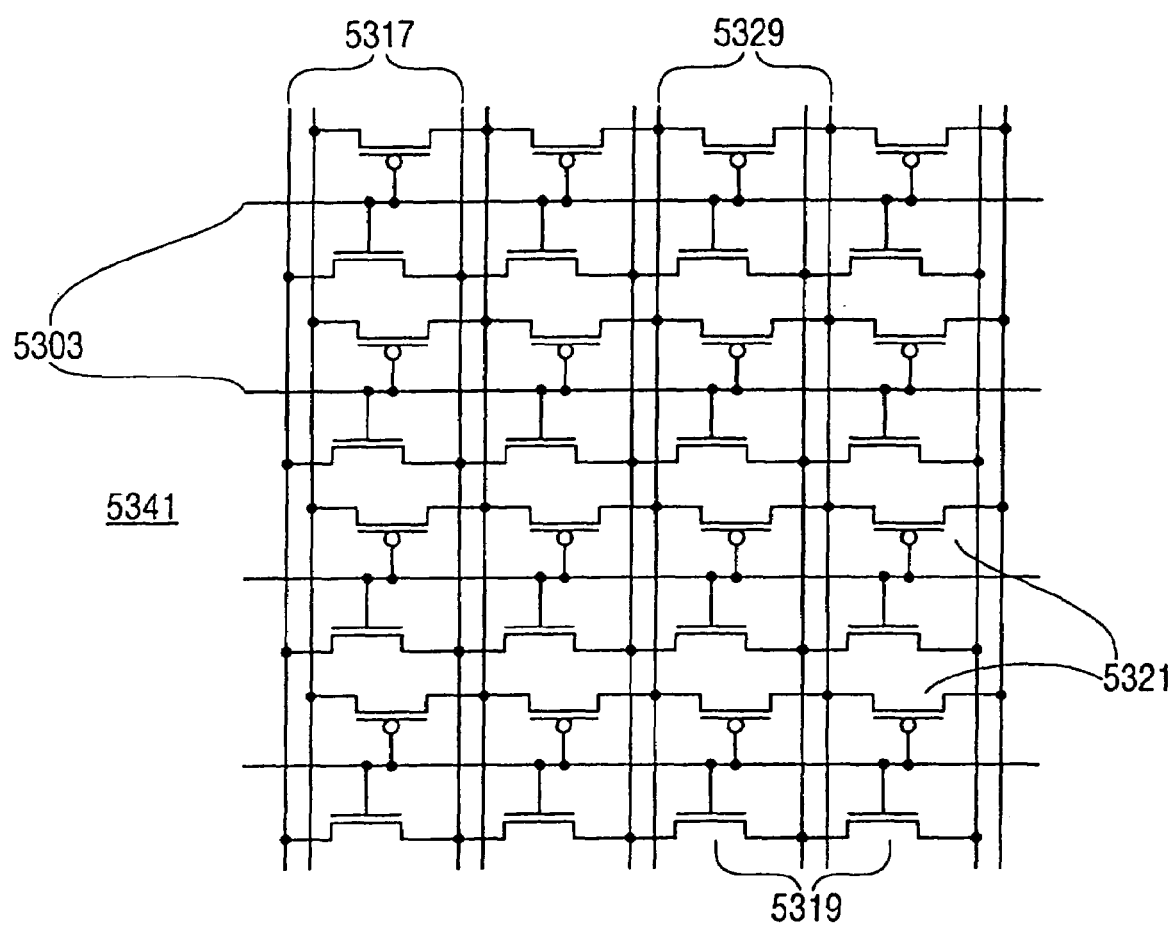
FIGS. 89–92 illustrate logic and memory circuits using the CMOS array of FIG. 87.

As shown in FIG. 89, the resulting TFT CMOS array is a matrix of NMOS 5319 and PMOS 5321 devices with common gates 5303. The array shown in FIG. 89 is an unprogrammed or unconfigured array. The array can then be configured into logic elements or memory devices by rupturing the gate dielectric (i.e., the charge storage film or region) to form a conductive link which connects the gate lines (i.e., word line rows) 5303 and source and drain electrodes 5317, 5329 (i.e., bit lines), or by storing charge in the charge storage regions of either NMOS or PMOS transistors to raise their threshold voltages and keep them permanently off. The array of TFT CMOS EEPROM devices 5300 may be used to form either logic elements or a memory array. Furthermore, the same semiconductor device in the unconfigured array may be used either as an antifuse or as an EPROM or an EEPROM.

According to a preferred embodiment of the present invention, a circuit comprising a plurality of charge storage devices and a plurality of antifuse devices is provided. The circuit may comprise a field programmable gate array or a programmable logic device. Preferably, the plurality of charge storage devices and the plurality of antifuse devices comprise a same set of devices. This greatly simplifies the fabrication of the circuit. These devices function as charge storage devices when a first programming voltage is applied to the devices to turn these devices off by increasing their threshold voltage. These devices also function as antifuses when a second programming voltage higher than a first voltage is applied to the devices. The second voltage may be any voltage which is sufficient to form a conductive link through the charge storage region. For example, the first (i.e., charge storage voltage) may be less than 5 volts, while the second voltage sufficient to form the conductive link may be 5–50 volts, depending on the device characteristics. The voltages are provided to the devices by the driver or peripheral circuit. However, if desired, charge storage and antifuse semiconductor devices having a different structure may be provided.

It should be noted that any charge storage devices which function as an antifuse when a conductive link has been formed through its charge storage region are within the scope of the present invention. Thus, any device is within the scope of the present invention if the device contains a semiconductor active region, a charge storage region adjacent to the semiconductor active region, a first electrode and second electrodes, and where charge is stored in the charge storage region when a first programming voltage is applied between the first and the second electrodes, and a conductive link is formed through the charge storage region to form a conductive path between the first and the second electrodes. Therefore, a charge storage device which is capable of being used as an antifuse is not limited to rail stack TFT EEPROMs. Such charge storage devices may include the pillar or self aligned TFT EEPROMs and diodes with charge storage regions of the previous embodiments, as well as EPROMs and EEPROMs formed in a single crystal semiconductor substrates.

Figure 90:
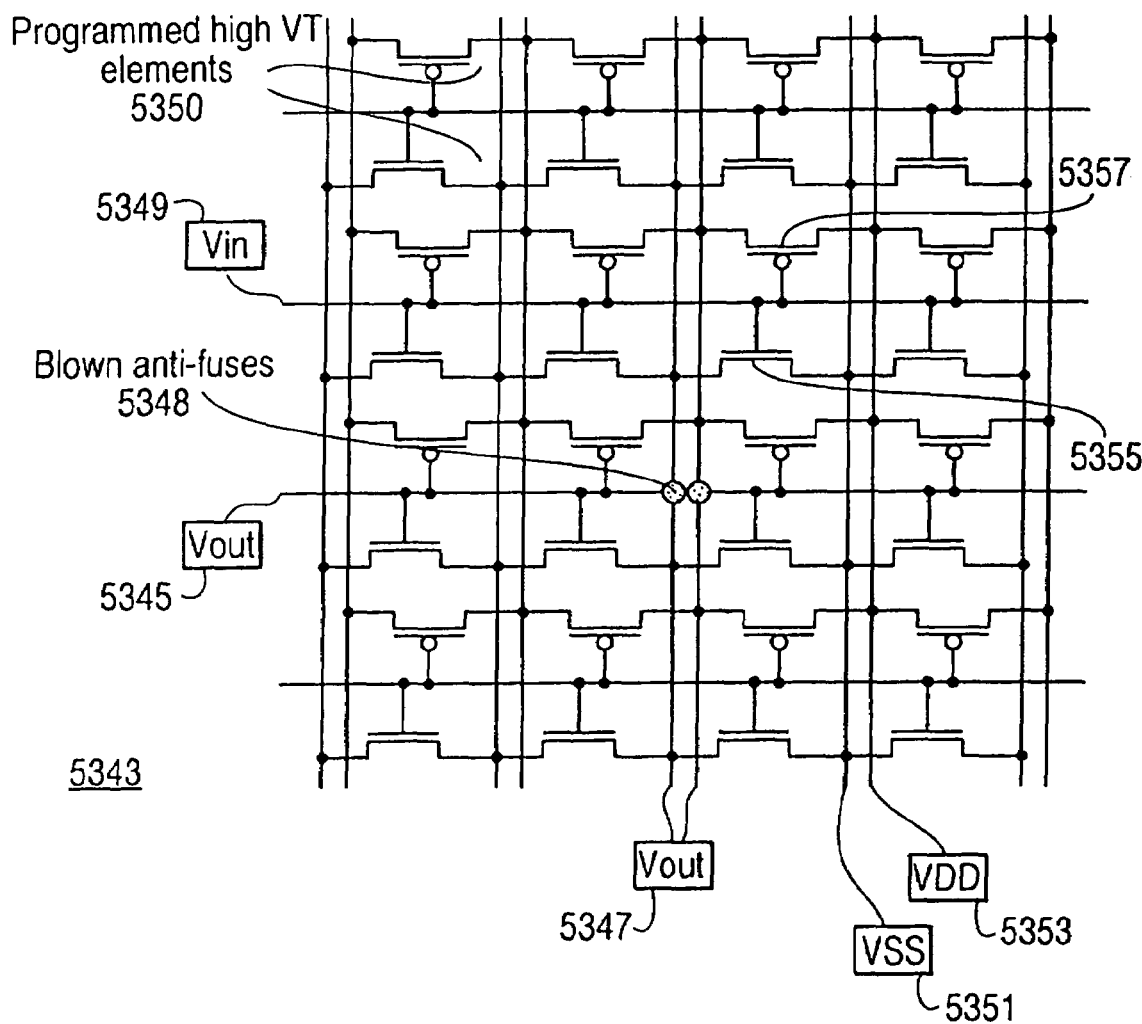

FIG. 90 illustrates how a 4×4 cell array of the circuit of FIG. 89 can be programmed into an inverter 5343. First, a high voltage is applied between gate (i.e., word) line 5345 and bit lines 5347, which will be used to carry the output voltage, $V_{out}$. This causes conductive antifuse links 5348 to form to electrically connect lines 5345 and 5347. Then, the driver circuit provides a programming voltage to all other transistors 5350 to increase their threshold voltage to turn them off, except to NMOS transistors 5355 and PMOS transistors 5357. The NMOS 5355 and PMOS 5357 transistors form the inverter. When a high voltage, $V_{in}$, is provided into gate line 5349, then a low voltage, $V_{out}$, is read out, and vice-versa. Voltages $V_{SS}$ (i.e., ground) and $V_{DD}$ (i.e., power supply voltage) are provided into bit lines 5351 and 5353 which are connected to transistors 5355 and 5357.

Figure 91:
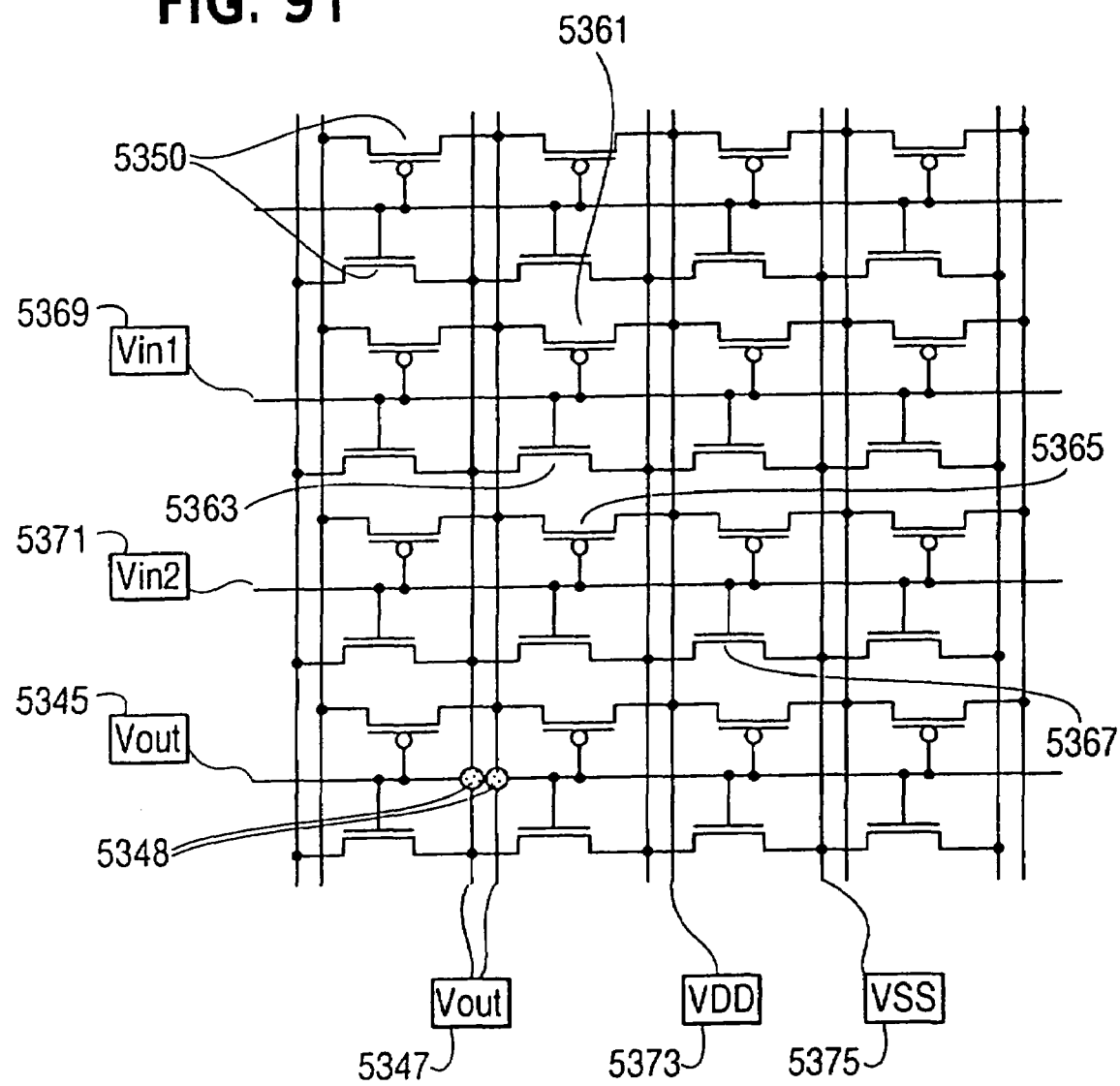

FIG. 91 illustrates how a 4×4 cell array of the circuit of FIG. 89 can be programmed into a two input NAND gate 5360. First, a high voltage is applied between gate (i.e., word) line 5345 and bit lines 5347, which will be used to carry the output voltage, $V_{out}$. This causes conductive antifuse links 5348 to form to electrically connect lines 5345 and 5347. Then, the driver circuit provides a programming voltage to all other transistors 5350 to increase their threshold voltage to turn them off, except for PMOS transistors 5361 and 5365 and NMOS transistors 5363 and 5365. The transistors 5361, 5363, 5365 and 5367 form the NAND gate. Input voltages $V_{in1}$ and $V_{in2}$ are provided into gate lines 5369 and 5371. CMOS 5361/5363 is connected to gate line 5369, while transistors 5365 and 5367 are connected to gate line 5371. Voltages $V_{SS}$ and $V_{DD}$ are provided into bit lines 5373 and 5375. NMOS 5367 is connected to bit line 5375, while PMOS 5361 and 5365 are connected to bit line 5373. Output voltages can be read out from lines 5345 or 5347, which are connected by a blown antifuse 5348.

Figure 92:
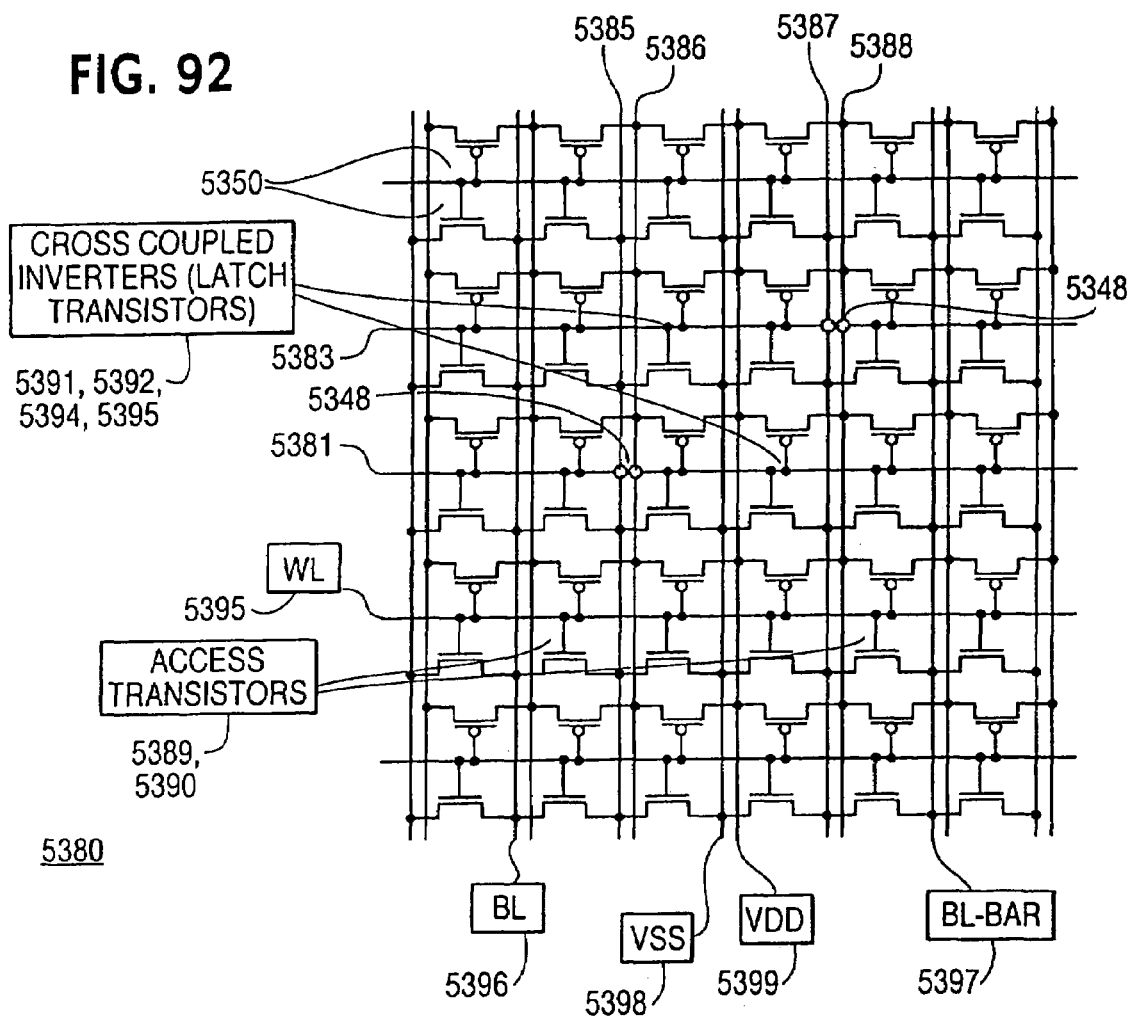
Figure 94A:
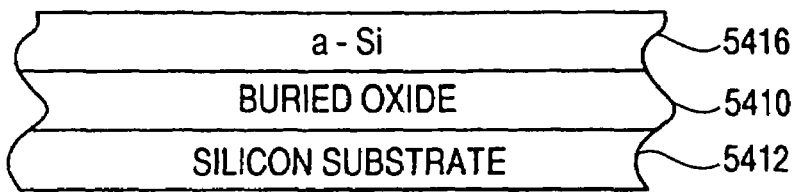
FIGS. 94A–94H are vertical cross-sectional drawings illustrating steps in the process of FIG. 93.
Figure 94B:
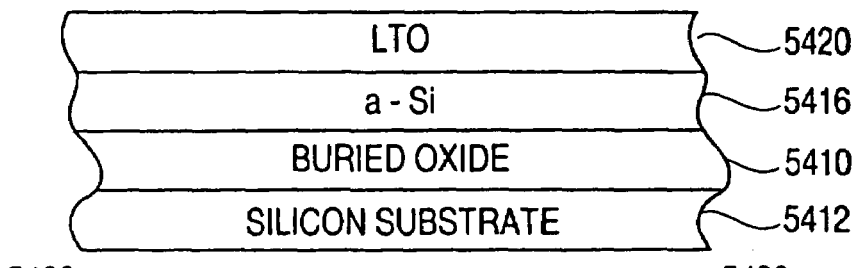
Figure 94C:
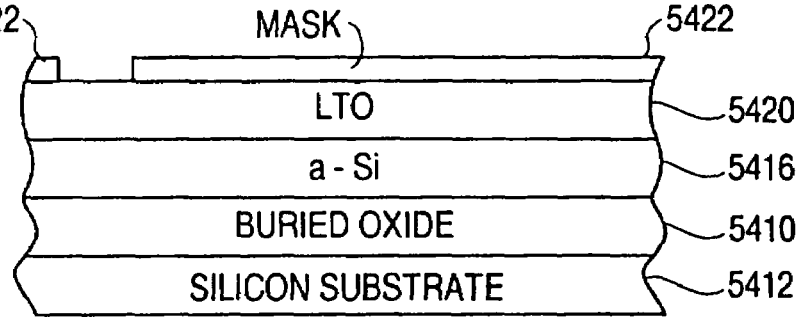
Figure 94D:
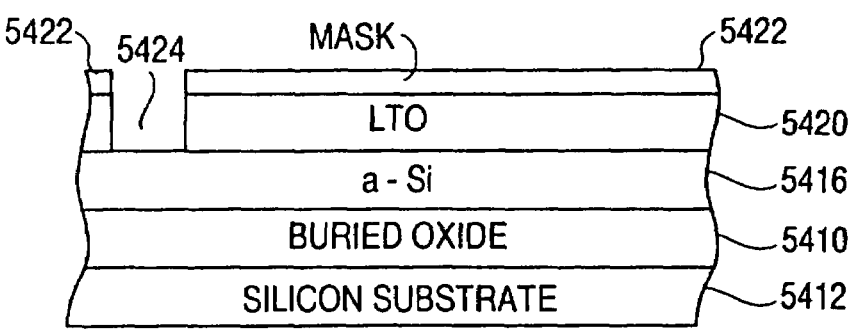
Figure 94E:
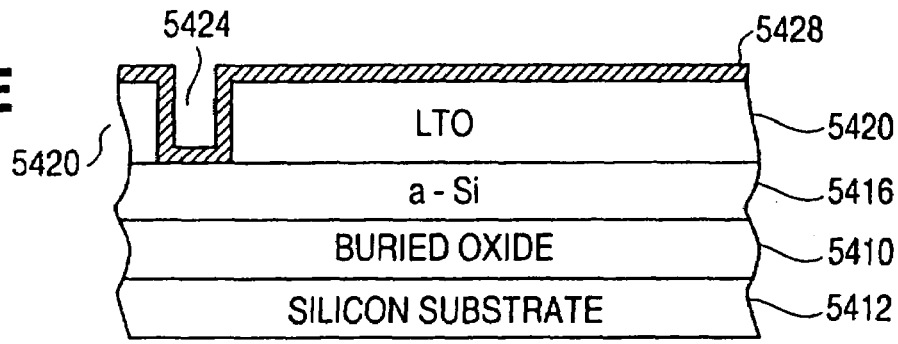
Figure 94F:
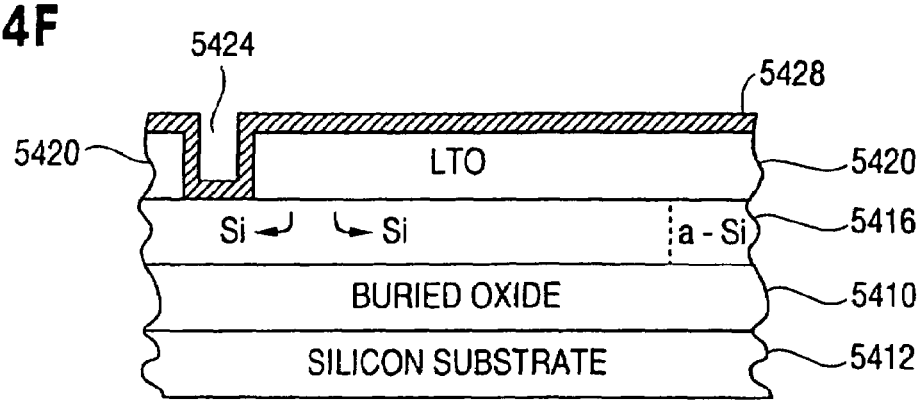
Figure 94G:
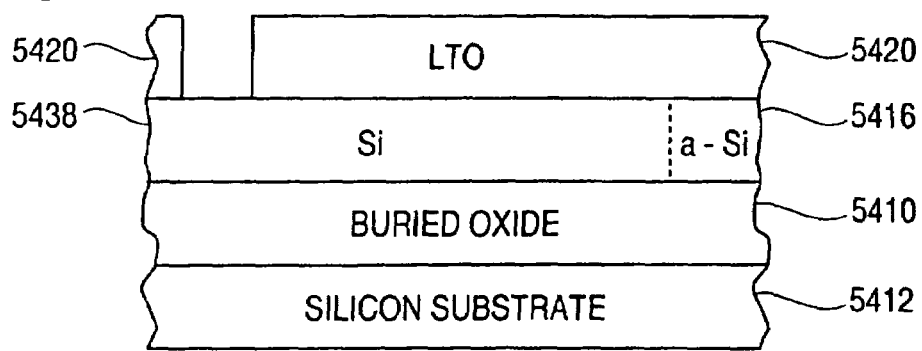
Figure 94H:
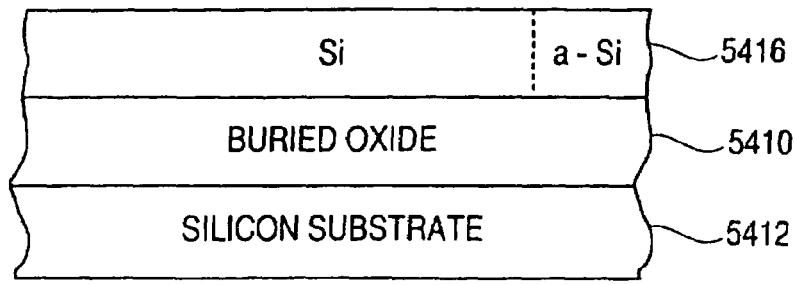

FIG. 92 illustrates how a 5×6 cell array of the circuit of FIG. 89 can be programmed into a static random access memory (SRAM) 5380. First, a high voltage is applied between gate (i.e., word) lines 5381 and 5383 and bit lines 5385, 5386, 5387 and 5388. This causes conductive antifuse links 5348 to form to electrically connect lines 5381 with lines 5385 and 5386, and to electrically connect lines 5383 with lines 5387 and 5388. Then, the driver circuit provides a programming voltage to all other transistors 5350 to increase their threshold voltage to turn them off, except for transistors 5389, 5390, 5391, 5392, 5393 and 5394. The transistors 5389 and 5390 are the SRAM access transistors, while transistors 5391, 5392, 5393 and 5394 are the cross coupled inverters. The cell is accessed by placing a positive voltage on the word line 5395. Data is input onto and read out of BL and BL-bar, which are provided into bit lines 5396 and 5397, respectively. Voltages $V_{SS}$ and $V_{DD}$ are provided into bit lines 5398 and 5399, respectively.

FIGS. 89–91 show various exemplary configurations that can be programmed. It should be noted that any other desired logic or memory device, such as a NOR gate, etc., may be programmed using the methods described above. Since all logic functions can be performed by basic elements, such as NAND gates, any logic circuit can be programmed into this type of an array. Furthermore, logic and memory devices may be programmed into the same circuit if desired. For logic devices, in general, the size of the logic block is $(x+1)^2$ times the cell area, where (x) is the number of inputs on the logic gate. Since the cell area here can be as small as $4F^2$, where F is the minimum feature size (half-pitch), then for F=0.25 microns, the minimum area per logic gate is $4(F(x+1))^2$, or 2.25 microns squared for a 2-input NAND or NOR gate. Preferably, the area per logic gate is $4(F(x+1))^2$ to $5(F(x+1))^2$. This size includes an "isolation" row and column on each edge of the block, that is shared with the next block.

VI. Metal Induced Crystallization

A preferred embodiment of the present invention is directed to a non-volatile thin film transistor (TFT) memory or logic device constructed above a substrate and including a source, drain and channel region made of deposited or grown amorphous silicon or polysilicon that has been crystallized by means of a transition metal-induced lateral crystallization (MILC) process. A two- or, more preferably, a three-dimensional many-times programmable (MTP) non-volatile memory or logic is constructed of such thin film transistor memory devices.

In accordance with the first aspect of the present embodiment, it is desirable to improve the performance characteristics of TFT-based non-volatile memory or logic cells having a channel formed in a deposited thin layer of silicon, such as amorphous silicon (a-Si) or polysilicon. This can be accomplished if the grain size of the a-Si or polysilicon can be increased to resemble monocrystalline silicon.

In the past, crystallization of a-Si has been accomplished in a number of ways. In accordance with a first approach, a-Si may be partially crystallized to form polycrystalline silicon with an anneal step taking tens of hours at about 600° C. This approach is not advantageous because the devices formed in that material have lower-performance characteristics and they take a relatively long amount of time to fabricate. Thus, crystallization can be enhanced by the use of transition metal or germanium catalysts to induce lateral crystallization at seeding sites.

Unfortunately, most transistor-based devices fabricated in this manner suffer from relatively poor performance characteristics (relative to monocrystalline silicon) and exhibit subthreshold slope values on the order of 100's of mV/dec and an Idsat of 10's of $\mu A/\mu m$. The metal-induced lateral crystallization (MILC) is carried out at a temperature of about 400° C. to about 700° C. to achieve lateral crystallization growth rates of several or more $\mu m/hr$. To further enlarge the silicon crystal sites to hundreds of microns, a relatively short duration high temperature anneal step, e.g., 900° C. for 30 minutes, is added to simultaneously crystallize multiple layers of a-Si (or another semiconductor material). Note that a crystallization temperature range of about 750° C. to about 975° C. will also provide satisfactory results if the time of the anneal is adjusted accordingly. This short duration high temperature anneal will not saturate the diffusion regions of the devices contemplated herein and can be applied once to a multi-level device, as can the low temperature anneal step.

Figure 95:
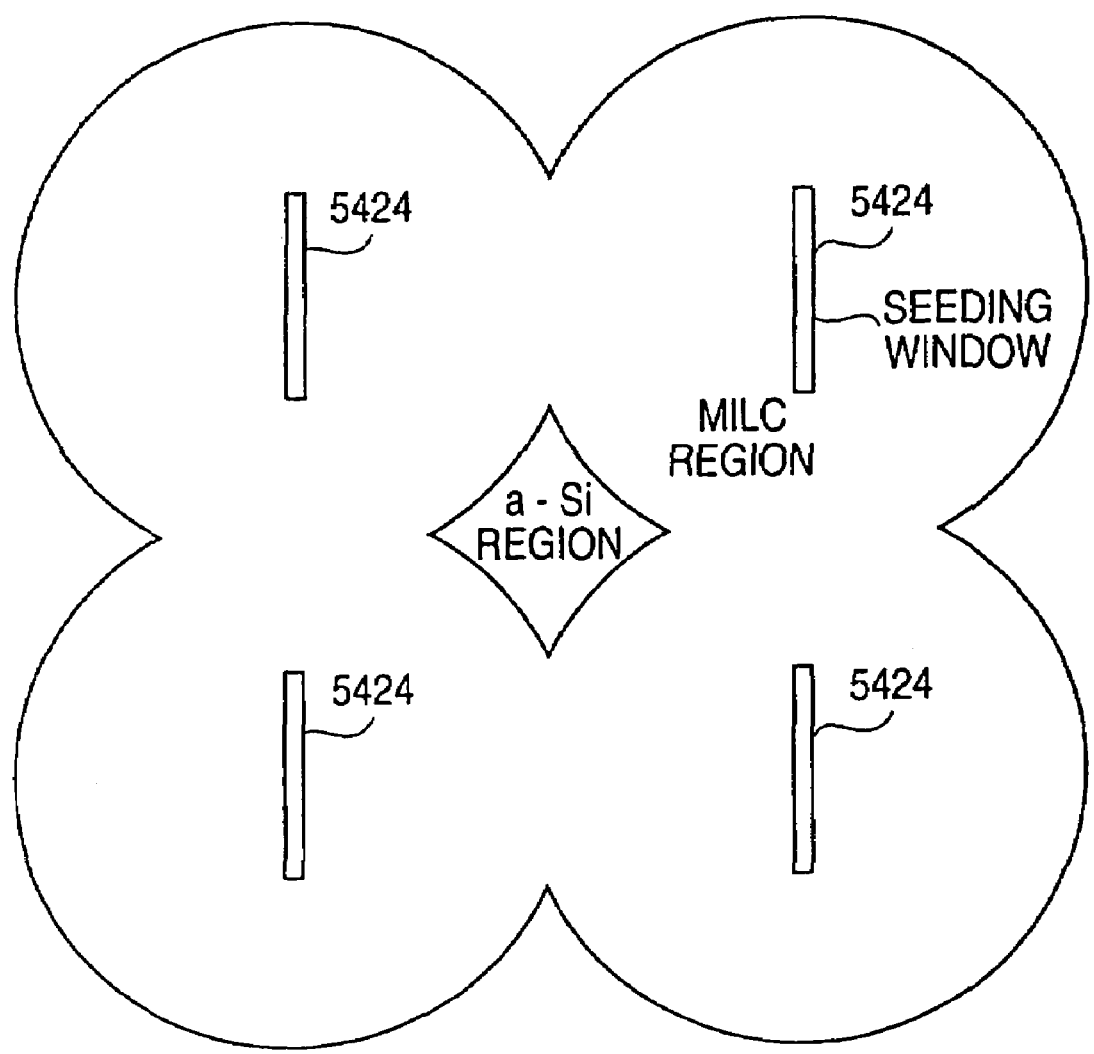
FIG. 95 is a top plan view of a portion of a silicon wafer after processing in accordance with the process of FIG. 93.
Figure 96:
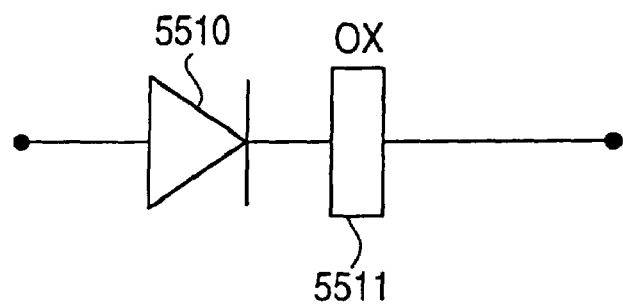
FIGS. 96–101 are illustrations of prior art devices.
Figure 97:
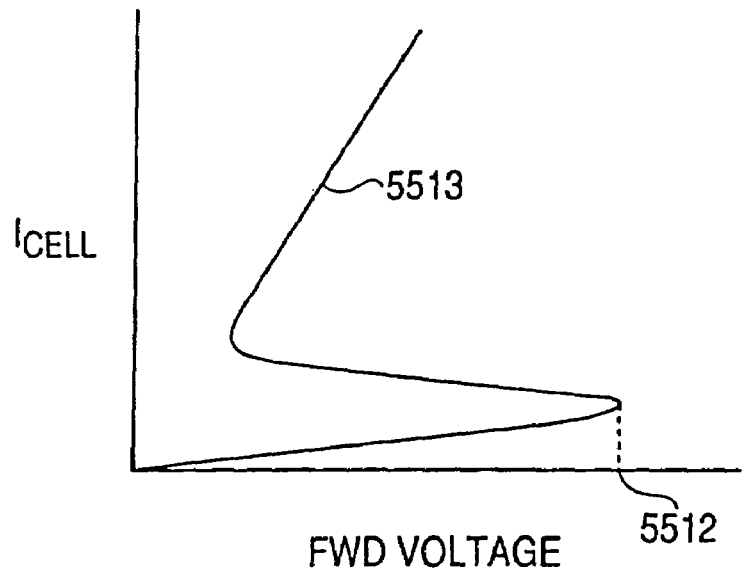
Figure 98:
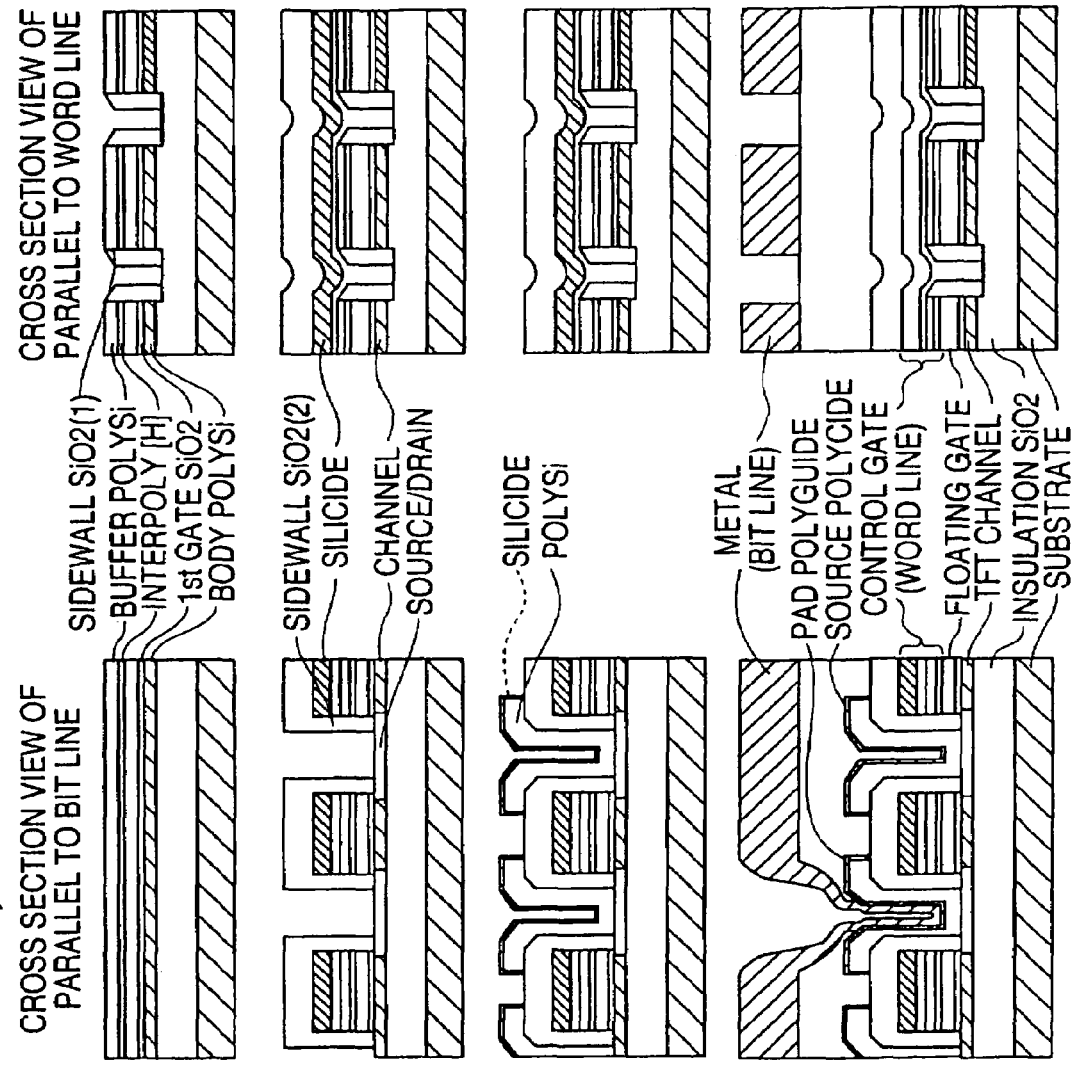
Figure 99:
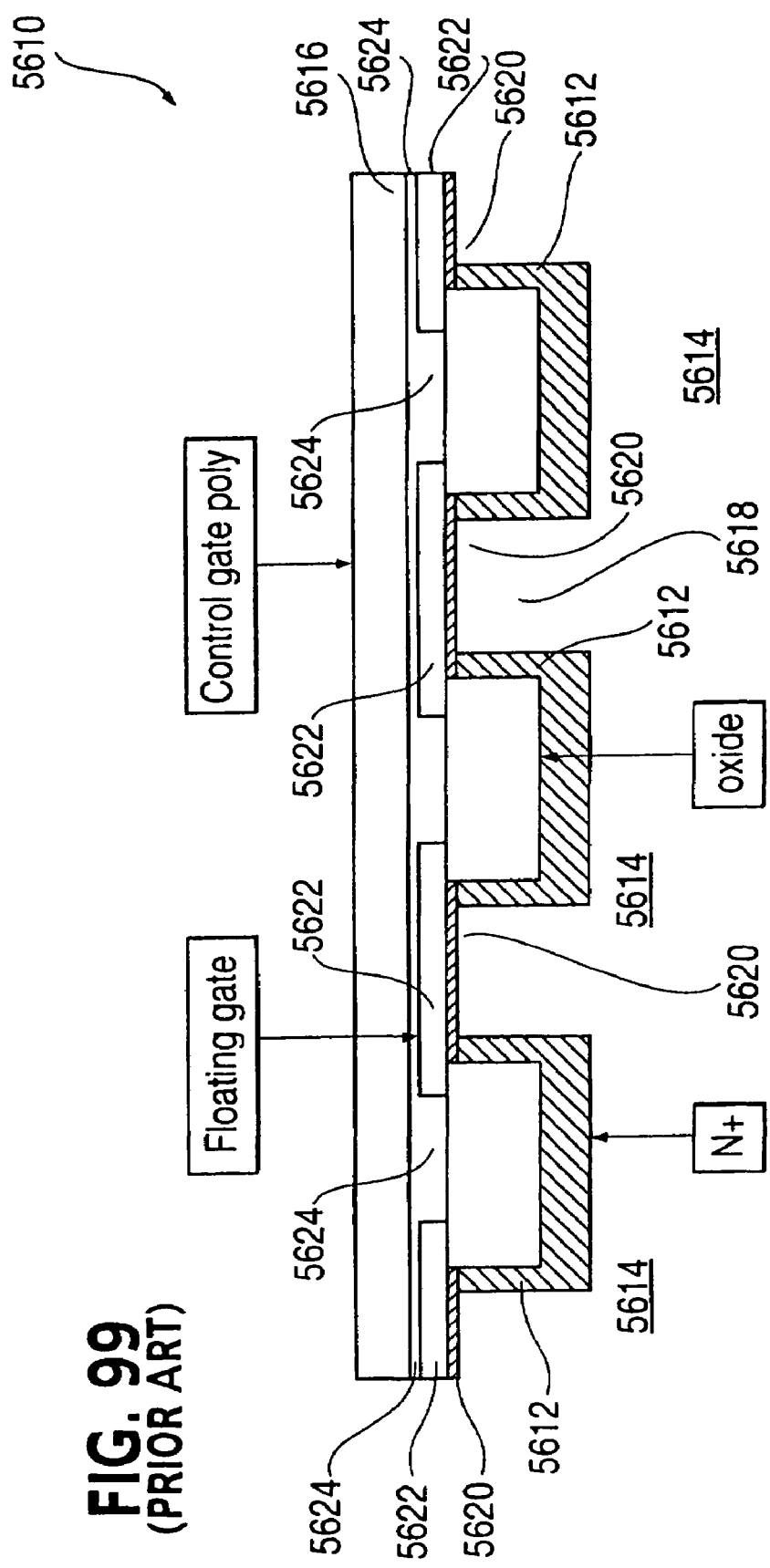
Figure 100:
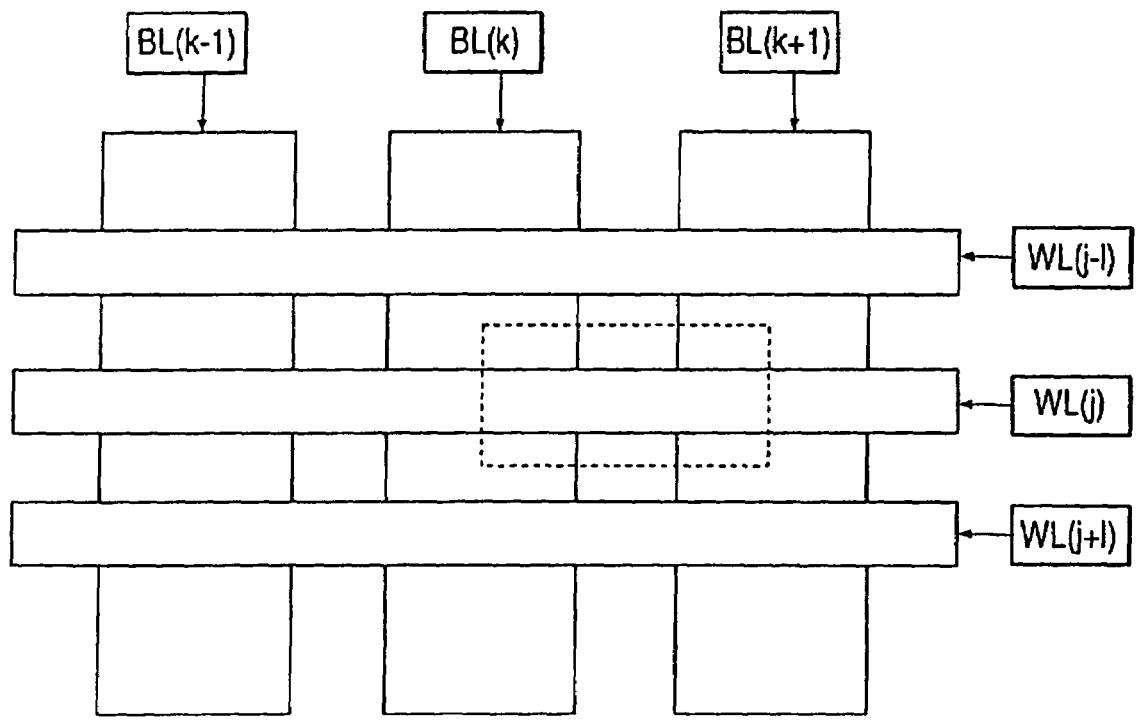
Figure 101:
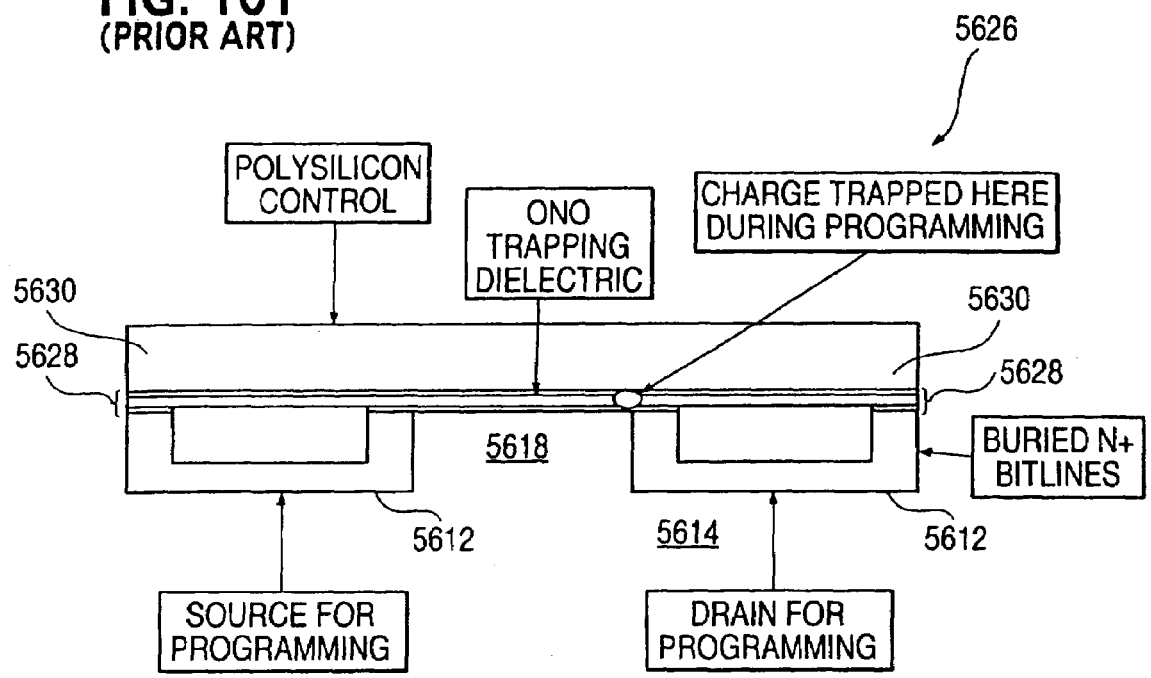

An example of a process for recrystallizing a deposited a-Si layer in accordance with a specific embodiment of the present invention is now described and illustrated in FIGS. 93–95. Those of ordinary skill in the art will now realize that many routine modifications to the process illustrated here are possible and do not affect the inventive concepts set forth herein.

Turning now to FIGS. 93–95, a process flow diagram of a fabrication process for a crystallized deposited (or grown) a-Si layer is illustrated in FIG. 93. FIGS. 94A–94H illustrate vertical cross sections of a silicon wafer prepared in accordance with the process of FIG. 93. FIG. 95 illustrates the effect of metal-induced lateral crystallization (MILC) through seeding windows 5424 in a-Si deposited over buried oxide over a standard silicon wafer.

The first step 5406 of the process 5408 is to grow (or deposit) a thick oxide layer 5410 (FIG. 94A) (e.g., 3000 Å) on a standard silicon wafer substrate 5412 to provide a buried oxide layer. The next step 5414 is to deposit a thin amorphous silicon (a-Si) layer 5416 (e.g., 1000 Å) over buried oxide layer 5410. This can be accomplished, for example, with low pressure chemical vapor deposition (LPCVD) at 550° C. using $SiH_4$ as the silicon source at a flow rate of 70 SCCM and a pressure of 300 mtorr. Alternatively, layer 5416 may comprise a polysilicon layer. The next step 5418 is to deposit a sacrificial low temperature oxide (LTO) layer 5420 (e.g., 3000 Å) and then in step 5419 to pattern it with mask 5422 and etch to expose transition metal seeding widows 5424. These seeding windows can be slots approximately 2 $\mu$m in width as shown in FIG. 95. Mask 5422 can now be removed.

The next step 5426 is to deposit a transition metal layer 5428 (e.g., 100 Å Ni (nickel)) over LTO layer 5420. Other transition metals may be used although Ni is presently preferred. Other transition metals which may also be used, but which are less desirable than Ni are: Fe (iron), Co (cobalt), Ru (ruthenium), Rh (rhodium), Pd (palladium), Os (osmium), Ir (iridium), Pt (platinum), Cu (copper) and Au (gold). Germanium may also be used if desired. The transition metal may also be introduced into the seeding window by implantation and other mechanisms well known to those of ordinary skill in the art.

The next step 5430 is to anneal for initial lateral crystallization. This step, illustrated in FIG. 94F, may be carried out in a range of temperature and times. For example, a 20 hour anneal at 560° C. in $N_2$ ambient will work. Lower temperatures require longer anneal times, higher temperatures require shorter anneal times. Those of ordinary skill in the art will now recognize that this can be optimized for throughput considerations. This step performs a crystallization which may be adequate for certain devices and provide silicon grain sizes of several to tens of $\mu$m. Other devices requiring even more performance and silicon grain sizes in the hundreds of $\mu$m may require the high temperature anneal step discussed below.

The next step 5432 is to strip the remaining transition metal layer 5428. This may be performed with $H_2SO_4:H_2O_2$ (4:1) at 70° C. Then step 5434 is the LTO layer 5420 is stripped with HF.

Finally, a high temperature anneal step 5436 (e.g., 900° C., 30 minutes, $N_2$ ambient) is conducted (if desired) to further crystallize the partially crystallized a-Si to form even larger grain silicon crystals, (>100 $\mu$m in size). This step gives the crystallized a-Si layer (i.e., a large grain polysilicon layer) performance characteristics similar to conventional SOI (silicon on insulator) CMOS technology. Note that transition metal-crystallized semiconductor material as used herein will contain trace detectable amounts of the transition metal(s) used for facilitating the crystallization. In normal semiconductor processing, trace amounts of transition metals (typically Fe, Ni) will escape the structure of the semiconductor fabrication equipment (usually containing stainless steel) and embed themselves into the semiconductor film where the TFT channel would be formed. Normally these transition metals are present at a level of less than about $10^{14}$ atoms/cc. In transition metal crystallization, however additional trace amounts of transition metals in excess of about $10^{14}$ atoms/cc and up to about $10^{18}$ atoms/cc will remain in the crystallized semiconductor material after processing. This is generally not a contamination problem, however, where it is desired to create a gradient of such contaminants, a gettering material, e.g., P (phosphorous), may be placed in the source and/or drain regions of the TFT to reduce the concentration of such contaminants in the channel region by increasing the concentration of such contaminants in the respective source and/or drain regions. Formation of devices in the region of the seeding windows 5424 should be avoided due to excessive transition metal contamination.

The above described metal induced crystallization method may be used to recrystallize the active semiconductor layer of any of the above described devices. Thus, pillar TFTs, self-aligned TFTs, rail stack TFTs and diodes (i.e., an active semiconductor layer which contains one or more p-n junctions) of various configurations may be formed in the recrystallized a-Si or polysilicon.

VII. Metallization

In the various embodiments described above, a metal silicide layer was formed in contact with a silicon layer, such as a polysilicon word line or bit line. One preferred method of forming a titanium suicide layer in contact with a silicon layer is by using a silicon cap and a TiN layer. The titanium silicide layer is formed on an undoped amorphous silicon cap layer. The cap layer is formed on a heavily doped silicon layer, such as a polysilicon or amorphous silicon layer doped to a concentration in excess of $10^{19}$ cm$^{-3}$, such as $10^{19}$ cm$^{-3}$ to $10^{21}$ cm$^{-3}$. The cap layer is preferably deposited on P+ polysilicon or N+ amorphous silicon layers. The N+ amorphous silicon may then be recrystallized into N+ polysilicon during subsequent annealing steps.

A method of forming a titanium silicide ($TiSi_2$) layer comprises the following steps. A heavily doped polysilicon layer is deposited. For example, a P+ polysilicon layer is boron doped to a concentration of $5 \times 10^{21}$ cm$^{-3}$, and has a thickness of about 1400 Angstroms. A cap layer of undoped amorphous silicon is deposited on the P+ polysilicon layer. The cap may be 600 Angstroms thick, for example. A titanium layer is deposited on the cap. The titanium layer may be 250 Angstroms thick, for example. A titanium nitride layer is deposited on the titanium layer. The titanium nitride layer may be 100 Angstroms thick, for example. Other layer thicknesses may be used, as required.

The layers are annealed at a temperature below 650° C. for less than five minutes to react the titanium and the silicon in the cap to form a C49 phase $TiSi_2$ layer. The anneal may be carried out at 600° C. for 1 minute, for example. If desired, another P+ polysilicon layer is deposited over the stack and the stack is etched into a thin "wire" or "rail", such as a word line or bit line. The wire or rail may be 0.25 mm wide or less. The titanium silicide is then transformed from the C49 to the C54 phase by a high temperature (i.e., above 650° C.) anneal. The anneal can take place before or after the wires or rails are patterned, at 800° C. for one minute, for example. By annealing each Si/Ti/TiN film stack below 650° C., dopant diffusion and thermal grooving of the TiSi$_2$ is minimized. Multiple film stacks can be deposited and etched sequentially.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. The drawings are not necessarily to scale and illustrate the arrays in schematic block format. It is intended that the scope of the invention be defined by the claims appended hereto, and their equivalents.

We claim:

1. A monolithic three dimensional array comprising:
   a) a first device level of charge storage transistors, the first device level comprising:
      i) a plurality of spaced apart first rails extending in a first direction; and
      ii) a plurality of spaced apart second rails formed over the first rails extending in a second direction different from the first direction,
      wherein the first rails comprise first portions of the charge storage transistors and the second rails comprise second portions of the charge storage transistors; and
   b) a second device level of charge storage transistors monolithically formed above the first device level.

2. The array of claim 1, wherein the second device level comprises:
   a plurality of spaced apart third rails extending in the first direction; and
   a plurality of spaced apart fourth rails formed over the third rails extending in the second direction;
      wherein the third rails comprise first portions of the charge storage transistors of the second device level and the fourth rails comprise second portions of the charge storage transistors of the second device level.

3. The array of claim 1, wherein the first device level is disposed above a monocrystalline semiconductor substrate.

4. The array of claim 3, wherein driver circuits are disposed in the monocrystalline semiconductor substrate.

5. The array of claim 1, wherein:
   the array comprises at least four device levels containing the charge storage transistors; and
   adjacent device levels are separated by a respective interlevel insulating layer.

6. The array of claim 1, further comprising:
   an interlevel insulating layer located between the first and second device levels;
   a via having a bottom end, the via extending between the first and second device levels through the interlevel insulating layer; and
   a contact which extends between the first and second device levels in the via to contact an active region in one of the first rails at the bottom end of the via.

7. The array of claim 1, wherein:
   each first rail comprises a plurality of polysilicon active regions and each of the plurality of active regions is in contact with a charge storage region.

8. The array of claim 7, wherein:
   the first direction is substantially perpendicular to the second direction; and
   each of the charge storage regions comprises an O—N—O dielectric stack.

9. The array of claim 8, further comprising at least two conductive layers which contact each first rail.

10. The array of claim 9, wherein:
    the charge storage transistors are formed at intersections of each first rail and each second rail;
    each transistor active region comprises source, channel and drain regions;
    each transistor comprises a gate electrode disposed in one of the second rails.

11. The array of claim 10, wherein the second rails comprise word lines.

12. The array of claim 11, further comprising a third device level of charge storage transistors formed between the first and the second device levels.

13. A monolithic, three dimensional array of charge storage devices, comprising a plurality of device levels monolithically formed above a substrate, wherein:
    each of the plurality of device levels comprises a plurality of spaced apart semiconductor active regions and a plurality of spaced apart rails;
    the plurality of active regions are disposed at a first height;
    the plurality of rails are disposed at a second height different than the first height; and
    wherein the active regions comprise first portions of the charge storage devices and the rails comprise second portions of the charge storage devices.

14. The array of claim 13, wherein:
    each charge storage device comprises a first portion located in one active region and a second portion located in one portion of one rail;
    each rail comprises a word line; and
    a charge storage film is located in contact with the word line and in contact with the plurality of the active regions.

15. The array of claim 14, wherein a space between said spaced apart rails is filled with an insulating material.

16. The array of claim 14, wherein:
    the active regions comprise polysilicon; and
    the charge storage film comprises an O—N—O dielectric stack.

17. The array of claim 14, wherein:
    the charge storage devices are located in at least four device levels; and
    adjacent device levels are separated by a respective interlevel insulating layer.

18. The array of claim 14, further comprising at least two conductive layers which contact each active region.

19. The array of claim 18, wherein:
    the charge storage devices comprise charge storage transistors;
    source, channel and drain regions of each transistor are located in each active region; and
    each transistor gate electrode comprises a portion of the word line which intersects the transistor active region.

20. The array of claim 19, wherein:
    the semiconductor active regions are disposed in elongated semiconductor strips having two vertical side surfaces and a horizontal surface which contacts the charge storage film; and
    the rails comprise elongated strips having two vertical side surfaces and a horizontal word line surface.

21. The array of claim 20, wherein the charge storage devices are located at intersections of the elongated semiconductor strips and the rails.

22. The array of claim 13, wherein the substrate is a monocrystalline semiconductor substrate.

23. The array of claim 13, wherein driver circuits are disposed in the substrate.

24. The array of claim 14, further comprising:
an interlevel insulating layer located between first and second device levels of the plurality of device levels;
a via having a bottom end, the via extending between the first and second device levels through the interlevel insulating layer; and
a contact which extends between the first and second device levels in the via to contact an active region at the bottom end of the via.

25. A method of making a monolithic three dimensional array of charge storage transistors disposed above a substrate, comprising:
a) forming a first device level of charge storage transistors, the first device level comprising:
i) a plurality of spaced apart first rails extending in a first direction; and
ii) a plurality of spaced apart second rails formed over the first rails extending in a second direction different from the first direction;
wherein the first rails comprise first portions of the charge storage transistors and the second rails comprise second portions of the charge storage transistors; and
b) monolithically forming a second device level of charge storage transistors above the first device level.

26. The method of claim 25, wherein the second device level comprises:
a plurality of spaced apart third rails extending in the first direction; and
a plurality of spaced apart fourth rails formed over the third rails extending in the second direction;
wherein the third rails comprise first portions of the charge storage transistors of the second device level and the fourth rails comprise second portions of the charge storage transistors of the second device level.

27. The method of claim 25, wherein:
the step of forming the first rails comprises:
forming a semiconductor layer above a substrate; and
patterning the semiconductor layer into a plurality of elongated strips having side walls and an upper surface; and
the step of forming the second rails comprises:
forming a word line film on a charge storage film; and
patterning the word line film to form the second rails.

28. The method of claim 25, wherein:
the step of forming the second rails comprises:
forming a word line film over a substrate; and
patterning the word line film to form the second rails; and
the step of forming the first rails comprises:
forming a semiconductor layer on a charge storage film above the second rails; and
patterning the semiconductor layer into a plurality of elongated strips having side walls and an upper surface.

29. The method of claim 25, further comprising:
monolithically forming at least four device levels over each other; and
forming interlevel insulating layers between adjacent device levels.

30. The method of claim 25, further comprising forming an insulating material between adjacent second rails.

31. The method of claim 25, wherein:
each first rail comprises a plurality of polysilicon charge storage transistor active regions;
each second rail comprises a word line; and
the first direction is substantially perpendicular to the second direction.

32. The method of claim 31, further comprising:
forming at least two conductive layers which contact each first rail; and
forming a charge storage film which contacts the active regions and the word line.

33. The method of claim 32, wherein:
the charge storage film comprises an O—N—O dielectric stack;
each transistor active region comprises source, channel and drain regions; and
each transistor gate electrode comprises a portion of the word line which overlies the transistor active region.

34. The method of claim 33, further comprising:
forming an interlevel insulating layer between the first and second device levels;
forming a via through the interlevel insulating layer which extends between the first and second device levels to an active region in a first rail; and
forming a contact in the via, such that the contact extends between the first and second device levels to contact the active region at a bottom of the via.

35. The method of claim 33, wherein:
the step of forming the first rails comprises forming a first photoresist mask over a semiconductor layer and patterning the semiconductor layer using the first photoresist mask; and
the step of forming the second rails comprises forming a second photoresist mask over a word line layer and patterning the word line layer using the second photoresist mask.

36. The method of claim 25, wherein the charge storage transistors are located at intersections of each first rail and each second rail.

37. The method of claim 25, further comprising forming a third device level of charge storage transistors between the first and the second device levels.

38. An integrated circuit, comprising:
a three-dimensional memory array having more than one memory level of memory cells, each memory level of said integrated circuit comprising:
a plurality of rails on an insulating layer above the substrate, said rails running in a first direction, said rails comprising a lightly-doped semiconductor region disposed between heavily-doped semiconductor regions;
a charge storage film on the rails;
a plurality of word lines on the charge storage film, said word lines running in a second direction different than the first direction; and
an interlevel insulating layer above the word lines.

39. The integrated circuit of claim 38, wherein the integrated circuit further comprises vias formed through at least one interlevel insulating layer making contact to portions of the rails.

40. The integrated circuit of claim 38, wherein the charge storage film comprises a charge storage dielectric film.

41. The integrated circuit of claim 40, wherein the charge storage dielectric film comprises silicon, oxygen and nitrogen.

42. The integrated circuit of claim 41, wherein the charge storage dielectric film comprises a silicon oxide/silicon nitride/silicon oxide (ONO) stack.

43. The integrated circuit of claim 38, further comprising a silicide layer formed on or within the word lines.

44. The integrated circuit of claim 38, wherein the memory levels are monolithically formed over the substrate.

45. The integrated circuit of claim 38, wherein the lightly-doped semiconductor region comprises a transistor channel region and the heavily-doped semiconductor regions comprise transistor source and drain regions.

46. The integrated circuit of claim 45, wherein the rails comprise polysilicon rails.

47. A method for manufacturing an integrated circuit comprising a three-dimensional memory array having more than one memory level of memory cells, the method comprising:
   forming a plurality of rails on an insulating layer above a substrate, said rails running in a first direction;
   forming heavily-doped semiconductor regions in the rails such that a lightly-doped semiconductor region is disposed between the heavily-doped semiconductor regions;
   forming a charge storage film on the rails;
   forming a plurality of word lines on the charge storage film, said word lines running in a second direction different than the first direction;
   forming an interlevel insulating layer above the word lines; and monolithically forming a second device level over the interlevel insulating layer.

48. The method of claim 47, further comprising forming vias through the interlevel insulating layer.

49. The method of claim 48, wherein the step of forming the vias comprises:
   forming openings in the interlevel insulating layer to expose a portion of at least one rail or word line therebelow; and
   filling the openings with a conductive material.

50. The method of claim 47, wherein the charge storage film comprises a charge storage dielectric film.

51. The method of claim 50, wherein the substrate is monocrystalline semiconductor.

52. The method of claim 51, wherein the charge storage dielectric film comprises silicon, oxygen and nitrogen.

53. The method of claim 52, wherein the charge storage dielectric film comprises a silicon oxide/silicon nitride/silicon oxide (ONO) stack.

54. The method of claim 47, wherein the step of forming the plurality of rails comprises:
   depositing a layer of silicon on the underlying insulating layer; and
   masking and etching the silicon layer to form the plurality of rails.

55. The method of claim 54, wherein the deposited layer of silicon comprises a polycrystalline silicon layer.

56. The method of claim 47, further comprising the step of forming a suicide layer on or within the word lines.

57. The method of claim 56, wherein the silicide layer is formed on a deposited polysilicon layer before etching the polysilicon layer to form the word lines.

58. The method of claim 47, wherein:
   the heavily-doped semiconductor regions comprise transistor source and drain regions; and
   lightly-doped semiconductor channel regions are disposed between the source and drain regions.

59. The method of claim 47, wherein the second device level comprises a plurality of charge storage transistors.

* * * * *